US011778907B2

(12) United States Patent
Parham et al.

(10) Patent No.: US 11,778,907 B2
(45) Date of Patent: Oct. 3, 2023

(54) COMPOSITION FOR ORGANIC ELECTRONIC DEVICES

(71) Applicant: Merck Patent GmbH, Darmstadt (DE)

(72) Inventors: Amir Parham, Frankfurt am Main (DE); Jonas Kroeber, Frankfurt am Main (DE); Christian Eickhoff, Mannheim (DE); Tobias Grossmann, Darmstadt (DE); Aurélie Ludemann, Frankfurt am Main (DE); Dominik Joosten, Ober-Ramstadt (DE)

(73) Assignee: Merck Patent GmbH, Darmstadt (DE)

( * ) Notice: Subject to any disclaimer, the term of this patent is extended or adjusted under 35 U.S.C. 154(b) by 510 days.

(21) Appl. No.: 16/604,855

(22) PCT Filed: Apr. 10, 2018

(86) PCT No.: PCT/EP2018/059076
§ 371 (c)(1),
(2) Date: Oct. 11, 2019

(87) PCT Pub. No.: WO2018/189134
PCT Pub. Date: Oct. 18, 2018

(65) Prior Publication Data
US 2020/0168810 A1 May 28, 2020

(30) Foreign Application Priority Data

Apr. 13, 2017 (EP) .................... 17166657

(51) Int. Cl.
*H10K 85/60* (2023.01)
*H10K 71/10* (2023.01)
*H10K 50/12* (2023.01)
*H10K 101/00* (2023.01)

(52) U.S. Cl.
CPC ......... *H10K 85/6572* (2023.02); *H10K 71/10* (2023.02); *H10K 85/654* (2023.02); *H10K 85/6574* (2023.02); *H10K 50/12* (2023.02); *H10K 2101/90* (2023.02)

(58) Field of Classification Search
None
See application file for complete search history.

(56) References Cited

U.S. PATENT DOCUMENTS

| 4,539,507 | A | 9/1985 | VanSlyke et al. |
| 5,151,629 | A | 9/1992 | VanSlyke |
| 5,840,217 | A | 11/1998 | Lupo et al. |
| 5,935,721 | A | 8/1999 | Shi et al. |
| 6,392,250 | B1 | 5/2002 | Aziz et al. |
| 6,458,909 | B1 | 10/2002 | Spreitzer et al. |
| 6,534,199 | B1 | 3/2003 | Hosokawa et al. |
| 6,713,192 | B2 | 3/2004 | Fukuoka et al. |
| 6,803,720 | B2 | 10/2004 | Kwong et al. |
| 7,345,301 | B2 | 3/2008 | Gerhard et al. |
| 7,429,425 | B2 | 9/2008 | Ikeda et al. |
| 7,790,892 | B2 | 9/2010 | Ikeda et al. |
| 7,795,801 | B2 | 9/2010 | Ueda et al. |
| 7,839,074 | B2 | 11/2010 | Ikeda et al. |
| 7,993,760 | B2 | 8/2011 | Komori et al. |
| 8,062,769 | B2 | 11/2011 | Kai et al. |
| 8,592,614 | B2 | 11/2013 | Becker et al. |
| 8,835,626 | B2 | 9/2014 | Parham et al. |
| 8,986,852 | B2 | 3/2015 | Stoessel et al. |
| 9,040,172 | B2 | 5/2015 | Parham et al. |
| 9,126,970 | B2 | 9/2015 | Pflumm et al. |
| 9,139,582 | B2 | 9/2015 | Parham et al. |
| 9,266,851 | B2 | 2/2016 | Yoshida et al. |
| 9,334,260 | B2 | 5/2016 | Parham et al. |
| 9,444,064 | B2 | 9/2016 | Kaiser et al. |
| 2003/0137239 | A1* | 7/2003 | Matsuura ............ H01L 51/5048 313/503 |
| 2005/0064233 | A1 | 3/2005 | Matsuura et al. |
| 2005/0069729 | A1 | 3/2005 | Ueda et al. |
| 2005/0233165 | A1 | 10/2005 | Ido et al. |
| 2011/0140043 | A1 | 6/2011 | Stoessel et al. |
| 2014/0249308 | A1* | 9/2014 | Parham ................ C07D 491/04 544/215 |
| 2014/0284584 | A1* | 9/2014 | Zheng .................. C07D 403/14 257/40 |
| 2015/0214489 | A1 | 7/2015 | Parham et al. |
| 2015/0340621 | A1 | 11/2015 | Parham et al. |

(Continued)

FOREIGN PATENT DOCUMENTS

| CN | 1362464 A | 8/2002 |
| EP | 0676461 A2 | 10/1995 |

(Continued)

OTHER PUBLICATIONS

Adachi, C., et al., "High-efficiency red electrophosphorescence devices", Applied Physics Letters, vol. 78, No. 11, (2001), pp. 1622-1624.
International Search Report for PCT/EP2018/059076 dated Jul. 24, 2018.
Written Opinion of the International Searching Authority for PCT/EP2018/059076 dated Jul. 24, 2018.

*Primary Examiner* — Gregory D Clark
(74) *Attorney, Agent, or Firm* — Faegre Drinker Biddle & Reath LLP

(57) ABSTRACT

The present invention relates to a composition comprising a bipolar host and an electron-transporting host, especially for use as matrix material in electronic devices, especially organic electroluminescent devices, and especially in an organic light-emitting diode (OLED). The invention further relates to electronic devices comprising said composition.

32 Claims, No Drawings

(56) References Cited

U.S. PATENT DOCUMENTS

2017/0186965 A1* 6/2017 Parham .............. H01L 51/0085
2017/0207399 A1 7/2017 Parham et al.
2017/0358760 A1 12/2017 Stoessel et al.

FOREIGN PATENT DOCUMENTS

| EP | 0906947 | A1 | 4/1999 |
|---|---|---|---|
| EP | 0906948 | A1 | 4/1999 |
| EP | 0908787 | A2 | 4/1999 |
| JP | 200921336 | A | 1/2009 |
| WO | WO-9827136 | A1 | 6/1998 |
| WO | WO-2001021729 | A1 | 3/2001 |
| WO | WO-2001076323 | A1 | 10/2001 |
| WO | WO-2003087023 | A1 | 10/2003 |
| WO | WO-2003095445 | A1 | 11/2003 |
| WO | WO-2004013073 | A1 | 2/2004 |
| WO | WO-2004016575 | A1 | 2/2004 |
| WO | WO-2004018587 | A1 | 3/2004 |
| WO | WO-2004018588 | A1 | 3/2004 |
| WO | WO-2004093207 | A2 | 10/2004 |
| WO | WO-2005003253 | A2 | 1/2005 |
| WO | WO-2005039246 | A1 | 4/2005 |
| WO | WO-2007063754 | A1 | 6/2007 |
| WO | WO-2008056746 | A1 | 5/2008 |
| WO | WO-2008145239 | A2 | 12/2008 |
| WO | WO-2009069442 | A1 | 6/2009 |
| WO | WO-2010006680 | A1 | 1/2010 |
| WO | WO-2010108579 | A1 | 9/2010 |
| WO | WO-2010136109 | A1 | 12/2010 |
| WO | WO-2011000455 | A1 | 1/2011 |
| WO | WO-2011046182 | A1 | 4/2011 |
| WO | WO-2011057706 | A2 | 5/2011 |
| WO | WO-2011116865 | A1 | 9/2011 |
| WO | WO-2011137951 | A1 | 11/2011 |
| WO | WO-2014015931 | A1 | 1/2014 |
| WO | WO-2014094964 | A1 | 6/2014 |
| WO | WO-2015169412 | A1 | 11/2015 |
| WO | WO-2016015810 | A1 | 2/2016 |
| WO | WO-2016062376 | A1 | 4/2016 |

* cited by examiner

COMPOSITION FOR ORGANIC ELECTRONIC DEVICES

CROSS-REFERENCE TO RELATED APPLICATIONS

This application is a national stage application der 35 U.S.C. § 371) of PCT/EP2018/059076, filed Apr. 10, 2018, which claims benefit of European Application No. 17166657.1, filed Apr. 13, 2017, both of which are incorporated herein by reference in their entirety.

The present invention relates to a composition comprising a bipolar host and an electron-transporting host, to the use thereof in electronic devices and electronic devices comprising said composition.

The structure of organic electroluminescent devices (e.g. OLEDs—organic light-emitting diodes or OLECs—organic light-emitting electrochemical cells) in which organic semiconductors are used as functional materials is described, for example, in U.S. Pat. Nos. 4,539,507, 5,151,629, EP 0676461 and WO 98/27136. Emitting materials used here, as well as fluorescent emitters, are increasingly organometallic complexes which exhibit phosphorescence rather than fluorescence (M. A. Baldo et al., *Appl. Phys. Lett.* 1999, 75, 4-6). For quantum-mechanical reasons, up to a fourfold increase in energy efficiency and power efficiency is possible using organometallic compounds as phosphorescent emitters. In general terms, however, there is still a need for improvement in OLEDs, especially also in OLEDs which exhibit triplet emission (phosphorescence), for example with regard to efficiency, operating voltage and lifetime.

The properties of organic electroluminescent devices are not only determined by the emitters used. Also of particular significance here are especially the other materials used, such as host and matrix materials, hole blocker materials, electron transport materials, hole transport materials and electron or exciton blocker materials, and among these especially the host or matrix materials. Improvements to these materials can lead to distinct improvements to electroluminescent devices.

Host materials for use in organic electronic devices are well-known to the person skilled in the art. The term "matrix material" is also frequently used in the prior art when what is meant is a host material for phosphorescent emitters. In the meantime, a multitude of host materials has been developed both for fluorescent and for phosphorescent electronic devices.

For fluorescent OLEDs, according to the prior art, fused aromatics in particular, especially anthracene derivatives, are used as host materials for blue-emitting electroluminescent devices in particular, for example 9,10-bis(2-naphthyl)anthracene (U.S. Pat. No. 5,935,721). WO 03/095445 and CN 1362464 disclose 9,10-bis(1-naphthyl)anthracene derivatives for use in OLEDs. Further anthracene derivatives are disclosed in WO 01/076323, in WO 01/021729, in WO 2004/013073, in WO 2004/018588, in WO 2003/087023 or in WO 2004/018587. Host materials based on aryl-substituted pyrenes and chrysenes are disclosed in WO 2004/016575. Host materials based on benzanthracene derivatives are disclosed in WO 2008/145239.

According to the prior art, ketones (for example according to WO 2004/093207 or WO 2010/006680) or phosphine oxides (for example according to WO 2005/003253) are among the matrix materials used for phosphorescent emitters. Further matrix materials according to the prior art are represented by triazines (for example WO 2008/056746, EP 0906947, EP 0908787, EP 0906948) and lactams (for example WO 2011/116865 or WO 2011/137951). In addition, according to the prior art, carbazole derivatives (for example according to WO 2005/039246, US 2005/0069729 or WO 2014/015931), indolocarbazole derivatives (for example according to WO 2007/063754 or WO 2008/056746) or indenocarbazole derivatives (for example according to WO 2010/136109 or WO 2011/000455), especially those substituted by electron-deficient heteroaromatics such as triazine, are among the matrix materials used for phosphorescent emitters. WO 2011/057706 discloses carbazole derivatives substituted by two triphenyltriazine groups. WO 2011/046182 discloses carbazole-arylene-triazine derivatives substituted by a fluorenyl group on the triazine.

WO 2009/069442 discloses tricyclic systems such as carbazole, dibenzofuran or dibenzothiophene having a high level of substitution by electron-deficient heteroaromatics (e.g. pyridine, pyrimidine or triazine) as host materials.

JP 2009-21336 discloses substituted dibenzofurans that are substituted in the 2 position by carbazole and in the 8 position by a triazine as host materials. WO 2011/057706 discloses a few substituted dibenzothiophenes and dibenzofurans as host materials, wherein the compounds are substituted in a specific manner by one electron-conducting and one hole-conducting group.

A further means of improving the performance data of electronic devices, especially of organic electroluminescent devices, is to use combinations of two or more materials, especially host materials.

U.S. Pat. No. 6,392,250 B1 discloses the use of a mixture consisting of an electron transport material, a hole transport material and a fluorescent emitter in the emission layer of an OLED. With the aid of this mixture, it was possible to improve the lifetime of the OLED compared to the prior art.

U.S. Pat. No. 6,803,720 B1 discloses the use of a mixture comprising a phosphorescent emitter and a hole transport material and an electron transport material in the emission layer of an OLED. Both the hole transport material and the electron transport material are small organic molecules.

WO 2010/108579 describes a mixture comprising a charge-transporting matrix material and a further matrix material which does not take part to a significant degree, if at all, in the charge transport by virtue of a large band gap.

According to WO 2014/094964, a mixture of an electron-transporting lactam derivative and a further electron-transporting carbazole-triazine derivative is used as matrix material for a phosphorescent and in some cases hole-conducting emitter.

However, in the case of use of these materials or in the case of use of mixtures of the materials, there is still a need for improvement, especially in relation to the lifetime of the organic electronic device, and especially also in the typical case that the light-emitting component has been doped into an emissive layer in low concentrations of down to 5% by weight, based on all components of an emissive layer.

The problem addressed by the present invention was therefore that of providing materials which are suitable for use in an organic electronic device, especially in an organic electroluminescent device, and especially in a fluorescent or phosphorescent OLED, and lead to good device properties, especially with regard to lifetime, and that of providing the corresponding electronic device.

It has been found that, surprisingly, compositions comprising a bipolar host and an electron-transporting host solve this problem and eliminate the disadvantages from the prior art. Compositions of this kind lead to very good properties of organic electronic devices, especially organic electroluminescent devices, especially with regard to lifetime and especially also at low concentrations of a light-emitting component in the emission layer.

The present invention therefore provides a composition comprising a bipolar host and an electron-transporting host. The present invention likewise provides organic electronic devices, especially organic electroluminescent devices, comprising compositions of this kind in a layer and the corresponding preferred embodiments. The surprising effects are achieved by virtue of a very specific selection of known materials.

The layer containing the composition comprising the bipolar host and the electron-transporting host is especially an emitting layer (EML), an electron transport layer (ETL), an electron injection layer (EIL) and/or a hole blocker layer (HBL). When the layer is an emitting layer, it is preferably a phosphorescent layer which is characterized in that it comprises a phosphorescent emitter in addition to the composition comprising the bipolar host and the electron-transporting host. In this case, the composition of the invention is matrix material for the phosphorescent emitter, i.e. does not itself take part to a significant degree, if at all, in the emission of light.

A phosphorescent emitter in the context of the present invention is a compound that exhibits luminescence from an excited state with higher spin multiplicity, i.e. a spin state >1, especially from an excited triplet state. In the context of this application, all luminescent complexes with transition metals or lanthanides are to be regarded as phosphorescent emitters. A more exact definition is given further down.

When the composition comprising the bipolar host and the electron-transporting host is used as matrix material for a phosphorescent emitter, it is preferable when the triplet energy thereof is not significantly less than the triplet energy of the phosphorescent emitter. In respect of the triplet level, it is preferably the case that $T_1(\text{emitter}) - T_1(\text{matrix}) \leq 0.2$ eV, more preferably $\leq 0.15$ eV, most preferably $\leq 0.1$ eV. $T_1(\text{matrix})$ here is the triplet level of the matrix material in the emission layer, this condition being applicable to each of the two matrix materials, and $T_1(\text{emitter})$ is the triplet level of the phosphorescent emitter. If the emission layer contains more than two matrix materials, the abovementioned relationship is preferably also applicable to every further matrix material.

A bipolar host in the context of the present invention, as exists in the composition of the invention, is preferably a compound having a LUMO of not higher than −2.4 eV and a HOMO of not lower than −5.5 eV. The LUMO is the lowest unoccupied molecular orbital and the HOMO is the highest occupied molecular orbital. The value of the LUMO and the HOMO in the compounds is determined by quantum-chemical calculation, as described in general terms in the examples section hereinafter.

An electron-transporting host in the context of the present invention, as exists in the composition of the invention, is preferably a compound having a LUMO of not higher than −2.3 eV, preferably not higher than −2.4 eV.

According to the invention, both the bipolar host and the electron-transporting host are organic compounds.

The person skilled in the art will be aware that a bipolar host is one which, in the mixture used, makes a significant contribution both to electron transport and to hole transport in the component used, i.e. encompasses both electron- and hole-conducting properties. The person skilled in the art will further be aware that this can be achieved by selecting a material (a) into which both electrons and holes are injected to a significant degree owing to its energy levels by comparison with the energy levels of further materials used in the same mixture, and (b) in which transport is not suppressed owing to extremely low electron or hole mobility (less than $10^{-8}$ cm$^2$/(Vs)). The measurement of electron and hole mobilities is conducted in a routine manner by the person skilled in the art by means of standard methods.

For the selection of suitable bipolar hosts, the person skilled in the art can resort to a large number of known hosts and combine them, for example, with emitters having fitting energy levels that are likewise known.

Preferred bipolar hosts are selected from the group of the triazines, pyrimidines, pyrazines, pyridines, pyrazoles, pyridazines, quinolines, isoquinolines, quinoxalines, quinazolines, thiazoles, benzothiazoles, oxazoles, oxadiazoles, benzoxazoles, imidazoles, benzimidazoles, carbazoles, indenocarbazoles, indolocarbazoles, phosphine oxides, phenylsulfonyls, ketones, lactams, phenanthrolines and triarylamines, particular preference being given to the triazines, pyrimidines, quinazolines, benzimidazoles, carbazoles, indenocarbazoles, indolocarbazoles, ketones, lactams and triarylamines. Very particularly preferred bipolar hosts are selected from the group of the triazines, pyrimidines, quinazolines, benzimidazoles, carbazoles and indenocarbazoles, special preference being given to the triazines, pyrimidines, carbazoles and indenocarbazoles.

Frequently, bipolar hosts take the form of what are called hybrid systems. Hybrid systems are characterized in that they contain both at least one electron-transporting group (ET) and at least one hole-transporting group (HT), these generally being groups which, by virtue of their electron richness or electron deficiency, achieve a HOMO suitable for hole injection or a LUMO suitable for electron injection.

In a preferred embodiment of the present invention, the bipolar host of the composition of the invention is therefore a compound of the general formula (1):

ET-(L)$_n$-HT-(R$^4$)$_q$    Formula (1)

where the symbols and indices used are as follows:
ET is an organic electron-transporting group (ET) from the group of the electron-deficient heteroaromatic groups, the ET group preferably being a heteroaryl group having 5 to 60 aromatic ring atoms, where nitrogen atoms are very preferred heteroatoms, and very particularly preferred ET groups being selected from the group of the triazines, pyrimidines, pyrazines, pyrazoles, pyridines, pyridazines, quinolines, isoquinolines, quinoxalines, quinazolines, thiazoles, benzothiazoles, oxazoles, oxadiazoles, benzoxazoles, imidazoles and benzimidazoles, where the ET group may be substituted by one or more independent R$^1$ radicals;
HT is an organic hole-transporting group (HT) from the group of the electron-rich heteroaromatic groups, the HT group preferably being a heteroaryl group having 5 to 60 aromatic ring atoms, where nitrogen atoms are very preferred heteroatoms, and very particularly preferred HT groups being selected from the group of the carbazoles, indenocarbazoles, indolocarbazoles, phenanthrolines and triarylamines, where the HT group may be substituted by one or more independent R$^{1''}$ radicals;
L is a bridging C(=O), S(=O)$_2$, P(=O)(R$^{1'''}$) group or an aromatic or heteroaromatic ring system which has 5 to 30 aromatic ring atoms and may be substituted by one or more independent R$^{1'''}$ radicals;
n is 0, 1, 2, 3 or 4, preferably 0 or 1, very preferably 1;

q is an integer from 1 to 5, preferably from 1 to 4, more preferably from 1 to 3, very preferably 1 to 2, even more preferably exactly 2 and especially preferably exactly 1;

$R^1$, $R^{1\prime}$, $R^{1\prime\prime}$ is the same or different at each instance and is H, D, F, Cl, Br, I, $N(R^2)_2$, CN, $NO_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy or thioalkoxy group having 1 to 40 carbon atoms or a straight-chain alkenyl or alkynyl group having 2 to 40 carbon atoms or a branched or cyclic alkyl, alkenyl, alkynyl, alkoxy, alkylalkoxy or thioalkoxy group having 3 to 40 carbon atoms, each of which may be substituted by one or more $R^2$ radicals, where one or more nonadjacent $CH_2$ groups may be replaced by $R^2C=CR^2$, $C\equiv C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where one or more hydrogen atoms may be replaced by D, F, Cl, Br, I, CN or $NO_2$, or an aromatic or heteroaromatic ring system which has 5 to 60 aromatic ring atoms and may be substituted in each case by one or more $R^2$ radicals, or an aryloxy, arylalkoxy or heteroaryloxy group which has 5 to 60 aromatic ring atoms and may be substituted by one or more $R^2$ radicals, or a diarylamino group, diheteroarylamino group or arylheteroarylamino group which has 10 to 40 aromatic ring atoms and may be substituted by one or more $R^2$ radicals, or a combination of two or more of these groups; at the same time, two or more adjacent $R^1$, $R^{1\prime}$ or $R^{1\prime\prime}$ radicals together may form a mono- or polycyclic, aliphatic or aromatic ring system, it being preferable when two or more adjacent $R^1$, $R^{1\prime}$ or $R^{1\prime\prime}$ radicals together do not form a mono- or polycyclic, aliphatic or aromatic ring system;

$R^2$ is the same or different at each instance and is H, D, F, Cl, Br, I, $N(R^3)_2$, CN, $NO_2$, $Si(R^3)_3$, $B(OR^3)_2$, $C(=O)R^3$, $P(=O)(R^3)_2$, $S(=O)R^3$, $S(=O)_2R^3$, $OSO_2R^3$, a straight-chain alkyl, alkoxy or thioalkoxy group having 1 to 40 carbon atoms or a straight-chain alkenyl or alkynyl group having 2 to 40 carbon atoms or a branched or cyclic alkyl, alkenyl, alkynyl, alkoxy, alkylalkoxy or thioalkoxy group having 3 to 40 carbon atoms, each of which may be substituted by one or more $R^3$ radicals, where one or more nonadjacent $CH_2$ groups may be replaced by $R^3C=CR^3$, $C\equiv C$, $Si(R^3)_2$, $Ge(R^3)_2$, $Sn(R^3)_2$, $C=O$, $C=S$, $C=Se$, $C=NR^3$, $P(=O)(R^3)$, SO, $SO_2$, $NR^3$, O, S or $CONR^3$ and where one or more hydrogen atoms may be replaced by D, F, Cl, Br, I, CN or $NO_2$, or an aromatic or heteroaromatic ring system which has 5 to 60 aromatic ring atoms and may be substituted in each case by one or more $R^3$ radicals, or an aryloxy, arylalkoxy or heteroaryloxy group which has 5 to 60 aromatic ring atoms and may be substituted by one or more $R^3$ radicals, or a diarylamino group, diheteroarylamino group or arylheteroarylamino group which has 10 to 40 aromatic ring atoms and may be substituted by one or more $R^3$ radicals, or a combination of two or more of these groups; at the same time, two or more adjacent $R^2$ radicals together may form a mono- or polycyclic, aliphatic or aromatic ring system;

$R^3$ is the same or different at each instance and is H, D, F or an aliphatic, aromatic and/or heteroaromatic hydrocarbyl radical having 1 to 20 carbon atoms, in which one or more hydrogen atoms may also be replaced by F; at the same time, two or more $R^3$ substituents together may also form a mono- or polycyclic aliphatic or aromatic ring system;

$R^4$ is the same or different at each instance and is $N(R^2)_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy or thioalkoxy group having 1 to 40 carbon atoms or a straight-chain alkenyl or alkynyl group having 2 to 40 carbon atoms or a branched or cyclic alkyl, alkenyl, alkynyl, alkoxy, alkylalkoxy or thioalkoxy group having 3 to 40 carbon atoms, each of which may be substituted by one or more $R^2$ radicals, where one or more nonadjacent $CH_2$ groups may be replaced by $R^2C=CR^2$, $C\equiv C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where one or more hydrogen atoms may be replaced by D, F, Cl, Br, I, CN or $NO_2$, or an aromatic or heteroaromatic ring system which has 5 to 60 aromatic ring atoms and may be substituted in each case by one or more $R^2$ radicals, or an aryloxy, arylalkoxy or heteroaryloxy group which has 5 to 60 aromatic ring atoms and may be substituted by one or more $R^2$ radicals, or a diarylamino group, diheteroarylamino group or arylheteroarylamino group which has 10 to 40 aromatic ring atoms and may be substituted by one or more $R^2$ radicals, or a combination of two or more of these groups; at the same time, two or more adjacent $R^4$ radicals together may form a mono- or polycyclic, aliphatic or aromatic ring system.

By definition, the compounds of the general formula (1) always contain at least one substituent $R^4$ that is not hydrogen.

If two or more adjacent radicals together do not form a mono- or polycyclic, aliphatic or aromatic or heteroaromatic ring system, these radicals must not be part of a ring or ring system. If, for example, the $R^1$ radical is defined such that two or more adjacent $R^1$ radicals together do not form a mono- or polycyclic, aliphatic or aromatic or heteroaromatic ring system with one another, but the $R^1$ radicals themselves may again be substituted by $R^2$ radicals, where two or more adjacent $R^2$ radicals together may form a mono- or polycyclic, aliphatic or aromatic or heteroaromatic ring system, the ring closure of the $R^2$ radicals must not be effected in such a way that this makes the $R^1$ radicals part of a ring or ring system.

The wording that two or more radicals together may form a ring, in the context of the present application, shall be understood to mean, inter alia, that the two radicals are joined to one another by a chemical bond. This is illustrated by the following scheme:

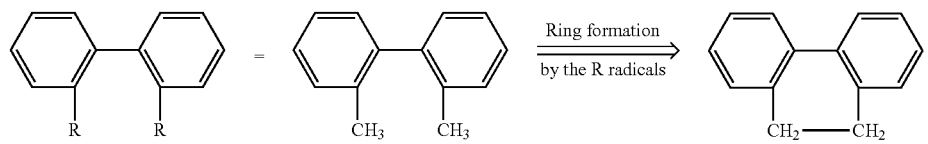

In addition, however, the abovementioned wording shall also be understood to mean that, if one of the two radicals is hydrogen, the second radical binds to the position to which the hydrogen atom was bonded, forming a ring. This shall be illustrated by the following scheme:

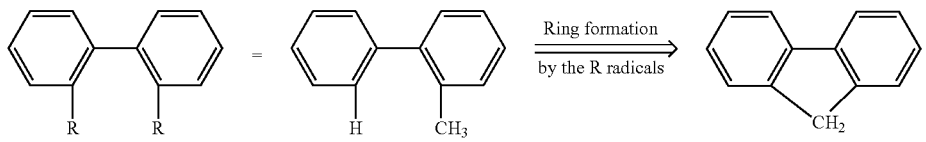

A fused (annelated) aryl group is understood to mean an aryl group containing two or more aromatic rings fused to one another, meaning that they share one or more aromatic bonds. A corresponding definition applies to heteroaryl groups. Examples of fused aryl groups, regardless of the number of ring atoms therein, are naphthyl, anthracenyl, pyrenyl, phenanthrenyl and perylenyl. Examples of fused heteroaryl groups are quinolinyl, indolyl, carbazolyl and acridinyl.

There follow general definitions of chemical groups in the context of the present application:

An aryl group in the context of this invention contains 6 to 60 aromatic ring atoms; a heteroaryl group in the context of this invention contains 5 to 60 aromatic ring atoms, at least one of which is a heteroatom. The heteroatoms are preferably selected from N, O and S. This is the fundamental definition. If other preferences are stated in the description of the present invention, for example with regard to the number of aromatic ring atoms or of heteroatoms present, these are applicable.

An aryl group or heteroaryl group is understood here to mean either a simple aromatic cycle, i.e. benzene, or a simple heteroaromatic cycle, for example pyridine, pyrimidine or thiophene, or a fused (annelated) aromatic or heteroaromatic polycycle, for example naphthalene, phenanthrene, quinoline or carbazole. A fused (annelated) aromatic or heteroaromatic polycycle, in the context of the present application, consists of two or more simple aromatic or heteroaromatic cycles fused to one another.

An electron-deficient heteroaromatic or heteroaryl group in the context of the present invention is defined as a 5-membered heteroaryl group having at least two heteroatoms, for example imidazole, oxazole, oxadiazole, etc., or as a 6-membered heteroaryl group having at least one heteroatom, for example pyridine, pyrimidine, pyrazine, triazine, etc. It is also possible for further 6-membered aryl or 6-membered heteroaryl groups to be fused onto these groups, as is the case, for example, in benzimidazole, quinoline or quinazoline.

An electron-rich heteroaromatic or heteroaryl group in the context of the present invention is those ring systems that contain, as heteroaryl group, pyrrole, furan, thiophene, benzothiophene, benzofuran, indole, carbazole, dibenzothiophene, dibenzofuran, azacarbazole and/or arylamines.

An aryl or heteroaryl group, each of which may be substituted by the abovementioned radicals and which may be joined to the aromatic or heteroaromatic system via any desired positions, is especially understood to mean groups derived from benzene, naphthalene, anthracene, phenanthrene, pyrene, dihydropyrene, chrysene, perylene, fluoranthene, benzanthracene, benzophenanthrene, tetracene, pentacene, benzopyrene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

An aryloxy group as defined in the present invention is understood to mean an aryl group as defined above bonded via an oxygen atom. An analogous definition applies to heteroaryloxy groups.

An aromatic ring system in the context of this invention contains 6 to 60 carbon atoms in the ring system. A heteroaromatic ring system in the context of this invention contains 5 to 60 aromatic ring atoms, at least one of which is a heteroatom. The heteroatoms are preferably selected from N, O and/or S. An aromatic or heteroaromatic ring system in the context of this invention is understood to mean a system which does not necessarily contain only aryl or heteroaryl groups, but in which it is also possible for two or more aryl or heteroaryl groups to be bonded by a nonaromatic unit (preferably less than 10% of the atoms other than H), for example an $sp^3$-hybridized carbon, silicon, nitrogen or oxygen atom, an $sp^2$-hybridized carbon or nitrogen atom or an sp-hybridized carbon atom. For example, systems such as 9,9'-spirobifluorene, 9,9'-diarylfluorene, triarylamine, diaryl ethers, stilbene, etc. are also to be regarded as aromatic ring systems in the context of this invention, and likewise systems in which two or more aryl groups are joined, for example, by a linear or cyclic alkyl, alkenyl or alkynyl group or by a silyl group. In addition, systems in which two or more aryl or heteroaryl groups are joined to one another via single bonds are also regarded as aromatic or heteroaromatic ring systems in the context of this invention, for example systems such as biphenyl, terphenyl or diphenyltriazine.

An aromatic or heteroaromatic ring system which has 5 to 60 or 5 to 30 aromatic ring atoms and may also be substituted in each case by radicals as defined above and which may be joined to the aromatic or heteroaromatic system via any desired positions is understood to mean, more particularly, groups derived from benzene, naphthalene, anthracene, benzanthracene, phenanthrene, benzophenanthrene, pyrene, chrysene, perylene, fluoranthene, naphthacene, pentacene, benzopyrene, biphenyl, biphenylene, terphenyl, terphenylene, quaterphenyl, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole, or combinations of these groups.

In the context of the present invention, an aliphatic hydrocarbyl radical or a straight-chain alkyl group having 1 to 40 carbon atoms and a branched or cyclic alkyl group having 3 to 40 carbon atoms and an alkenyl or alkynyl group having 2 to 40 carbon atoms in which individual hydrogen atoms or $CH_2$ groups may also be substituted by the groups mentioned above in the definition of the radicals are preferably understood to mean the methyl, ethyl, n-propyl, i-propyl, n-butyl, i-butyl, s-butyl, t-butyl, 2-methylbutyl, n-pentyl, s-pentyl, cyclopentyl, neopentyl, n-hexyl, cyclohexyl, neohexyl, n-heptyl, cycloheptyl, n-octyl, cyclooctyl, 2-ethyihexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl radicals. An alkoxy or thioalkyl group having 1 to 40 carbon atoms is preferably understood to mean methoxy, trifluoromethoxy, ethoxy, n-propoxy, i-propoxy, n-butoxy, i-butoxy, s-butoxy, t-butoxy, n-pentoxy, s-pentoxy, 2-methylbutoxy, n-hexoxy, cyclohexyloxy, n-heptoxy, cycloheptyloxy, n-octyloxy, cyclooctyloxy, 2-ethylhexyloxy, pentafluoroethoxy, 2,2,2-trifluoroethoxy, methylthio, ethylthio, n-propylthio, i-propylthio, n-butylthio, i-butylthio, s-butylthio, t-butylthio, n-pentylthio, s-pentylthio, n-hexylthio, cyclohexylthio, n-heptylthio, cycloheptylthio, n-octylthio, cyclooctylthio, 2-ethylhexylthio, trifluoromethylthio, pentafluoroethylthio, 2,2,2-trifluoroethylthio, ethenylthio, propenylthio, butenylthio, pentenylthio, cyclopentenylthio, hexenylthio, cyclohexenylthio, heptenylthio, cycloheptenylthio, octenylthio, cyclooctenylthio, ethynylthio, propynylthio, butynylthio, pentynylthio, hexynylthio, heptynylthio or octynylthio.

The ET group is preferably an electron-deficient heteroaromatic group which may be substituted by one or more $R^1$ radicals. Even more preferred are heteroaromatic groups having 6 aromatic ring atoms of which at least one is and preferably 2 and very preferably at least three are a nitrogen atom, or heteroaromatic groups having 5 aromatic ring atoms of which at least 2 are heteroatoms, and preferably at least one of them a nitrogen atom which may be substituted by $R^1$, where further aryl or heteroaryl groups may also be fused onto each of these groups.

Preferred electron-deficient heteroaromatic groups are therefore selected from the following groups:

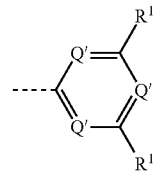

Formula (ET-1)

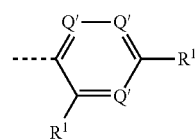

Formula (ET-2)

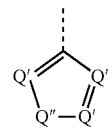

(Formula (ET-3))

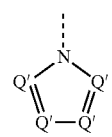

Formula (ET-4)

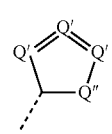

Formula (ET-5)

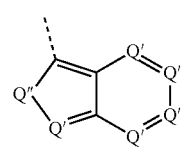

Formula (ET-6)

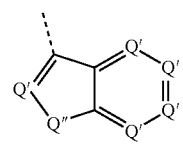

Formula (ET-7)

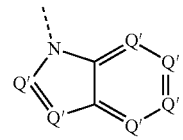

Formula (ET-8)

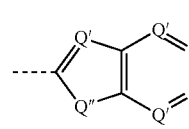

Formula (ET-9)

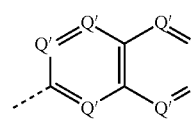

Formula (ET-10)

Formula (ET-11)

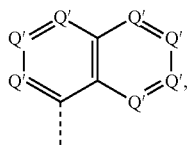

where the dotted bond marks the position of attachment to the bridging $(L)_n$ group or the HT group (when n=0), $R^1$ is as defined above and Q' is the same or different at each instance and is $CR^1$ or N, and Q'' is $NR^1$, O or S;

and where at least one Q' is N and/or at least one Q'' is $NR^1$.

Preferred examples of electron-deficient heteroaromatic groups are: pyridines, pyrazines, pyrimidines, pyridazines, 1,2,4-triazines, 1,3,5-triazines, quinolines, isoquinolines, quinoxalines, quinazolines, pyrazoles, imidazoles, benzimidazoles, thiazoles, benzothiazoles, oxazoles or benzoxazoles, each of which may be substituted by $R^1$. Even more preferably, the electron-transporting group is a pyridine, pyrazine, pyrimidine, pyridazine, 1,3,5-triazine, benzimidazole and quinazoline substituted by one or more $R^1$ radicals.

Particularly preferred electron-deficient heteroaromatic groups are selected from the formulae Formula (ET-12)

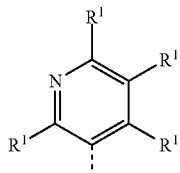

Formula (ET-13)

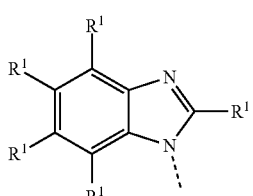

Formula (ET-14)

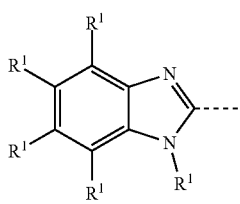

Formula (ET-15)

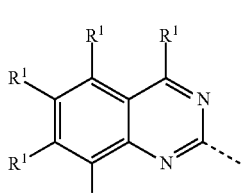

Formula (ET-16)

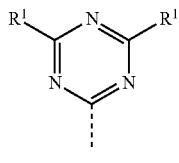

Formula (ET-17)

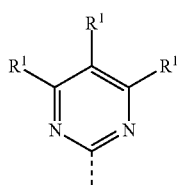

Formula (ET-18)

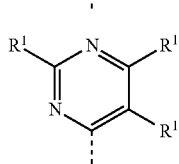

Formula (ET-19)

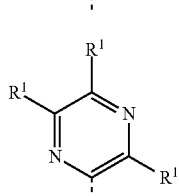

Formula (ET-20)

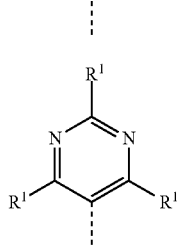

very particular preference being given to groups of the formulae (ET-12), (ET-13), (ET-14), (ET-15), (ET-16) and (ET-20), and greatest preference to groups of the formula (ET-12).

The substituents $R^1$ in the ET group are preferably selected from the group consisting of H or an aromatic or heteroaromatic ring system which has 5 to 60 aromatic ring atoms and may be substituted in each case by one or more $R^2$ radicals, it being preferable that an ET group substituted by one or more $R^1$ radicals does not contain any electron-rich aromatic or heteroaromatic rings or ring systems.

Examples of very particularly preferred ET groups are the following groups which may be substituted by one or more independent $R^2$ radicals, where the dotted bonds indicate the binding position to the bridging $(L)_n$ group or the HT group (when n=0):

Formula (ET-21)

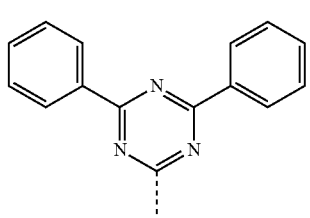

Formula (ET-22)
Formula (ET-23)
Formula (ET-24)
Formula (ET-25)
Formula (ET-26)
Formula (ET-27)
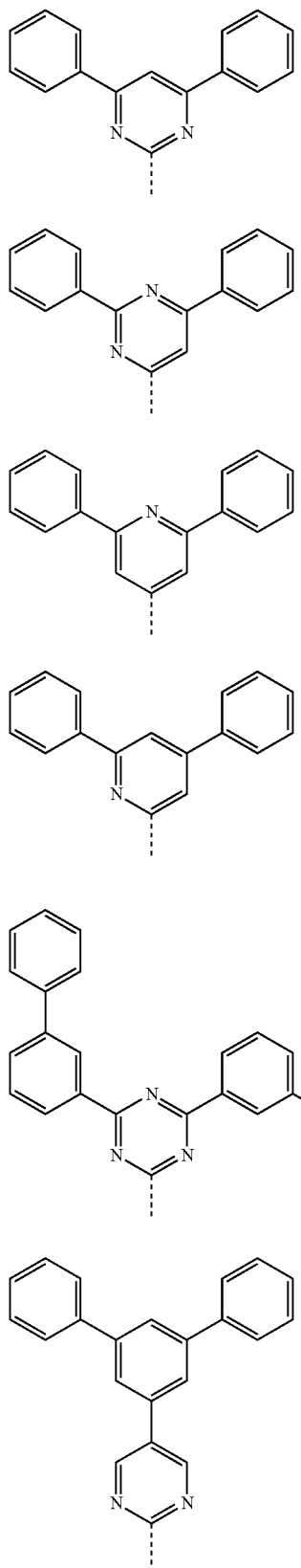
Formula (ET-28)
Formula (ET-29)
Formula (ET-30)
Formula (ET-31)
Formula (ET-32)
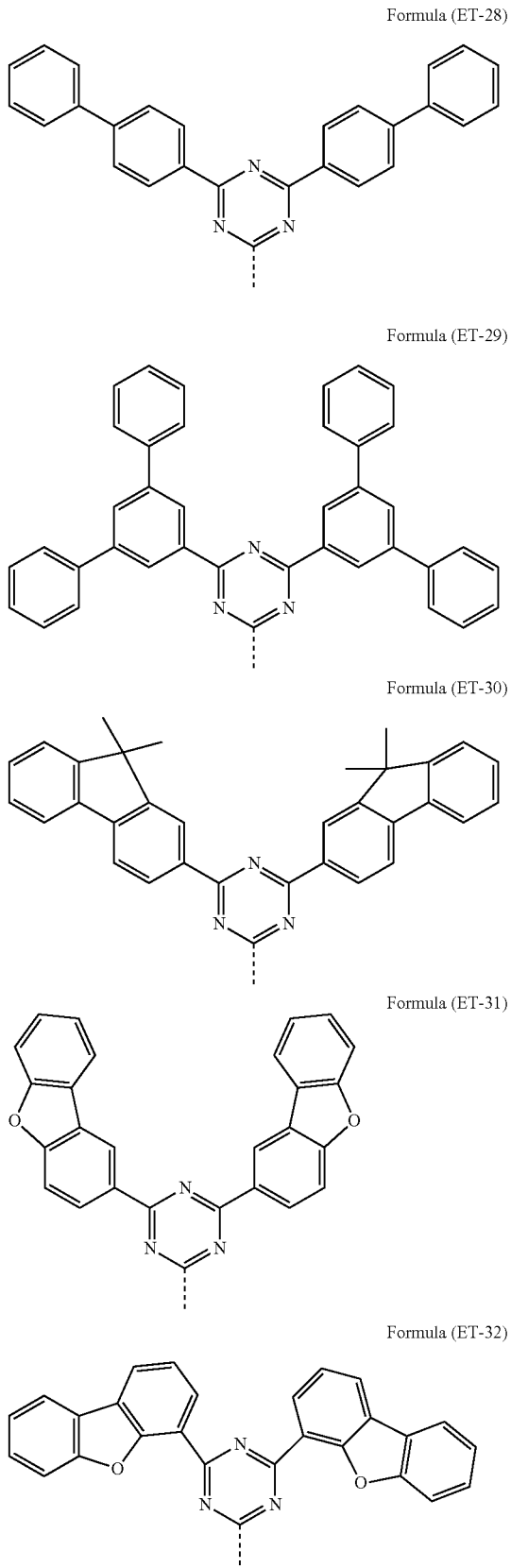

Formula (ET-33)

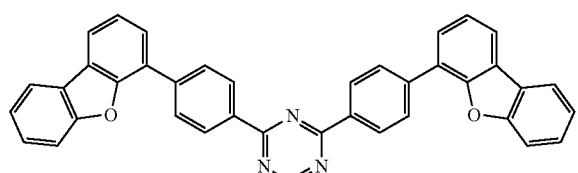

Formula (ET-34)

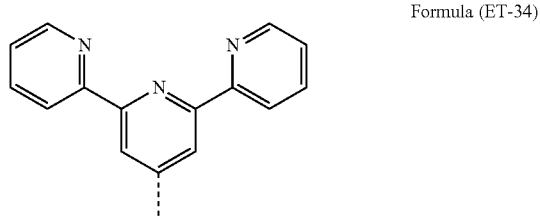

Formula (ET-35)

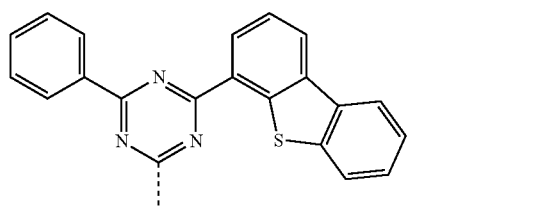

Formula (ET-36)

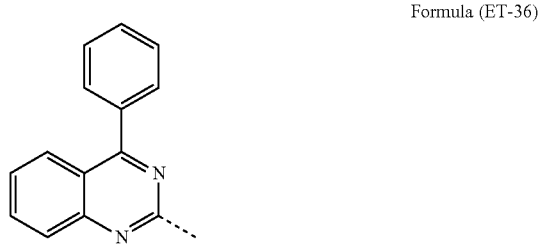

The HT group is preferably an electron-rich heteroaromatic group which may be substituted by one or more $R^{1'}$ radicals and which is substituted by at least 1 and at most 5 $R^4$ radicals. Even more preferred are aromatic heterocyclic groups having 3 to 5 aryl groups fused to one another, each having 5 or 6 aromatic ring atoms, of which at least one group, preferably 1 or 2 groups, and very preferably exactly one group, is a heteroaryl group having 5 aromatic ring atoms, where one of the ring atoms is a heteroatom, preferably a nitrogen atom which may be substituted by $R^{1'}$ or $R^4$.

The electron-rich heteroaromatic group (HT), in a preferred embodiment, has a structure of the following formula (HT-1):

Formula (HT-1)

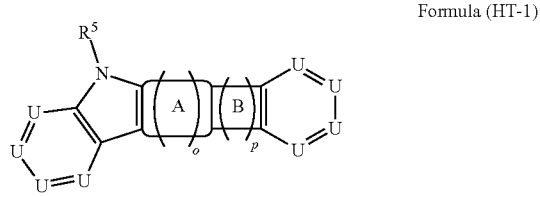

where:
A, B are the same or different and are an aromatic or heteroaromatic ring which has 5 or 6 aromatic ring atoms and may be substituted by one or more $R^5$ radicals;
o, p are the same or different and are 0 or 1;
U is the same or different at each instance and is $CR^5$, N or O, where not more than two U per cycle, which are not adjacent to one another, are N or O, and where U is carbon if an $(L)_n$ group or an ET group (when n=0) is attached to this position;
$R^5$ is the same or different at each instance and is $R^{1'}$ or $R^4$,
with the proviso that there are 1 to 5 $R^5$ radicals corresponding to $R^4$ in the structure of the formula (HT-1), where $R^{1'}$ and $R^4$ have the definitions given above.

In the structure of the formula (HT-1), it is preferable when both o and p are 0 or are 1, i.e. each assume the value of 0 or 1. More preferably, o and p are both equal to 0.

If both o and p assume the value of 1, it is preferable when the rings A and B have a different number of aromatic ring atoms. This means that, when A is an aromatic or heteroaromatic ring having 6 aromatic ring atoms, B is preferably an aromatic or heteroaromatic ring having 5 aromatic ring atoms, and vice versa.

In addition, it is preferable, if A and/or B is a heteroaromatic ring, that not more than two and more preferably exactly one of the aromatic ring atoms is a heteroatom selected from N and O, preferably N.

U in the structure of the formula (HT-1) is the same or different at each instance and is $CR^5$, N or O, where the maximum of two U per cycle that are not alongside one another are preferably N. More preferably, U is $CR^5$.

Particularly preferred examples of electron-rich heteroaromatic HT groups are carbazoles, indenocarbazoles and indolocarbazoles, very particular preference being given to carbazoles.

Preferred embodiments of the indenocarbazole group, the indolocarbazole group or the carbazole group are the structures of the following formulae:

Formula (HT-2)

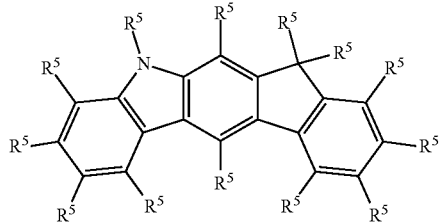

Formula (HT-3)

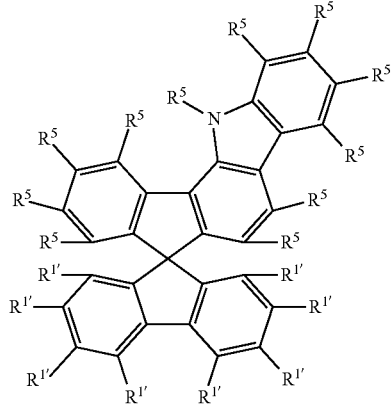

Formula (HT-4)

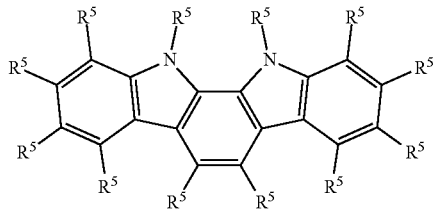

Formula (HT-5)

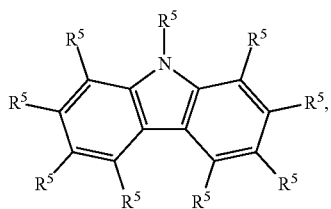

where $R^5$ is the same or different at each instance and is either $R^{1'}$ or $R^4$, with the proviso that the (HT-2), (HT-3), (HT-4) and (HT-5) groups each have, rather than one of the $R^5$ radicals, a bond to the bridging $(L)_n$ group or the ET group (when n=0), and that, in each of the (HT-2), (HT-3), (HT-4) and (HT-5) groups, there are 1 to 5 $R^5$ radicals corresponding to $R^4$, and where $R^{1'}$ and $R^4$ have the definitions given above.

The bond of the 1 to 5 $R^4$ radicals may be to any as yet unsubstituted positions in the (HT-2), (HT-3), (HT-4) and (HT-5) groups.

The aforementioned ET and HT groups may be combined with one another as desired.

Examples of bipolar hosts suitable for use in the composition of the invention are therefore compounds of the following general formulae:

| | | | |
|---|---|---|---|
| (1-2) | (ET-1)-$(L)_n$-(HT-2)-$(R^4)_q$ | (1-3) | (ET-1)-$(L)_n$-(HT-3)-$(R^4)_q$ |
| (1-4) | (ET-1)-$(L)_n$-(HT-4)-$(R^4)_q$ | (1-5) | (ET-1)-$(L)_n$-(HT-5)-$(R^4)_q$ |
| (1-6) | (ET-2)-$(L)_n$-(HT-2)-$(R^4)_q$ | (1-7) | (ET-2)-$(L)_n$-(HT-3)-$(R^4)_q$ |
| (1-8) | (ET-2)-$(L)_n$-(HT-4)-$(R^4)_q$ | (1-9) | (ET-2)-$(L)_n$-(HT-5)-$(R^4)_q$ |
| (1-10) | (ET-3)-$(L)_n$-(HT-2)-$(R^4)_q$ | (1-11) | (ET-3)-$(L)_n$-(HT-3)-$(R^4)_q$ |
| (1-12) | (ET-3)-$(L)_n$-(HT-4)-$(R^4)_q$ | (1-13) | (ET-3)-$(L)_n$-(HT-5)-$(R^4)_q$ |
| (1-14) | (ET-4)-$(L)_n$-(HT-2)-$(R^4)_q$ | (1-15) | (ET-4)-$(L)_n$-(HT-3)-$(R^4)_q$ |
| (1-16) | (ET-4)-$(L)_n$-(HT-4)-$(R^4)_q$ | (1-17) | (ET-4)-$(L)_n$-(HT-5)-$(R^4)_q$ |
| (1-18) | (ET-5)-$(L)_n$-(HT-2)-$(R^4)_q$ | (1-19) | (ET-5)-$(L)_n$-(HT-3)-$(R^4)_q$ |
| (1-20) | (ET-5)-$(L)_n$-(HT-4)-$(R^4)_q$ | (1-21) | (ET-5)-$(L)_n$-(HT-5)-$(R^4)_q$ |
| (1-22) | (ET-6)-$(L)_n$-(HT-2)-$(R^4)_q$ | (1-23) | (ET-6)-$(L)_n$-(HT-3)-$(R^4)_q$ |
| (1-24) | (ET-6)-$(L)_n$-(HT-4)-$(R^4)_q$ | (1-25) | (ET-6)-$(L)_n$-(HT-5)-$(R^4)_q$ |
| (1-26) | (ET-7)-$(L)_n$-(HT-2)-$(R^4)_q$ | (1-27) | (ET-7)-$(L)_n$-(HT-3)-$(R^4)_q$ |
| (1-28) | (ET-7)-$(L)_n$-(HT-4)-$(R^4)_q$ | (1-29) | (ET-7)-$(L)_n$-(HT-5)-$(R^4)_q$ |
| (1-30) | (ET-8)-$(L)_n$-(HT-2)-$(R^4)_q$ | (1-31) | (ET-8)-$(L)_n$-(HT-3)-$(R^4)_q$ |
| (1-32) | (ET-8)-$(L)_n$-(HT-4)-$(R^4)_q$ | (1-33) | (ET-8)-$(L)_n$-(HT-5)-$(R^4)_q$ |
| (1-34) | (ET-9)-$(L)_n$-(HT-2)-$(R^4)_q$ | (1-35) | (ET-9)-$(L)_n$-(HT-3)-$(R^4)_q$ |
| (1-36) | (ET-9)-$(L)_n$-(HT-4)-$(R^4)_q$ | (1-37) | (ET-9)-$(L)_n$-(HT-5)-$(R^4)_q$ |
| (1-38) | (ET-10)-$(L)_n$-(HT-2)-$(R^4)_q$ | (1-39) | (ET-10)-$(L)_n$-(HT-3)-$(R^4)_q$ |
| (1-40) | (ET-10)-$(L)_n$-(HT-4)-$(R^4)_q$ | (1-41) | (ET-10)-$(L)_n$-(HT-5)-$(R^4)_q$ |
| (1-42) | (ET-11)-$(L)_n$-(HT-2)-$(R^4)_q$ | (1-43) | (ET-11)-$(L)_n$-(HT-3)-$(R^4)_q$ |
| (1-44) | (ET-11)-$(L)_n$-(HT-4)-$(R^4)_q$ | (1-45) | (ET-11)-$(L)_n$-(HT-5)-$(R^4)_q$ |
| (1-46) | (ET-12)-$(L)_n$-(HT-2)-$(R^4)_q$ | (1-47) | (ET-12)-$(L)_n$-(HT-3)-$(R^4)_q$ |
| (1-48) | (ET-12)-$(L)_n$-(HT-4)-$(R^4)_q$ | (1-49) | (ET-12)-$(L)_n$-(HT-5)-$(R^4)_q$ |
| (1-50) | (ET-13)-$(L)_n$-(HT-2)-$(R^4)_q$ | (1-51) | (ET-13)-$(L)_n$-(HT-3)-$(R^4)_q$ |
| (1-52) | (ET-13)-$(L)_n$-(HT-4)-$(R^4)_q$ | (1-53) | (ET-13)-$(L)_n$-(HT-5)-$(R^4)_q$ |
| (1-54) | (ET-14)-$(L)_n$-(HT-2)-$(R^4)_q$ | (1-55) | (ET-14)-$(L)_n$-(HT-3)-$(R^4)_q$ |
| (1-56) | (ET-14)-$(L)_n$-(HT-4)-$(R^4)_q$ | (1-57) | (ET-14)-$(L)_n$-(HT-5)-$(R^4)_q$ |
| (1-58) | (ET-15)-$(L)_n$-(HT-2)-$(R^4)_q$ | (1-59) | (ET-15)-$(L)_n$-(HT-3)-$(R^4)_q$ |
| (1-60) | (ET-15)-$(L)_n$-(HT-4)-$(R^4)_q$ | (1-61) | (ET-15)-$(L)_n$-(HT-5)-$(R^4)_q$ |
| (1-62) | (ET-16)-$(L)_n$-(HT-2)-$(R^4)_q$ | (1-63) | (ET-16)-$(L)_n$-(HT-3)-$(R^4)_q$ |
| (1-64) | (ET-16)-$(L)_n$-(HT-4)-$(R^4)_q$ | (1-65) | (ET-16)-$(L)_n$-(HT-5)-$(R^4)_q$ |
| (1-66) | (ET-17)-$(L)_n$-(HT-2)-$(R^4)_q$ | (1-67) | (ET-17)-$(L)_n$-(HT-3)-$(R^4)_q$ |
| (1-68) | (ET-17)-$(L)_n$-(HT-4)-$(R^4)_q$ | (1-69) | (ET-17)-$(L)_n$-(HT-5)-$(R^4)_q$ |
| (1-70) | (ET-18)-$(L)_n$-(HT-2)-$(R^4)_q$ | (1-71) | (ET-18)-$(L)_n$-(HT-3)-$(R^4)_q$ |
| (1-72) | (ET-18)-$(L)_n$-(HT-4)-$(R^4)_q$ | (1-73) | (ET-18)-$(L)_n$-(HT-5)-$(R^4)_q$ |
| (1-74) | (ET-19)-$(L)_n$-(HT-2)-$(R^4)_q$ | (1-75) | (ET-19)-$(L)_n$-(HT-3)-$(R^4)_q$ |
| (1-76) | (ET-19)-$(L)_n$-(HT-4)-$(R^4)_q$ | (1-77) | (ET-19)-$(L)_n$-(HT-5)-$(R^4)_q$ |
| (1-78) | (ET-20)-$(L)_n$-(HT-2)-$(R^4)_q$ | (1-79) | (ET-20)-$(L)_n$-(HT-3)-$(R^4)_q$ |
| (1-80) | (ET-20)-$(L)_n$-(HT-4)-$(R^4)_q$ | (1-81) | (ET-20)-$(L)_n$-(HT-5)-$(R^4)_q$ |

$R^4$, q and n have the definition given above.

The (HT-1) to (HT-5) groups have preferably 1 to 4, more preferably 1 to 3, very preferably 1 to 2, even more preferably exactly 2 $R^5$ radicals and most preferably exactly 1 $R^5$ radical corresponding to an $R^4$ radical.

Particularly preferred embodiments of the indenocarbazole group, the indolocarbazole group or the carbazole group are therefore the structures of the following formulae:

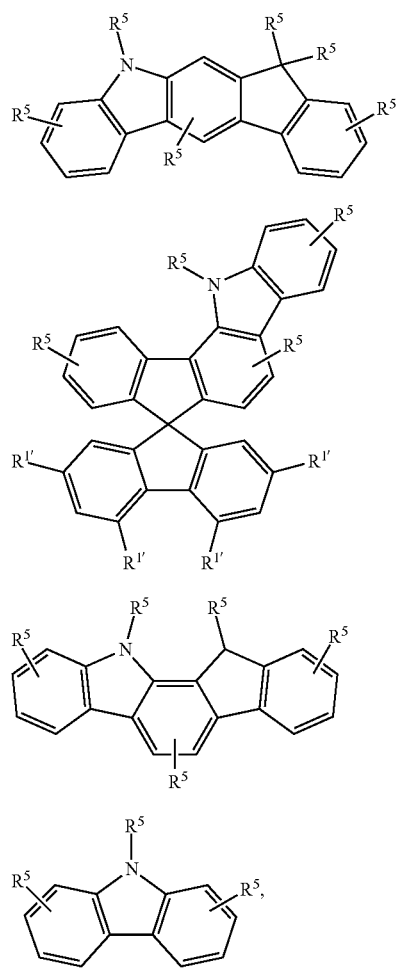

Formula (HT-6)

Formula (HT-7)

Formula (HT-8)

Formula (HT-9)

where the symbols used have the definitions given above and where, in the groups of the formulae (HT-6), (HT-7), (HT-8) and (HT-9), exactly two $R^5$ radicals correspond and preferably exactly one $R^5$ radical corresponds to an $R^4$ radical, and one of the other $R^5$ radicals in each case corresponds to a bond to the bridging $(L)_n$ group or the ET group (when n=0).

In the cases in which $R^5$ in the HT group corresponds to an $R^{1'}$ radical, $R^{1'}$ is preferably selected from the group consisting of H or an aromatic or heteroaromatic ring or ring system having 5 to 30 ring atoms, where the ring or ring system may be substituted in each case by one or more $R^2$ radicals, but is preferably unsubstituted.

$R^{1'}$ is very preferably H or an aromatic ring or ring system having 5 to 30 ring atoms, where the ring or ring system may be substituted in each case by one or more $R^2$ radicals, it being even more preferable when $R^{1'}$ is unsubstituted. Very particularly preferred aromatic groups are phenyl, biphenyl, terphenyl and quarterphenyl.

$R^{1'}$ is also very preferably H or a heteroaromatic ring or ring system having 5 to 30 ring atoms, where the ring or ring system may be substituted in each case by one or more $R^2$ radicals, it being even more preferable when $R^{1'}$ is unsubstituted. Very particularly preferred heteroaromatic groups are furan, dibenzofuran, thiophene, benzothiophene, dibenzothiophene, carbazole, phenanthridine and quinoxaline.

In a preferred embodiment of the invention, the bipolar host contains at least one of the (ET-12) to (ET-16) and (ET-20) groups

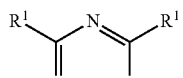

Formula (ET-12)

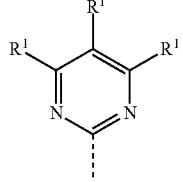

Formula (ET-13)

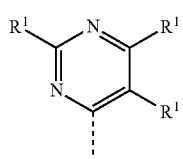

Formula (ET-14)

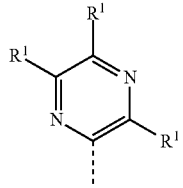

Formula (ET-15)

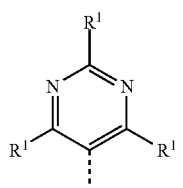

Formula (ET-16)

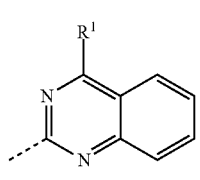

Formula (ET-20)

which is bonded via a bridging $(L)_n$ group or directly to an HT group (when n=0) selected from the structures of the formulae (HT-6), (HT-7), (HT-8) and (HT-9), where L, n and $R^1$ have the definitions given above and the dotted bond marks the position of attachment to $(L)_n$ or the HT group (when n=0).

Carbazoles of the (HD-9) group are very particularly preferred electron-rich heteroaromatic HT groups.

The bipolar host is therefore more preferably selected from the compounds of the formulae (1a-1) to (1a-6) and (1b-1) to (1b-6)

Formula (1a-1)

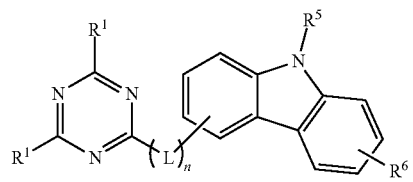

Formula (1a-3)

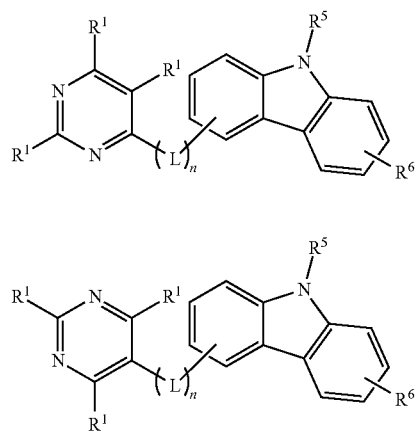

Formula (1a-5)

Formula (1b-1)

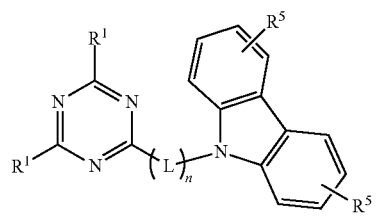

Formula (1b-3)

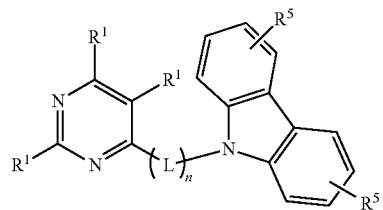

Formula (1b-5)

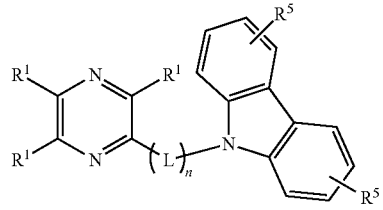

Formula (1a-2)

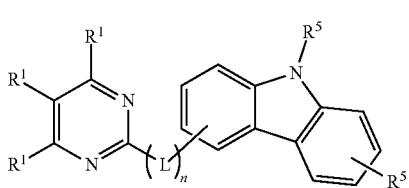

Formula (1a-4)

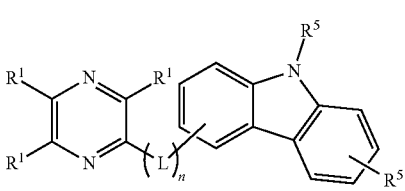

Formula (1a-6)

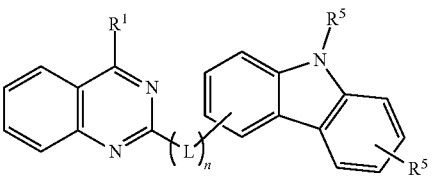

Formula (1b-2)

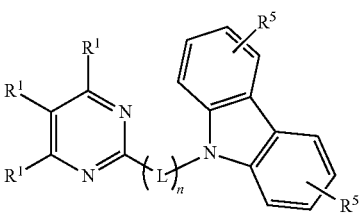

Formula (1b-4)

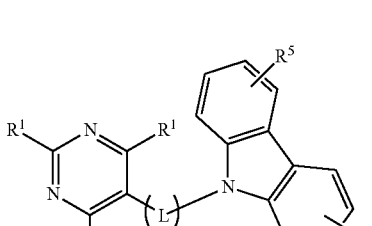

Formula (1b-6)

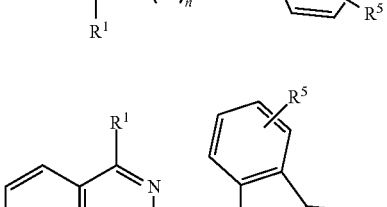

where L, n, $R^1$ and $R^5$ have the definitions given above.

As already elucidated above, n is 0, 1, 2, 3 or 4, preferably 0 or 1, and very preferably 1.

As likewise already elucidated above, the bridging L group is C(=O), S(=O)$_2$, P(=O)($R^{1\prime\prime}$), or L is an aromatic or heteroaromatic ring system which has 5 to 30 aromatic ring atoms and may be substituted by one or more independent $R^{1\prime\prime}$ radicals.

Preferably, L is an aromatic or heteroaromatic ring system which has 5 to 24 aromatic ring atoms, especially 6 to 13 aromatic ring atoms, and which may be substituted by one or more $R^{1\prime\prime}$ radicals, but is preferably unsubstituted.

In a further preferred embodiment of the present invention, the bipolar host of the composition of the invention is therefore a compound of the general formula (1-1):

Formula (1-1)

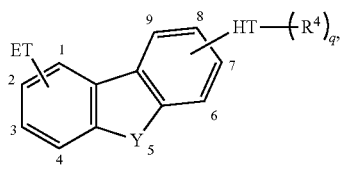

where the R⁴ radical and the ET and HT groups have the definitions given above and n=1, and where q is an integer from 1 to 5, preferably from 1 to 4, more preferably from 1 to 3, very preferably from 1 to 2, even more preferably exactly 2 and especially preferably exactly 1; and Y is O or S, preferably O.

Preferably, the ET group in the compounds of the general formula (1-1) is selected from the (ET-1) to (ET-11) groups, more preferably from the groups of the formulae (ET-12) to (ET-20), most preferably from the groups of the formulae (ET-12), (ET-13), (ET-14), (ET-15), (ET-16) and (ET-20).

The HT group in compounds of the general formula (1-1) is preferably selected from the structures of the formulae (HT-2) to (HT-5), more preferably from the structures of the formulae (HT-6) to (HT-9), and most preferably from the structures of the formula (HT-9).

In a preferred embodiment of the invention, the bipolar host is therefore selected from the compounds of the formulae (1a-7) to (1a-12) and formulae (1b-7) to (1b-12)

Formula (1a-7)

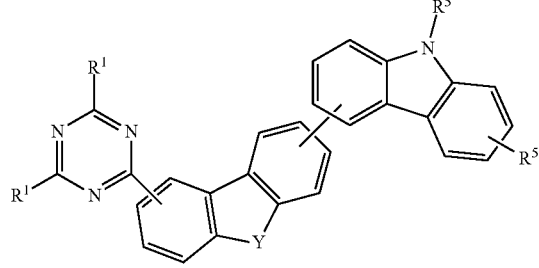

Formula (1a-9)

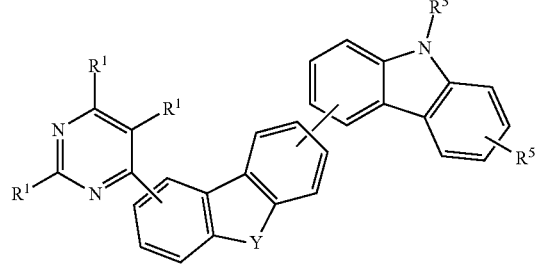

Formula (1a-11)

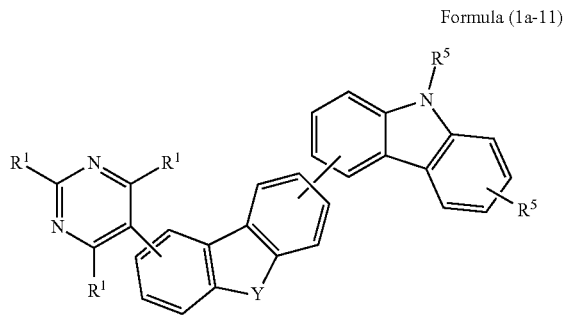

Formula (1a-8)

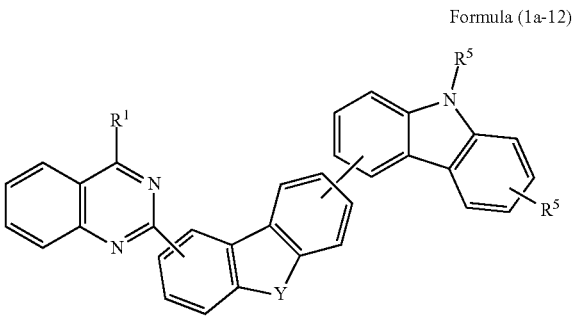

Formula (1a-10)

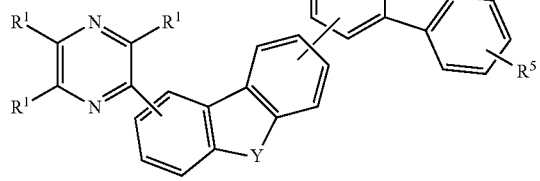

Formula (1a-12)

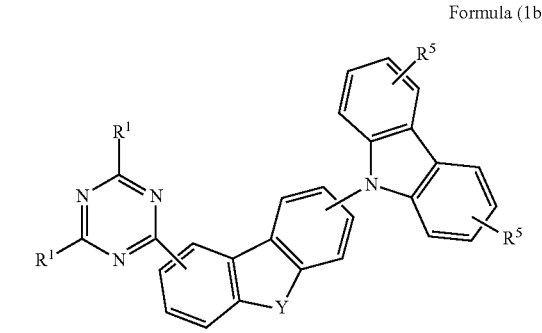

Formula (1b-7)

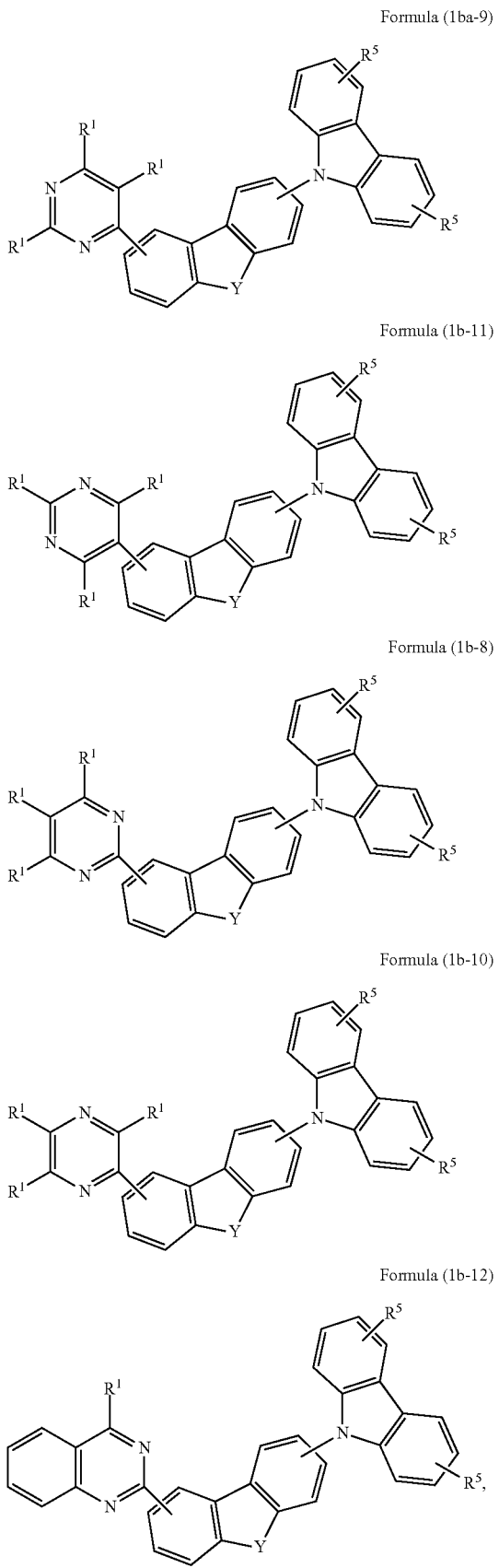

Formula (1ba-9)
Formula (1b-11)
Formula (1b-8)
Formula (1b-10)
Formula (1b-12)

where the symbols used have the definitions given above, and where, in the formulae (1a-7) to (1a-12) and (1b-7) to (1b-12), exactly one of the $R^5$ radicals in each case corresponds to an $R^4$ radical.

It is particularly preferable here when, in the structures of the formulae (1a-7) to (1a-12) and (1b-7) to (1b-12), a further carbazole radical which may be substituted by one or more $R^2$ radicals is bonded to the carbazole radical corresponding to the (HT-9) group.

In a further-preferred embodiment of the present invention, $R^4$ is the same or different at each instance and is $N(R^2)_2$, a straight-chain alkyl, alkoxy or thioalkoxy group having 1 to 40 carbon atoms or a straight-chain alkenyl or alkynyl group having 2 to 40 carbon atoms or a branched or cyclic alkyl, alkenyl, alkynyl, alkoxy, alkylalkoxy or thioalkoxy group having 3 to 40 carbon atoms, each of which may be substituted by one or more $R^2$ radicals, or an aromatic or heteroaromatic ring system which has 5 to 60 aromatic ring atoms and may be substituted in each case by one or more $R^2$ radicals, or an aryloxy, arylalkoxy or heteroaryloxy group which has 5 to 60 aromatic ring atoms and may be substituted by one or more $R^2$ radicals, or a diarylamino group, diheteroarylamino group or arylheteroarylamino group which has 10 to 40 aromatic ring atoms and may be substituted by one or more $R^2$ radicals, or a combination of two or more of these groups; at the same time, two or more adjacent $R^4$ radicals together may form a mono- or polycyclic, aliphatic or aromatic ring system.

Very preferably, $R^4$ is the same or different at each instance and is an aromatic or heteroaromatic ring system which has 5 to 60 aromatic ring atoms and may be substituted in each case by one or more $R^2$ radicals, or an aryloxy, arylalkoxy or heteroaryloxy group which has 5 to 60 aromatic ring atoms and may be substituted by one or more $R^2$ radicals, or a diarylamino group, diheteroarylamino group or arylheteroarylamino group which has 10 to 40 aromatic ring atoms and may be substituted by one or more $R^2$ radicals, or a combination of two or more of these groups; at the same time, two or more adjacent $R^4$ radicals together may form a mono- or polycyclic, aliphatic or aromatic ring system.

It is particularly preferable when $R^4$ is the same or different at each instance and is an aromatic or heteroaromatic ring system which has 5 to 60 aromatic ring atoms and may be substituted in each case by one or more $R^2$ radicals; at the same time, two or more adjacent $R^4$ radicals together may form a polycyclic aromatic ring system.

Very particularly preferred aromatic or heteroaromatic ring systems for $R^4$ are phenyl, biphenyl, terphenyl, quarterphenyl, carbazole, dibenzofuranyl, which may be substituted by one or more $R^2$.

It is therefore very particularly preferred when, in the structures of the formulae (1a-7) to (1a-12) and (1b-7) to (1b-12), $R^4$ represents the one further carbazole radical optionally substituted by one or more $R^2$ radicals which is bonded to the carbazole radical of the (HT-9) group.

In a particularly preferred embodiment, the bipolar host is therefore selected from:

the compounds of the formulae (1a-13) to (1a-18) having the general formula

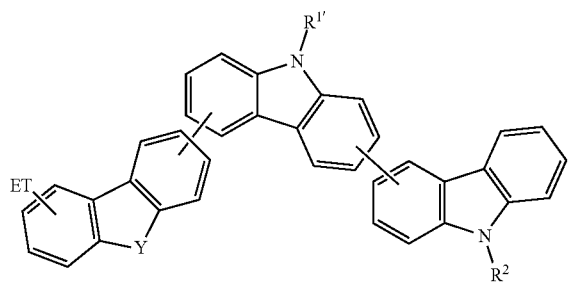

where:

| ET group | Bipolar host |
|---|---|
| (ET-12) | Formula (1a-13) |
| (ET-13) | Formula (1a-14) |
| (ET-14) | Formula (1a-15) |
| (ET-15) | Formula (1a-16) |
| (ET-16) | Formula (1a-17) |
| (ET-20) | Formula (1a-18); | the compounds of the formulae (1a-19) to (1a-24) having the general formula

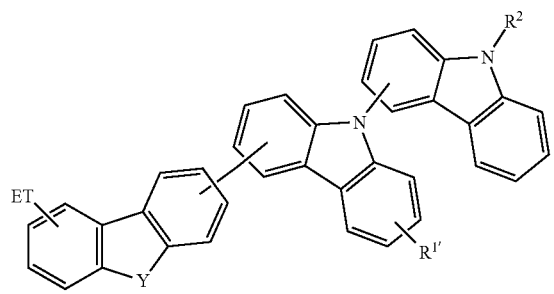

where:

| ET group | Bipolar host |
|---|---|
| (ET-12) | Formula (1a-19) |
| (ET-13) | Formula (1a-20) |
| (ET-14) | Formula (1a-21) |
| (ET-15) | Formula (1a-22) |
| (ET-16) | Formula (1a-23) |
| (ET-20) | Formula (1a-24); | the compounds of the formulae (1b-13) to (1b-18) having the general formula

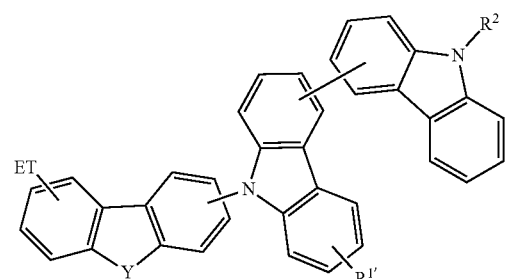

where:

| ET group | Bipolar host |
|---|---|
| (ET-12) | Formula (1b-13) |
| (ET-13) | Formula (1b-14) |
| (ET-14) | Formula (1b-15) |
| (ET-15) | Formula (1b-16) |
| (ET-16) | Formula (1b-17) |
| (ET-20) | Formula (1b-18); | and the compounds of the formulae (1b-19) to (1b-24) having the general formula

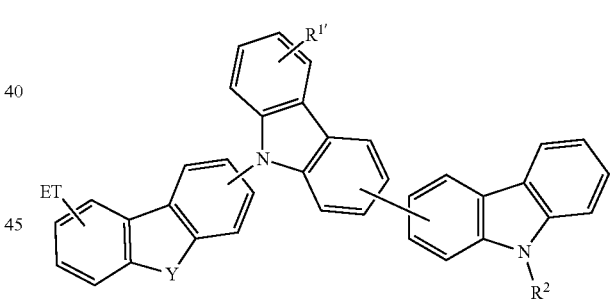

where:

| ET group | Bipolar host |
|---|---|
| (ET-12) | Formula (1b-19) |
| (ET-13) | Formula (1b-20) |
| (ET-14) | Formula (1b-21) |
| (ET-15) | Formula (1b-22) |
| (ET-16) | Formula (1b-23) |
| (ET-20) | Formula (1b-24); | and where $R^{1'}$, $R^2$ and Y have the definitions given above.

The $R^4$ radical can in principle be bonded to any as yet unsubstituted positions 1 to 9 in the carbazole base skeleton that corresponds to the (HT-9) group. The bonding positions on a carbazole that apply in the context of the present invention are shown below:

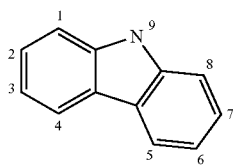

Preferred bonding positions for $R^4$ are positions 2, 3, 6, 7 and 9. Particular preference is given to positions 3, 6 and 9. In the cases of the formulae (1a-1) to (1a-12), very particular preference is given to bonding positions 6 and 9 for the bonding of $R^4$ to the carbazole base skeleton of the (HT-9) group. In the cases of the formulae (1b-1) to (1b-12), very particular preference is given to bonding positions 3 and 6 for the bonding of $R^4$ to the carbazole base skeleton of the (HT-9) group.

The bridging $(L)_n$ group or ET (when n=0) in the cases of the formulae (1a-1) to (1a-6) and of the dibenzyl group in the cases of the formulae (1a-7) to (1a-12) is preferably bonded at positions 1, 2, 3 or 4 of the carbazole base skeleton of the (HT-9) group, more preferably at 2 or 3, and most preferably at position 3.

In a more particularly preferred embodiment, the bipolar host is therefore selected from the following compounds of the formulae (1a-25) to (1a-30) having the general formula

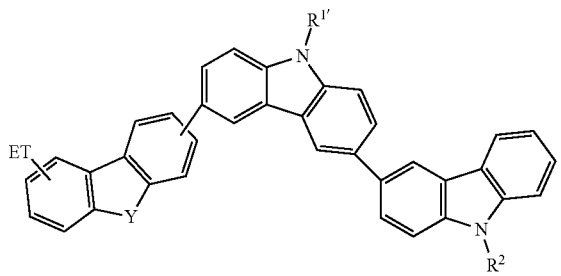

where

| ET group | Bipolar host |
|---|---|
| (ET-12) | Formula (1a-25) |
| (ET-13) | Formula (1a-26) |
| (ET-14) | Formula (1a-27) |
| (ET-15) | Formula (1a-28) |
| (ET-16) | Formula (1a-29) |
| (ET-20) | Formula (1a-30); | the following compounds of the formulae (1a-31) to (1a-36) having the general formula:

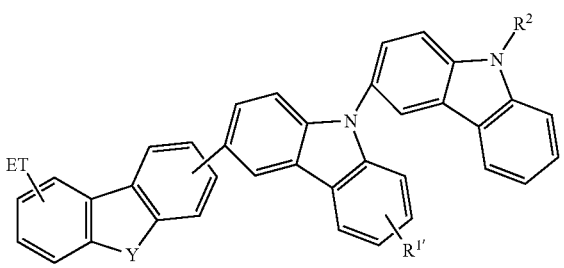

where:

| ET group | Bipolar host |
|---|---|
| (ET-12) | Formula (1a-31) |
| (ET-13) | Formula (1a-32) |
| (ET-14) | Formula (1a-33) |
| (ET-15) | Formula (1a-34) |
| (ET-16) | Formula (1a-35) |
| (ET-20) | Formula (1a-36); | the following compounds of the formulae (1b-25) to (1b-30) having the general formula.

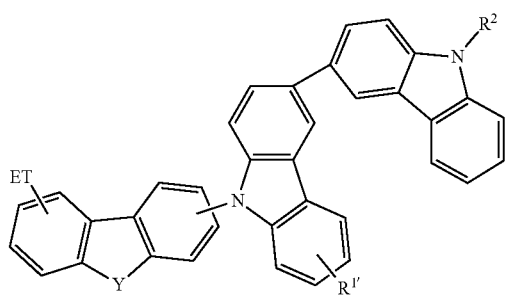

where:

| ET group | Bipolar host |
|---|---|
| (ET-12) | Formula (1b-25) |
| (ET-13) | Formula (1b-26) |
| (ET-14) | Formula (1b-27) |
| (ET-15) | Formula (1b-28) |
| (ET-16) | Formula (1b-29) |
| (ET-20) | Formula (1b-30); | and
the following compounds of the formulae (1b-31) to (1b-36) having the general formula:

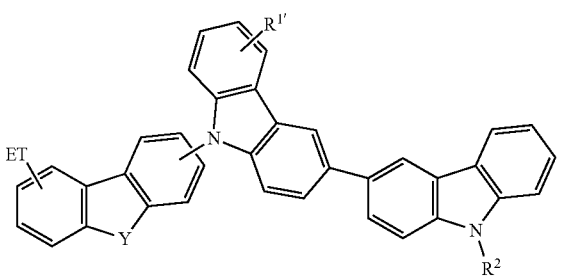

where:

| ET group | Bipolar host |
|---|---|
| (ET-12) | Formula (1b-31) |
| (ET-13) | Formula (1b-32) |
| (ET-14) | Formula (1b-33) |
| (ET-15) | Formula (1b-34) |
| (ET-16) | Formula (1b-35) |
| (ET-20) | Formula (1b-36); | where $R^{1'}$, $R^2$ and Y have the definitions given above.

The substituents R¹' are preferably selected from the group consisting of H or an aromatic or heteroaromatic ring or ring system having 5 to 30 ring atoms, where the ring or ring system may be substituted in each case by one or more R² radicals, but is preferably unsubstituted. R¹' is very preferably H or an aromatic ring or ring system having 5 to 30 ring atoms, where the ring or ring system may be substituted in each case by one or more R² radicals, it being even more preferable when R¹' is unsubstituted. Very particularly preferred aromatic groups are phenyl, biphenyl, terphenyl and quarterphenyl. R¹' is also very preferably H or a heteroaromatic ring or ring system having 5 to 30 ring atoms, where the ring or ring system may be substituted in More preferably, the ET group is a triazine of the formula (ET-12), the compounds of the formulae (ET-21) to (ET-36) being very particularly preferred examples of the ET group.

As has already been elucidated above, Y is preferably O, and so the bridging ligand is preferably dibenzofuran (see formula (1-1)).

It is further preferable when the ET group is bonded at position 1 or 2, more preferably at position 1, of the dibenzofuran.

In a further very particularly preferred embodiment, the bipolar host is therefore selected from the compounds of the following formulae (1a-37), (1a-38), (1b-37) and (1b-38):

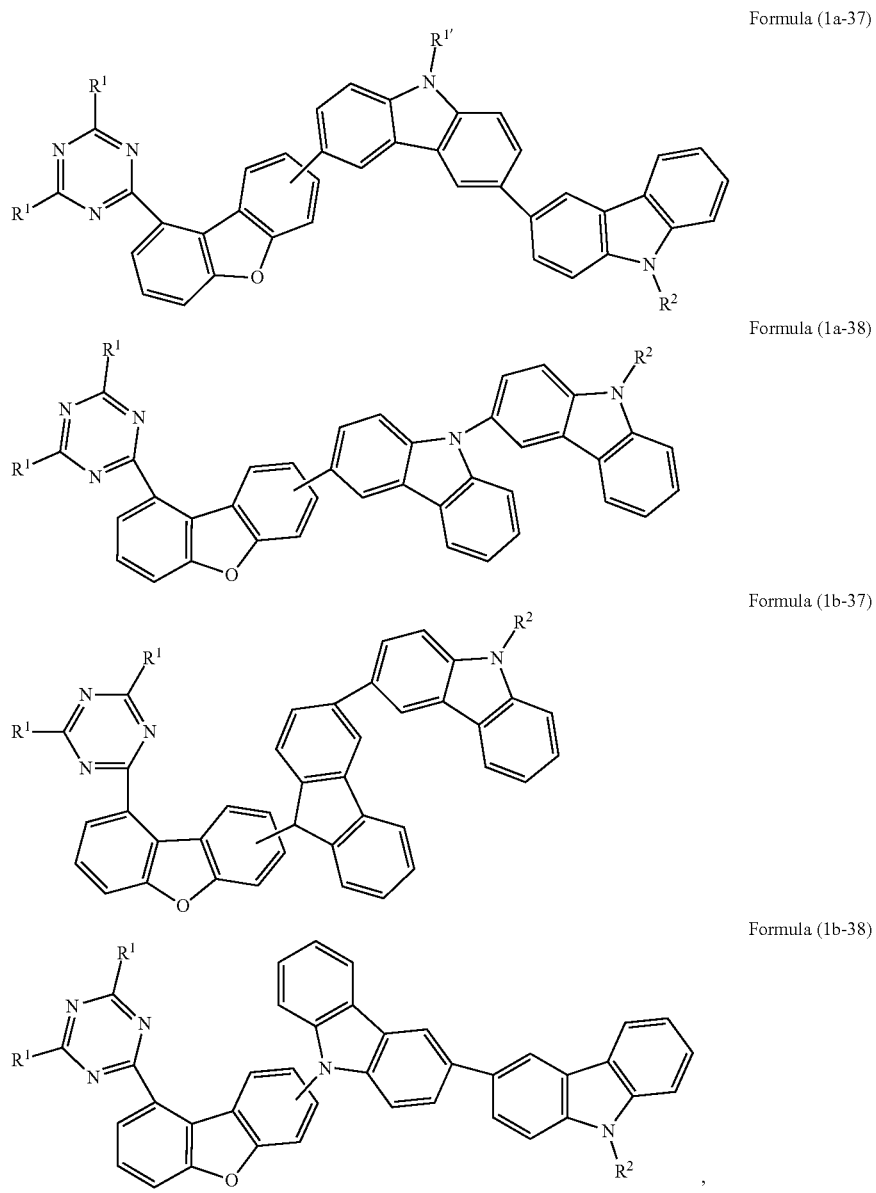

Formula (1a-37)

Formula (1a-38)

Formula (1b-37)

Formula (1b-38)

each case by one or more R² radicals, it being even more preferable when R¹' is unsubstituted. Very particularly preferred heteroaromatic groups are furan, benzofuran, thiophene, benzothiophene, dibenzothiophene, carbazole, phenanthridine and quinoxaline.

where R¹ and R² have the definitions given above.

The substituents R¹ are most preferably selected from the group consisting of H and an aromatic or heteroaromatic ring system which has 5 to 60 aromatic ring atoms and may be substituted in each case by one or more R² radicals, it being preferable that $R^1$ does not contain any electron-rich aromatic or heteroaromatic rings or ring systems. Most preferably, the substituents $R^1$ are selected such that the triazine group corresponding to the ET group in the compounds of the formulae (1a-37), (1a-38), (1b-37) and (1b-38) corresponds to one of the (ET-21) to (ET-36) groups.

The substituent $R^2$ is preferably selected from the group consisting of H or an aromatic or heteroaromatic ring or ring system having 5 to 30 ring atoms, where the ring or ring system may be substituted in each case by one or more $R^3$ radicals, but is preferably unsubstituted. $R^{2\prime}$ is very preferably H or an aromatic ring or ring system having 5 to 30 ring atoms, where the ring or ring system may be substituted in each case by one or more $R^3$ radicals, it being even more preferable when $R^2$ is unsubstituted. Very particularly preferred aromatic groups are phenyl, biphenyl, terphenyl and quarterphenyl.

Most preferably, the HT group in the compounds of the formulae (1a-37), (1a-38), (1b-37) and (1b-38) is bonded to position 8 of the dibenzofuran.

Examples of suitable compounds of the invention for the bipolar host are the structures shown below.

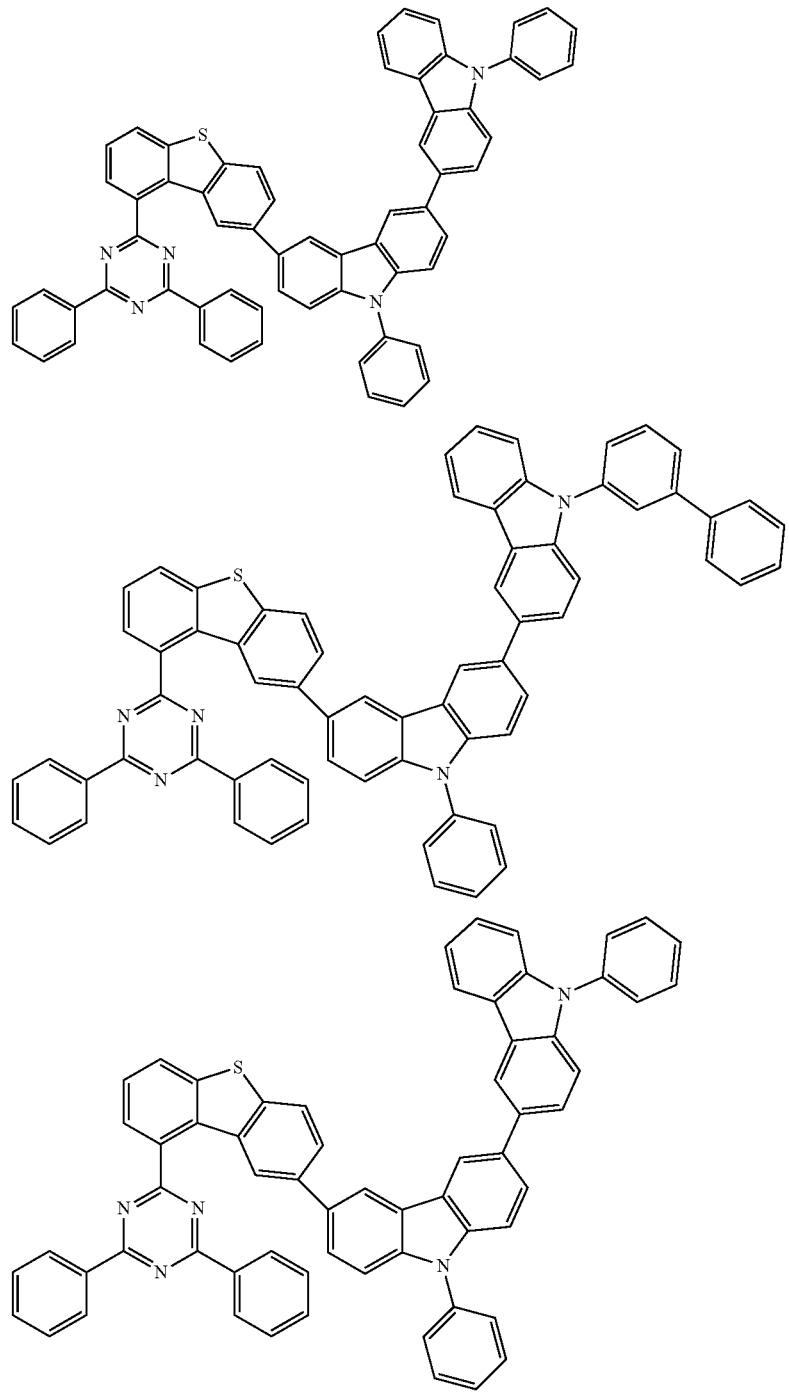

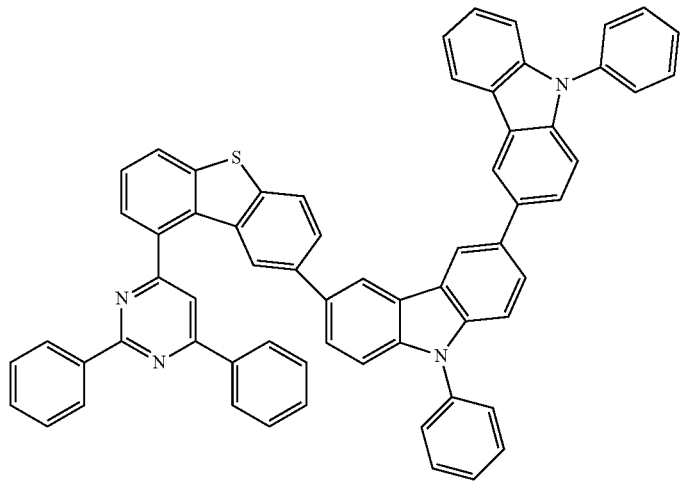 [SMILES: c1ccc(-c2cc(-c3cccc4sc5ccc(-c6ccc7c(c6)c6cc(-c8ccc9c(c8)c8ccccc8n9-c8ccccc8)ccc6n7-c6ccccc6)cc5c34)nc(-c3ccccc3)n2)cc1]
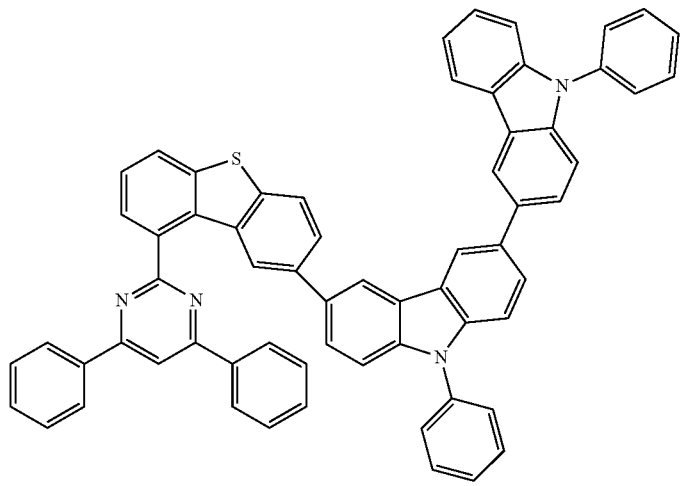 [SMILES: c1ccc(-c2cc(-c3ccccc3)nc(-c3cccc4sc5ccc(-c6ccc7c(c6)c6cc(-c8ccc9c(c8)c8ccccc8n9-c8ccccc8)ccc6n7-c6ccccc6)cc5c34)n2)cc1]
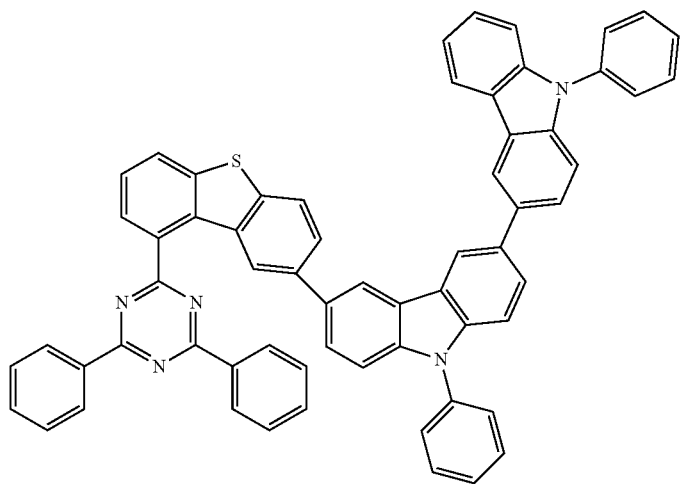 [SMILES: c1ccc(-c2nc(-c3ccccc3)nc(-c3cccc4sc5ccc(-c6ccc7c(c6)c6cc(-c8ccc9c(c8)c8ccccc8n9-c8ccccc8)ccc6n7-c6ccccc6)cc5c34)n2)cc1]

-continued
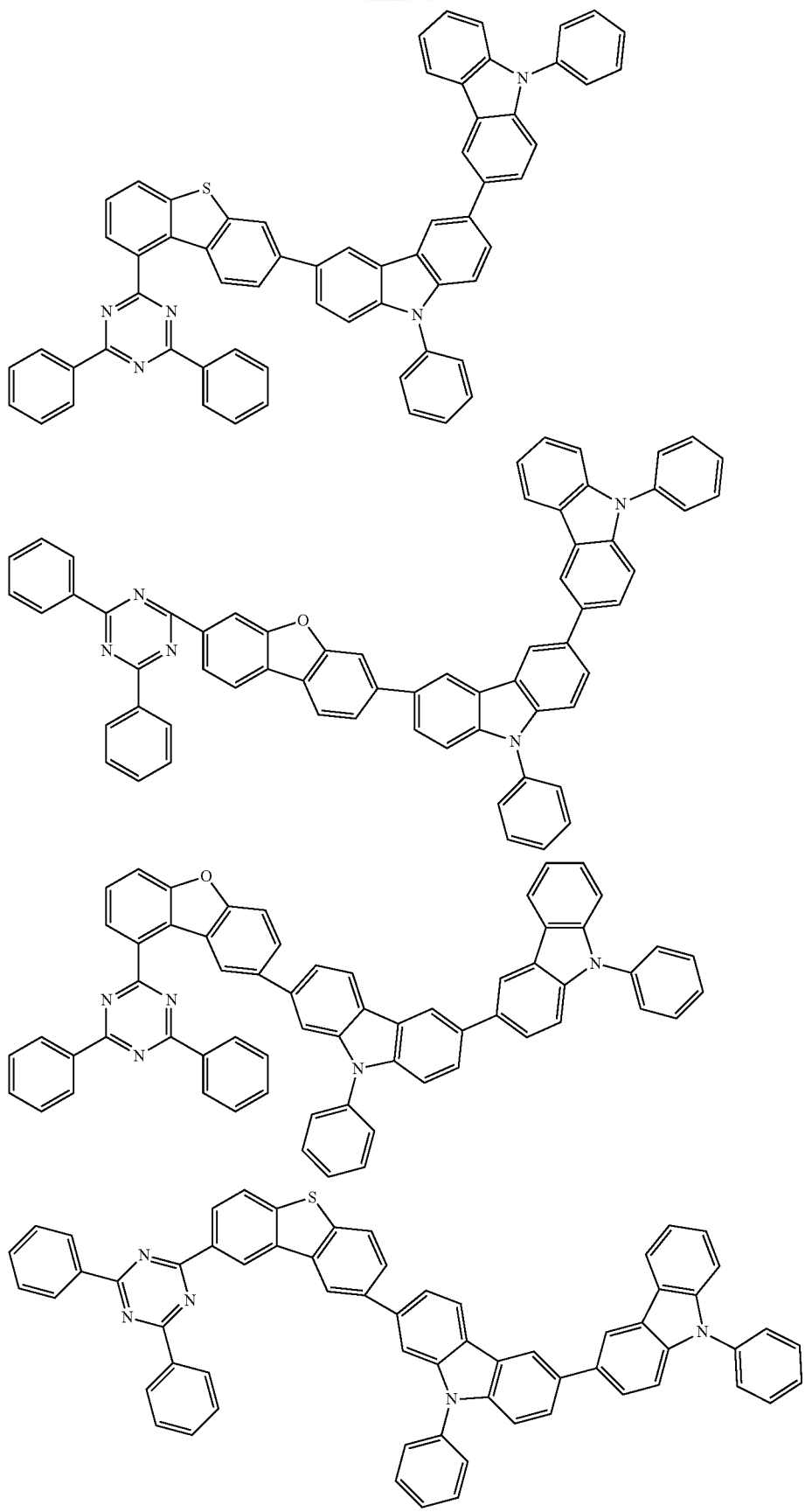

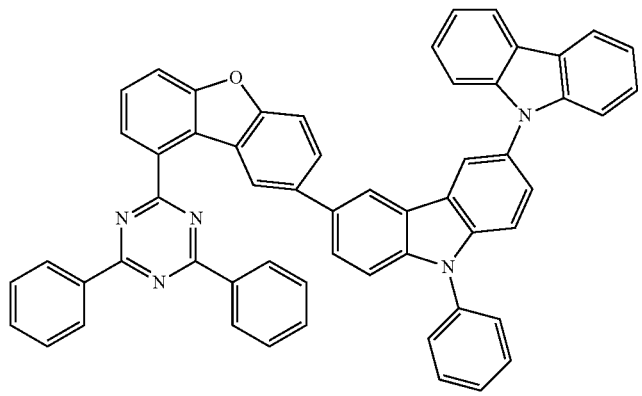 [SMILES: c1ccc(-c2nc(-c3ccccc3)nc(-c3cccc4oc5ccc(-c6ccc7c(c6)c6cc(-n8c9ccccc9c9ccccc98)ccc6n7-c6ccccc6)cc5c34)n2)cc1]
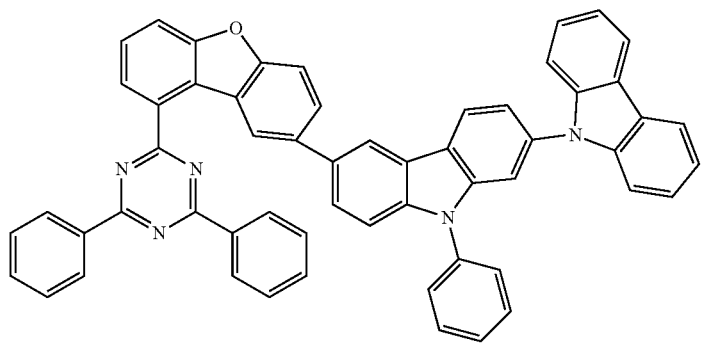 [SMILES: c1ccc(-c2nc(-c3ccccc3)nc(-c3cccc4oc5ccc(-c6ccc7c(c6)c6ccc(-n8c9ccccc9c9ccccc98)cc6n7-c6ccccc6)cc5c34)n2)cc1]
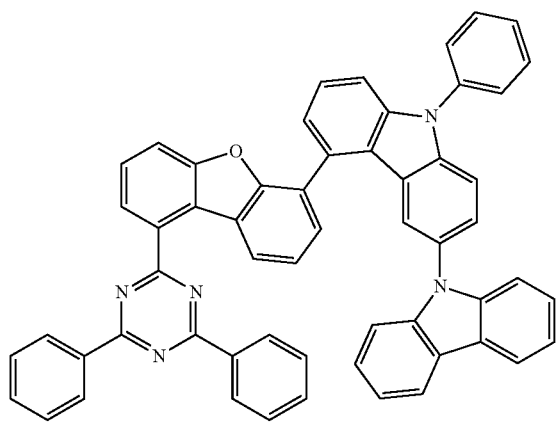 [SMILES: c1ccc(-c2nc(-c3ccccc3)nc(-c3cccc4oc5c(-c6cccc7c6c6cc(-n8c9ccccc9c9ccccc98)ccc6n7-c6ccccc6)cccc5c34)n2)cc1]

-continued
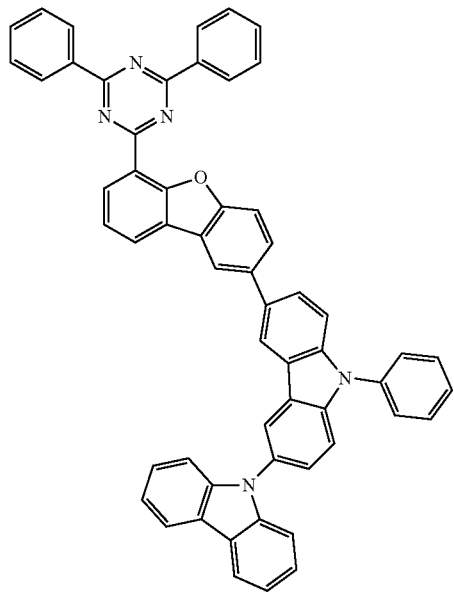 [SMILES: c1ccc(-c2nc(-c3ccccc3)nc(-c3cccc4c3oc3ccc(-c5ccc6c(c5)c5cc(-n7c8ccccc8c8ccccc87)ccc5n6-c5ccccc5)cc34)n2)cc1]
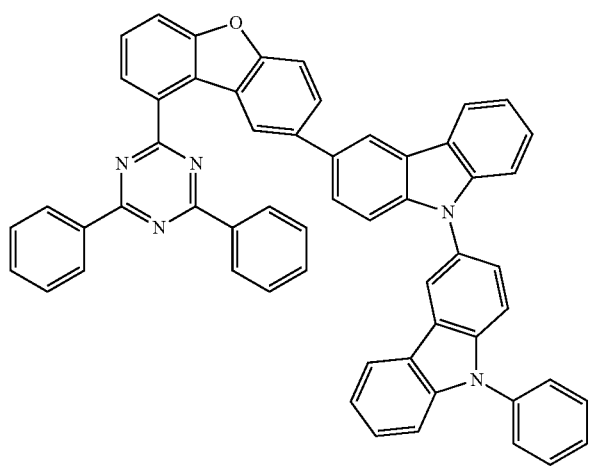
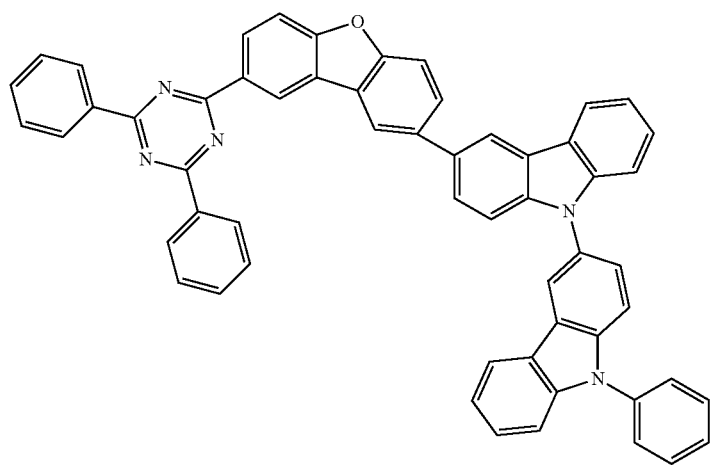

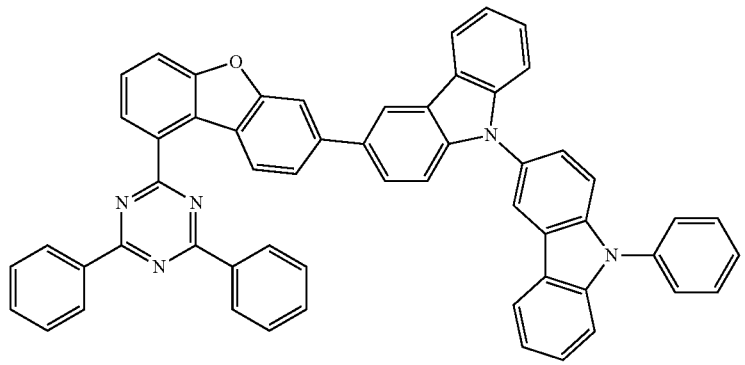 [SMILES: c1ccc(-c2nc(-c3ccccc3)nc(-c3cccc4oc5cc(-c6ccc7c(c6)c6ccccc6n7-c6ccc7c(c6)c6ccccc6n7-c6ccccc6)ccc5c34)n2)cc1]
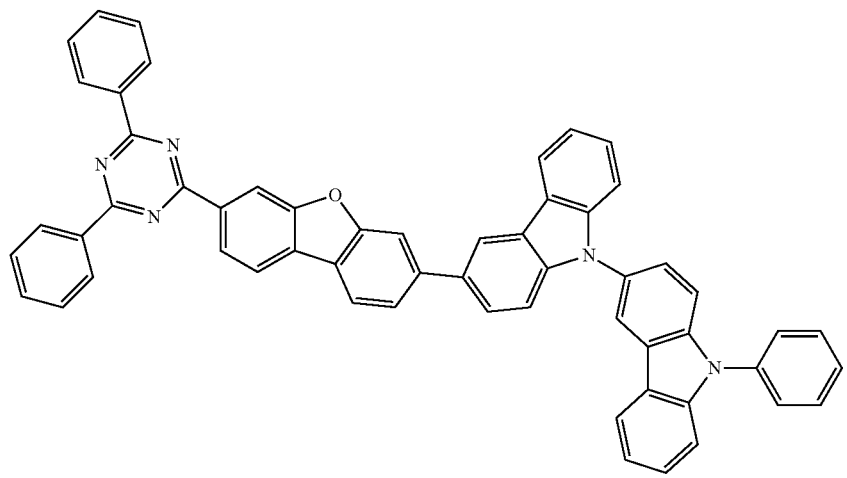 [SMILES: c1ccc(-c2nc(-c3ccccc3)nc(-c3ccc4c(c3)oc3cc(-c5ccc6c(c5)c5ccccc5n6-c5ccc6c(c5)c5ccccc5n6-c5ccccc5)ccc34)n2)cc1]
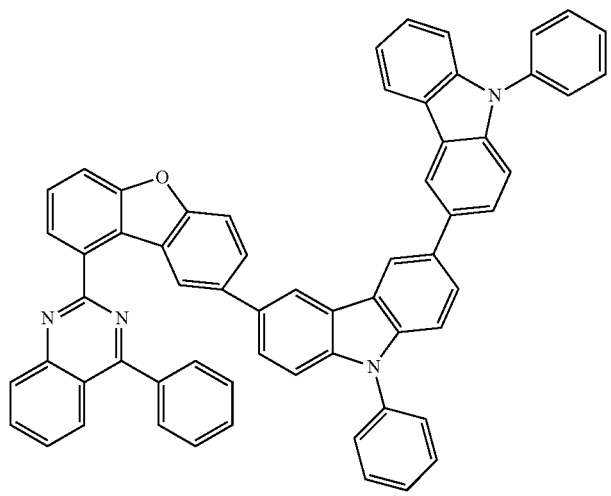 [SMILES: c1ccc(-c2nc(-c3cccc4oc5ccc(-c6ccc7c(c6)c6cc(-c8ccc9c(c8)c8ccccc8n9-c8ccccc8)ccc6n7-c6ccccc6)cc5c34)nc3ccccc23)cc1]

-continued
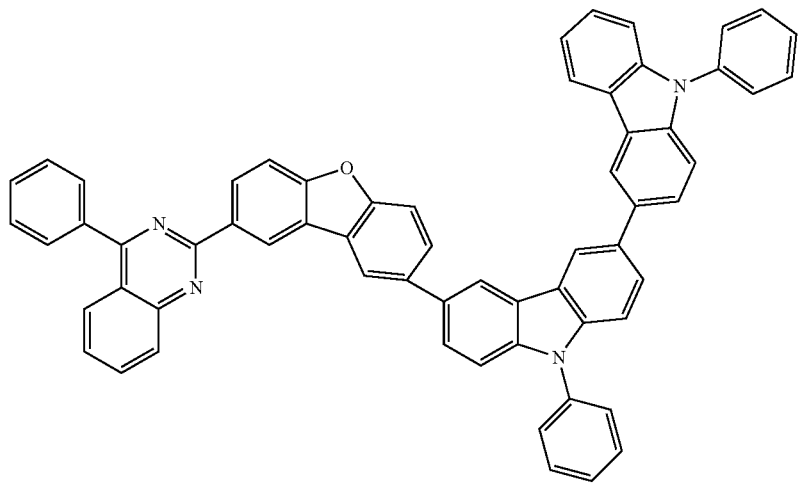 [SMILES: c1ccc(-c2nc(-c3ccc4oc5ccc(-c6ccc7c(c6)c6cc(-c8ccc9c(c8)c8ccccc8n9-c8ccccc8)ccc6n7-c6ccccc6)cc5c4c3)nc3ccccc23)cc1]
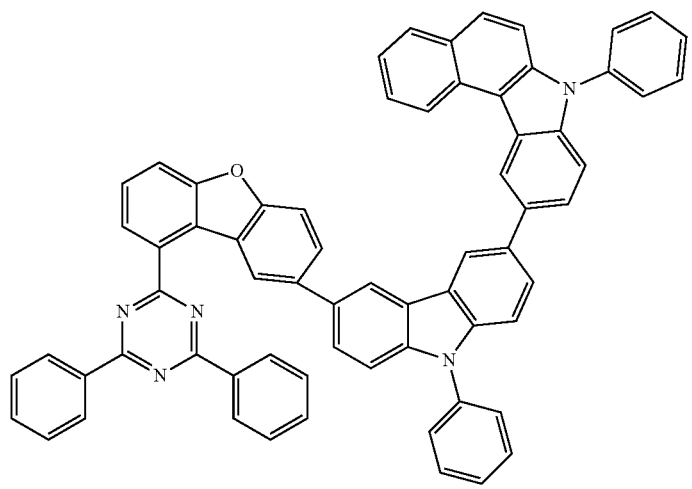 [SMILES: c1ccc(-c2nc(-c3ccccc3)nc(-c3cccc4oc5ccc(-c6ccc7c(c6)c6cc(-c8ccc9c(c8)c8c%10ccccc%10ccc8n9-c8ccccc8)ccc6n7-c6ccccc6)cc5c34)n2)cc1]
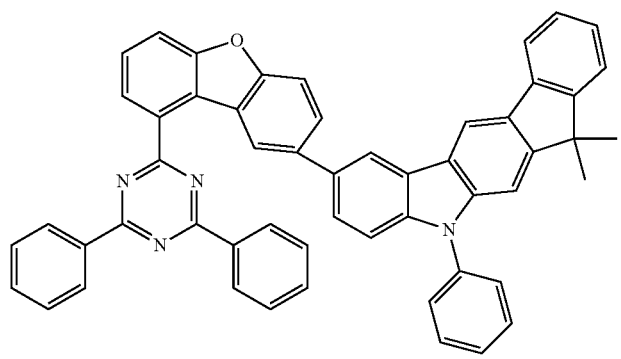 [SMILES: CC1(C)c2ccccc2-c2cc3c4cc(-c5ccc6oc7cccc(-c8nc(-c9ccccc9)nc(-c9ccccc9)n8)c7c6c5)ccc4n(-c4ccccc4)c3cc21]

-continued
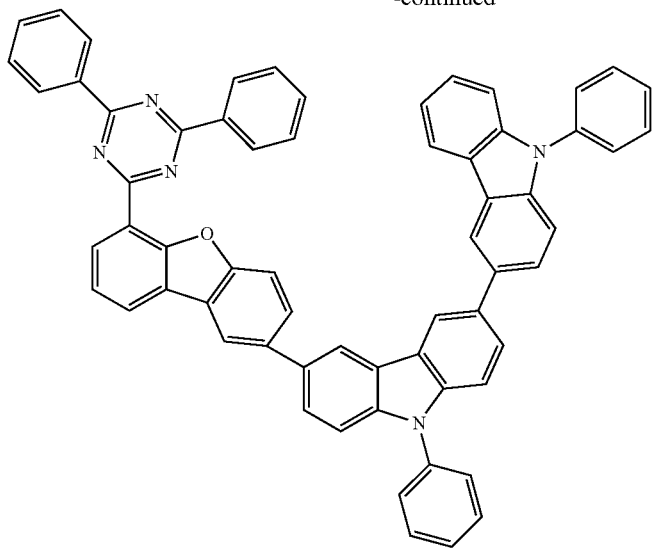
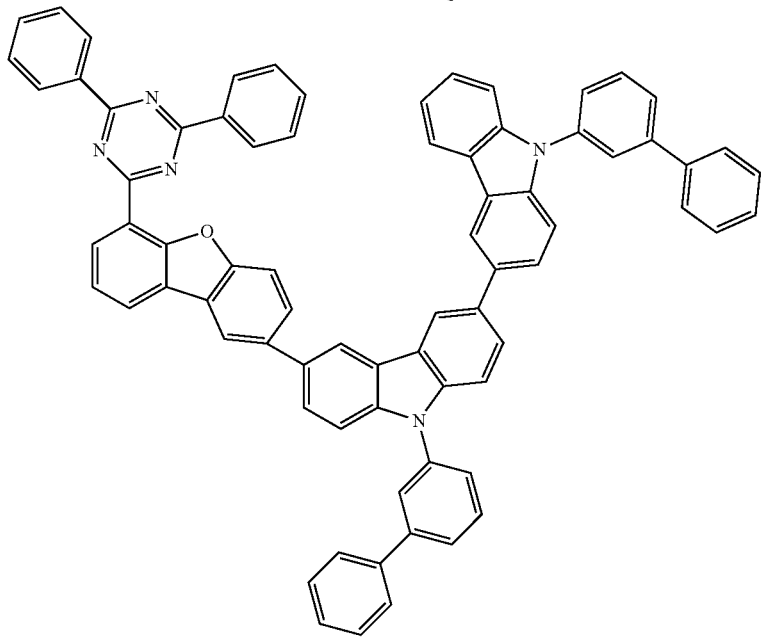 [SMILES: c1ccc(-c2cccc(-n3c4ccccc4c4cc(-c5ccc6c(c5)c5cc(-c7ccc8oc9c(-c%10nc(-c%11ccccc%11)nc(-c%11ccccc%11)n%10)cccc9c8c7)ccc5n6-c5cccc(-c6ccccc6)c5)ccc43)c2)cc1]
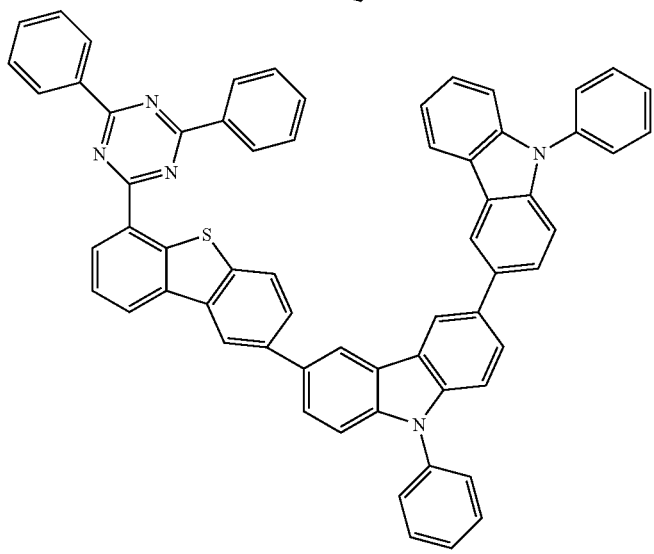

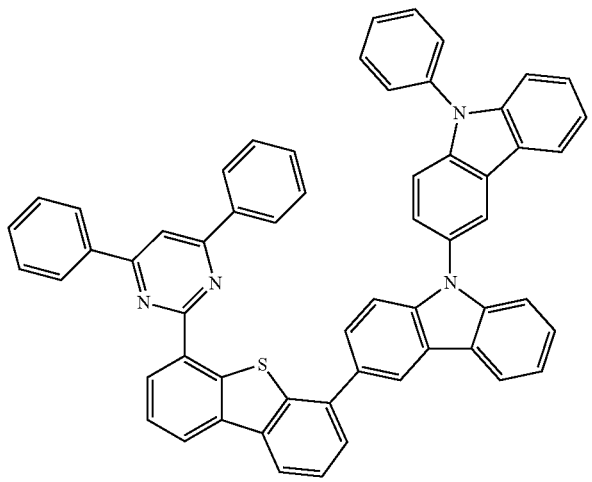 [SMILES: c1ccc(-c2cc(-c3ccccc3)nc(-c3cccc4c3sc3c(-c5ccc6c(c5)c5ccccc5n6-c5ccc6c(c5)c5ccccc5n6-c5ccccc5)cccc34)n2)cc1]
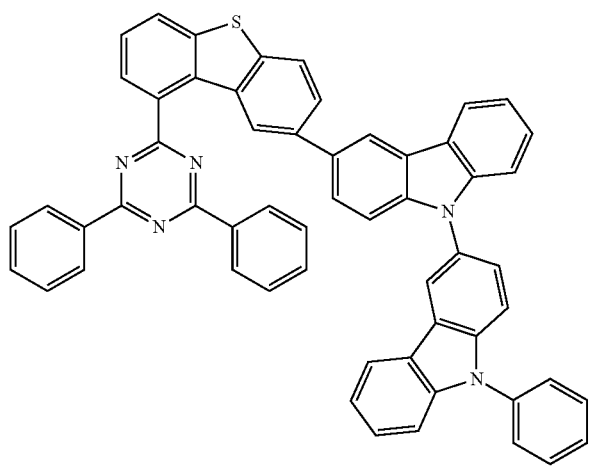 [SMILES: c1ccc(-c2nc(-c3ccccc3)nc(-c3cccc4sc5ccc(-c6ccc7c(c6)c6ccccc6n7-c6ccc7c(c6)c6ccccc6n7-c6ccccc6)cc5c34)n2)cc1]
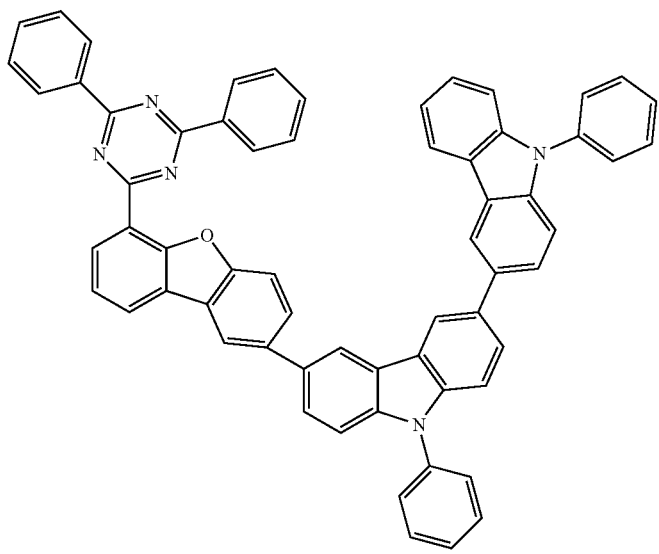 [SMILES: c1ccc(-c2nc(-c3ccccc3)nc(-c3cccc4c3oc3ccc(-c5ccc6c(c5)c5cc(-c7ccc8c(c7)c7ccccc7n8-c7ccccc7)ccc5n6-c5ccccc5)cc34)n2)cc1]

-continued
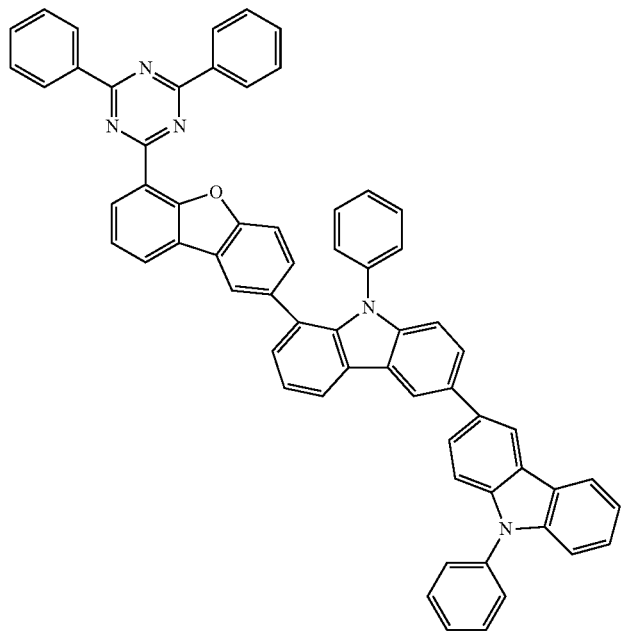 [SMILES: c1ccc(-c2nc(-c3ccccc3)nc(-c3cccc4c3oc3ccc(-c5cccc6c7cc(-c8ccc9c(c8)c8ccccc8n9-c8ccccc8)ccc7n(-c7ccccc7)c56)cc34)n2)cc1]
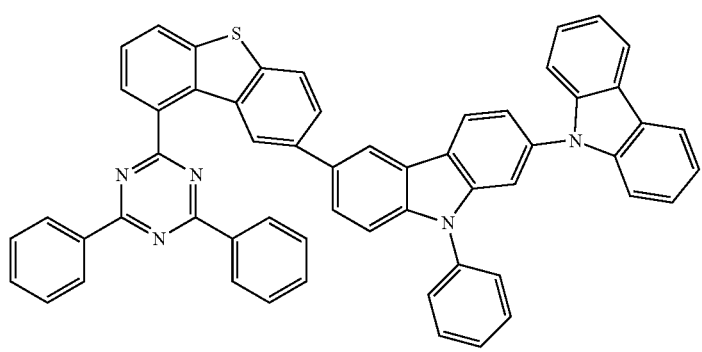
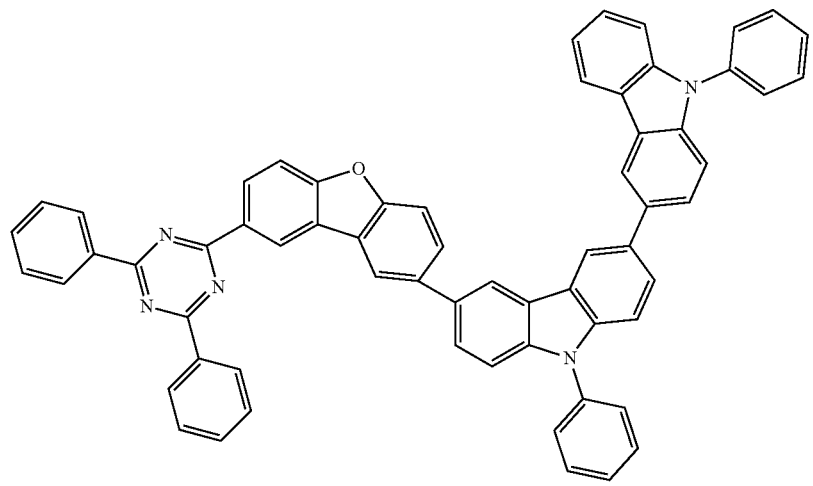

-continued
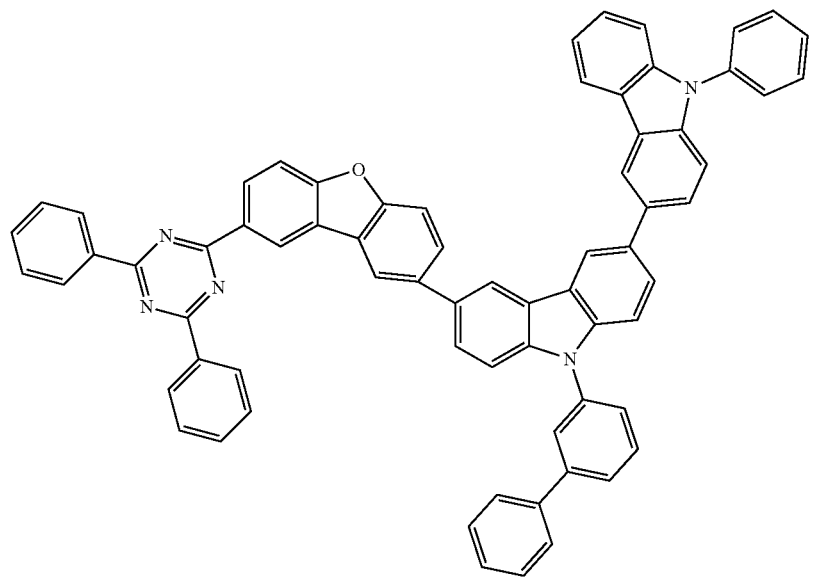
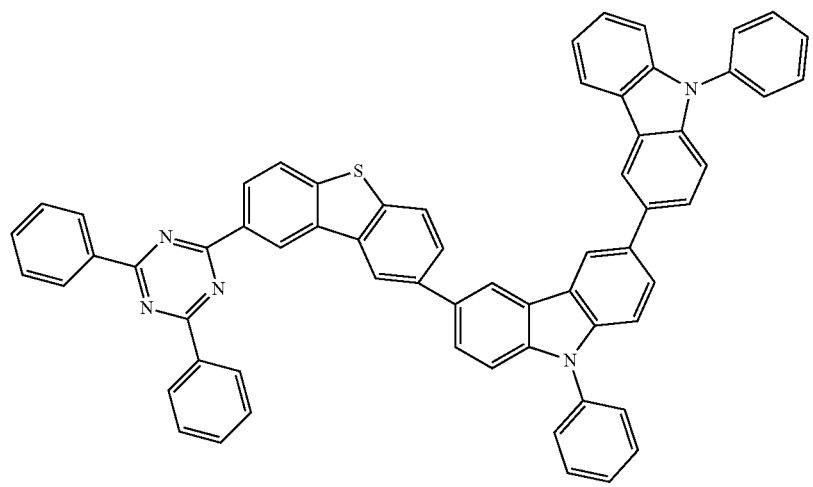
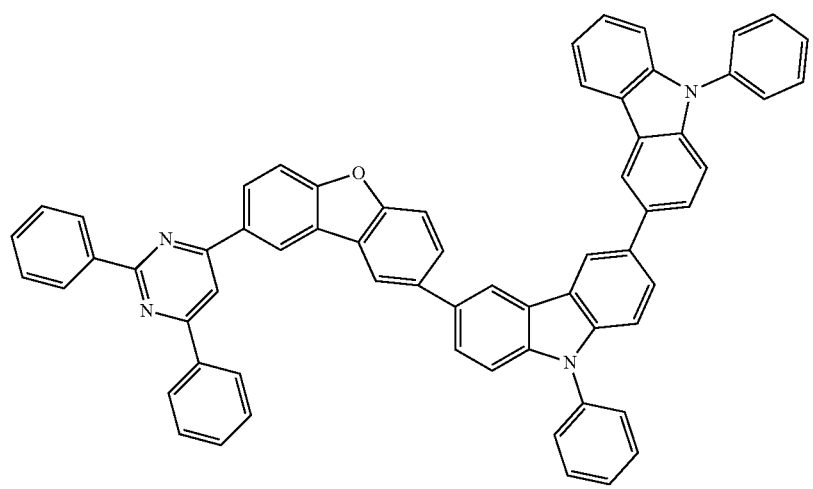

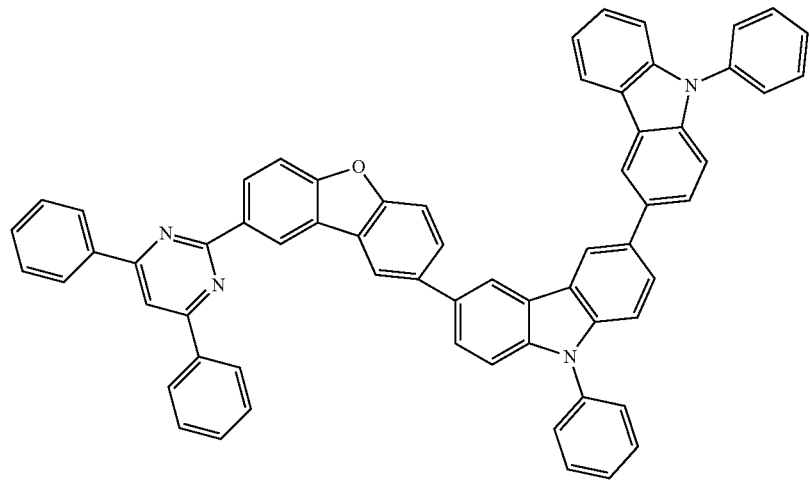
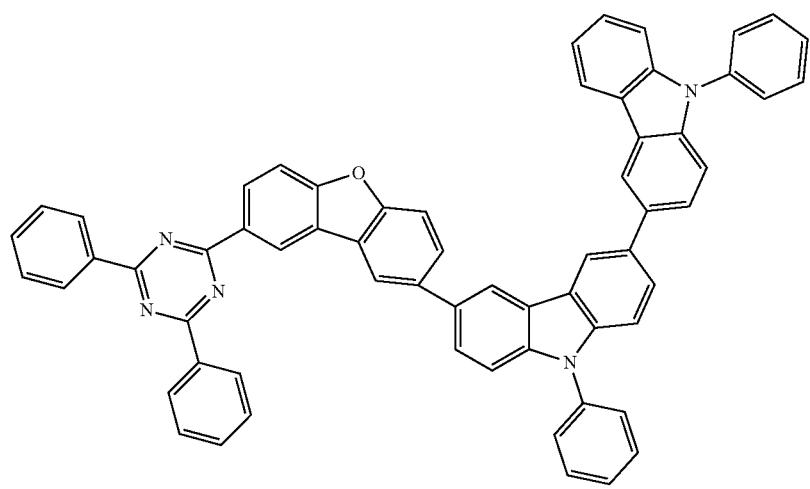
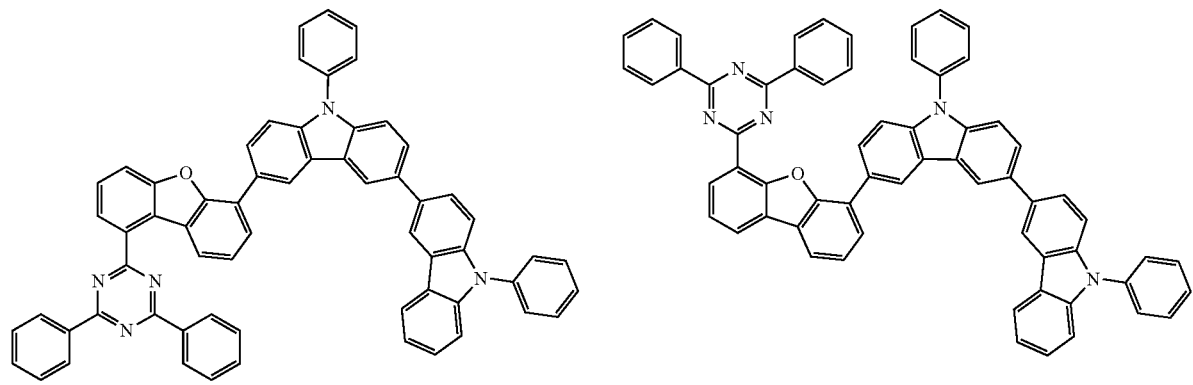

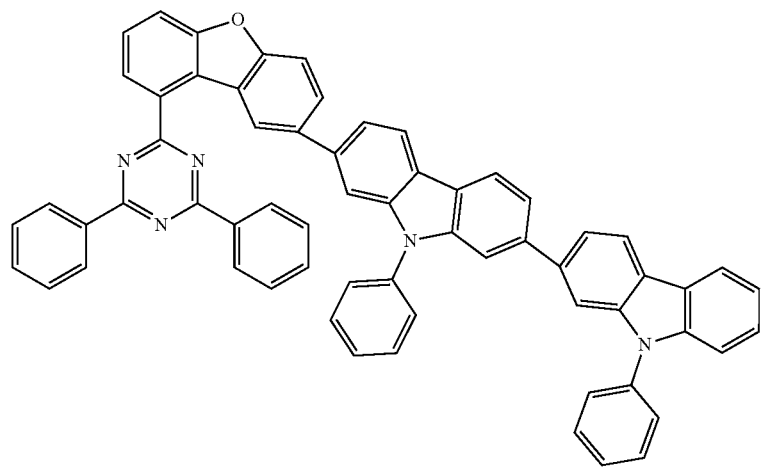
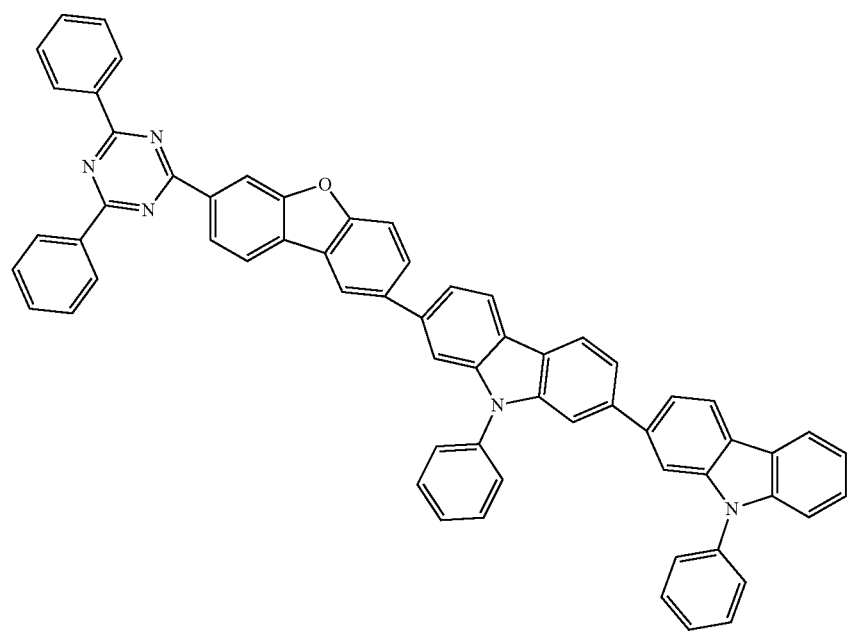
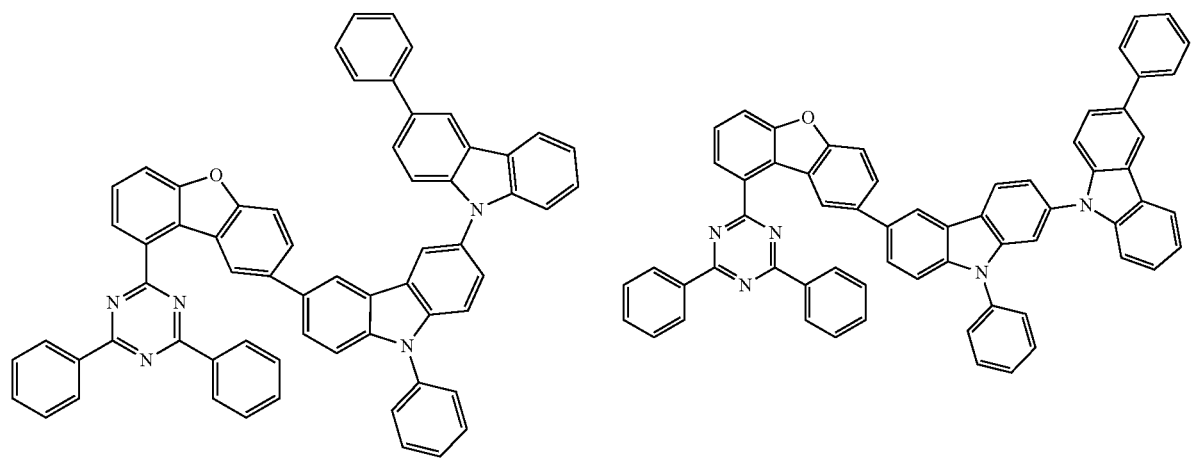

-continued
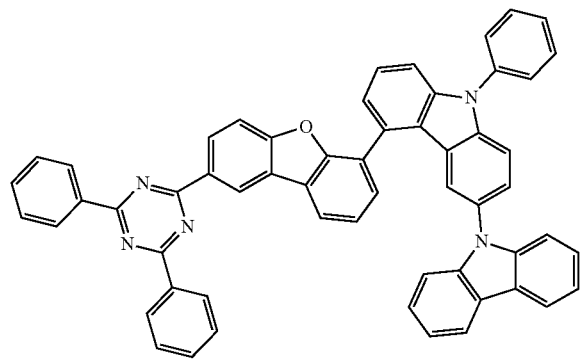
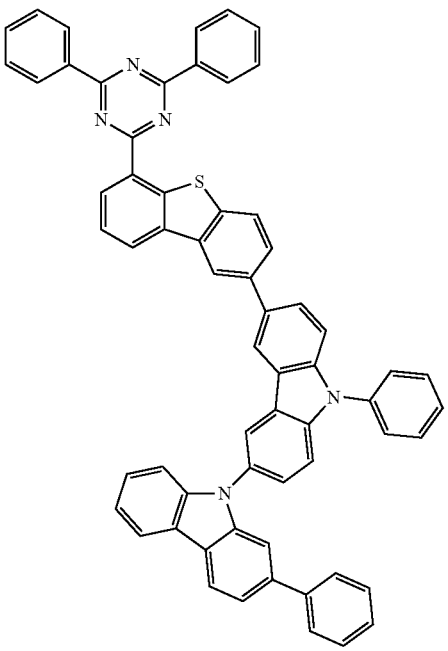
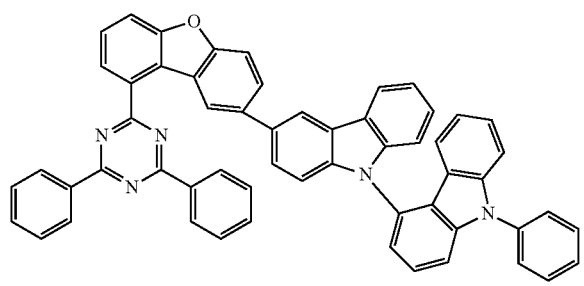
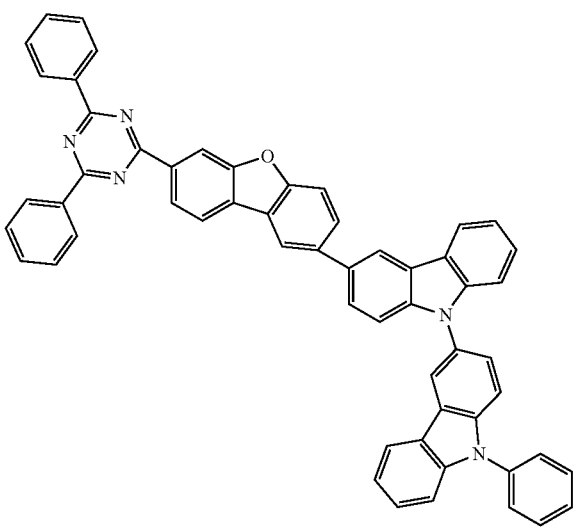
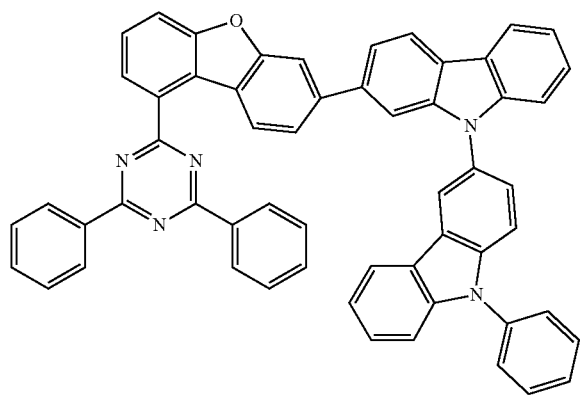
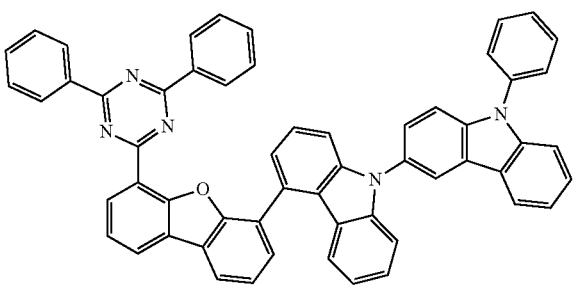

-continued
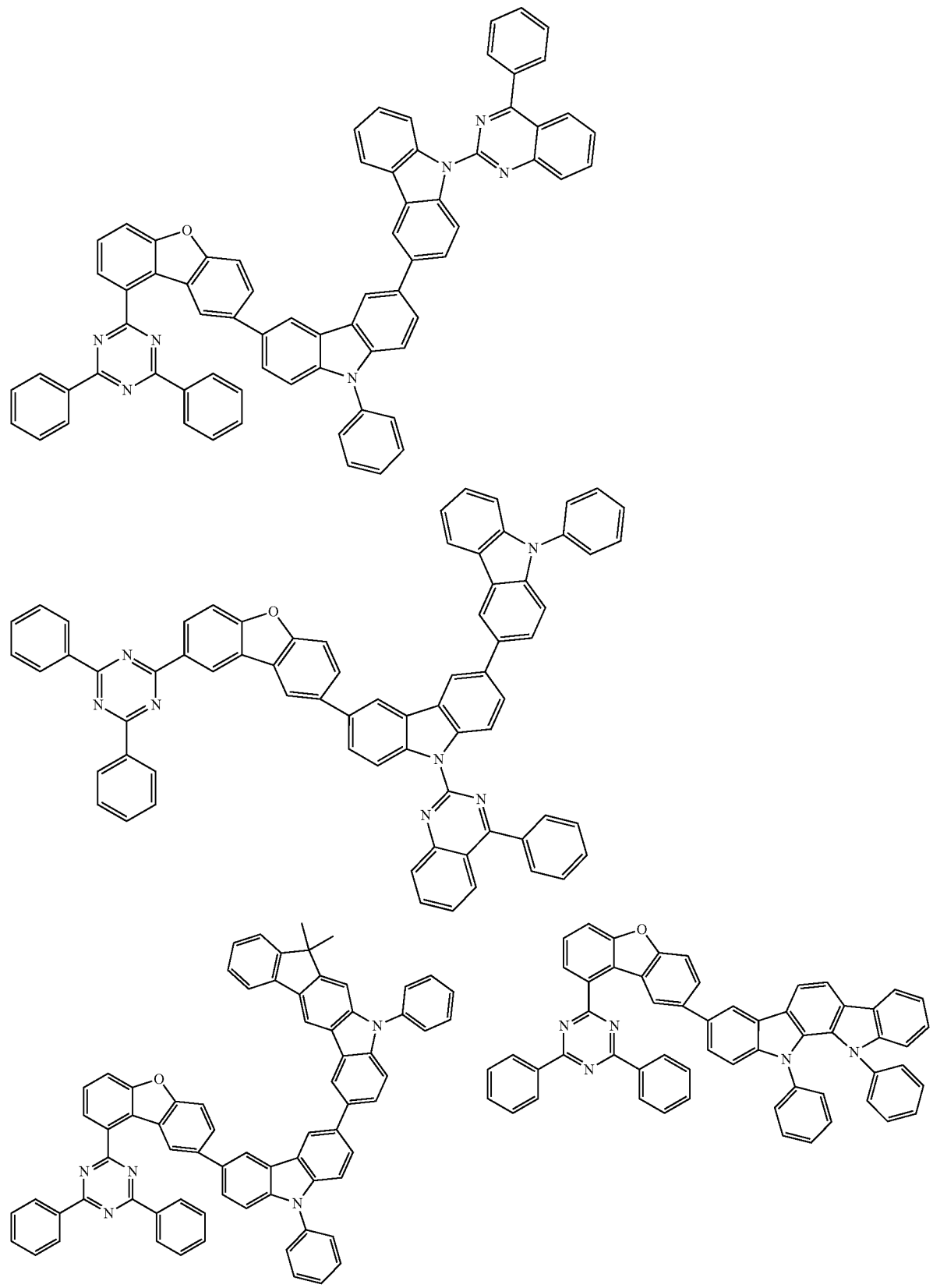

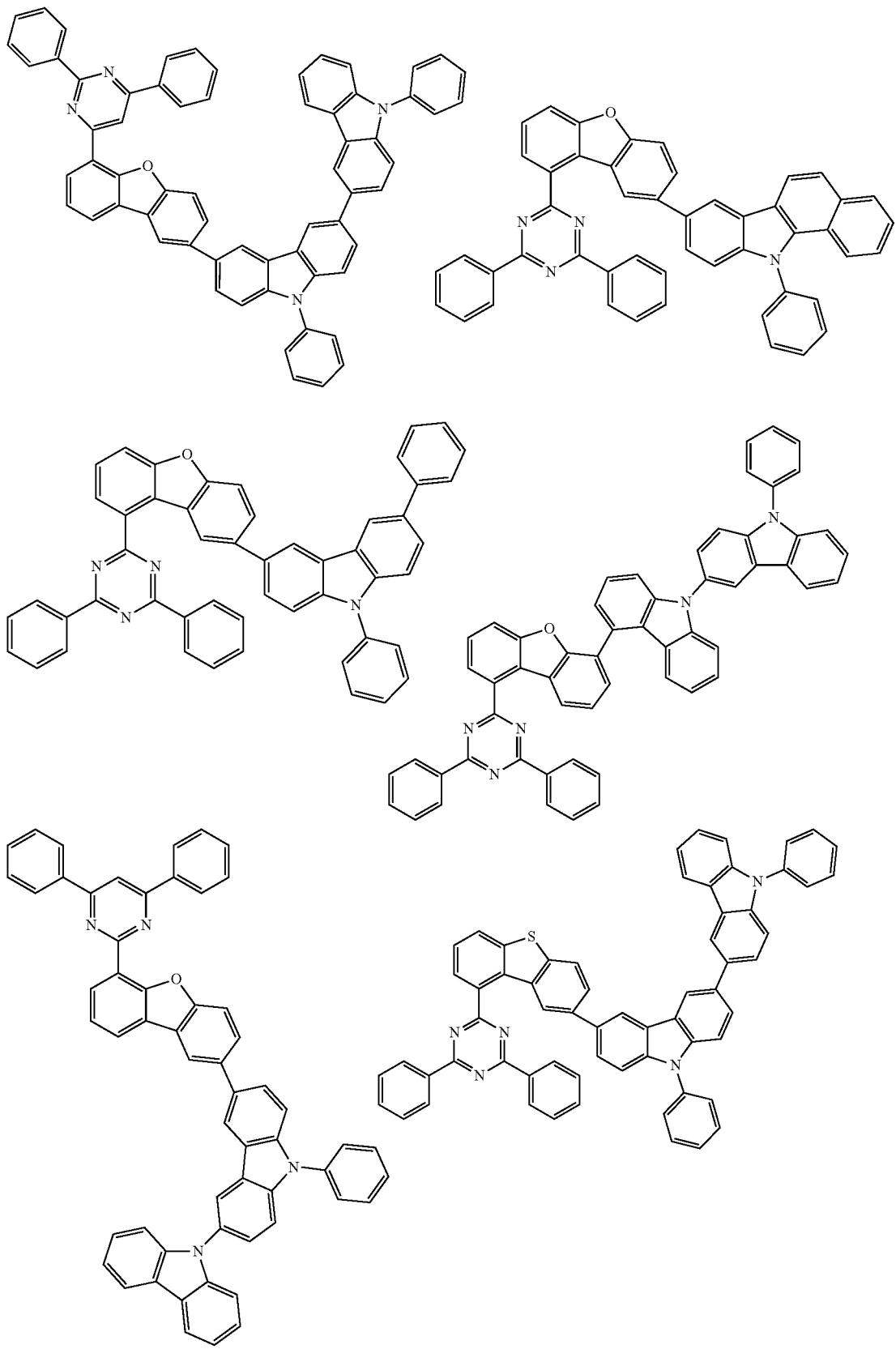

-continued
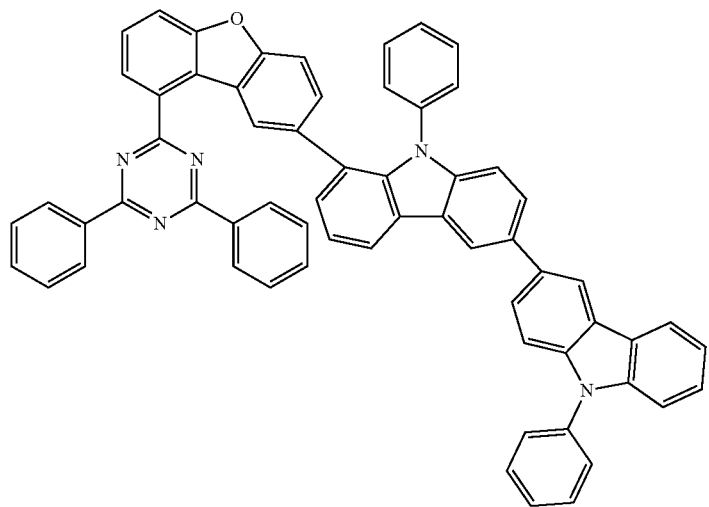
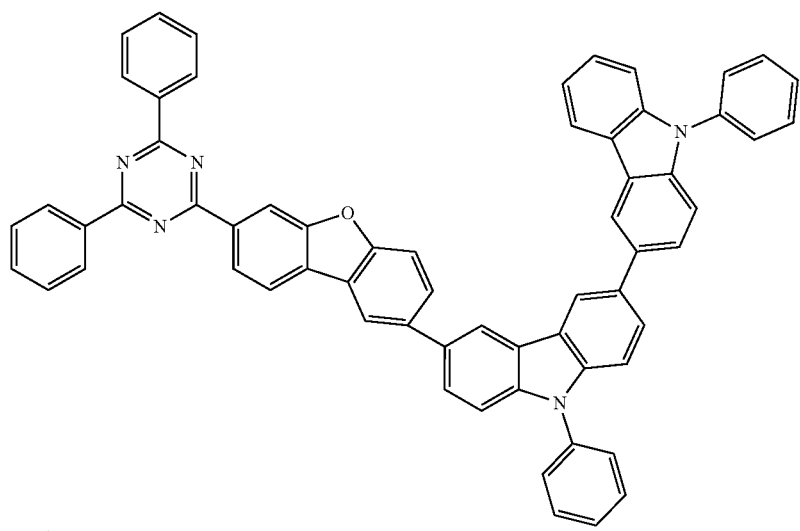
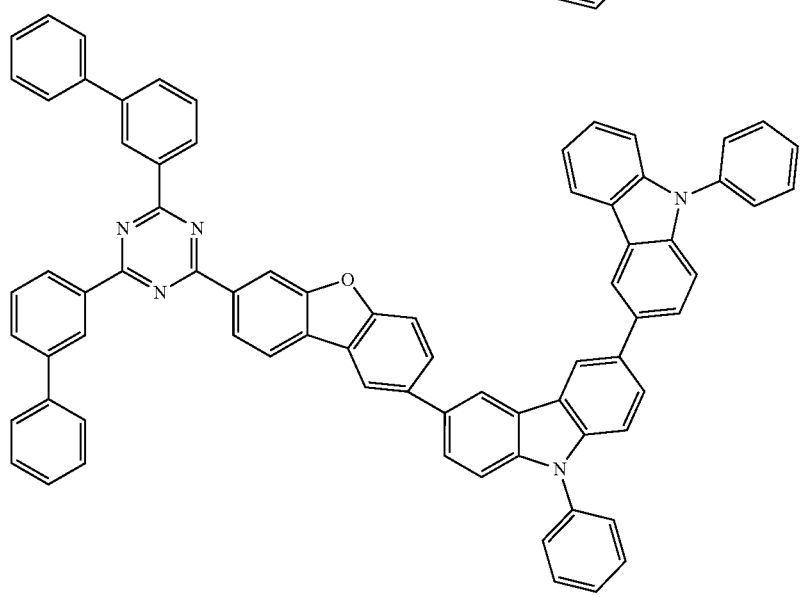

-continued
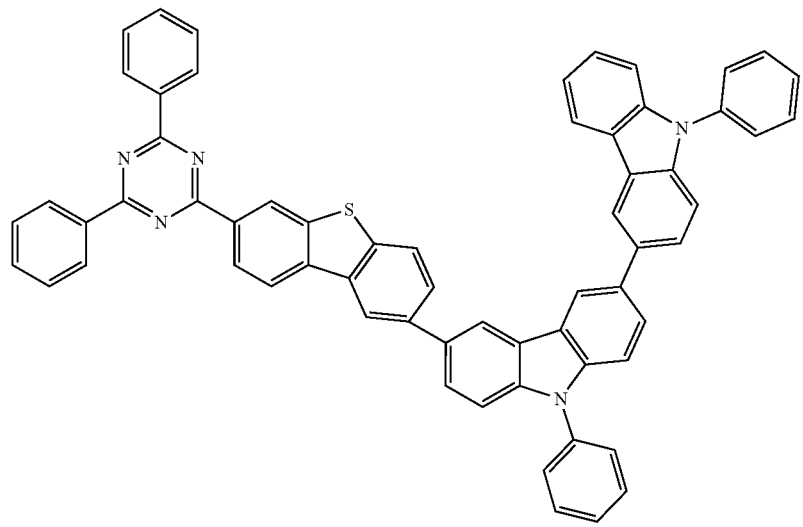
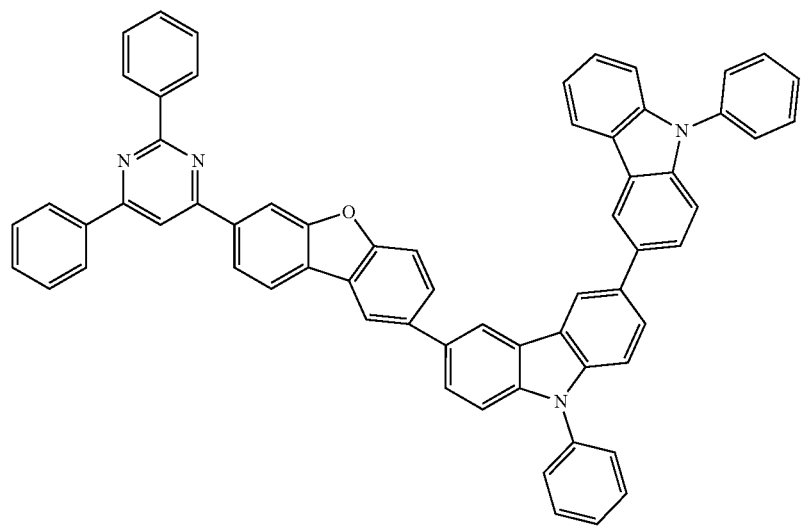
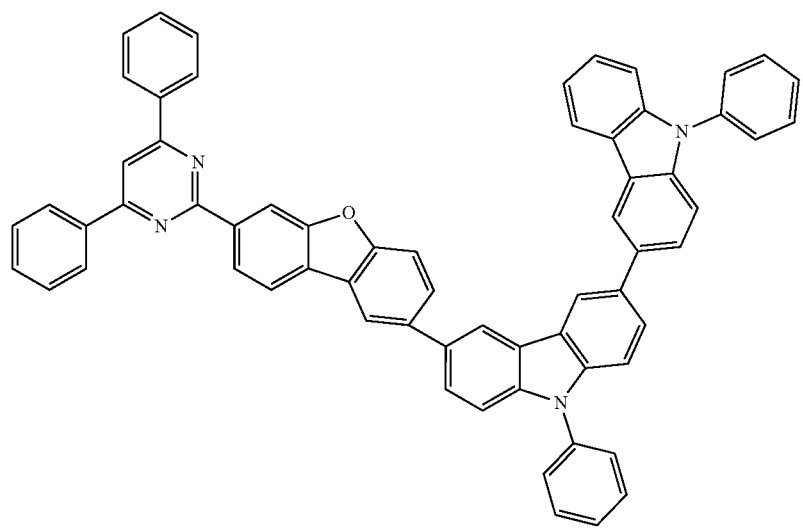

-continued
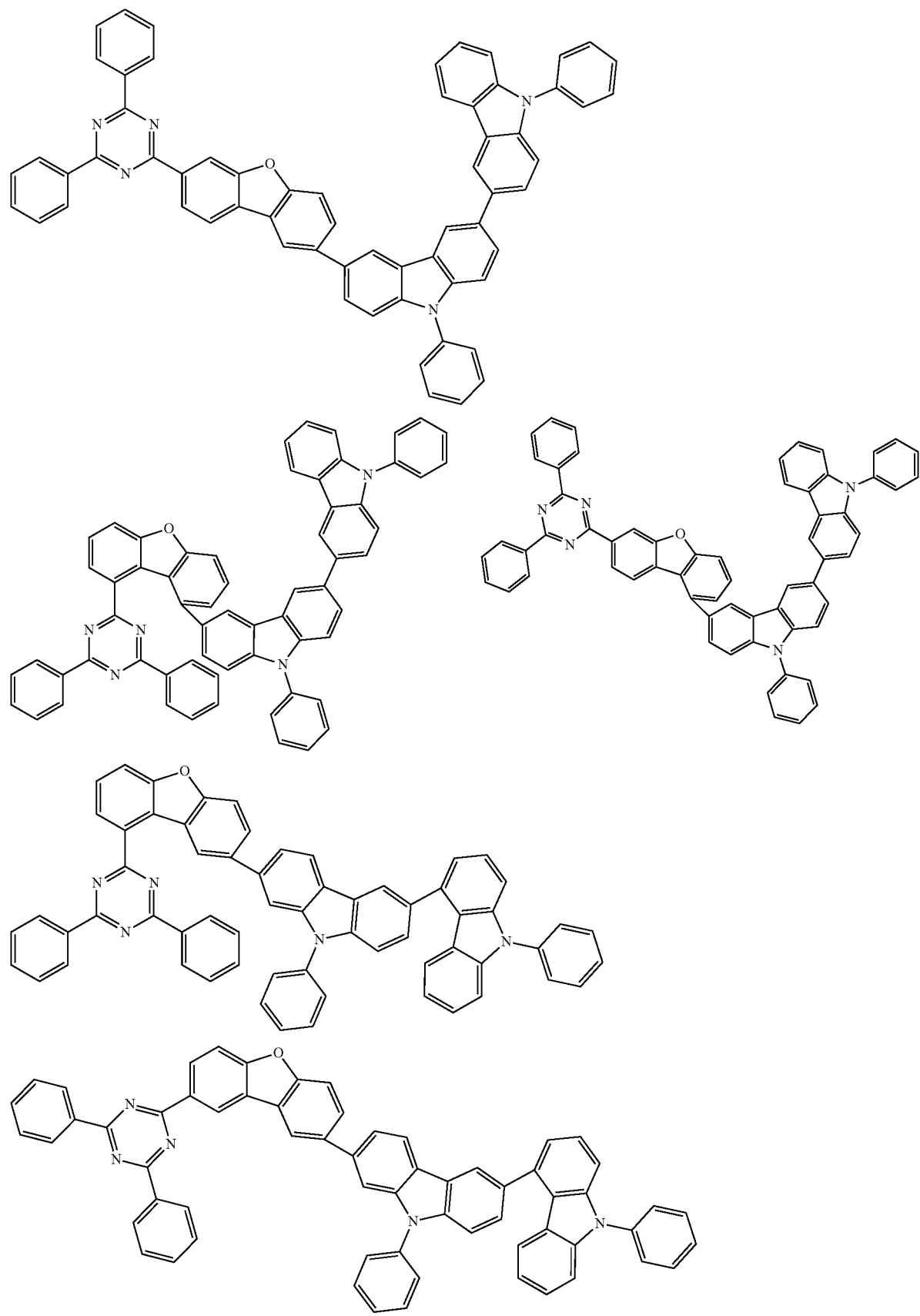

-continued

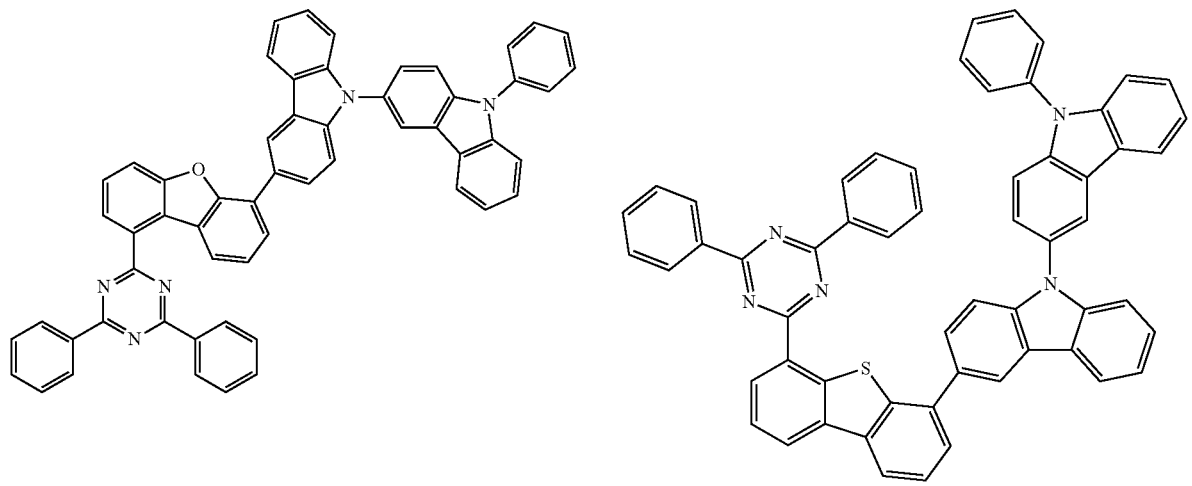
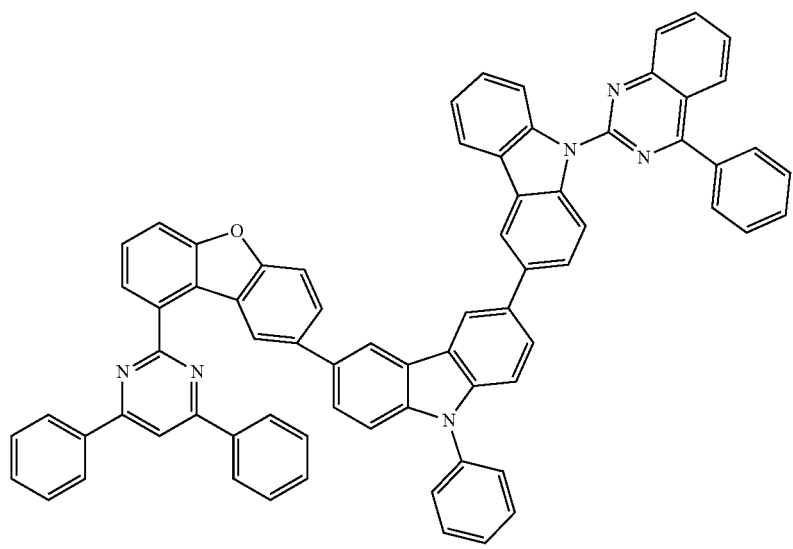
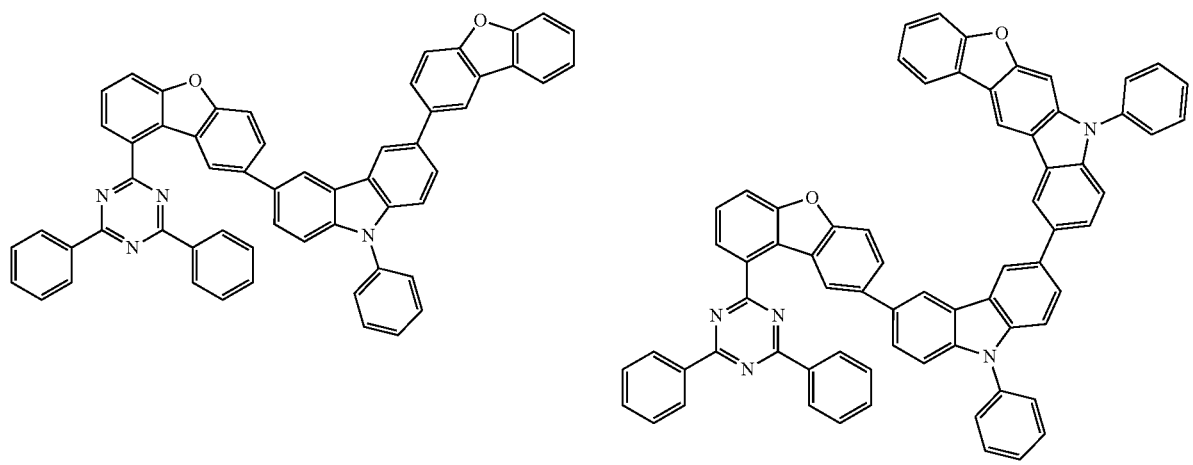

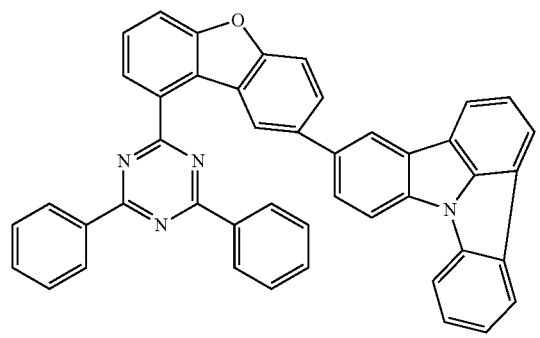
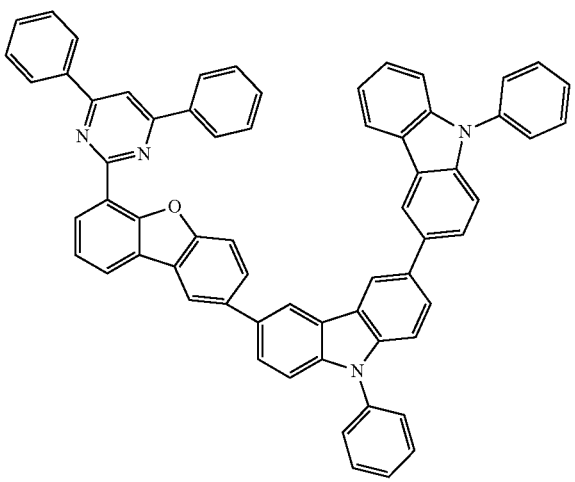
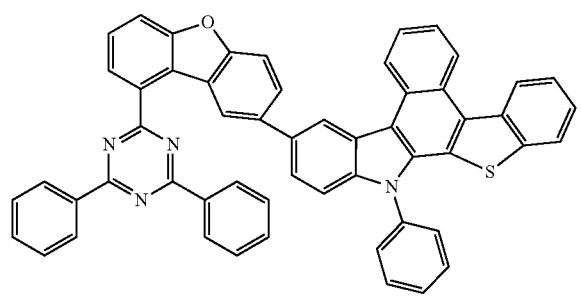
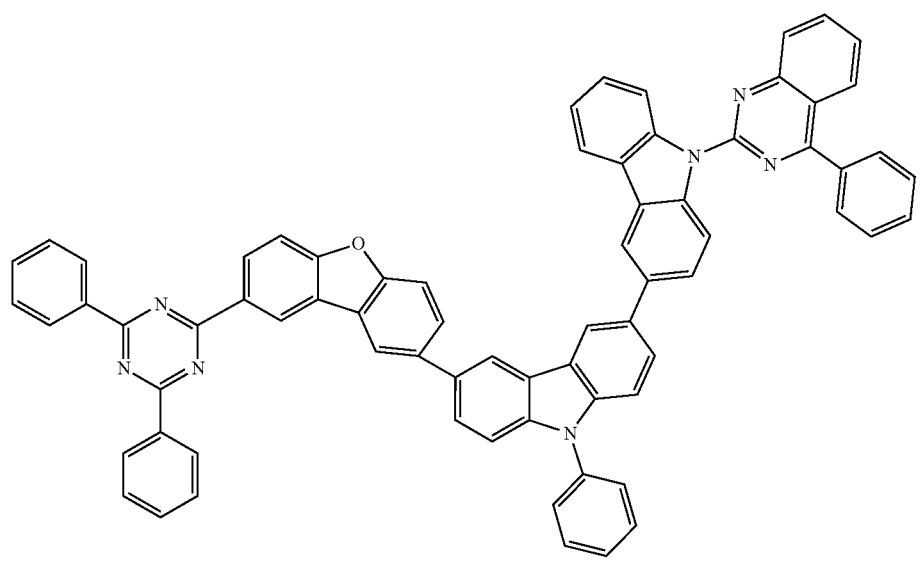

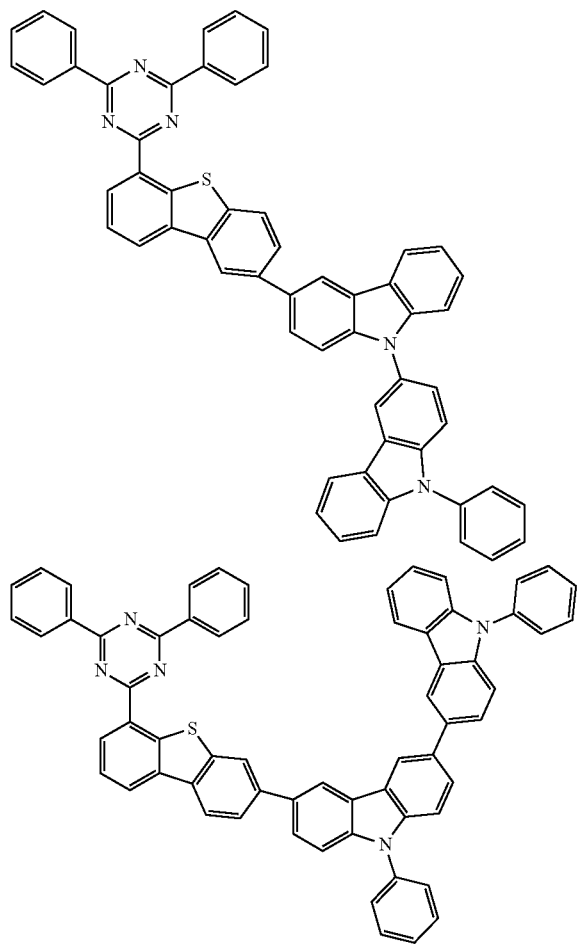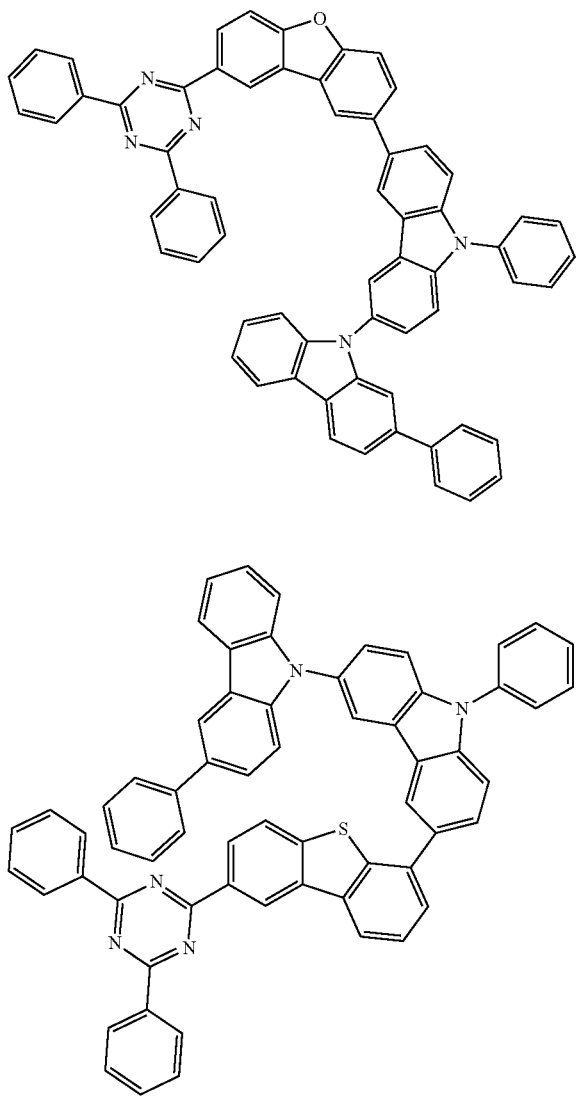
The compounds of the invention for the bipolar host can be prepared by synthesis steps known to those skilled in the art, for example bromination, Suzuki coupling, Ullmann coupling, Hartwig-Buchwald coupling, etc. A suitable synthesis method is shown in general terms in scheme 1 below:
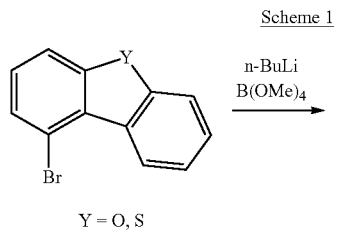
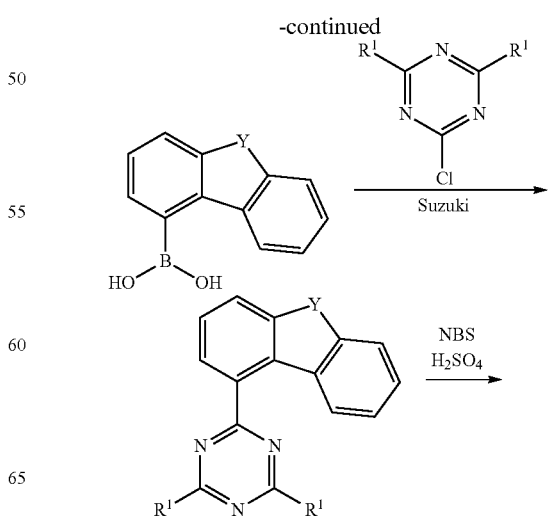

-continued

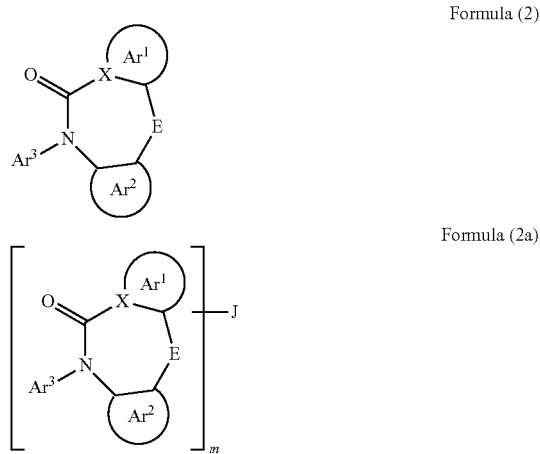

There follows a description of preferred electron-transporting compounds that are used as electron-transporting host in combination with the bipolar host in compositions of the invention.

The electron-transporting host is preferably a compound of the general formula (2) or (2a):

Formula (2)

Formula (2a)

where the symbols and indices used are as follows:

E is a single bond or $NAr^4$;

X is C when $Ar^1$ is a 6-membered aryl or 6-membered heteroaryl group, or is C or N when $Ar^1$ is a 5-membered heteroaryl group;

$Ar^1$ together with the X group and the carbon atom shown explicitly is an aromatic or heteroaromatic ring system which has 5 to 30 aromatic ring atoms and may be substituted by one or more R radicals;

$Ar^2$ together with the carbon atoms shown explicitly is an aromatic or heteroaromatic ring system which has 5 to 30 aromatic ring atoms and may be substituted by one or more R radicals; at the same time, $Ar^2$ may also be joined to $Ar^3$ by a single bond;

$Ar^3$ is selected from the group consisting of H, D, F, Cl, Br, I, CN, $NO_2$, $N(Ar^5)_2$, $N(R^6)_2$, $C(=O)Ar^5$, $C(=O)R^6$, $P(=O)(Ar^5)_2$, a straight-chain alkyl, alkoxy or thioalkyl group having 1 to 40 carbon atoms or a branched or cyclic alkyl, alkoxy or thioalkyl group having 3 to 40 carbon atoms or an alkenyl or alkynyl group having 2 to 40 carbon atoms, each of which may be substituted by one or more $R^6$ radicals, where one or more nonadjacent $CH_2$ groups may be replaced by $R^6C=CR^6$, $C\equiv C$, $Si(R^6)_2$, $Ge(R^6)_2$, $Sn(R^6)_2$, $C=O$, $C=S$, $C=Se$, $C=NR^6$, $P(=O)(R^6)$, SO, $SO_2$, $NR^6$, O, S or $CONR^6$ and where one or more hydrogen atoms may be replaced by D, F, Cl, Br, I, CN or $NO_2$, an aromatic or heteroaromatic ring system which has 5 to 30 aromatic ring atoms and may be substituted in each case by one or more $R^6$ radicals, an aryloxy or heteroaryloxy group which has 5 to 30 aromatic ring atoms and may be substituted by one or more $R^6$ radicals, or a combination of these systems; at the same time, $Ar^3$ may also be joined to $Ar^2$ by a single bond;

$Ar^4$ is an aromatic or heteroaromatic ring system which has 5 to 30 aromatic ring atoms and may be substituted by one or more R radicals; at the same time, $Ar^4$ may also be joined to $Ar^2$ or $Ar^1$ by a single bond;

m is 2, 3 or 4;

J when m=2 is a single bond or a bivalent group, or when m=3 is a trivalent group, or when m=4 is a tetravalent group, each of which is bonded at any desired position to $Ar^1$, $Ar^2$, Ara or $Ar^4$;

R is the same or different at each instance and is selected from the group consisting of H, D, F, Cl, Br, I, CN, $NO_2$, $N(Ar^5)_2$, $N(R^6)_2$, $C(=O)Ar^5$, $C(=O)R^6$, $P(=O)(Ar^5)_2$, a straight-chain alkyl, alkoxy or thioalkyl group having 1 to 40 carbon atoms or a branched or cyclic alkyl, alkoxy or thioalkyl group having 3 to 40 carbon atoms or an alkenyl or alkynyl group having 2 to 40 carbon atoms, each of which may be substituted by one or more $R^6$ radicals, where one or more nonadjacent $CH_2$ groups may be replaced by $R^6C=CR^6$, $C\equiv C$, $Si(R^6)_2$, $Ge(R^6)_2$, $Sn(R^6)_2$, $C=O$, $C=S$, $C=Se$, $C=NR^6$, $P(=O)(R^6)$, SO, $SO_2$, $NR^6$, O, S or $CONR^6$ and where one or more hydrogen atoms may be replaced by D, F, Cl, Br, I, CN or $NO_2$, an aromatic or heteroaromatic ring system which has 5 to 60 aromatic ring atoms and may be substituted in each case by one or more $R^6$ radicals, an aryloxy or heteroaryloxy group which has 5 to 60 aromatic ring atoms and may be substituted by one or more $R^6$ radicals, or a combination of these systems; where it is optionally possible for two or more adjacent R substituents to form a monocyclic or polycyclic, aliphatic, aromatic or heteroaromatic ring system which may be substituted by one or more $R^6$ radicals;

$R^6$ is the same or different at each instance and is selected from the group consisting of H, D, F, Cl, Br, I, CN, $NO_2$, $N(Ar^5)_2$, $N(R^7)_2$, $C(=O)Ar^5$, $C(=O)R^7$, $P(=O)(Ar^5)_2$, a straight-chain alkyl, alkoxy or thioalkyl group having 1 to 40 carbon atoms or a branched or cyclic alkyl, alkoxy or thioalkyl group having 3 to 40 carbon atoms or an alkenyl or alkynyl group having 2 to 40 carbon atoms, each of which may be substituted by one or more $R^7$ radicals, where one or more nonadjacent $CH_2$ groups may be replaced by $R^7C=CR^7$, $C\equiv C$, $Si(R^7)_2$, $Ge(R^7)_2$, $Sn(R^7)_2$, $C=O$, $C=S$, $C=Se$, $C=NR^7$, $P(=O)(R^7)$, SO, $SO_2$, $NR^7$, O, S or $CONR^7$ and where one or more hydrogen atoms may be replaced by D, F, Cl, Br, I, CN or $NO_2$, an aromatic or heteroaromatic ring system which has 5 to 60 aromatic ring atoms and may be substituted in each case by one or more $R^7$ radicals, an aryloxy or heteroaryloxy group which has 5-60 aromatic ring atoms and may be substituted by one or more $R^7$ radicals, or a combination of these systems; where it is optionally possible for two or more adjacent $R^6$ substituents to form a monocyclic or polycyclic, aliphatic, aromatic or heteroaromatic ring system which may be substituted by one or more $R^7$ radicals;

$Ar^5$ is the same or different at each instance and is an aromatic or heteroaromatic ring system which has 5 to 30 aromatic ring atoms and may be substituted by one or more nonaromatic $R^7$ radicals; at the same time, two $Ar^5$ radicals bonded to the same nitrogen atom or phosphorus atom may also be bridged to one another by a single bond or a bridge selected from $N(R^7)$, $C(R^7)_2$ and O;

$R^7$ is selected from the group consisting of H, D, F, CN, an aliphatic hydrocarbyl radical having 1 to 20 carbon atoms, an aromatic or heteroaromatic ring system having 5 to 30 aromatic ring atoms in which one or more hydrogen atoms may be replaced by D, F, Cl, Br, I or CN, where two or more adjacent $R^7$ substituents together may form a mono- or polycyclic, aliphatic, aromatic or heteroaromatic ring system.

6-Membered aryl or 6-membered heteroaryl group or 5-membered heteroaryl group in the definition of X means that the ring that contains the carbon atom shown explicitly and the X group is a ring of this kind. It is also possible for further aromatic or heteroaromatic groups to be fused to this ring.

There follows a description of preferred embodiments of the compound of the formula (2) or (2a).

In a preferred embodiment of the invention, the $Ar^1$ group in compounds of the formula (2) or (2a) is a group of the formula (3), (4), (5), (6) or (7)

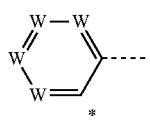

Formula (3)

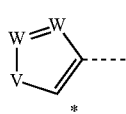

Formula (4)

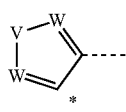

Formula (5)

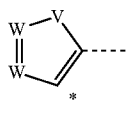

Formula (6)

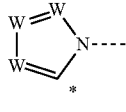

Formula (7)

where the dotted bond indicates the linkage to the carbonyl group, * indicates the position of the linkage to E and in addition:

W is the same or different at each instance and is CR or N, or two adjacent W groups are a group of the following formula (8) or (9)

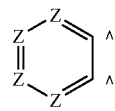

Formula (8)

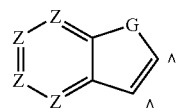

Formula (9)

where G is $CR^2$, NR, O or S, Z is the same or different at each instance and is CR or N and ^ indicate the corresponding adjacent W groups in the formulae (3) to (7);

V is NR, O or S;

the Are group is a group of one of the formulae (10), (11) and (12)

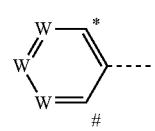

Formula (10)

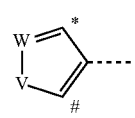

Formula (11)

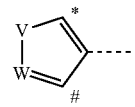

Formula (12)

where the dotted bond indicates the linkage to N, # indicates the position of a possible linkage to $Ar^3$, * indicates the linkage to E, and W and V have the definitions given above;

the $Ar^3$ group is a group of one of the formulae (13), (14), (15) and (16)

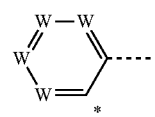

Formula (13)

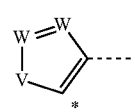

Formula (14)

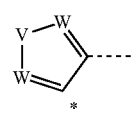

Formula (15)

Formula (16)

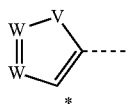

where the dotted bond indicates the linkage to N, * indicates a possible linkage to Ar², and W and V have the definitions given above.

At the same time, the abovementioned preferred Ar¹, Ar² and Ar³ groups may be combined with one another as desired.

Preferred embodiments of the invention are therefore compounds of formula (2) or (2a) for which:

E is a single bond;

Ar¹ is selected from the groups of the abovementioned formulae (3), (4), (5), (6) and (7);

Ar² is selected from the groups of the abovementioned formulae (10), (11) and (12);

Ar³ is selected from the groups of the abovementioned formulae (13), (14), (15) and (16).

More preferably, at least two of the Ar¹, Ar² and Ar³ groups are a 6-membered aryl or a 6-membered heteroaryl group. Thus, more preferably, Ar¹ is a group of the formula (3) and at the same time Ar² is a group of the formula (10), or Ar¹ is a group of the formula (3) and at the same time Ar³ is a group of the formula (13), or Ar² is a group of the formula (10) and at the same time Ar³ is a group of the formula (13).

Particularly preferred embodiments of the formula (2) are therefore the compounds of the following formulae (17) to (26):

Formula (17)

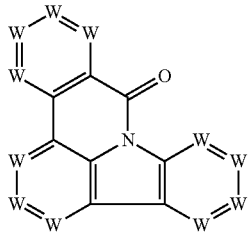

Formula (18)

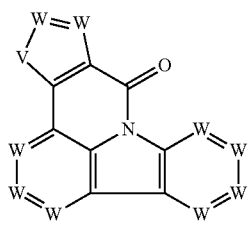

Formula (18-I)

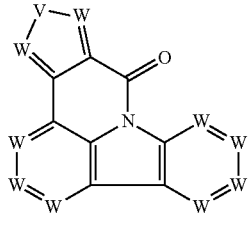

Formula (19)

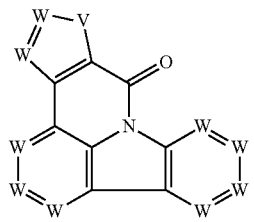

Formula (20)

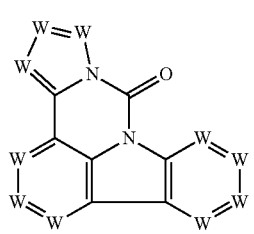

Formula (21)

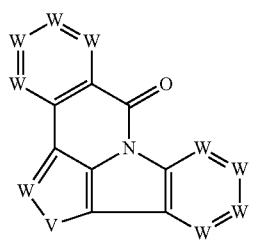

Formula (22)

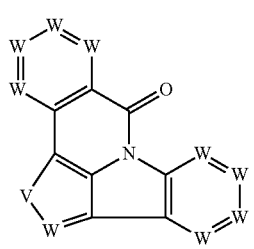

Formula (23)

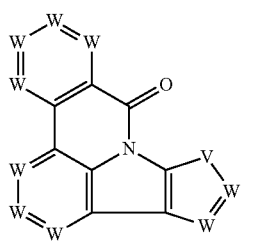

Formula (24)

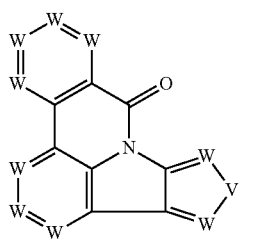

Formula (25)

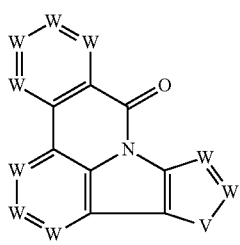

Formula (26)

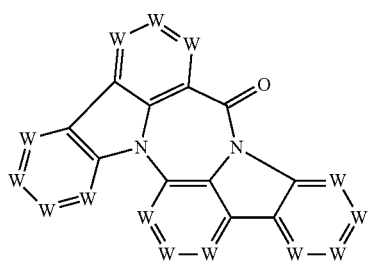

where the symbols used have the definitions given above.

It is further preferable when W is CR or N and is not a group of the formula (8) or (9). In a preferred embodiment of the compounds of formulae (17) to (26), not more than one W symbol in total per cycle is N, and the remaining W symbols are CR.

In a particularly preferred embodiment of the invention, all W symbols are CR. Particular preference is therefore given to the compounds of the following formulae (17a) to (26a):

Formula (17a)

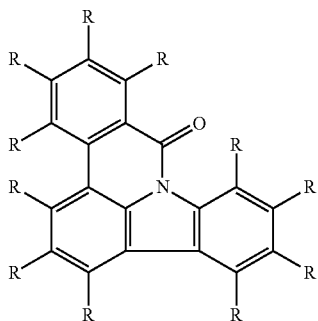

Formula (18a)

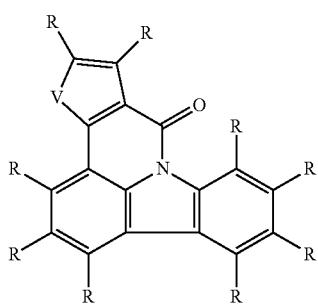

Formula (18-Ia)

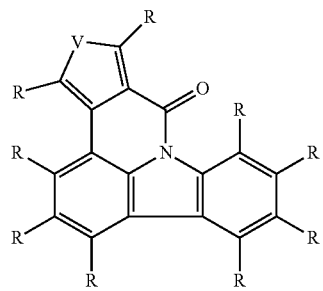

Formula (19a)

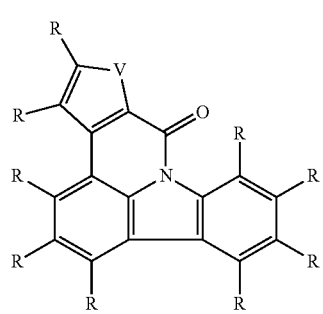

Formula (20a)

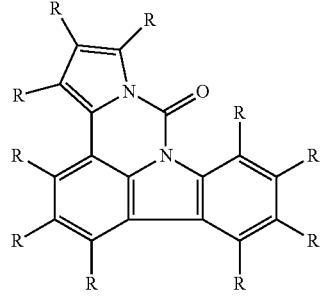

Formula (21a)

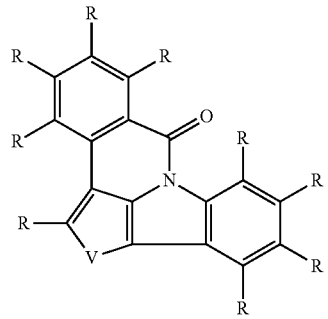

Formula (22a)

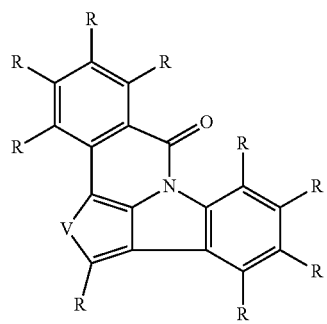

Formula (23a)
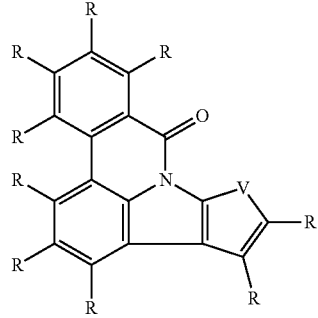
Formula (24a)
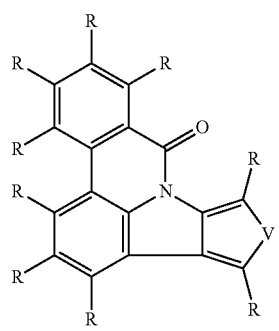
Formula (25a)
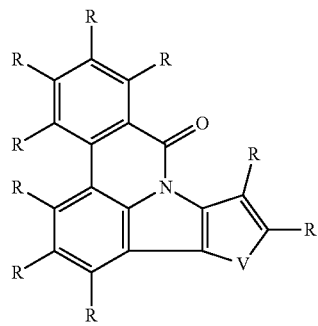
Formula (26a)
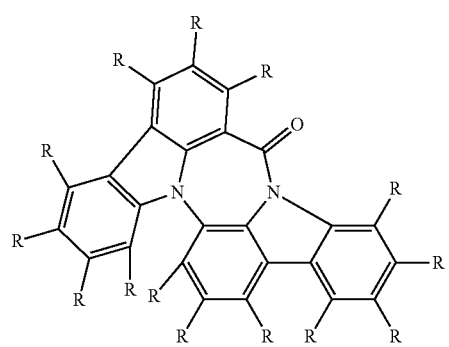
where the symbols used have the definitions given above.
Very particular preference is given to the structures of the formulae (17b) to (26b):
Formula (17b)
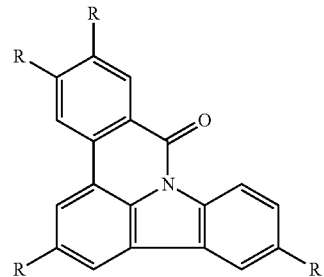
Formula (18b)
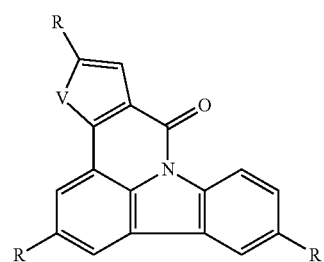
Formula (18-Ib)
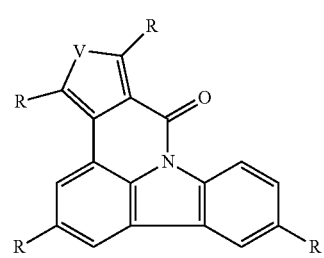
Formula (19b)
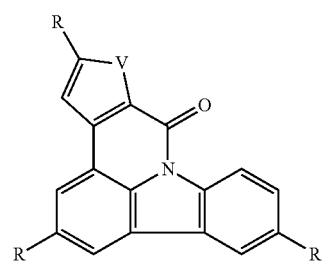
Formula (20b)
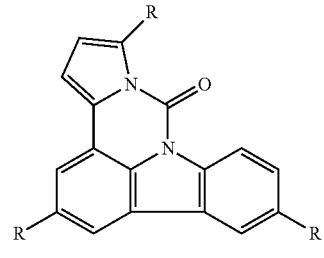
Formula (21b)
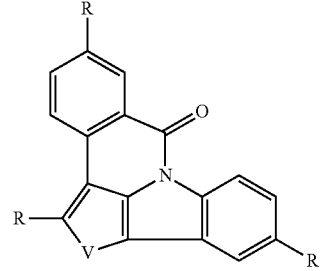

-continued

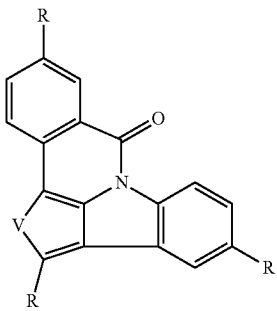

Formula (22b)

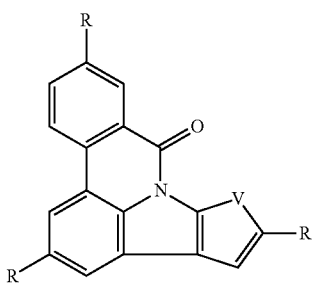

Formula (23b)

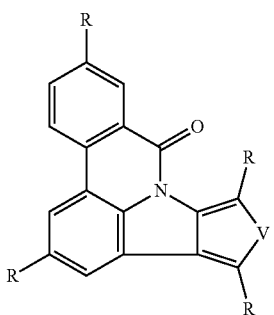

Formula (24b)

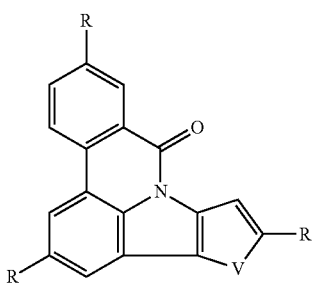

Formula (25b)

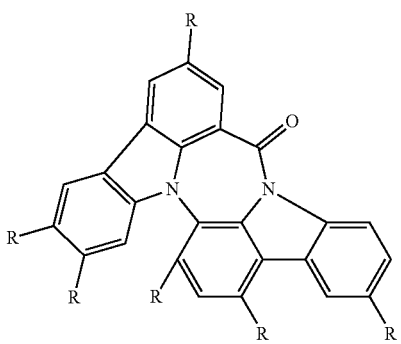

Formula (26b)

where the symbols used have the definitions given above.

Very particular preference is given to the compounds of the formula (17) or (17a) or (17b).

In a further preferred embodiment of the invention, $Ar^3$ is a group of the formula (13) and two adjacent W groups in this $Ar^3$ group are a group of the formula (9) and the other W groups in this $Ar^3$ group are the same or different and are CR or N, especially CR. The group of the formula (9) may be fused on in any possible position. More preferably, at the same time, $Ar^1$ is a group of the formula (3) in which W is the same or different and is CR or N, especially CR, and Ar e is a group of the formula (10) in which W is the same or different and is CR or N, especially CR. Preferred embodiments of the compounds of the formula (2) are thus also the compounds of the following formulae (27) to (32):

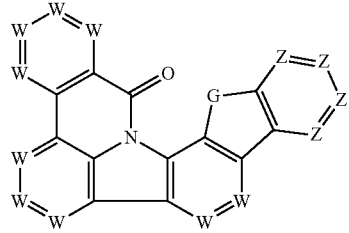

Formula (27)

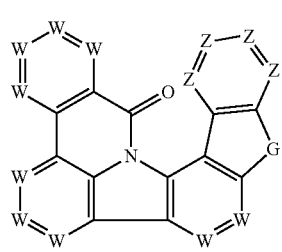

Formula (28)

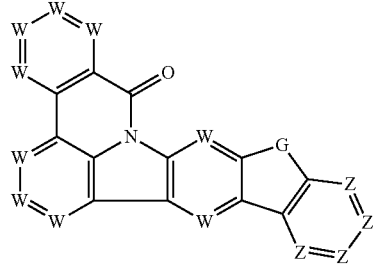

Formula (29)

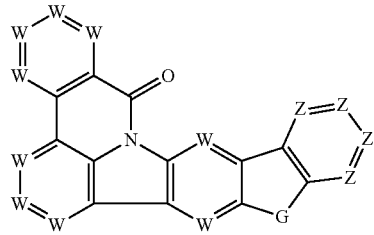

Formula (30)

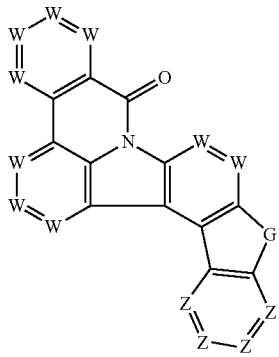

Formula (31)

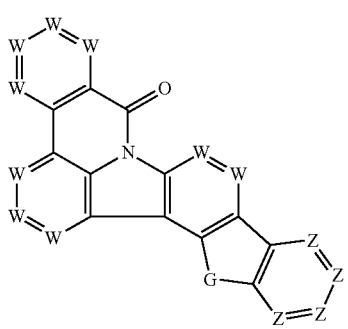

Formula (32)

where the symbols used have the definitions given above.

It is further preferable when W is CR or N. In a preferred embodiment of the invention, for each cycle in the compounds of the formulae (27) to (32), a maximum of one W or Z group in each case is N and the other W and Z groups are CR. More preferably, all W and Z groups are CR.

In a further preferred embodiment of the invention, G is CR², NR or O, more preferably CR² or NR and most preferably CR². In a particularly preferred embodiment of the invention, all W and Z groups are CR, and G is simultaneously CR², NR or O, more preferably CR² or NR and especially CR².

Preferred compounds of the formulae (27) to (32) are thus the compounds of the following formulae (27a) to (32a):

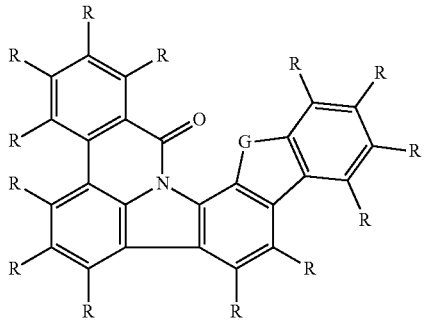

Formula (27a)

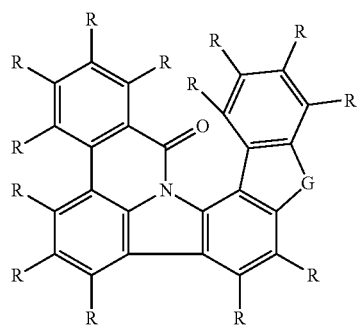

Formula (28a)

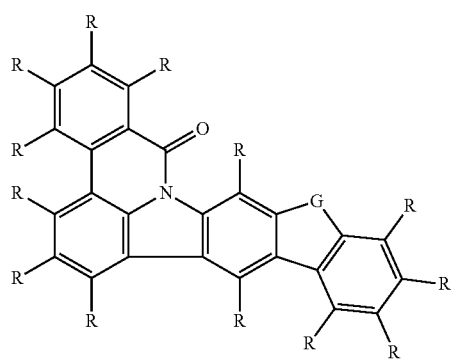

Formula (29a)

Formula (30a)

Formula (31a)

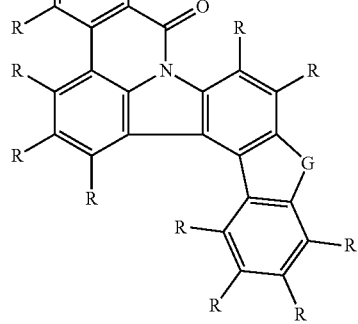

Formula (32a)

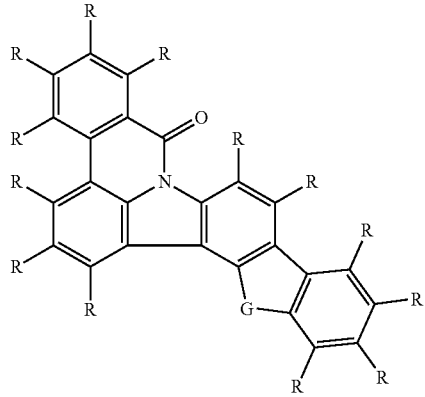

where the symbols used have the definitions given above.
The following compounds of the formulae (27b) to (32b) are more preferably:

Formula (27b)

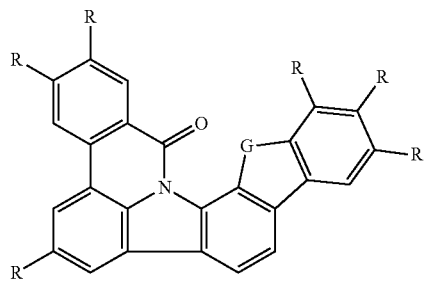

Formula (28b)

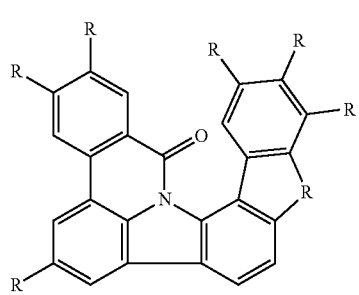

Formula (29b)

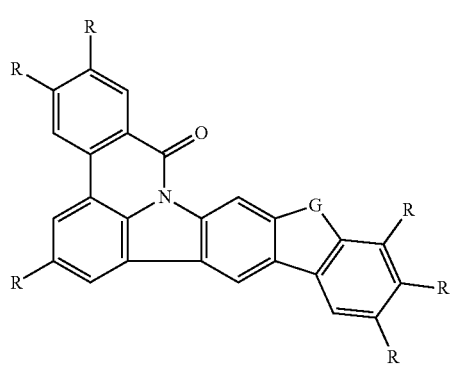

Formula (30b)

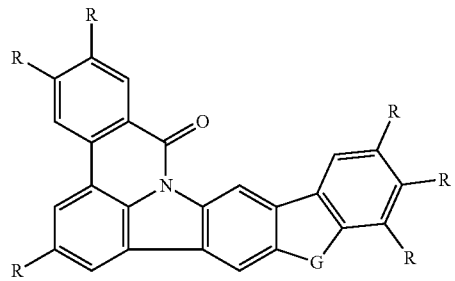

Formula (31b)

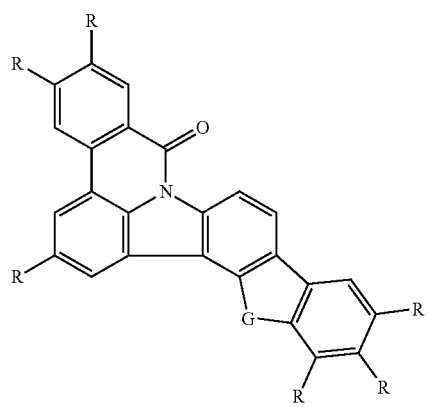

Formula (32b)

R and G here have the definitions given above and the preferred definitions cited above or hereinafter.

The bridging J group in the compounds of the formulae (2a) is preferably selected from a single bond or an aromatic or heteroaromatic ring system which has 5 to 30 aromatic ring atoms and may be substituted by one or more R radicals. At the same time, the aromatic or heteroaromatic ring systems preferably do not contain any fused aryl or heteroaryl groups in which more than two aromatic six-membered rings are fused directly to one another. More preferably, they do not contain any aryl or heteroaryl groups in which aromatic six-membered rings are fused directly to one another at all.

In a further preferred embodiment of the invention, the index m in compounds of the formula (2a)=2 or 3, especially 2. Very particular preference is given to using compounds of the formula (2).

In a preferred embodiment of the invention, R in the abovementioned formulae is the same or different at each instance and is selected from the group consisting of H, D, F, Cl, Br, CN, N(Ar$^5$)$_2$, C(=O)Ar$^5$, a straight-chain alkyl or alkoxy group having 1 to 10 carbon atoms or a branched or cyclic alkyl or alkoxy group having 3 to 10 carbon atoms or an alkenyl or alkynyl group having 2 to 10 carbon atoms, each of which may be substituted by one or more R$^1$ radicals, where one or more nonadjacent CH$_2$ groups may be replaced by O and where one or more hydrogen atoms may be replaced by D or F, an aromatic or heteroaromatic ring system which has 5 to 30 aromatic ring atoms and may be substituted in each case by one or more R$^6$ radicals, an aryloxy or heteroaryloxy group which has 5 to 30 aromatic ring atoms and may be substituted by one or more R$^6$ radicals, or a combination of these systems. More preferably, R in the abovementioned formulae is the same or different at each instance and is selected from the group consisting of H, D, F, Cl, Br, CN, a straight-chain alkyl group having 1 to 10 carbon atoms or a branched or cyclic alkyl group having 3 to 10 carbon atoms, each of which may be substituted by one or more R$^6$ radicals, where one or more hydrogen atoms may be replaced by D or F, an aromatic or heteroaromatic ring system which has 5 to 18 aromatic ring atoms and may be substituted in each case by one or more R$^6$ radicals, or a combination of these systems.

At the same time, the R radicals, when they contain aromatic or heteroaromatic ring systems, preferably do not contain any fused aryl or heteroaryl groups in which more than two aromatic six-membered rings are fused directly to one another. More preferably, they do not contain any aryl or heteroaryl groups in which aromatic six-membered rings are fused directly to one another at all. Especially preferred here are phenyl, biphenyl, terphenyl, quaterphenyl, carbazole, dibenzothiophene, dibenzofuran, indenocarbazole, indolocarbazole, triazine or pyrimidine, each of which may also be substituted by one or more R$^6$ radicals. It is also preferable when, in the R$^6$ radicals, not more than two aromatic six-membered rings are fused directly to one another. More preferably, R$^6$ does not contain any aryl or heteroaryl groups in which aromatic six-membered rings are fused directly to one another at all.

The compounds of the formula (2) can be synthesized by the methods described in WO 2011/116865 and WO 2011/137951.

Examples of compounds preferred in accordance with the invention for the electron-transporting host according to the embodiments detailed above are the compounds detailed hereinafter.

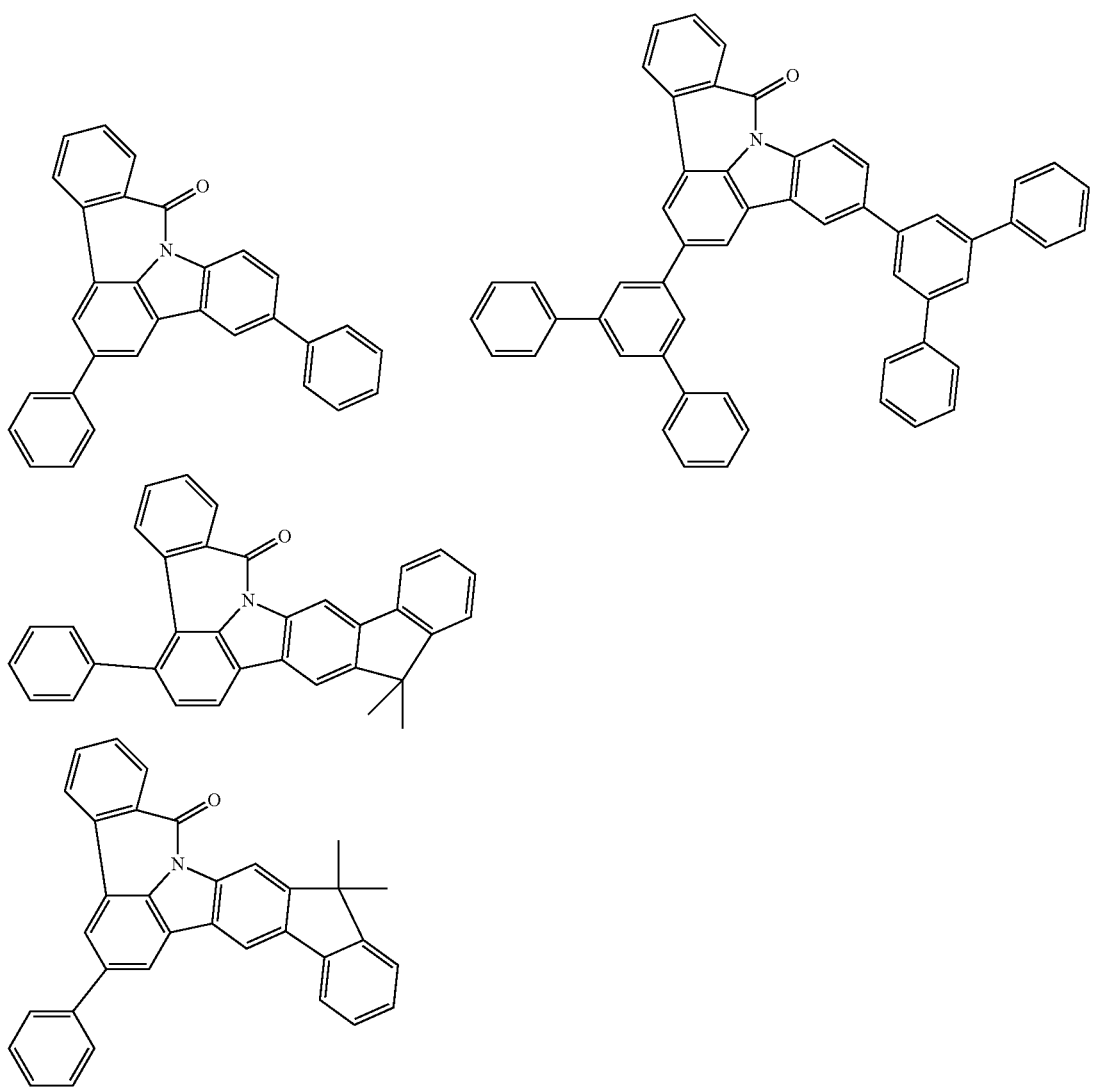

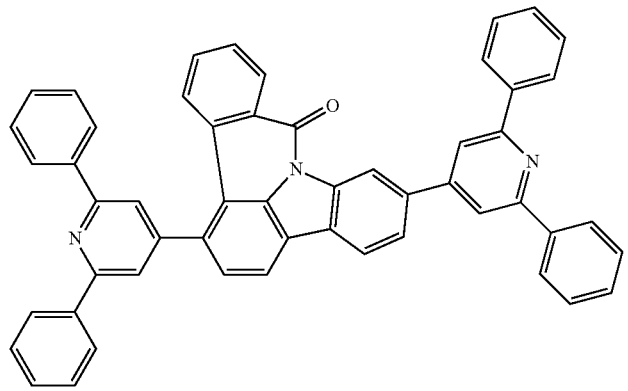
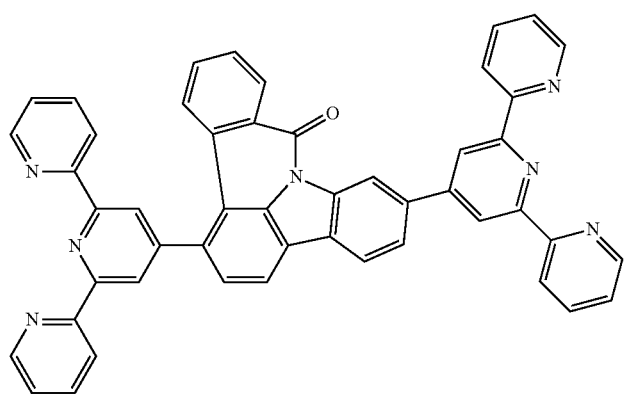
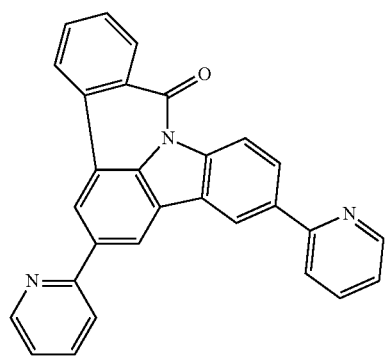
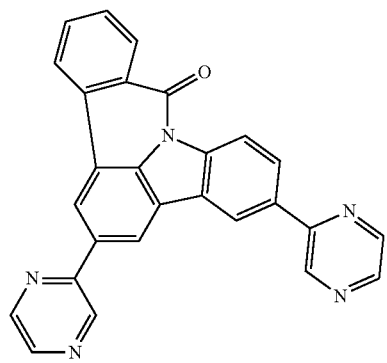

-continued
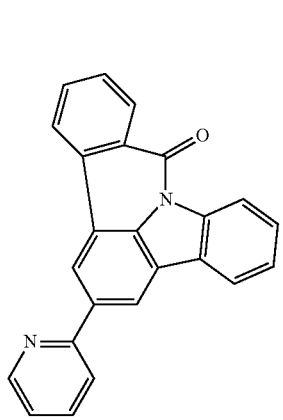
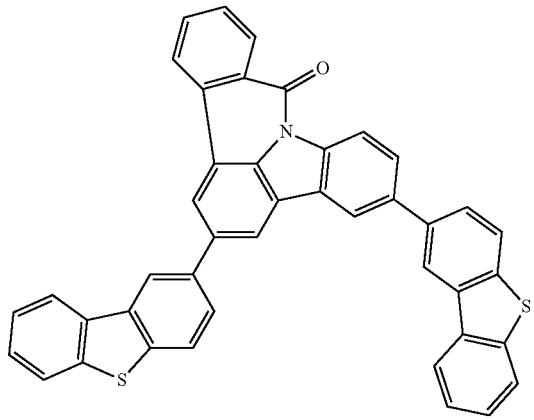
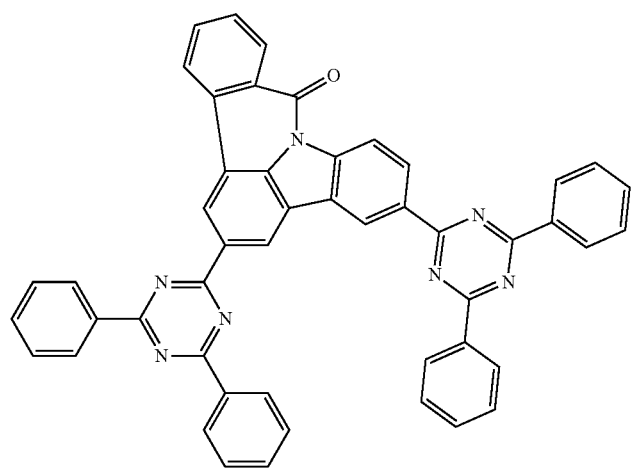
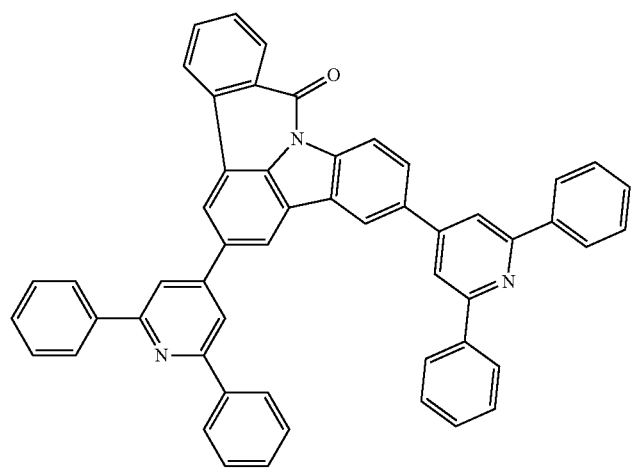

-continued
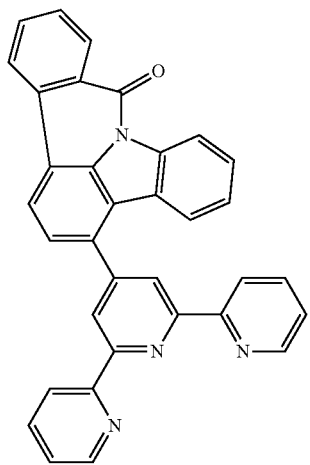
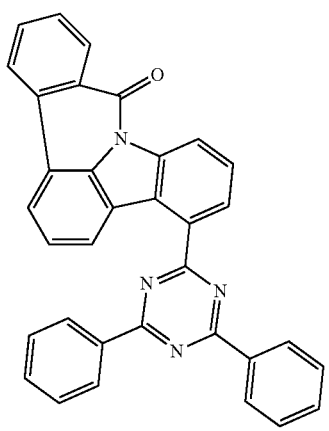
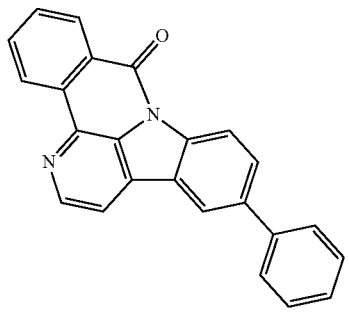
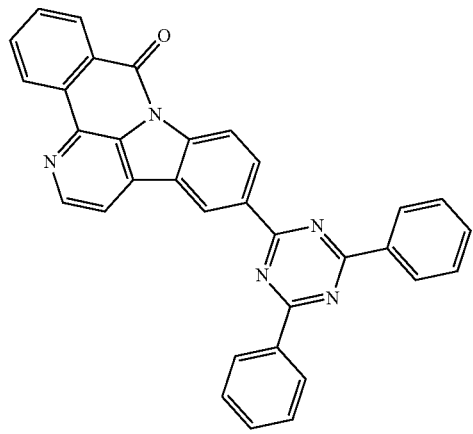
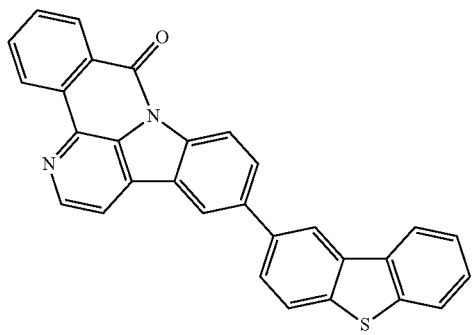
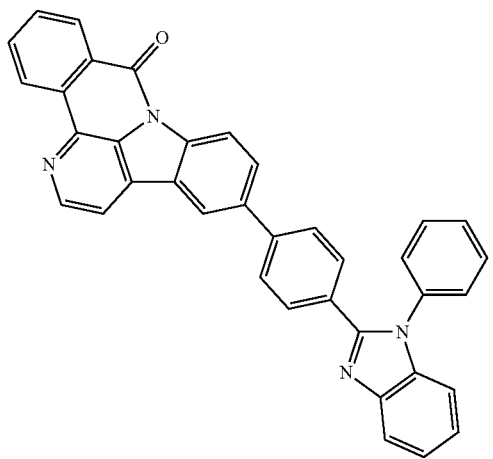

-continued
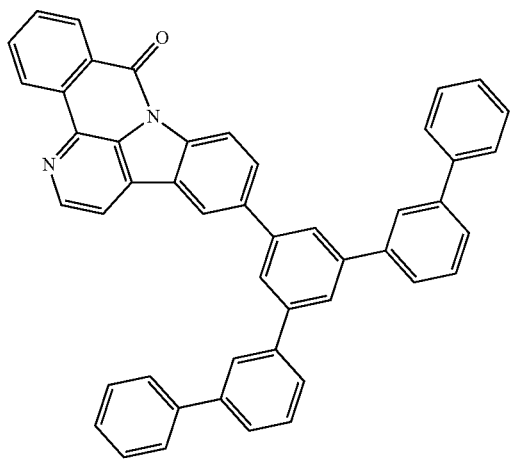
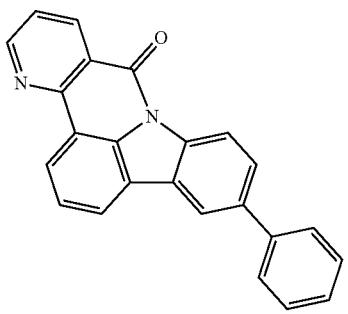
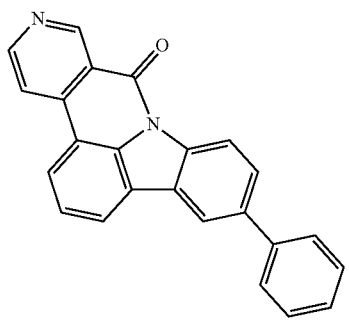
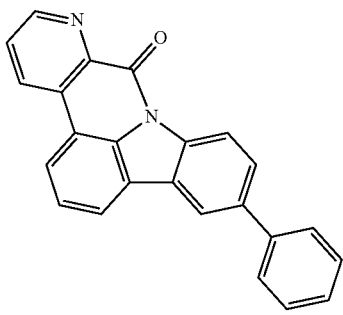
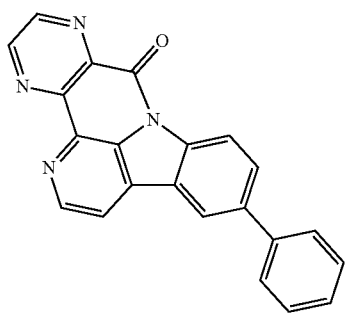
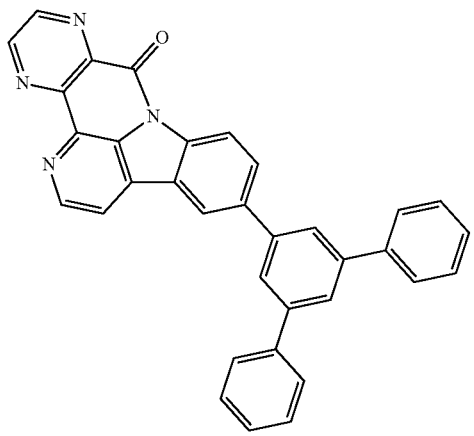

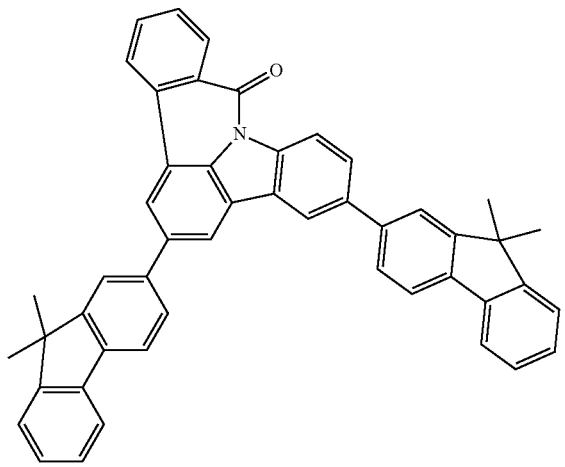
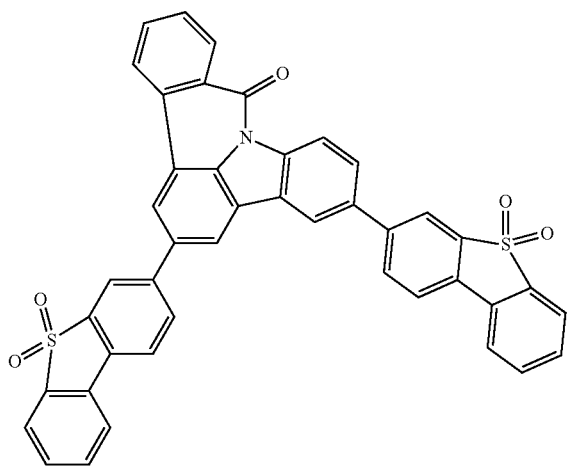
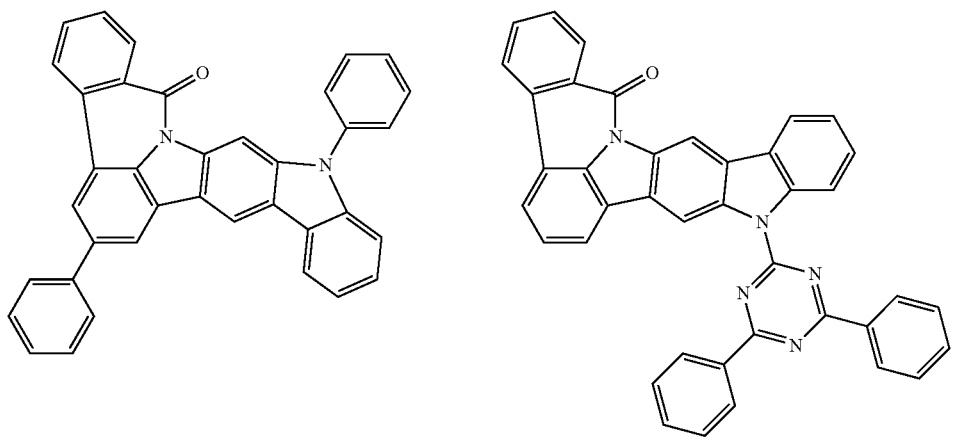

-continued
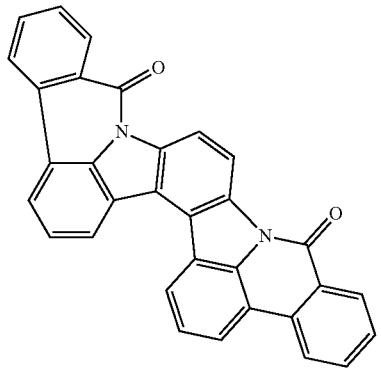
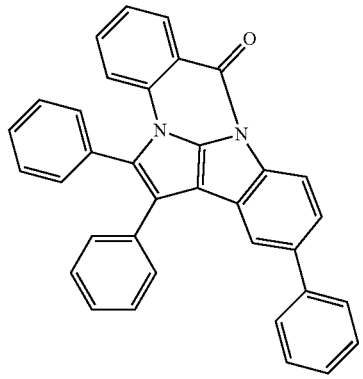
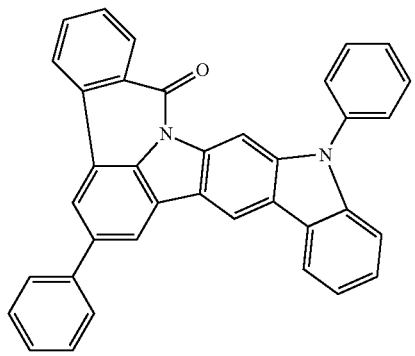
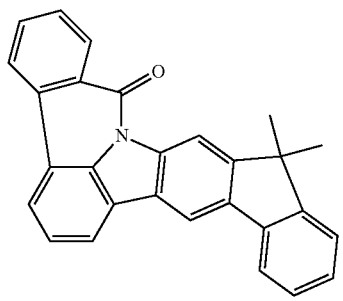
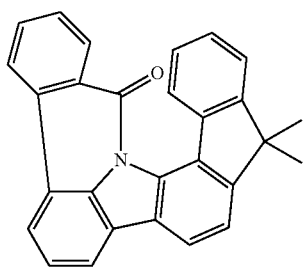
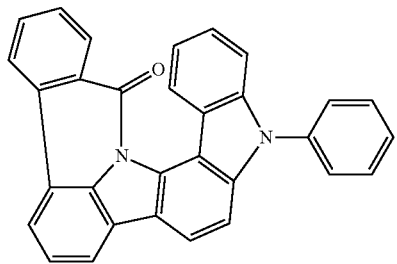

-continued
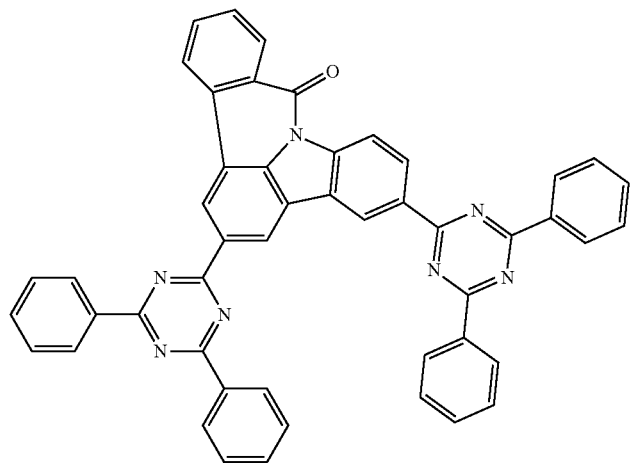
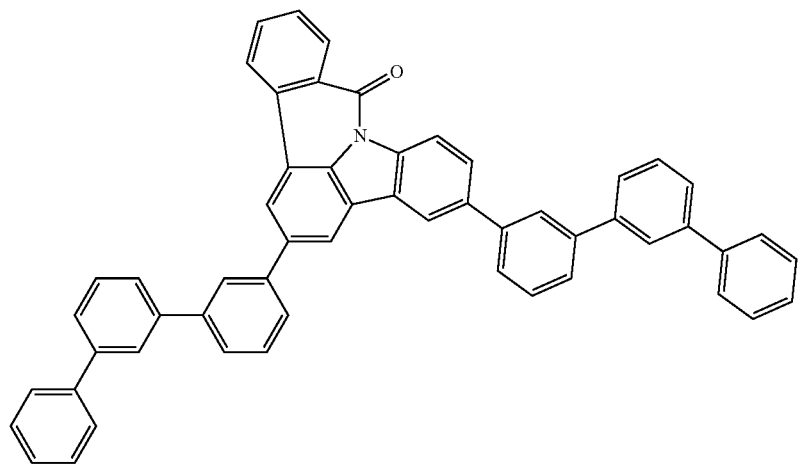
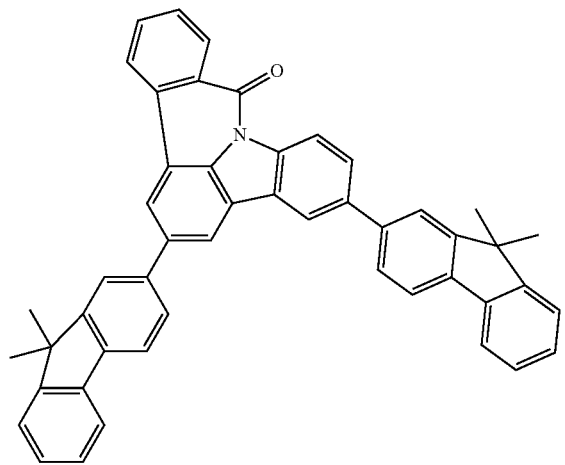

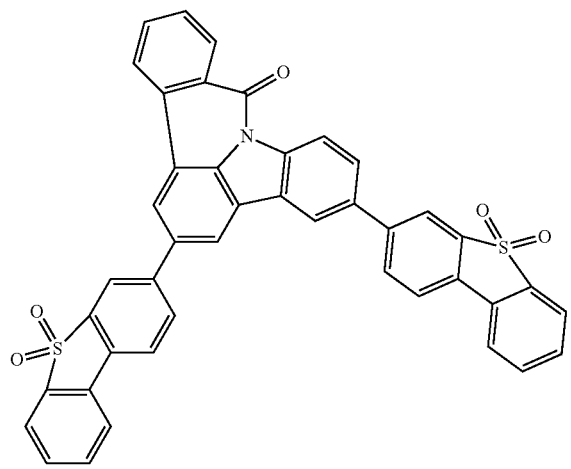
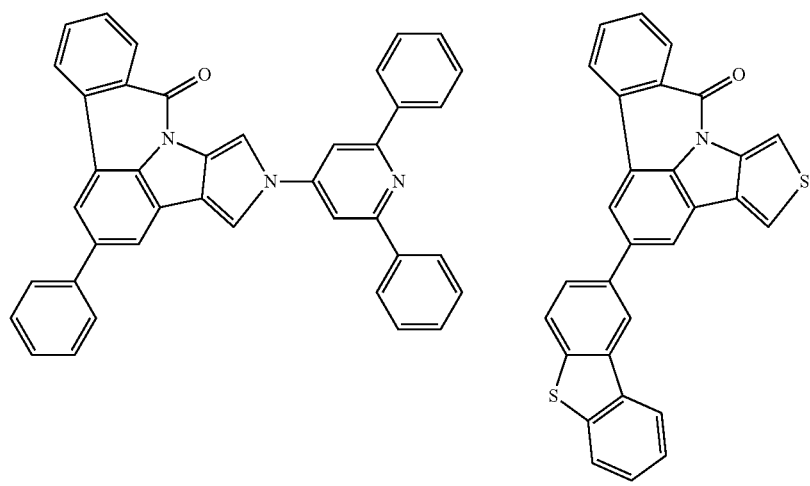
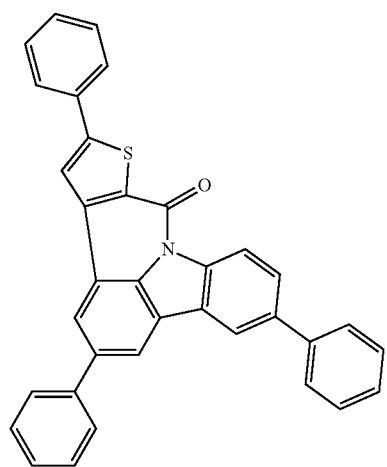

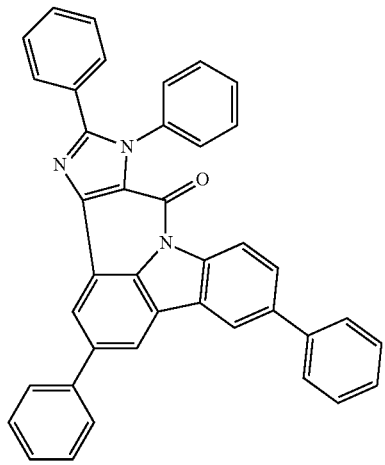
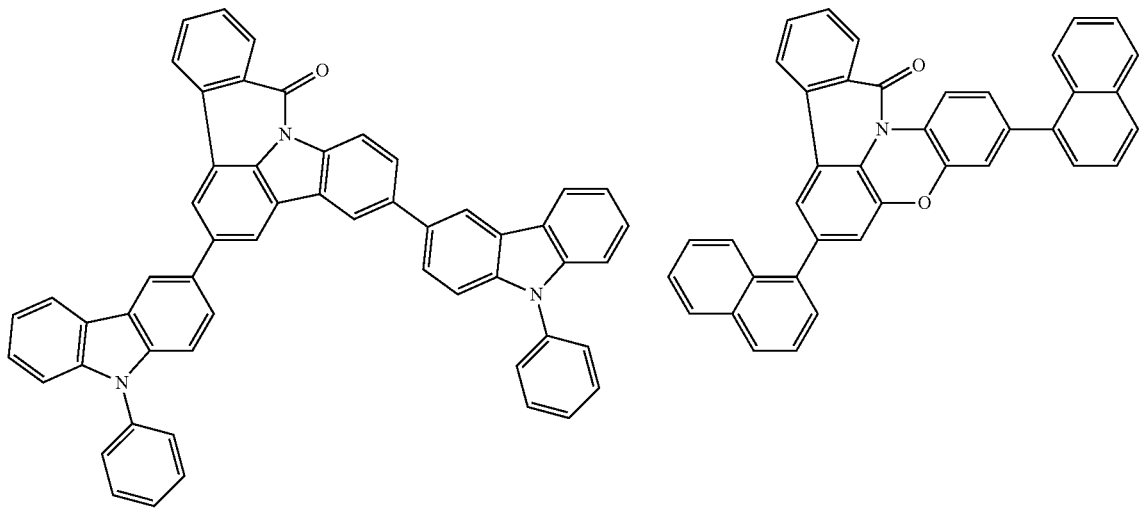
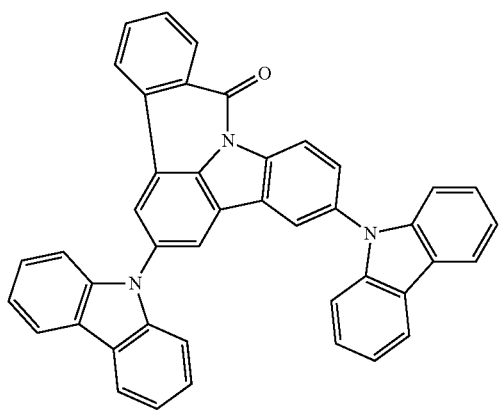

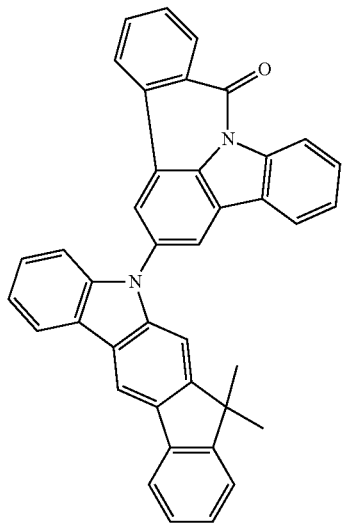
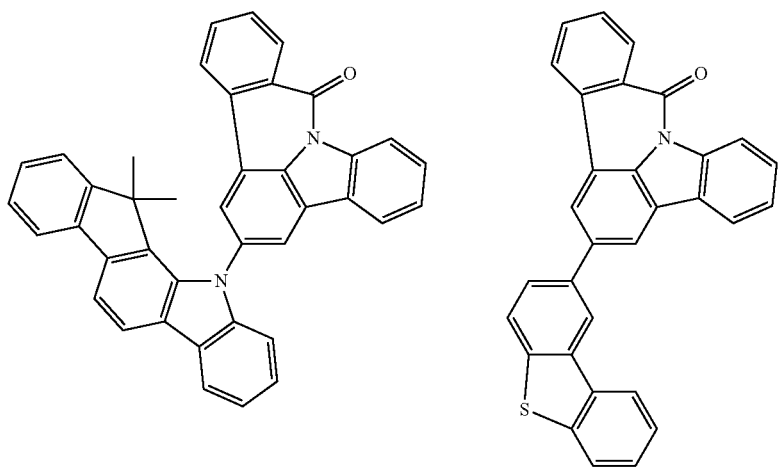
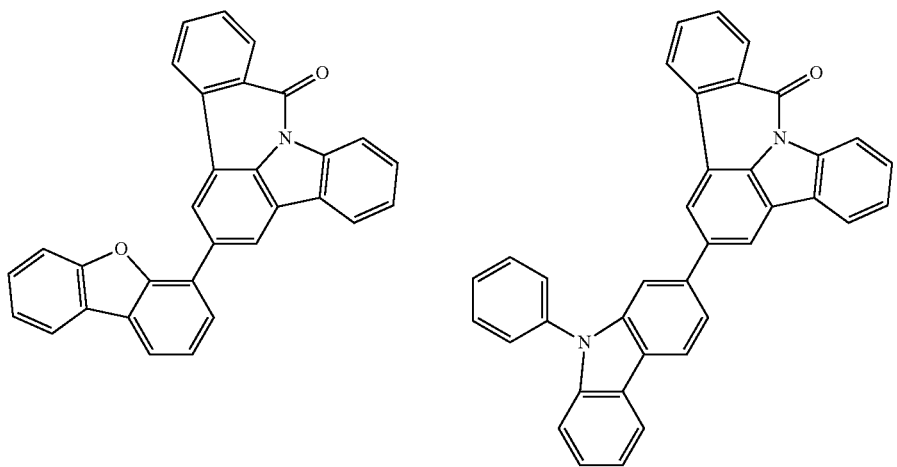

117
-continued
118
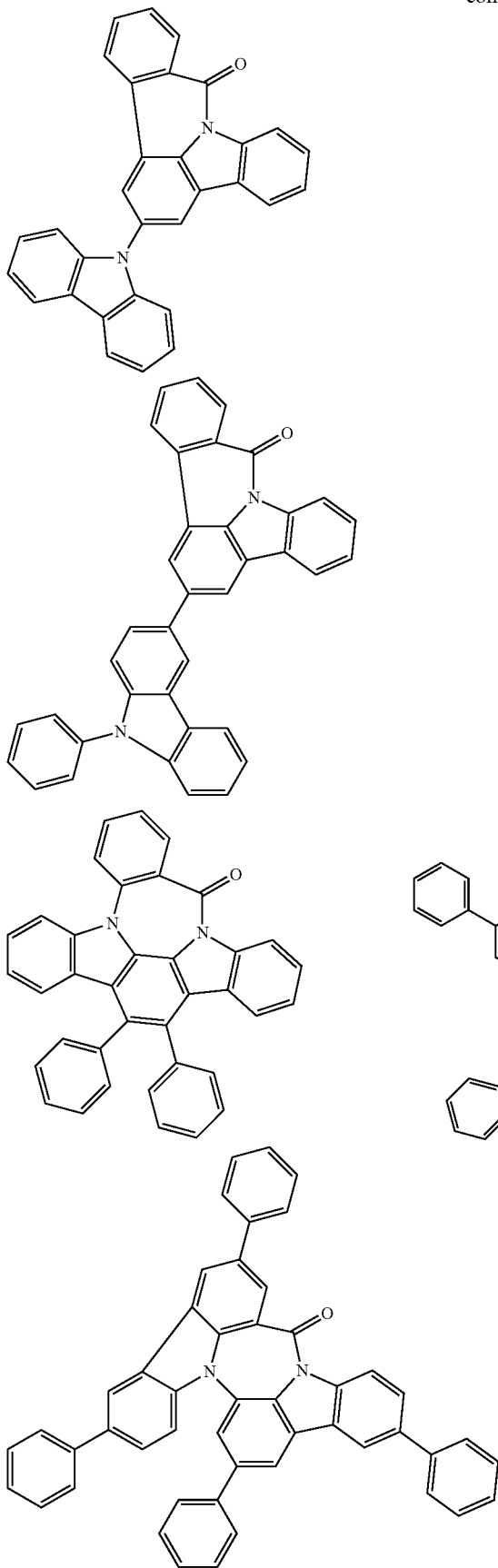
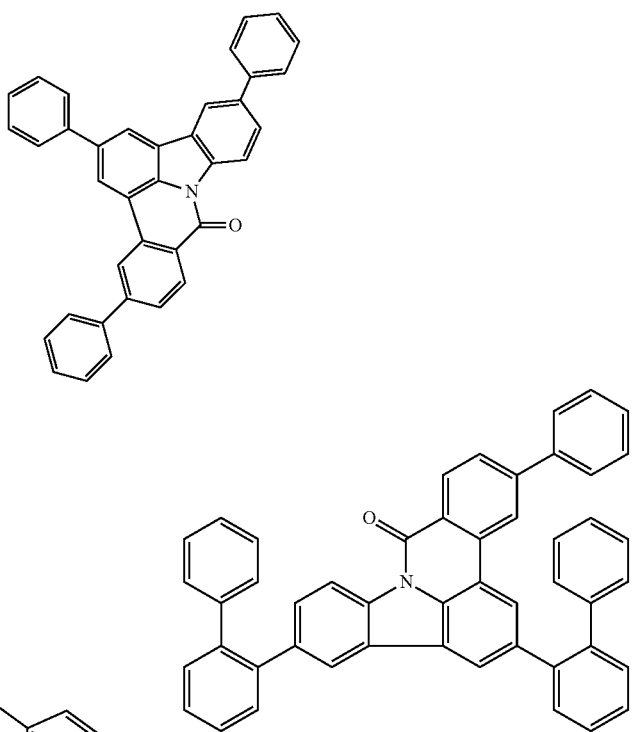

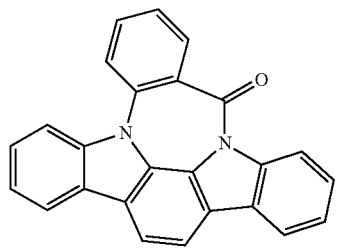
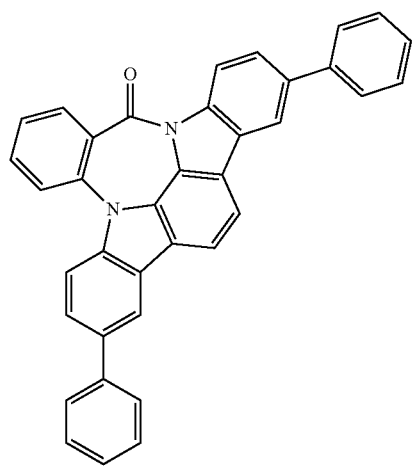
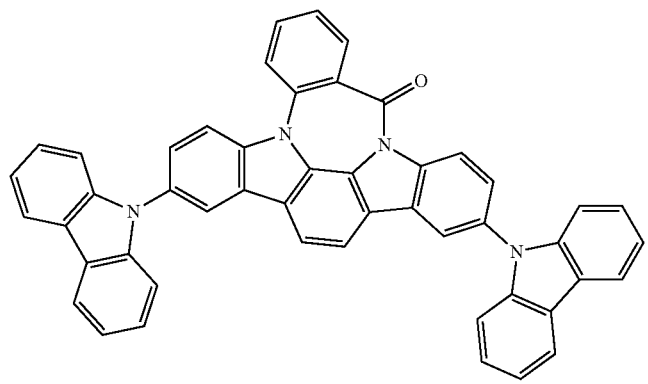
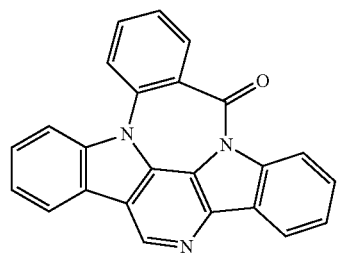
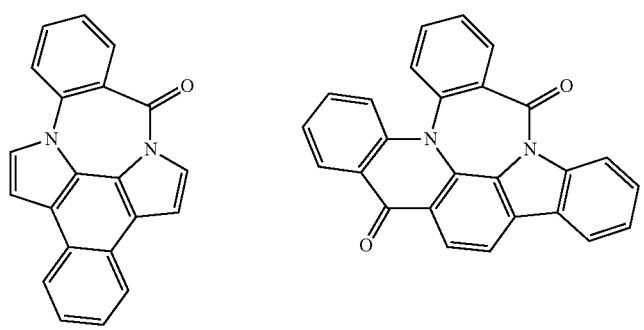

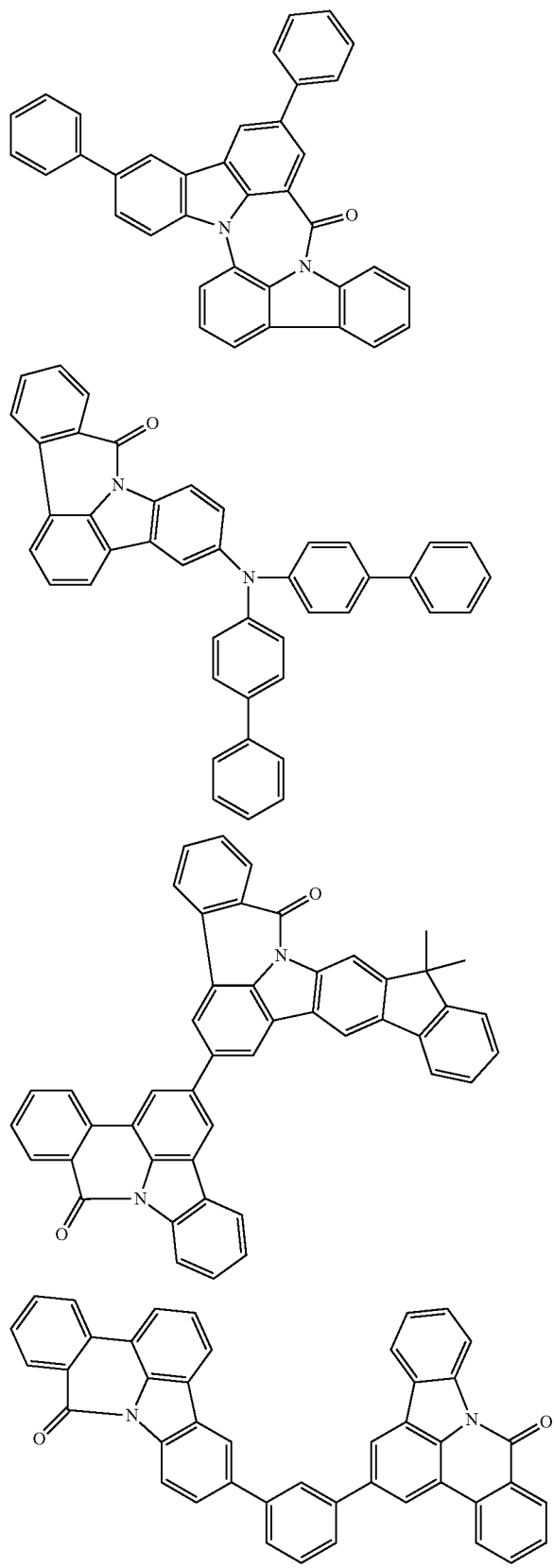

-continued
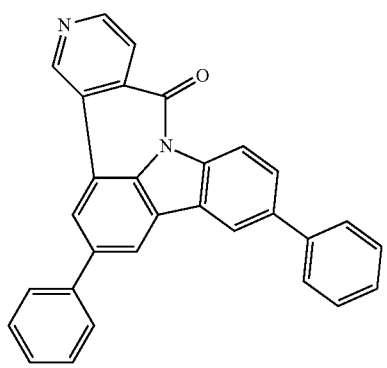
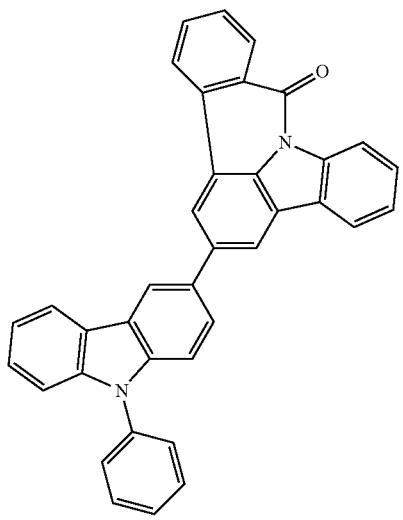
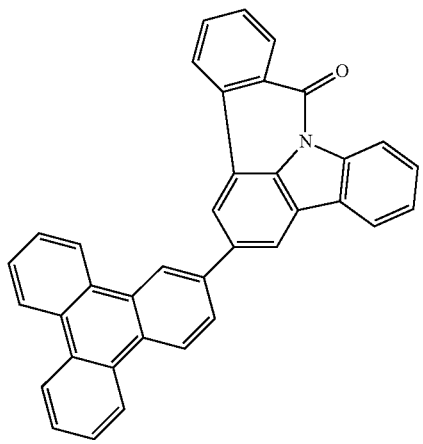
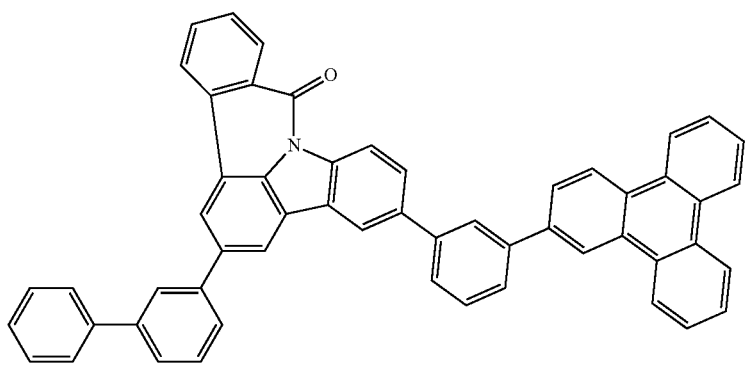

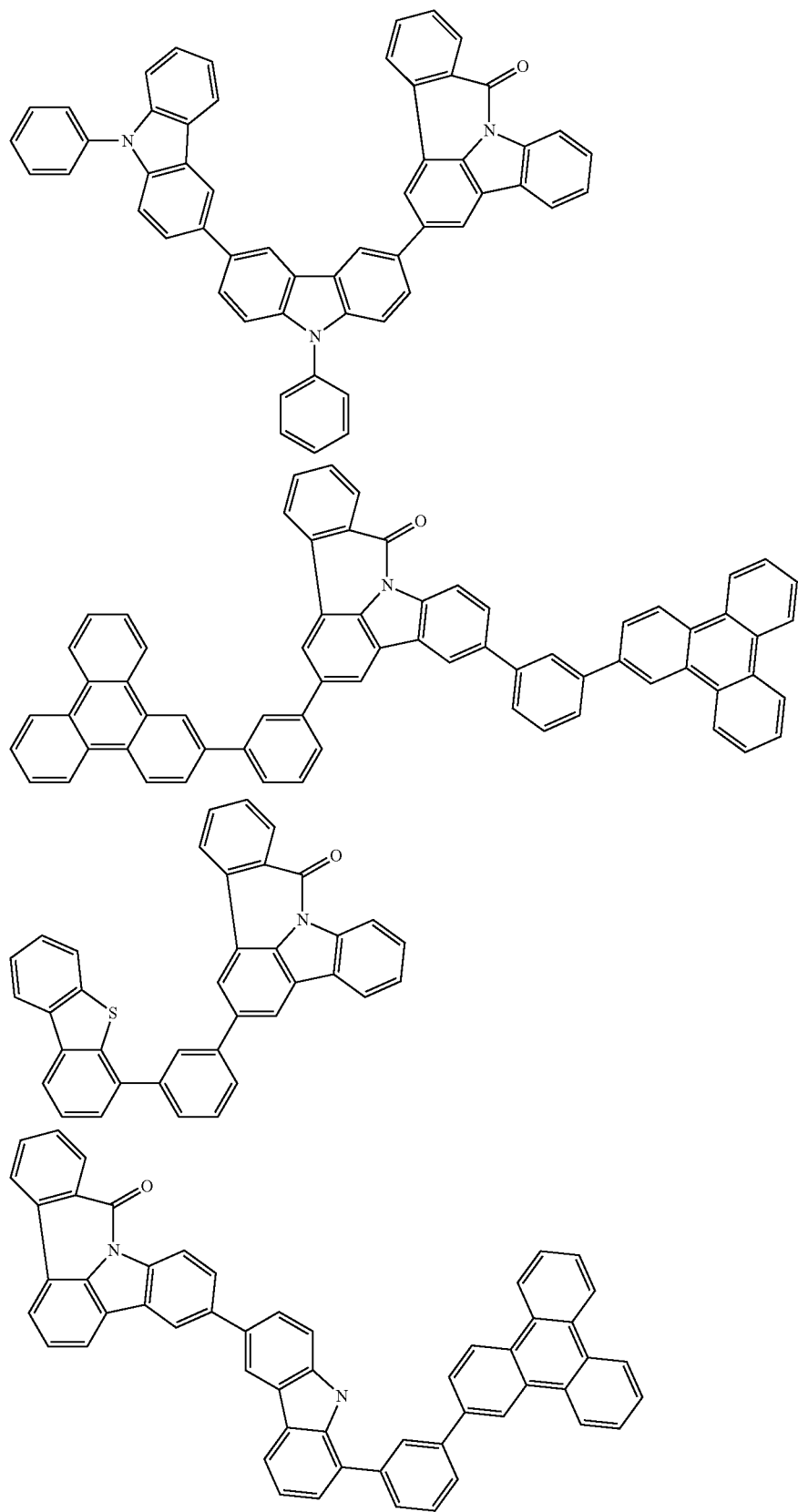

-continued
127
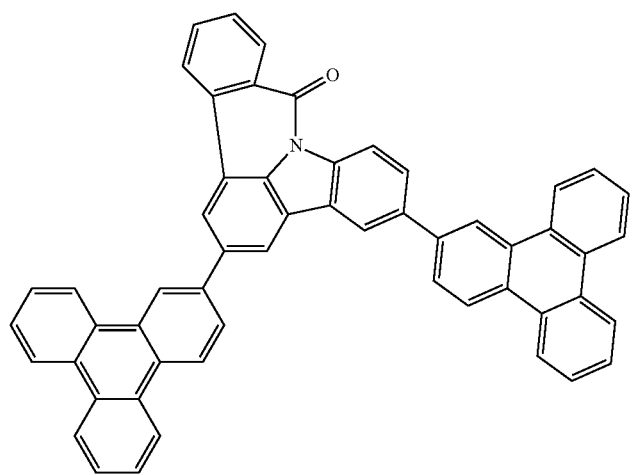
128
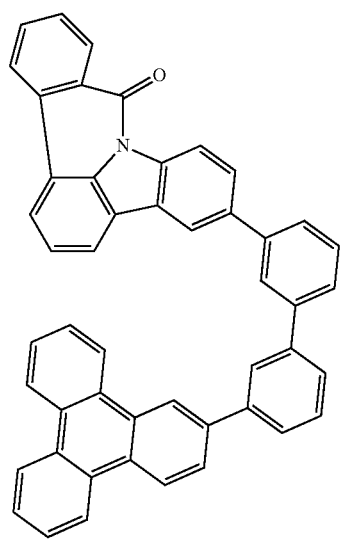
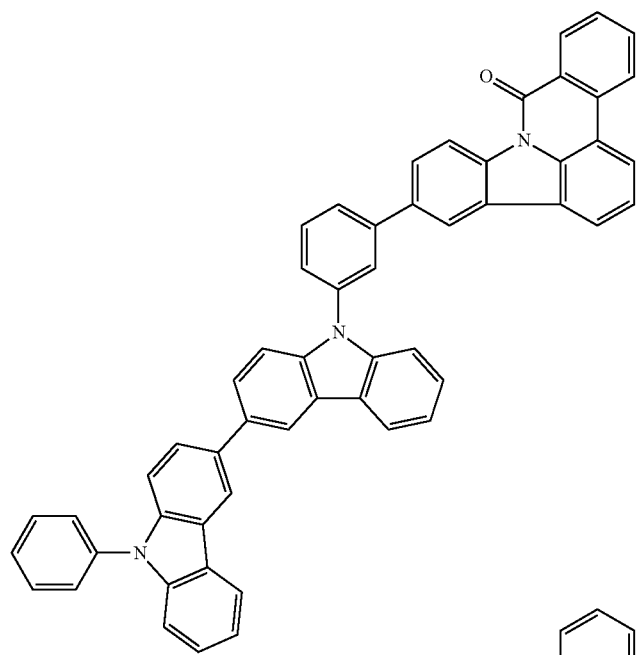
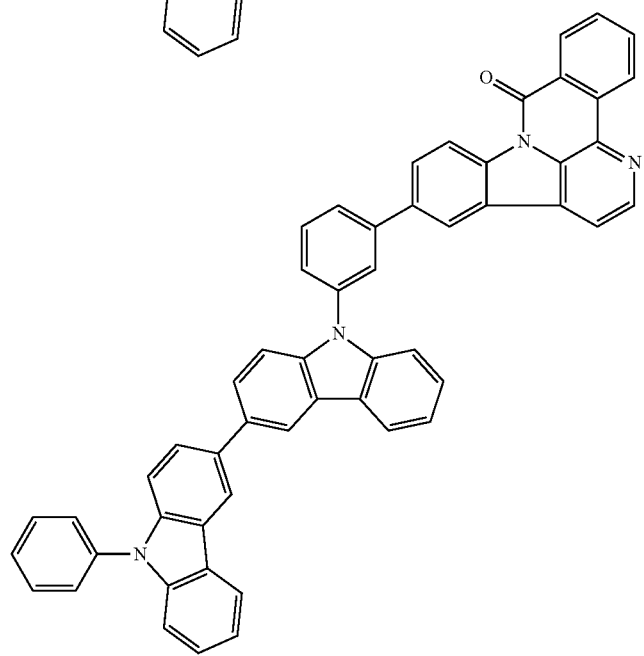

-continued
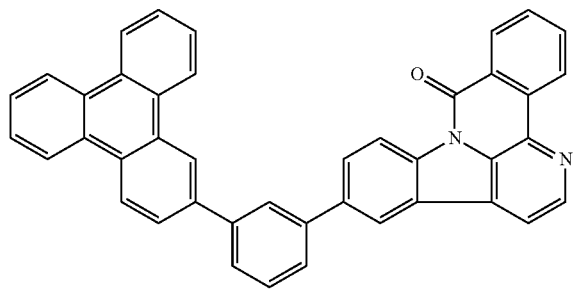
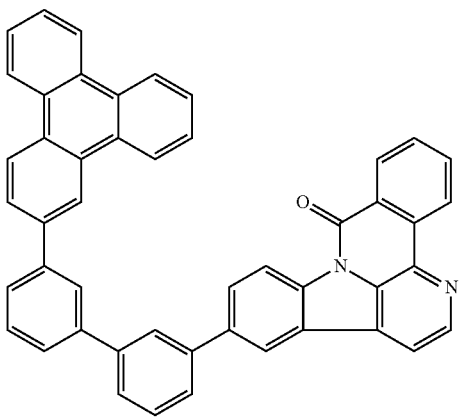
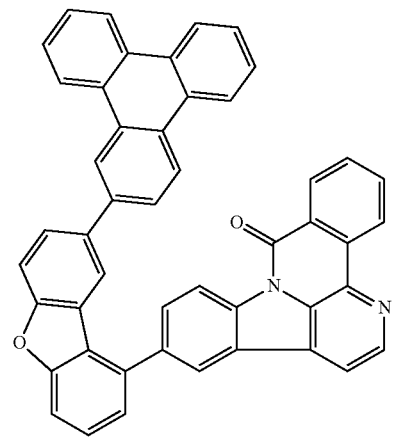
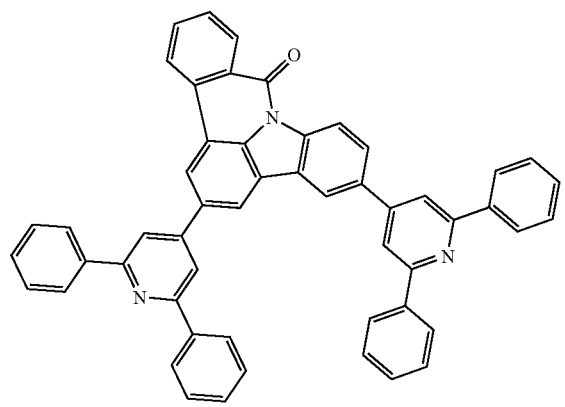
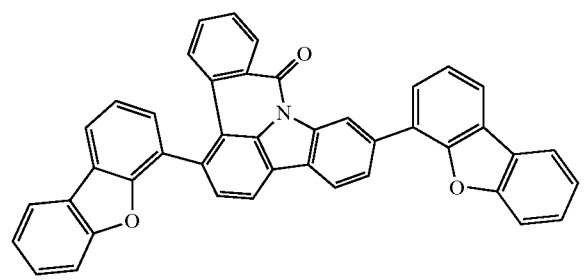

-continued
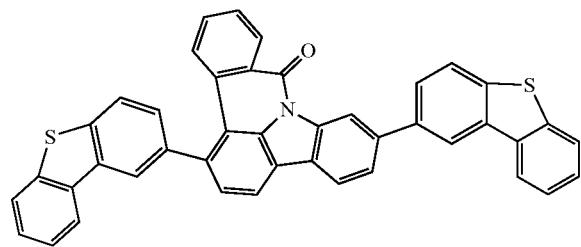
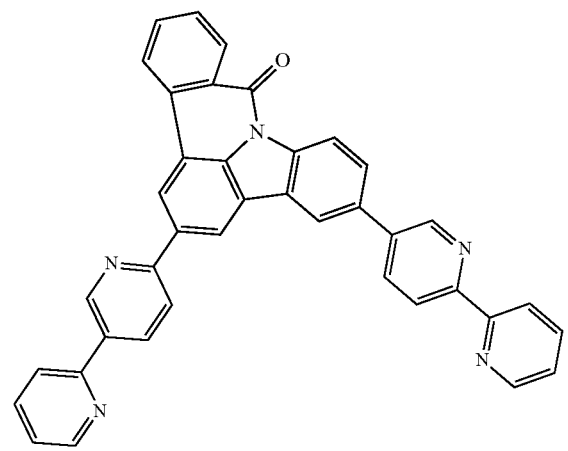
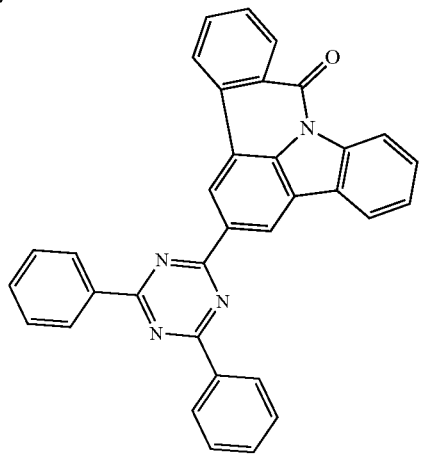
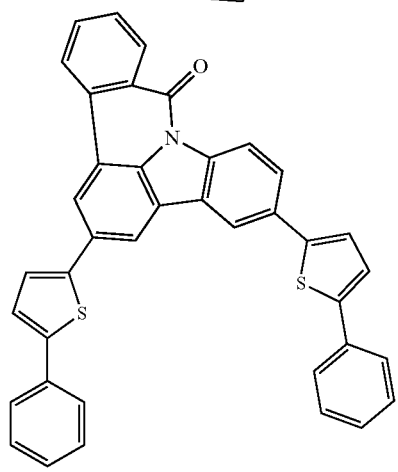

-continued
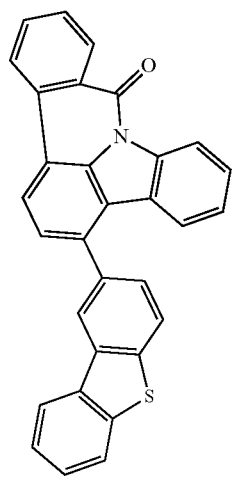
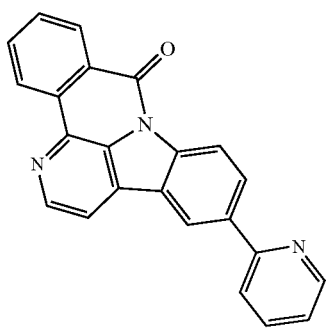
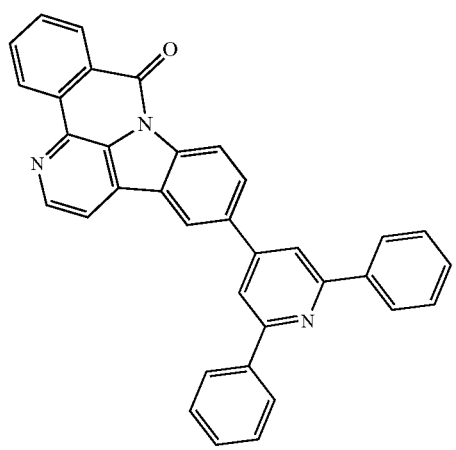
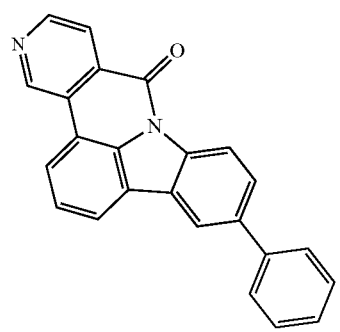 [SMILES: O=c1c2ccncc2c2cccc3c4cc(-c5ccccc5)ccc4n1c23]

-continued
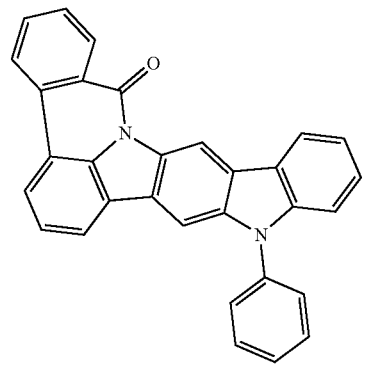
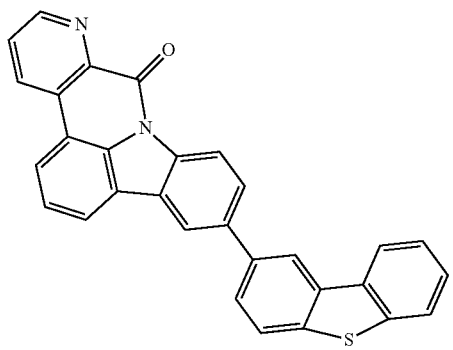
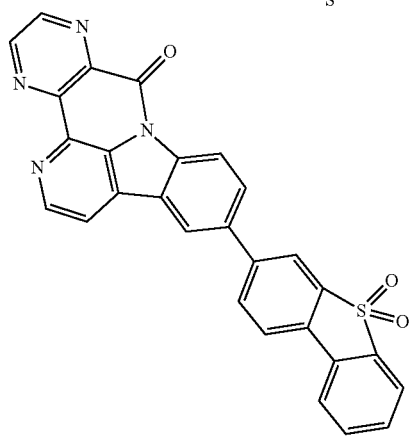
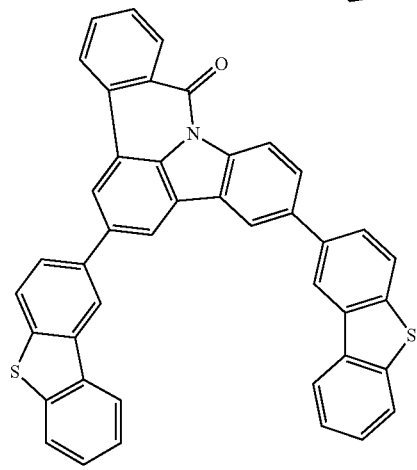

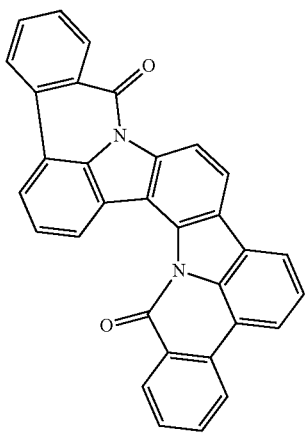
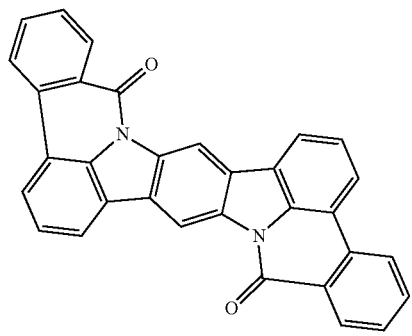
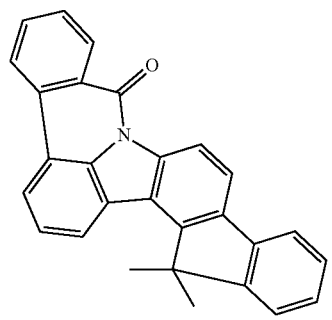
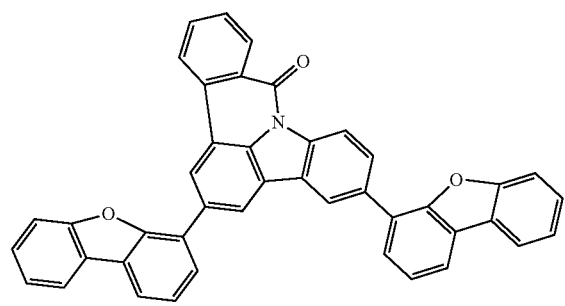

-continued
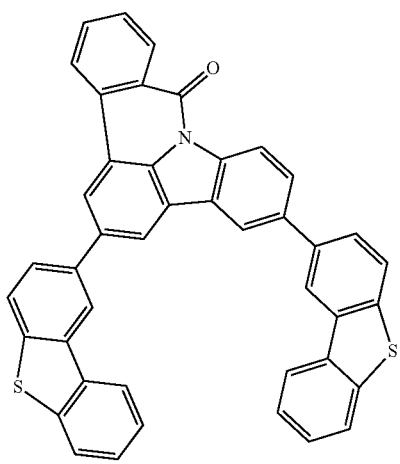
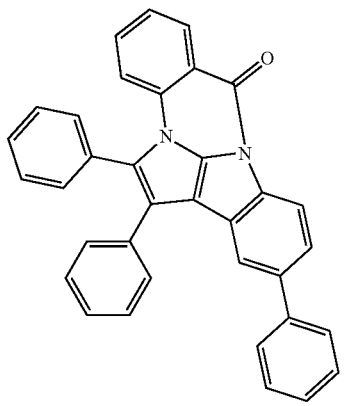
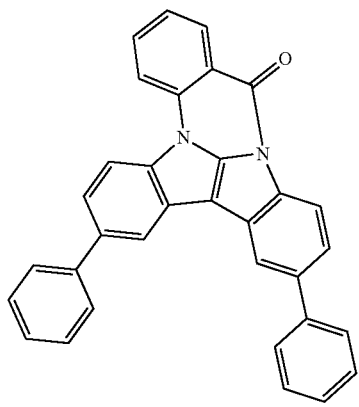
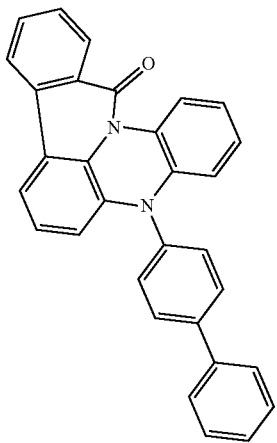

-continued
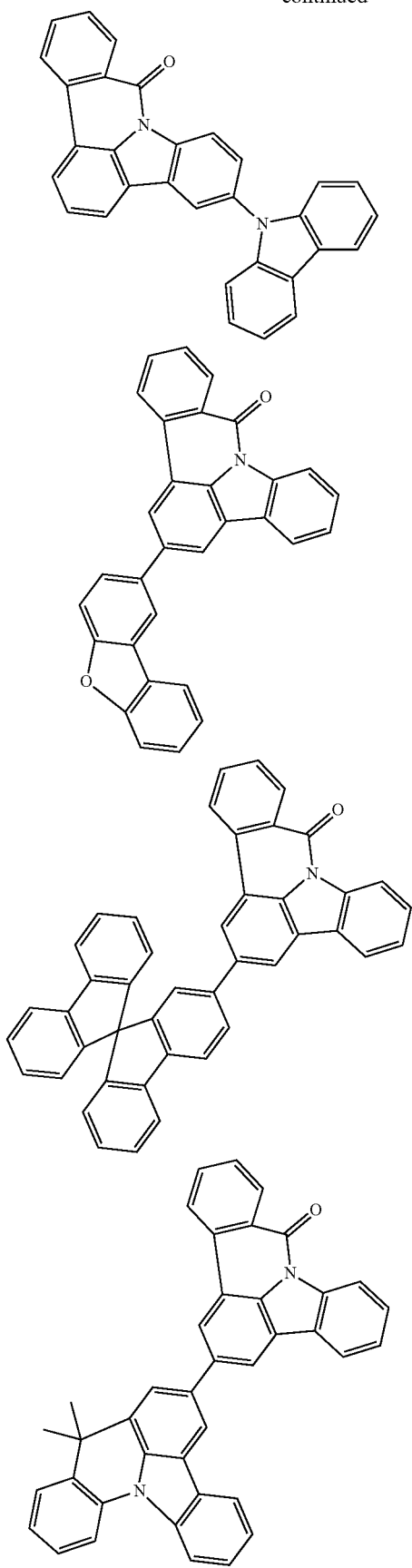

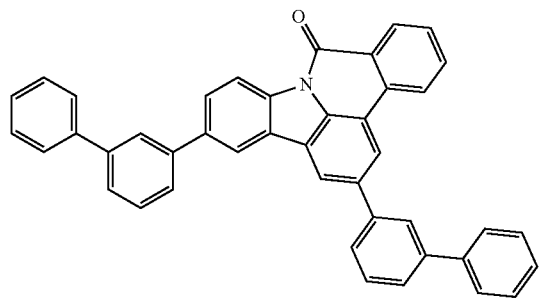
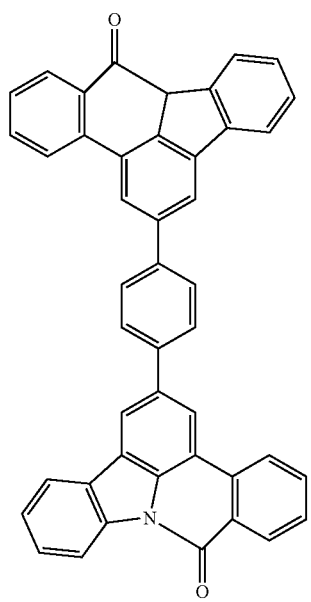
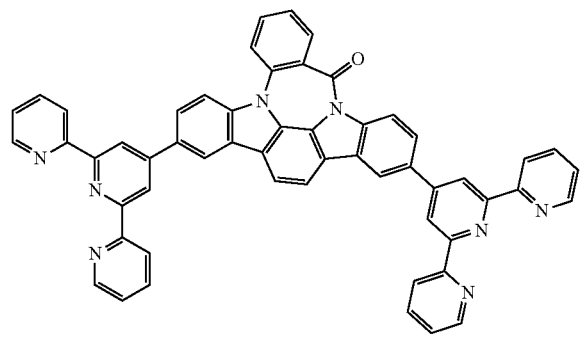
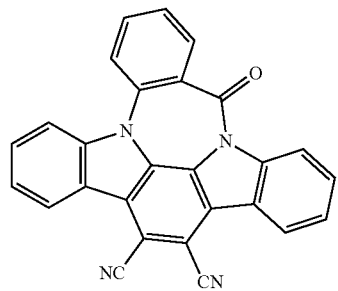

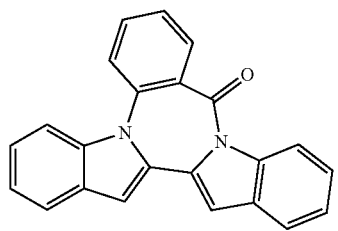
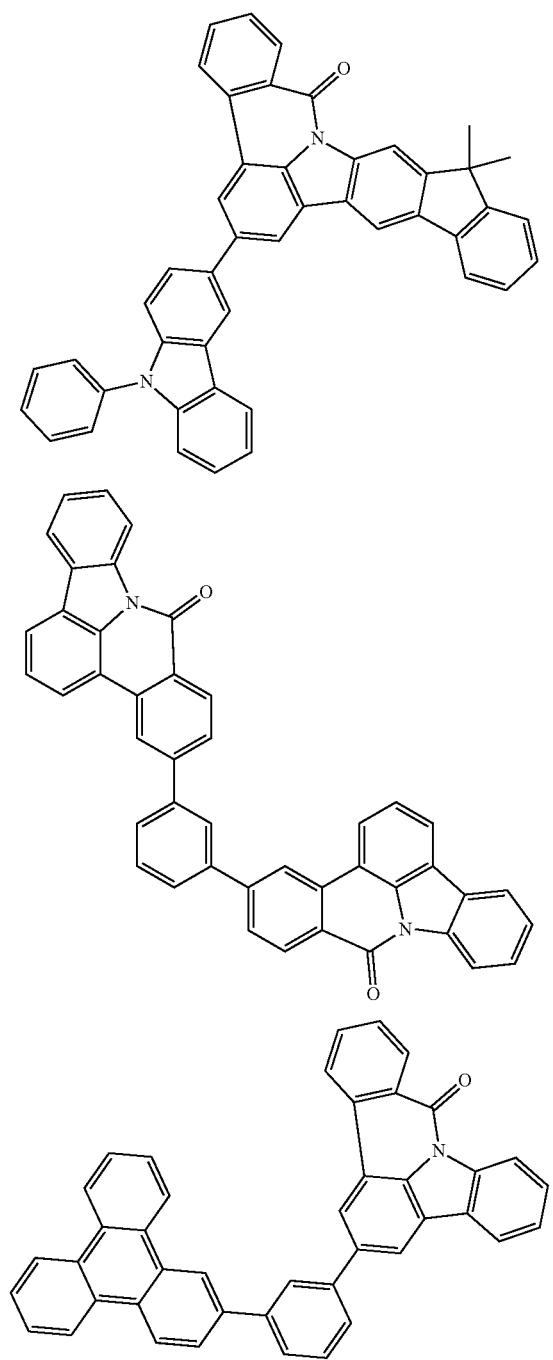

-continued
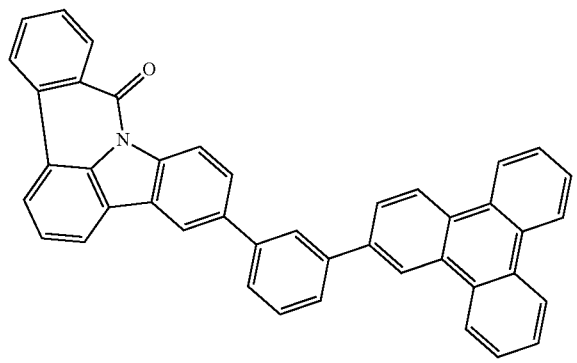
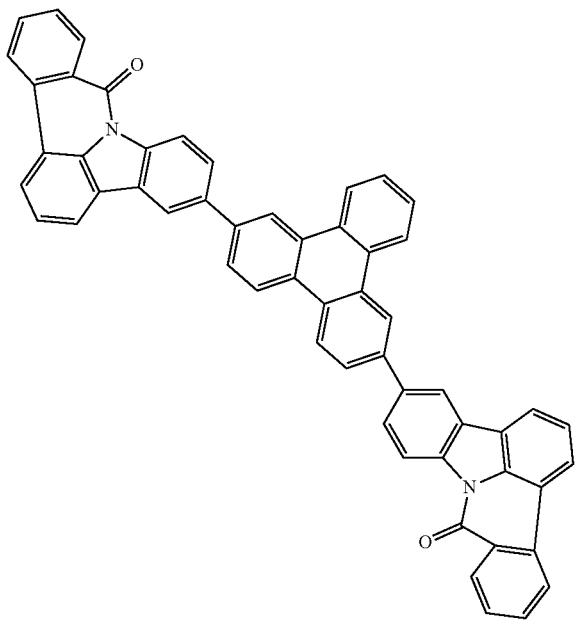
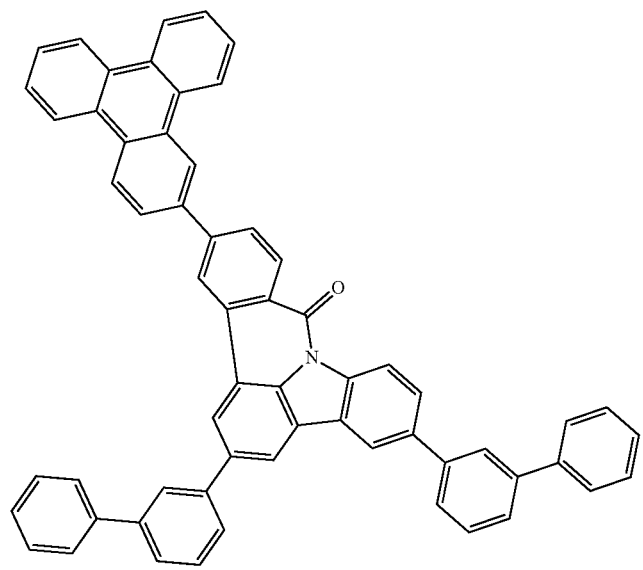

-continued

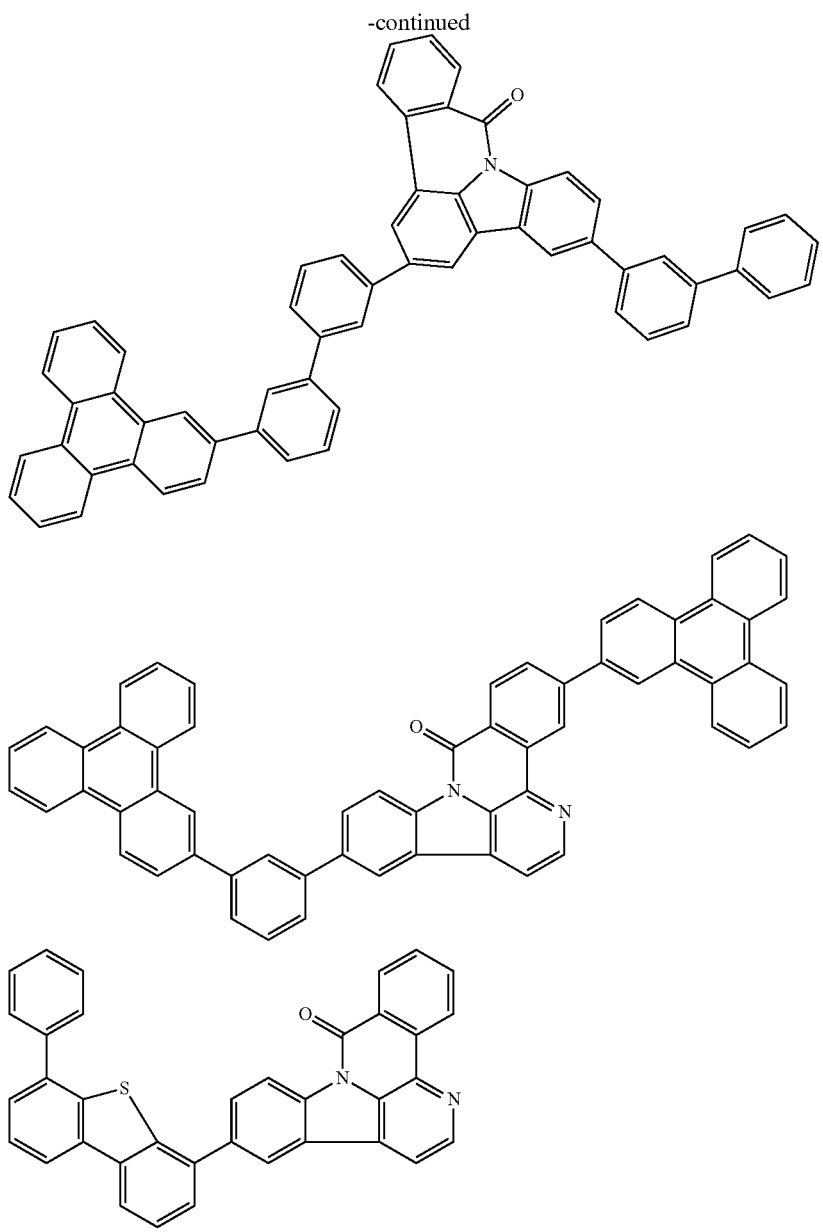

The concentration of the electron-transporting host in the composition of the invention is in the range from 5% by weight to 90% by weight, preferably in the range from 10% by weight to 85% by weight, more preferably in the range from 20% by weight to 85% by weight, even more preferably in the range from 30% by weight to 80% by weight, very particularly preferably in the range from 20% by weight to 60% by weight and most preferably in the range from 30% by weight to 50% by weight, based on the overall composition.

The concentration of the bipolar host in the composition is in the range from 10% by weight to 95% by weight, preferably in the range from 15% by weight to 90% by weight, more preferably in the range from 15% by weight to 80% by weight, even more preferably in the range from 20% by weight to 70% by weight, very particularly preferably in the range from 40% by weight to 80% by weight and most preferably in the range from 50% by weight to 70% by weight, based on the overall composition.

The composition of the invention may, in a further preferred embodiment, as well as a bipolar host and an electron-transporting host, also comprise further compounds, especially organic functional materials.

The present invention therefore also relates to a composition which, as well as the aforementioned materials, also comprises at least one further compound selected from the group consisting of hole injection materials, hole transport materials, hole blocker materials, wide band gap materials, fluorescent emitters, phosphorescent emitters, host materials, matrix materials, electron blocker materials, electron transport materials and electron injection materials, n-dopants and p-dopants. It does not present any difficulties at all to the person skilled in the art to select these from a multitude of materials that are known to such a person.

n-Dopants are understood herein to mean reducing agents, i.e. electron donors. Preferred examples of n-dopants are W(hpp)$_4$ and further electron-rich metal complexes according to WO 2005/086251 A2, P=N compounds (e.g. WO 2012/175535 A1, WO 2012/175219 A1), naphthylenecarbodiimides (e.g. WO 2012/168358 A1), fluorenes (e.g. WO 2012/031735 A1), radicals and diradicals (e.g. EP 1837926 A1, WO 2007/107306 A1), pyridines (e.g. EP 2452946 A1, EP 2463927 A1), N-heterocyclic compounds (e.g. WO 2009/000237 A1) and acridines and phenazines (e.g. US 2007/145355 A1).

p-Dopants are understood herein to mean oxidizing agents, i.e. electron acceptors. Preferred examples of p-dopants are $F_4$-TCNQ, $F_6$-TNAP, NDP-2 (from Novaled), NDP-9 (from Novaled), quinones (e.g. EP 1538684 A1, WO 2006/081780 A1, WO 2009/003455 A1, WO 2010/097433 A1), radialenes (e.g. EP 1988587 A1, US 2010/102709 A1, EP 2180029 A1, WO 2011/131185 A1, WO 2011134458 A1, US 2012/223296 A1), S-containing transition metal complexes (e.g. WO 2007/134873 A1, WO 2008/061517 A2, WO 2008/061518 A2, DE 102008051737 A1, WO 2009/089821 A1, US 2010/096600 A1), bisimidazoles (e.g. WO 2008/138580 A1), phthalocyanines (e.g. WO 2008/058525 A2), bora-tetraazapentalenes (e.g. WO 2007/115540 A1), fullerenes (e.g. DE 102010046040 A1) and main group halides (e.g. WO 2008/128519 A2).

A wide band gap material is understood herein to mean a material within the scope of the disclosure of U.S. Pat. No. 7,294,849 which is characterized by a band gap of at least 3.5 eV, the band gap being understood to mean the gap between the HOMO and LUMO energy of a material. These systems exhibit exceptional advantageous performance data in electroluminescent devices.

It is preferable when the composition of the invention comprising a bipolar host and an electron-transporting host additionally comprises at least one light-emitting compound or an emitter, particular preference being given to phosphorescent emitters.

The term "phosphorescent emitters" typically encompasses compounds where the light is emitted through a spin-forbidden transition from an excited state having high spin multiplicity, i.e. a spin state >1, for example through a transition from a triplet state or a state having an even higher spin quantum number, for example a quintet state. This is preferably understood to mean a transition from a triplet state.

Suitable phosphorescent emitters (=triplet emitters) are especially compounds which, when suitably excited, emit light, preferably in the visible region, and also contain at least one atom of atomic number greater than 20, preferably greater than 38 and less than 84, more preferably greater than 56 and less than 80, especially a metal having this atomic number. Preferred phosphorescence emitters used are compounds containing copper, molybdenum, tungsten, rhenium, ruthenium, osmium, rhodium, iridium, palladium, platinum, silver, gold or europium, especially compounds containing iridium or platinum. In the context of the present invention, all luminescent compounds containing the above-mentioned metals are regarded as phosphorescent emitters.

Examples of the above-described emitters can be found in applications WO 00/70655, WO 2001/41512, WO 2002/02714, WO 2002/15645, EP 1191613, EP 1191612, EP 1191614, WO 05/033244, WO 05/019373, US 2005/0258742, WO 2009/146770, WO 2010/015307, WO 2010/031485, WO 2010/054731, WO 2010/054728, WO 2010/086089, WO 2010/099852, WO 2010/102709, WO 2011/032626, WO 2011/066898, WO 2011/157339, WO 2012/007086, WO 2014/008982, WO 2014/023377, WO 2014/094961, WO 2014/094960, EP 13004411.8, EP 14000345.0, EP 14000417.7 and EP 14002623.8. In general, all phosphorescent complexes as used for phosphorescent OLEDs according to the prior art and as known to those skilled in the art in the field of organic electroluminescent devices are suitable, and the person skilled in the art will be able to use further phosphorescent complexes without exercising inventive skill.

Preferred fluorescent emitters are selected from the class of the arylamines. An arylamine or an aromatic amine in the context of this invention is understood to mean a compound containing three substituted or unsubstituted aromatic or heteroaromatic ring systems bonded directly to the nitrogen. Preferably, at least one of these aromatic or heteroaromatic ring systems is a fused ring system, more preferably having at least 14 aromatic ring atoms. Preferred examples of these are aromatic anthraceneamines, aromatic anthracenediamines, aromatic pyreneamines, aromatic pyrenediamines, aromatic chryseneamines or aromatic chrysenediamines. An aromatic anthraceneamine is understood to mean a compound in which a diarylamino group is bonded directly to an anthracene group, preferably in the 9 position. An aromatic anthracenediamine is understood to mean a compound in which two diarylamino groups are bonded directly to an anthracene group, preferably in the 9,10 positions. Aromatic pyreneamines, pyrenediamines, chryseneamines and chrysenediamines are defined analogously, where the diarylamino groups are bonded to the pyrene preferably in the 1 position or 1,6 positions. Further preferred fluorescent emitters are indenofluoreneamines or -diamines, for example according to WO 2006/108497 or WO 2006/122630, benzoindenofluoreneamines or -diamines, for example according to WO 2008/006449, and dibenzoindenofluoreneamines or -diamines, for example according to WO 2007/140847, and the indenofluorene derivatives having fused aryl groups disclosed in WO 2010/012328.

In a further preferred embodiment of the invention, the composition of the invention is used as a component of mixed matrix systems. The mixed matrix systems preferably comprise three or four different matrix materials, more preferably three different matrix materials (in other words, one further matrix component in addition to the composition of the invention). Examples of suitable matrix materials which can be used in combination with the composition of the invention as matrix components in a mixed matrix system are selected from wide band gap materials, electron transport materials (ETM) and hole transport materials (HTM).

Preference is given to using mixed matrix systems in phosphorescent organic electroluminescent devices. One source of more detailed information about mixed matrix systems is the application WO 2010/108579. Particularly suitable matrix materials which can be used in combination with the composition of the invention as matrix components of a mixed matrix system in phosphorescent or fluorescent organic electroluminescent devices are selected from the preferred matrix materials specified below for phosphorescent emitters or the preferred matrix materials for fluorescent emitters, according to what type of emitter is used.

Useful further matrix materials, preferably for fluorescent emitters, as well as the composition of the invention comprising the bipolar host and the electron-transporting host, include various substance classes. Preferred further matrix materials are selected from the classes of the oligoarylenes (e.g. 2,2',7,7'-tetraphenylspirobifluorene according to EP 676461 or dinaphthylanthracene), especially of the oligoarylenes containing fused aromatic groups, the oligoarylenevinylenes (e.g. DPVBi or spiro-DPVBi according to EP 676461), the polypodal metal complexes (for example according to WO 2004/081017), the hole-conducting compounds (for example according to WO 2004/058911), the electron-conducting compounds, especially ketones, phosphine oxides, sulfoxides, etc. (for example according to WO 2005/084081 and WO 2005/084082), the atropisomers (for example according to WO 2006/048268), the boronic acid derivatives (for example according to WO 2006/117052) or the benzanthracenes (for example according to WO 2008/145239). Particularly preferred matrix materials are selected from the classes of the oligoarylenes comprising naphthalene, anthracene, benzanthracene and/or pyrene or atropisomers of these compounds, the oligoarylenevinylenes, the ketones, the phosphine oxides and the sulfoxides. Very particularly preferred matrix materials are selected from the classes of the oligoarylenes comprising anthracene, benzanthracene, benzophenanthrene and/or pyrene or atropisomers of these compounds. An oligoarylene in the context of this invention shall be understood to mean a compound in which at least three aryl or arylene groups are bonded to one another.

Preferred further matrix materials for phosphorescent emitters are, as well as the composition of the invention comprising the bipolar host and the electron-transporting host, aromatic amines, especially triarylamines, for example according to US 2005/0069729, carbazole derivatives (e.g. CBP, N,N-biscarbazolylbiphenyl) or compounds according to WO 2005/039246, US 2005/0069729, JP 2004/288381, EP 1205527 or WO 2008/086851, bridged carbazole derivatives, for example according to WO 2011/088877 and WO 2011/128017, indenocarbazole derivatives, for example according to WO 2010/136109 and WO 2011/000455, azacarbazole derivatives, for example according to EP 1617710, EP 1617711, EP 1731584, JP 2005/347160, indolocarbazole derivatives, for example according to WO 2007/063754 or WO 2008/056746, ketones, for example according to WO 2004/093207 or WO 2010/006680, phosphine oxides, sulfoxides and sulfones, for example according to WO 2005/003253, oligophenylenes, bipolar matrix materials, for example according to WO 2007/137725, silanes, for example according to WO 2005/111172, azaboroles or boronic esters, for example according to WO 2006/117052, triazine derivatives, for example according to WO 2010/015306, WO 2007/063754 or WO 2008/056746, zinc complexes, for example according to EP 652273 or WO 2009/062578, aluminium complexes, e.g. BAlq, diazasilole derivatives and tetraazasilole derivatives, for example according to WO 2010/054729, diazaphosphole derivatives, for example according to WO 2010/054730, and aluminium complexes, e.g. BAlQ.

In an alternative embodiment of the present invention, the composition, aside from the constituents of bipolar host and electron-transporting host, does not contain any further constituents, i.e. any functional materials.

The composition of the invention is suitable for use in an organic electronic device. An organic electronic device is understood here to mean a device containing at least one layer containing at least one organic compound. The device may also comprise inorganic materials or else layers formed entirely from inorganic materials.

The components or constituents of the compositions may be processed by vapour deposition or from solution. If the compositions are applied from solution, formulations of the composition of the invention comprising at least one further solvent are required. These formulations may, for example, be solutions, dispersions or emulsions. For this purpose, it may be preferable to use mixtures of two or more solvents.

The present invention therefore further provides a formulation comprising a composition of the invention and at least one solvent.

Suitable and preferred solvents are, for example, toluene, anisole, o-, m- or p-xylene, methyl benzoate, mesitylene, tetralin, veratrole, THF, methyl-THF, THP, chlorobenzene, dioxane, phenoxytoluene, especially 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, methyl benzoate, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane, hexamethylindane or mixtures of these solvents.

The formulation may also comprise at least one further organic or inorganic compound which is likewise used in the electronic device, especially an emitting compound, especially a phosphorescent emitter and/or a further matrix material. Suitable emitting compounds and further matrix materials have already been detailed above.

The present invention also provides for the use of the composition of the invention in an organic electronic device, preferably in an electron-transporting layer and/or in an emitting layer.

The organic electronic device is preferably selected from organic integrated circuits (OICs), organic field-effect transistors (OFETs), organic thin-film transistors (OTFTs), organic electroluminescent devices, organic solar cells (OSCs), organic optical detectors and organic photoreceptors, particular preference being given to organic electroluminescent devices.

Very particularly preferred organic electroluminescent devices for the use of the composition of the invention are organic light-emitting transistors (OLETs), organic field-quench devices (OFQDs), organic light-emitting electrochemical cells (OLECs, LECs, LEECs), organic laser diodes (O-lasers) and organic light-emitting diodes (OLEDs); OLECs and OLEDs are especially preferred and OLEDs are most preferred.

Preferably, the composition of the invention comprising the bipolar host and the electron-transporting host is used in an electronic device in a layer with electron-transporting function. The layer is preferably an electron injection layer (EIL), an electron transport layer (ETL), a hole blocker layer (HBL) and/or an emission layer (EML), more preferably an ETL, EIL and/or an EML. Most preferably, the composition of the invention is used in an EML, especially as matrix material.

Therefore, the present invention still further provides an organic electronic device which is especially selected from one of the aforementioned electronic devices and which comprises the composition of the invention comprising a bipolar host and an electron-transporting host, preferably in an emission layer (EML), in an electron transport layer (ETL), in an electron injection layer (EIL) and/or in a hole blocker layer (HBL), very preferably in an EML, EIL and/or ETL and most preferably in an EML.

When the layer is an emitting layer, it is especially preferably a phosphorescent layer which is characterized in that it comprises a phosphorescent emitter in addition to the composition comprising the bipolar host and the electron-transporting host.

In a particularly preferred embodiment of the present invention, therefore, the electronic device is an organic electroluminescent device, most preferably an organic light-emitting diode (OLED), comprising the composition of the invention comprising a bipolar host and an electron-transporting host together with a phosphorescent emitter in the emission layer (EML).

The composition composed of bipolar host and electron-transporting host according to the preferred embodiments and the emitting compound preferably contains between 99.9% and 1% by volume, further preferably between 99% and 10% by volume, especially preferably between 98% and 60% by volume, very especially preferably between 97% and 80% by volume, of matrix material composed of bipolar and electron-transporting host according to the preferred embodiments, based on the overall mixture of emitter and matrix material. Correspondingly, the composition preferably contains between 0.1% and 99% by volume, further preferably between 1% and 90% by volume, more preferably between 2% and 40% by volume, most preferably between 3% and 20% by volume, of the emitter based on the overall mixture of emitter and matrix material. If the compounds are processed from solution, preference is given to using the corresponding amounts in % by weight rather than the above-specified amounts in % by volume.

Apart from the cathode, anode and the layer comprising the composition of the invention, an electronic device may comprise further layers. These are selected, for example, from in each case one or more hole injection layers, hole transport layers, hole blocker layers, emitting layers, electron transport layers, electron injection layers, electron blocker layers, exciton blocker layers, interlayers, charge generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*) and/or organic or inorganic p/n junctions. However, it should be pointed out that not necessarily every one of these layers need be present.

The sequence of layers in an organic electroluminescent device is preferably as follows:
anode/hole injection layer/hole transport layer/emitting layer/electron transport layer/electron injection layer/cathode.

At the same time, it should be pointed out again that not all the layers mentioned need be present and/or that further layers may additionally be present.

An organic electroluminescent device comprising the composition of the invention may comprise multiple emitting layers. More preferably, these emission layers in this case have several emission maxima between 380 nm and 750 nm overall, such that the overall result is white emission; in other words, various emitting compounds which may fluoresce or phosphoresce and which emit blue or yellow or orange or red light are used in the emitting layers. Especially preferred are three-layer systems, i.e. systems having three emitting layers, where the three layers show blue, green and orange or red emission (for the basic construction see, for example, WO 2005/011013). It should be noted that, for the production of white light, rather than a plurality of colour-emitting emitter compounds, an emitter compound used individually which emits over a broad wavelength range may also be suitable.

Suitable charge transport materials as usable in the hole injection or hole transport layer or electron blocker layer or in the electron transport layer of the organic electroluminescent device of the invention are, for example, the compounds disclosed in Y. Shirota et al., Chem. Rev. 2007, 107(4), 953-1010, or other materials as used in these layers according to the prior art.

Materials used for the electron transport layer may be any materials as used according to the prior art as electron transport materials in the electron transport layer. Especially suitable are aluminium complexes, for example $Alq_3$, zirconium complexes, for example $Zrq_4$, benzimidazole derivatives, triazine derivatives, pyrimidine derivatives, pyridine derivatives, pyrazine derivatives, quinoxaline derivatives, quinoline derivatives, oxadiazole derivatives, aromatic ketones, lactams, boranes, diazaphosphole derivatives and phosphine oxide derivatives. Further suitable materials are derivatives of the abovementioned compounds as disclosed in JP 2000/053957, WO 2003/060956, WO 2004/028217, WO 2004/080975 and WO 2010/072300.

Preferred hole transport materials are especially materials which can be used in a hole transport, hole injection or electron blocker layer, such as indenofluoreneamine derivatives (for example according to WO 06/122630 or WO 06/100896), the amine derivatives disclosed in EP 1661888, hexaazatriphenylene derivatives (for example according to WO 01/049806), amine derivatives having fused aromatic systems (for example according to U.S. Pat. No. 5,061,569), the amine derivatives disclosed in WO 95/09147, monobenzoindenofluoreneamines (for example according to WO 08/006449), dibenzoindenofluoreneamines (for example according to WO 07/140847), spirobifluoreneamines (for example according to WO 2012/034627 or the as yet unpublished EP 12000929.5), fluoreneamines (for example according to EP 12005369.9, EP 12005370.7 and EP 12005371.5), spirodibenzopyranamines (for example according to the as yet unpublished application EP 11009127.9) and dihydroacridine derivatives (for example according to the as yet unpublished EP 11007067.9).

Preferred cathodes of electronic devices are metals having a low work function, metal alloys or multilayer structures composed of various metals, for example alkaline earth metals, alkali metals, main group metals or lanthanoids (e.g. Ca, Ba, Mg, Al, In, Mg, Yb, Sm, etc.). Additionally suitable are alloys composed of an alkali metal or alkaline earth metal and silver, for example an alloy composed of magnesium and silver. In the case of multilayer structures, in addition to the metals mentioned, it is also possible to use further metals having a relatively high work function, for example Ag or Al, in which case combinations of the metals such as Ca/Ag, Mg/Ag or Ba/Ag, for example, are generally used. It may also be preferable to introduce a thin interlayer of a material having a high dielectric constant between a metallic cathode and the organic semiconductor. Examples of useful materials for this purpose are alkali metal or alkaline earth metal fluorides, but also the corresponding oxides or carbonates (e.g. LiF, $Li_2O$, $BaF_2$, MgO, NaF, CsF, $Cs_2CO_3$, etc.). It is also possible to use lithium quinolinate (LiQ) for this purpose. The layer thickness of this layer is preferably between 0.5 and 5 nm.

Preferred anodes are materials having a high work function. Preferably, the anode has a work function of greater than 4.5 eV versus vacuum. Firstly, metals having a high redox potential are suitable for this purpose, for example Ag, Pt or Au. Secondly, metal/metal oxide electrodes (e.g. Al/Ni/

NiO$_x$, Al/PtO$_x$) may also be preferred. For some applications, at least one of the electrodes has to be transparent or partly transparent in order to enable the irradiation of the organic material (organic solar cell) or the emission of light (OLED, O-laser). Preferred anode materials here are conductive mixed metal oxides. Particular preference is given to indium tin oxide (ITO) or indium zinc oxide (IZO). Preference is further given to conductive doped organic materials, especially conductive doped polymers. In addition, the anode may also consist of two or more layers, for example of an inner layer of ITO and an outer layer of a metal oxide, preferably tungsten oxide, molybdenum oxide or vanadium oxide.

The organic electronic device, in the course of production, is appropriately (according to the application) structured, contact-connected and finally sealed, since the lifetime of the devices of the invention is shortened in the presence of water and/or air.

In a further preferred embodiment, the organic electronic device comprising the composition of the invention is characterized in that one or more organic layers comprising the composition of the invention are coated by a sublimation method. In this case, the materials are applied by vapour deposition in vacuum sublimation systems at an initial pressure of less than $10^{-5}$ mbar, preferably less than $10^{-6}$ mbar. In this case, however, it is also possible that the initial pressure is even lower, for example less than 10-7 mbar.

Preference is likewise given to an organic electroluminescent device, characterized in that one or more layers are coated by the OVPD (organic vapour phase deposition) method or with the aid of a carrier gas sublimation. In this case, the materials are applied at a pressure between $10^{-5}$ mbar and 1 bar. A special case of this method is the OVJP (organic vapour jet printing) method, in which the materials are applied directly by a nozzle and thus structured (for example M. S. Arnold et al., Appl. Phys. Lett. 2008, 92, 053301).

Preference is additionally given to an organic electroluminescent device, characterized in that one or more organic layers comprising the composition of the invention are produced from solution, for example by spin-coating, or by any printing method, for example screen printing, flexographic printing, nozzle printing or offset printing, but more preferably LITI (light-induced thermal imaging, thermal transfer printing) or inkjet printing. For this purpose, soluble compounds of the components of the composition of the invention are needed. High solubility can be achieved by suitable substitution of the corresponding compounds. Processing from solution has the advantage that the layer comprising the composition of the invention can be applied in a very simple and inexpensive manner. This technique is especially suitable for the mass production of organic electronic devices.

In addition, hybrid methods are possible, in which, for example, one or more layers are applied from solution and one or more further layers are applied by vapour deposition.

These methods are known in general terms to those skilled in the art and can be applied by those skilled in the art without exercising inventive skill to organic electroluminescent devices.

The present invention therefore further provides a process for producing an organic electronic device, characterized in that at least one organic layer comprising the composition of the invention is applied by gas phase deposition, especially by a sublimation method and/or by an OVPD (organic vapour phase deposition) method and/or with the aid of carrier gas sublimation, and/or in that at least one organic layer comprising the composition of the invention is applied from solution, especially by spin-coating or by a printing method.

In the production of an organic electronic device by means of gas phase deposition, there are two methods in principle by which an organic layer which is to comprise the composition of the invention and which may comprise multiple different constituents can be applied, or applied by vapour deposition, to any substrate. Firstly, the materials used can each be initially charged in a material source and ultimately evaporated from the different material sources ("co-evaporation"). Secondly, the various materials can be premixed and the mixture can be initially charged in a single material source from which it is ultimately evaporated ("premix evaporation"). In this way, it is possible in a simple and rapid manner to achieve the vapour deposition of a layer with homogeneous distribution of the components without a need for precise actuation of a multitude of material sources.

In a preferred embodiment of the present invention, the at least one organic layer is therefore applied by means of gas phase deposition, wherein the constituents of the composition are premixed and evaporated from a single material source.

The compositions of the invention and the devices of the invention feature the following surprising advantages over the prior art:

1. The use of the compositions of the invention in organic electronic devices, especially in an organic electroluminescent device, and especially in an OLED or OLEC, leads to distinct increases in the lifetimes of the devices.
2. The compositions of the invention are of very good suitability for use in an emission layer and show improved performance data, especially lifetime, compared to compounds from the prior art, especially also in the case that the light-emitting compound is present/has been incorporated by doping in low concentrations down to about 5% by weight in the emission layer.
3. The compositions of the invention can easily be processed and are therefore of very good suitability for mass production in commercial use.
4. The compositions of the invention can be premixed and vapour-deposited from a single material source, and so it is possible in a simple and rapid manner to produce an organic layer with homogeneous distribution of the components used.

These abovementioned advantages are not accompanied by a deterioration in the further electronic properties of an electronic device.

It should be pointed out that variations of the embodiments described in the present invention are covered by the scope of this invention. Any feature disclosed in the present invention may, unless this is explicitly ruled out, be exchanged for alternative features which serve the same purpose or an equivalent or similar purpose. Any feature disclosed in the present invention, unless stated otherwise, should therefore be considered as an example from a generic series or as an equivalent or similar feature.

All features of the present invention may be combined with one another in any manner, unless particular features and/or steps are mutually exclusive. This is especially true of preferred features of the present invention. Equally, features of non-essential combinations may be used separately (and not in combination).

The technical teaching disclosed with the present invention may be abstracted and combined with other examples.

The invention is illustrated in more detail by the examples which follow, without any intention of restricting it thereby.

EXAMPLES

Determination of Orbital Energies and Electronic States

The HOMO and LUMO energies and the triplet level and the singlet levels of the materials are determined via quantum-chemical calculations. For this purpose, in the present case, the "Gaussian09, Revision D.01" software package (Gaussian Inc.) is used. For calculation of organic substances without metals (referred to as the "org." method), a geometry optimization is first conducted by the semi-empirical method AM1 (Gaussian input line "#AM1 opt") with charge 0 and multiplicity 1. Subsequently, on the basis of the optimized geometry, a (single-point) energy calculation is effected for the electronic ground state and the triplet level. This is done using the TDDFT (time dependent density functional theory) method B3PW91 with the 6-31G(d) basis set (Gaussian input line "#B3PW91/6-31G(d) td=(50-50, nstates=4)") (charge 0, multiplicity 1). For organometallic compounds (referred to as the "M-org." method), the geometry is optimized by the Hartree-Fock method and the LanL2 MB basis set (Gaussian input line "#HF/LanL2 MB opt") (charge 0, multiplicity 1). The energy calculation is effected, as described above, analogously to that for the organic substances, except that the "LanL2DZ" basis set is used for the metal atom and the "6-31G(d)" basis set for the ligands (Gaussian input line "#B3PW91/gen pseudo=lanl2 td=(50-50,nstates=4)"). From the energy calculation, the HOMO is obtained as the last orbital occupied by two electrons (alpha occ. eigenvalues) and LUMO as the first unoccupied orbital (alpha virt. eigenvalues) in Hartree units, where HEh and LEh represent the HOMO energy in Hartree units and the LUMO energy in Hartree units respectively. This is used to determine the HOMO and LUMO value in electron volts, calibrated by cyclic voltammetry measurements, as follows:

HOMO (eV)=(HEh*27.212)*0.8308−1.118

LUMO (eV)=(LEh*27.212)*1.0658−0.5049

These values are to be regarded as HOMO and as LUMO of the materials in the context of this application.

The triplet level T1 of a material is defined as the relative excitation energy (in eV) of the triplet state having the lowest energy which is found by the quantum-chemical energy calculation.

The singlet level S1 of a material is defined as the relative excitation energy (in eV) of the singlet state having the second-lowest energy which is found by the quantum-chemical energy calculation.

The energetically lowest singlet state is referred to as S0.

The method described herein is independent of the software package used and always gives the same results. Examples of frequently utilized programs for this purpose are "Gaussian09" (Gaussian Inc.) and Q-Chem 4.1 (Q-Chem, Inc.). In the present case, the energies are calculated using the software package "Gaussian09, Revision D.01".

Production of the OLEDs

Examples I1 to I3 which follow (see Table 1) present the use of the composition of the invention in OLEDs.

Pretreatment for Examples I1-I3:

Glass plaques coated with structured ITO (indium tin oxide) of thickness 50 nm are treated prior to coating, first with an oxygen plasma, followed by an argon plasma. These plasma-treated glass plaques form the substrates to which the OLEDs are applied.

The OLEDs basically have the following layer structure: substrate/hole injection layer (HIL)/hole transport layer (HTL)/electron blocker layer (EBL)/emission layer (EML)/optional hole blocker layer (HBL)/electron transport layer (ETL)/optional electron injection layer (EIL) and finally a cathode. The cathode is formed by an aluminium layer of thickness 100 nm. The exact structure of the OLEDs can be found in Table 1. The materials required for production of the OLEDs are shown in Table 2. The data of the OLEDs are listed in Table 3. Examples C1 to C4 are comparative examples according to the prior art; examples I1 to I3 show data of OLEDs of the invention. The HOMO and LUMO values of the compounds are collated in Table 4.

All materials are applied by thermal vapour deposition in a vacuum chamber. In this case, the emission layer always consists of at least one matrix material (host material) and an emitting dopant (emitter) which is added to the matrix material(s) in a particular proportion by volume by co-evaporation. Details given in such a form as L1:CbzT1:TEG1 (45%:45%:10%) mean here that the material L1 is present in the layer in a proportion by volume of 45%, CbzT1 in a proportion of 45% and TEG1 in a proportion of 10%. Analogously, the electron transport layer may also consist of a mixture of two materials.

The OLEDs are characterized in a standard manner. For this purpose, the electroluminescence spectra, the current efficiency (CE, measured in cd/A) and the external quantum efficiency (EQE, measured in %) are determined as a function of luminance, calculated from current-voltage-luminance characteristics assuming Lambertian emission characteristics, as is the lifetime. The electroluminescence spectra are determined at a luminance of 1000 cd/m2, and the CIE 1931 x and y colour coordinates are calculated therefrom. The parameter U1000 in Table 3 refers to the voltage which is required for a luminance of 1000 cd/m2. CE1000 and EQE1000 respectively denote the current efficiency and external quantum efficiency that are attained at 1000 cd/m$^2$.

The lifetime LT is defined as the time after which the luminance drops from the starting luminance to a certain proportion L1 in the course of operation with constant current density $j_0$. A figure of L1=80% in Table 3 means that the lifetime reported in the LT column corresponds to the time after which the luminance falls to 80% of its starting value.

Use of Compositions of the Invention in OLEDs

The materials of the invention can be used in the emission layer in phosphorescent green OLEDs. The inventive compounds CbBzT4 and L2 are used in Examples I1 to 13 as matrix material in the emission layer. In addition, the materials of the invention can be used in the electron transport layer (ETL), electron injection layer (EIL), hole blocker layer (HBL) or electron blocker layer (EBL).

The examples are elucidated in detail hereinafter, in order to illustrate the advantages of the OLEDs of the invention.

Use of Compositions of the Invention in the Emission Layer of Phosphorescent OLEDs Through the use of compounds according to prior art, i.e. the combination of two electron-transporting hosts (e.g. a lactam derivative and a triazine-carbazole derivative) with a hole-transporting emitter, it is possible to achieve good voltages, efficiencies and lifetimes with moderate emitter concentrations in the EML of 10% (C1 to C3). As expected, the use of smaller emitter concentrations of <10% according to Example C3 leads to a distinct reduction in lifetime, since the balance of electron current and hole current has been lost. The combination of an electron-transporting host and a bipolar host, where both are from the class of the triazine-carbazole derivatives, by contrast, leads to an improvement in lifetime (C4) even at low emitter concentrations (7%).

An excellent improvement in lifetime with simultaneously low emitter concentration (7%) in the EML is obtained via the specific combination of an electron-transporting host from the class of the lactams and a bipolar host from the class of the triazine-carbazole derivatives (11 to 12). Even with very low emitter concentrations of 3%, it is possible to achieve an improvement in lifetime by about a factor of 2 (13) compared to the prior art (C1 to C3).

At the same time, the low operating voltage of the OLEDs in 11 to 13 is maintained. Compared to the prior art, it is also possible to achieve excellent efficiencies.

According to the model of examples 11 to 13, through the combination of further bipolar triazine-carbazole compounds (left-hand column of Table 5) with electron-conducting lactams (right-hand column of Table 5) and phosphorescent emitters, OLEDs having excellent performance data are obtained, which demonstrates the broad applicability of the material combination of the invention.

TABLE 1

Structure of the OLEDs

| Ex | HIL/HTL thickness | HTL/HIL thickness | EBL thickness | EML thickness | HBL thickness | ETL thickness | EIL thickness |
|---|---|---|---|---|---|---|---|
| C1 | SpA1 70 nm | HATCN 5 nm | SpMA1 90 nm | L1:CbzT1:TEG1 (45%:45%:10%) 40 nm | — | ST2:LiQ (50%:50%) 30 nm | — |
| C2 | SpA1 70 nm | HATCN 5 nm | SpMA1 90 nm | L1:CbzT3:TEG1 (45%:45%:10%) 40 nm | IC1 5 nm | ST2:LiQ (50%:50%) 25 nm | — |
| C3 | SpA1 70 nm | HATCN 5 nm | SpMA1 90 nm | L2:CbzT1:TEG1 (45%:45%:10%) 40 nm | — | ST2 30 nm | LiQ 1 nm |
| C4 | HATCN 5 nm | SpMA1 215 nm | SpMA2 20 nm | CbzT2:CbzT4:TEG2 (475%:46%:07%) 30 nm | ST2 10 nm | ST2:LiQ (50%:50%) 30 nm | LiQ 1 nm |
| I1 | HATCN 5 nm | SpMA1 215 nm | SpMA2 20 nm | L2:CbzT4:TEG2 (47%:46%:07%) 30 nm | ST2 10 nm | ST2:LiQ (50%:50%) 30 nm | LiQ 1 nm |
| I2 | HATCN 5 nm | SpMA1 215 nm | SpMA2 20 nm | L2:CbzT4:TEG3 (47%:46%:07%) 30 nm | ST2 10 nm | ST2:LiQ (50%:50%) 30 nm | LiQ 1 nm |
| I3 | HATCN 5 nm | SpMA1 215 nm | SpMA2 20 nm | L2:CbzT4:TEG3 (48%:49%:03%) 30 nm | ST2 10 nm | ST2:LiQ (50%:50%) 30 nm | LiQ 1 nm |

TABLE 2

Structural formulae of the materials for the OLEDs

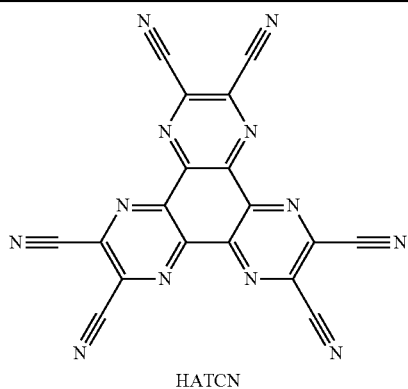

HATCN

TABLE 2-continued
Structural formulae of the materials for the OLEDs
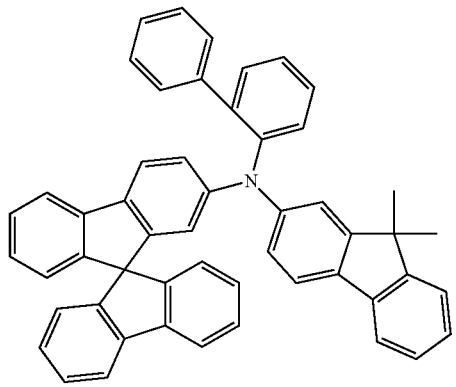
SpMA1
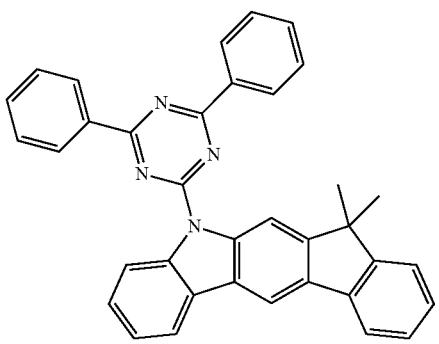
IC1
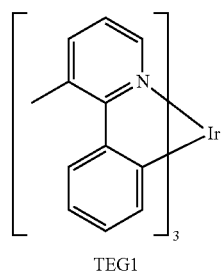
TEG1

TABLE 2-continued
Structural formulae of the materials for the OLEDs
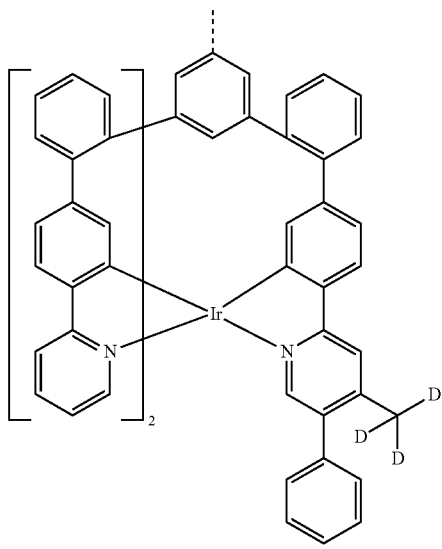
TEG3
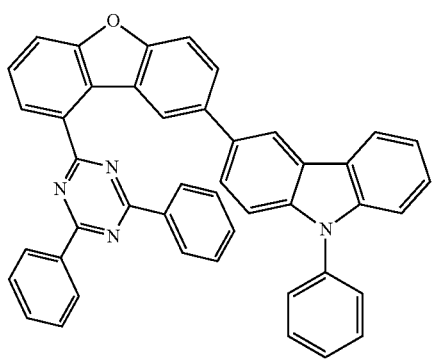
CbzT2
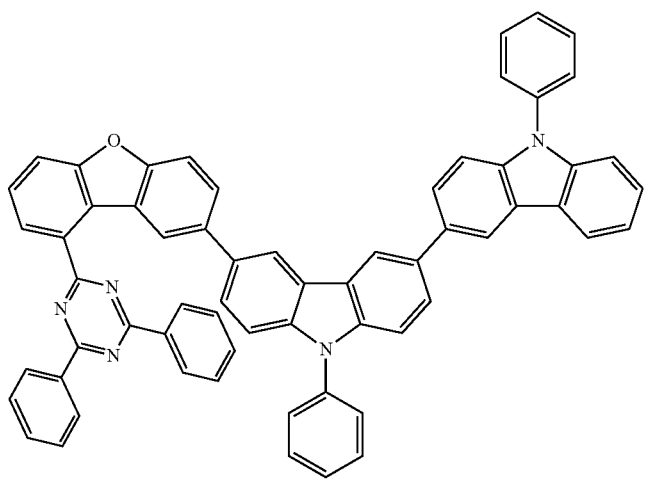
CbzT4

TABLE 2-continued
Structural formulae of the materials for the OLEDs
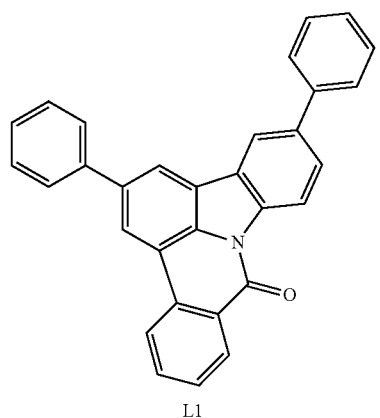 [SMILES: O=c1c2ccccc2c2cc(-c3ccccc3)cc3c4cc(-c5ccccc5)ccc4n1c23]
L1
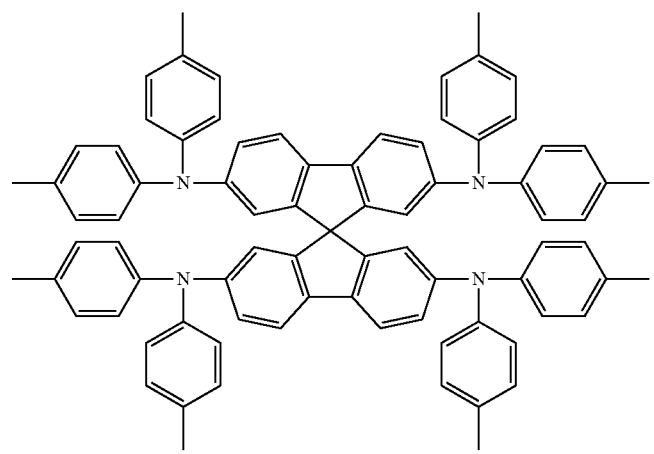
SpA1
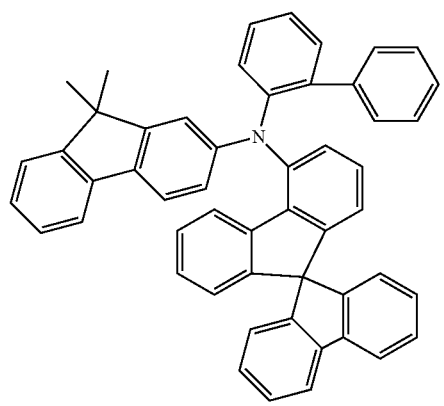
SpMA2

TABLE 2-continued
Structural formulae of the materials for the OLEDs
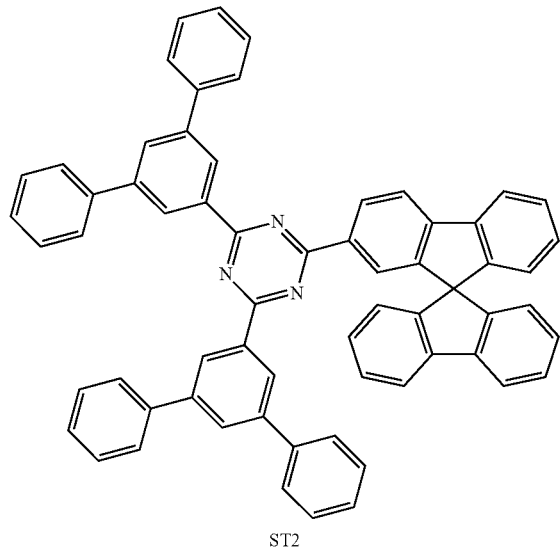 [SMILES: c1ccc(-c2cc(-c3ccccc3)cc(-c3nc(-c4cc(-c5ccccc5)cc(-c5ccccc5)c4)nc(-c4ccc5c(c4)C4(c6ccccc6-c6ccccc64)c4ccccc4-5)n3)c2)cc1 ; "ST2"]
ST2
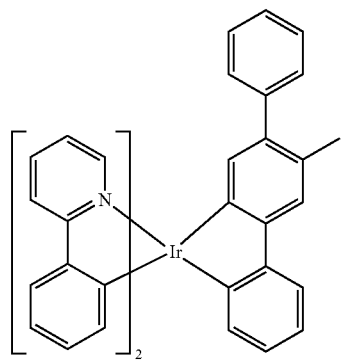
TEG2
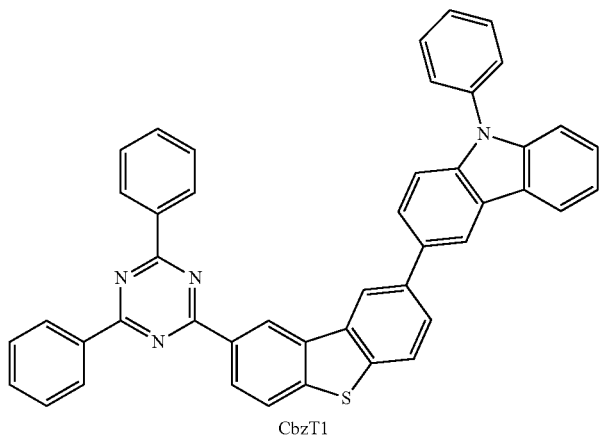
CbzT1

TABLE 2-continued
Structural formulae of the materials for the OLEDs
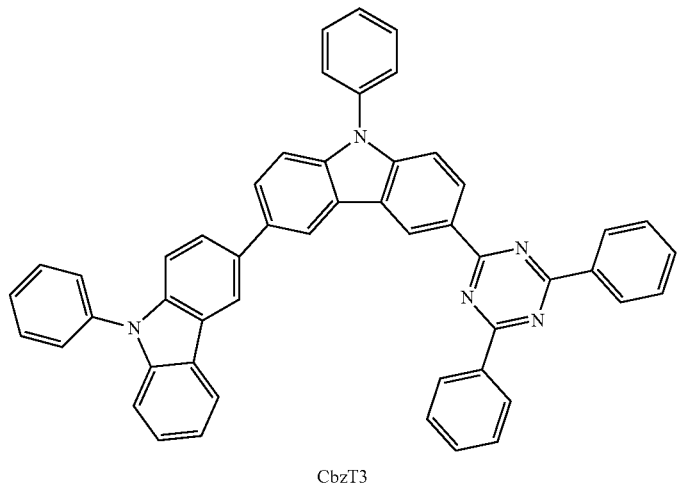 [SMILES: c1ccc(-c2nc(-c3ccccc3)nc(-c3ccc4c(c3)c3cc(-c5ccc6c(c5)c5ccccc5n6-c5ccccc5)ccc3n4-c3ccccc3)n2)cc1]
CbzT3
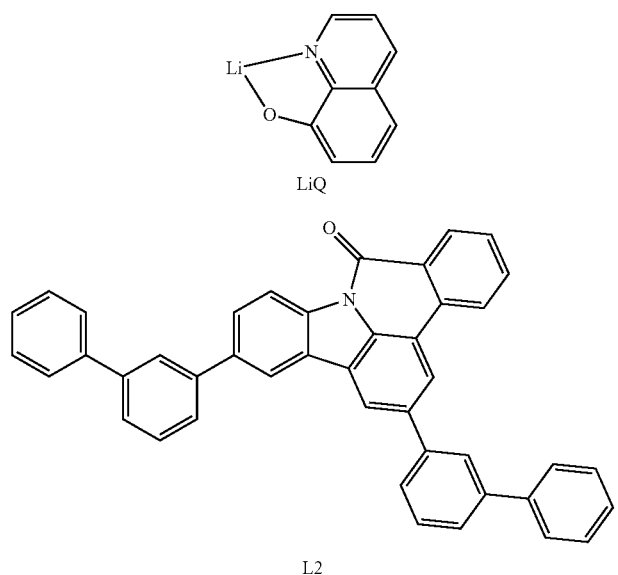
LiQ
L2
| | TABLE 3 | | | | | | |
|---|---|---|---|---|---|---|---|
| | Data of the OLEDs | | | | | | |
| Ex | U1000 (V) | CE1000 (cd/A) | EQE 1000 (%) | CIE x/y at 1000 cd/m² | $j_0$ (mA/cm²) | L1 (%) | LT (h) |
| C1 | 2.9 | 62 | 17.2 | 0.33/0.62 | 20 | 80 | 260 |
| C2 | 3.4 | 55 | 15.4 | 0.33/0.63 | 20 | 80 | 215 |
| C3 | 2.6 | 59 | 16.4 | 0.33/0.62 | 20 | 80 | 165 |
| C4 | 3.1 | 66 | 17.9 | 0.35/0.62 | 20 | 60 | 620 |
| I1 | 3.2 | 70 | 18.9 | 0.32/0.64 | 20 | 80 | 750 |
| I2 | 3.1 | 72 | 19.0 | 0.37/0.61 | 20 | 80 | 1110 |
| I3 | 3.1 | 70 | 18.4 | 0.37/0.61 | 20 | 80 | 500 |
| TABLE 4 | | |
|---|---|---|
| HOMO and LUMO values of the compounds | | |
| Compound | HOMO (eV) | LUMO (eV) |
| L1 | −5.97 | −2.49 |
| L2 | −5.97 | −2.50 |
| CbzT1 | −5.60 | −2.55 |
| CbzT2 | −5.53 | −2.64 |
| CbzT3 | −5.43 | −2.37 |
| CbzT4 | −5.31 | −2.59 |

TABLE 5
Structural formulae for further material combinations
| Carbazole-triazines (CbzT) | Lactams (L) |
| --- | --- |
| 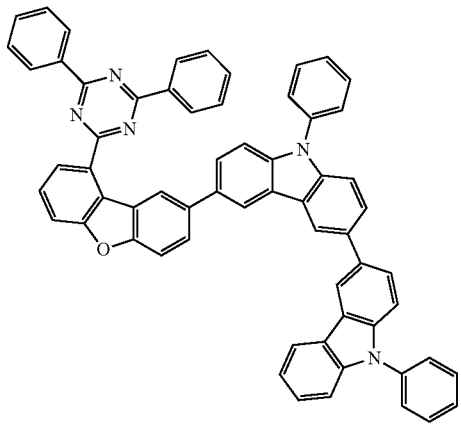 [SMILES: c1ccc(-c2nc(-c3ccccc3)nc(-c3cccc4oc5ccc(-c6ccc7c(c6)c6cc(-c8ccc9c(c8)c8ccccc8n9-c8ccccc8)ccc6n7-c6ccccc6)cc5c34)n2)cc1] | 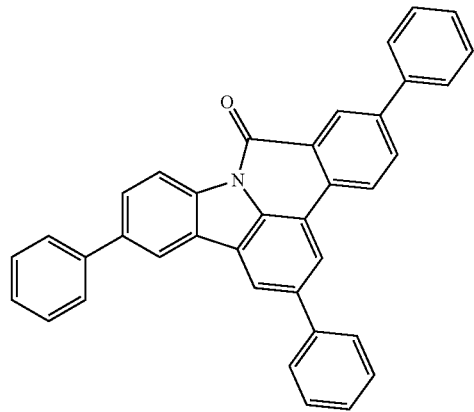 [SMILES: O=c1c2cc(-c3ccccc3)ccc2c2cc(-c3ccccc3)cc3c4cc(-c5ccccc5)ccc4n1c23] |
| 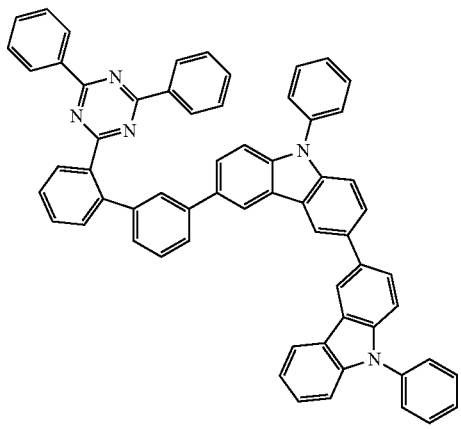 [SMILES: c1ccc(-c2nc(-c3ccccc3)nc(-c3ccccc3-c3cccc(-c4ccc5c(c4)c4cc(-c6ccc7c(c6)c6ccccc6n7-c6ccccc6)ccc4n5-c4ccccc4)c3)n2)cc1] | 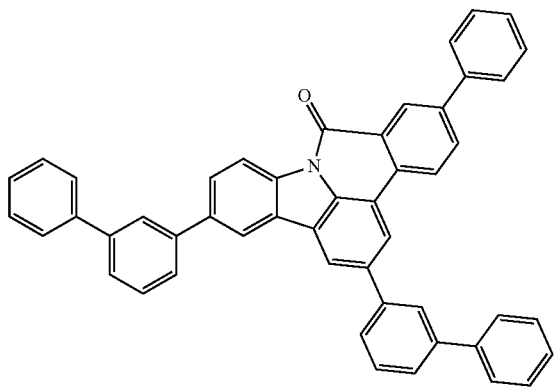 [SMILES: O=c1c2cc(-c3ccccc3)ccc2c2cc(-c3cccc(-c4ccccc4)c3)cc3c4cc(-c5cccc(-c6ccccc6)c5)ccc4n1c23] |
| 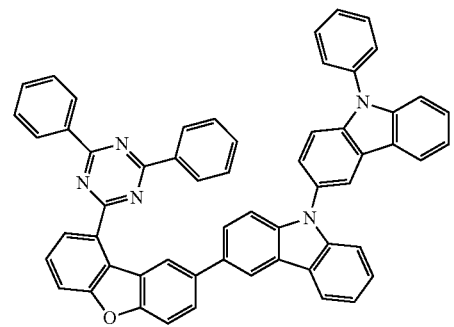 [SMILES: c1ccc(-c2nc(-c3ccccc3)nc(-c3cccc4oc5ccc(-c6ccc7c(c6)c6ccccc6n7-c6ccc7c(c6)c6ccccc6n7-c6ccccc6)cc5c34)n2)cc1] | 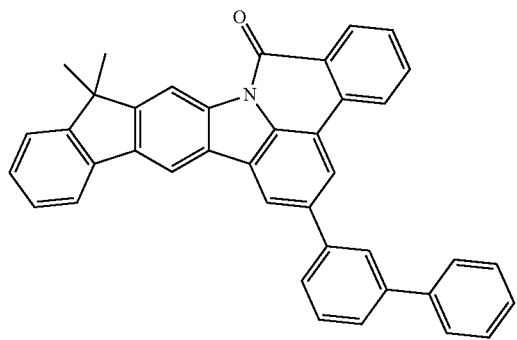 [SMILES: CC1(C)c2ccccc2-c2cc3c4cc(-c5cccc(-c6ccccc6)c5)cc5c6ccccc6c(=O)n(c3cc21)c54] |
| | 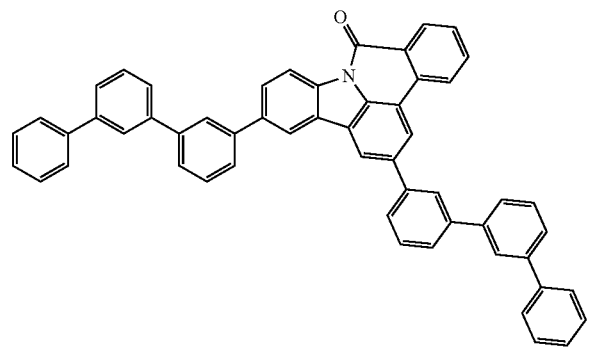 [SMILES: O=c1c2ccccc2c2cc(-c3cccc(-c4cccc(-c5ccccc5)c4)c3)cc3c4cc(-c5cccc(-c6cccc(-c7ccccc7)c6)c5)ccc4n1c23] |

TABLE 5-continued
Structural formulae for further material combinations
| Carbazole-triazines (CbzT) | Lactams (L) |
|---|---|
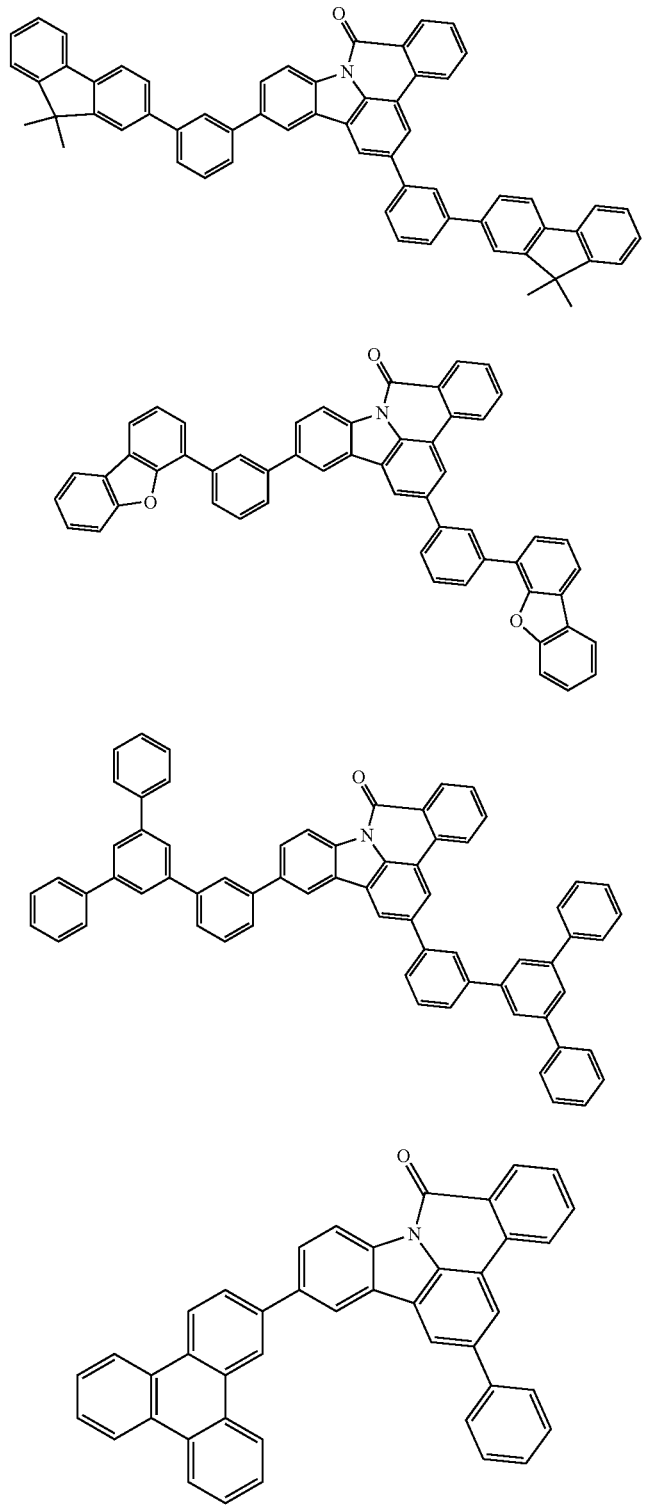

TABLE 5-continued
Structural formulae for further material combinations
| Carbazole-triazines (CbzT) | Lactams (L) |
|---|---|
| | 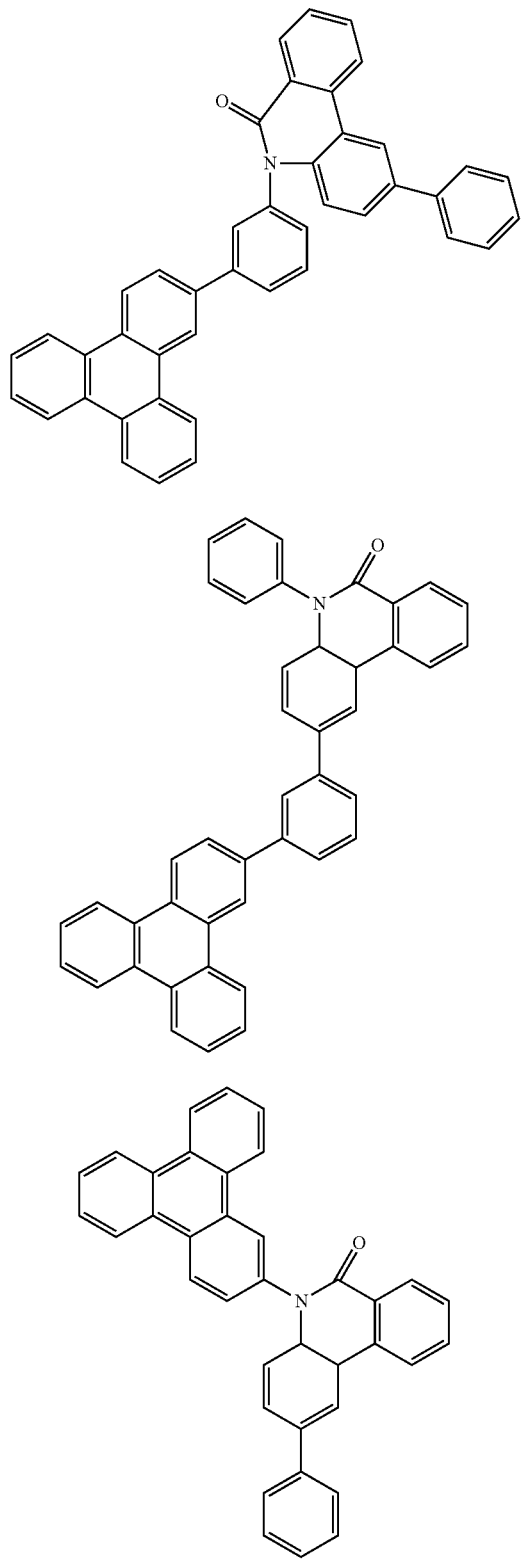 |

TABLE 5-continued

Structural formulae for further material combinations

| Carbazole-triazines (CbzT) | Lactams (L) |
|---|---|
|  | 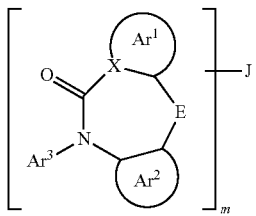 |

The invention claimed is:

1. A composition comprising a bipolar host and an electron-transporting host and wherein the electron-transporting host is a compound of the general formula (2) or (2a)

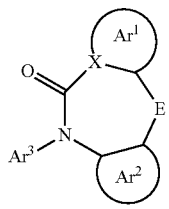

Formula (2)

Formula (2a)

where the symbols and indices used are as follows:

E is a single bond or $NAr^4$;

X is C when $Ar^1$ is a 6-membered aryl or 6-membered heteroaryl group, or is C or N when $Ar^1$ is a 5-membered heteroaryl group;

$Ar^1$ together with the X group and the carbon atom shown explicitly is an aromatic or heteroaromatic ring system which has 5 to 30 aromatic ring atoms and may be substituted by one or more R radicals;

$Ar^2$ together with the carbon atoms shown explicitly is an aromatic or heteroaromatic ring system which has 5 to 30 aromatic ring atoms and may be substituted by one or more R radicals; at the same time, $Ar^2$ may also be joined to $Ar^3$ by a single bond;

$Ar^3$ is selected from the group consisting of H, D, F, Cl, Br, I, CN, $NO_2$, $N(Ar^5)_2$, $N(R^6)_2$, $C(=O)Ar^5$, $C(=O)R^6$, $P(=O)(Ar^5)_2$, a straight-chain alkyl, alkoxy or thioalkyl group having 1 to 40 carbon atoms or a branched or cyclic alkyl, alkoxy or thioalkyl group having 3 to 40 carbon atoms or an alkenyl or alkynyl group having 2 to 40 carbon atoms, each of which may be substituted by one or more $R^6$ radicals, where one or more nonadjacent $CH_2$ groups may be replaced by $R^6C=CR^6$, $C\equiv C$, $Si(R^6)_2$, $Ge(R^6)_2$, $Sn(R^6)_2$, C=O, C=S, C=Se, $C=NR^6$, $P(=O)(R^6)$ SO, $SO_2$, $NR^6$, O, S or $CONR^6$ and where one or more hydrogen atoms may be replaced by D, F, Cl, Br, I, CN or $NO_2$, an aromatic or heteroaromatic ring system which has 5 to 30 aromatic ring atoms and may be substituted in each case by one or more $R^6$ radicals, an aryloxy or heteroaryloxy group which has 5 to 30 aromatic ring atoms and may be substituted by one or more $R^6$ radicals, or a combination of these systems; at the same time, $Ar^3$ may also be joined to $Ar^2$ by a single bond;

$Ar^4$ is an aromatic or heteroaromatic ring system which has 5 to 30 aromatic ring atoms and may be substituted by one or more R radicals; at the same time, $Ar^4$ may also be joined to $Ar^2$ or A' by a single bond;

m is 1, 3 or 4;

J when m=2 is a single bond or a bivalent group, or when m=3 is a trivalent group, or when m=4 is a tetravalent group, each of which is bonded at any desired position to $Ar^1$, $Ar^2$, $Ar^3$ or $Ar^4$;

R is the same or different at each instance and is selected from the group consisting of H, D, F, Cl, Br, I, CN, $NO_2$, $N(Ar^5)_2$, $N(R^6)_2$, $C(=O)Ar^5$, $C(=O)R^6$, $P(=O)(Ar^5)_2$, a straight-chain alkyl, alkoxy or thioalkyl group having 1 to 40 carbon atoms or a branched or cyclic alkyl, alkoxy or thioalkyl group having 3 to 40 carbon atoms or an alkenyl or alkynyl group having 2 to 40 carbon atoms, each of which may be substituted by one or more $R^6$ radicals, where one or more nonadjacent $CH_2$ groups may be replaced by $R^6C=CR^6$, $C\equiv C$, $Si(R^6)_2$, $Ge(R^6)_2$, $SN(R^6)_2$, $C=O$, $C=S$, $C=Se$, $C=NR^6$, $P(=O)(R^6)$, SO, $SO_2$, $NR^6$, O, S or $CONR^6$ and where one or more hydrogen atoms may be replaced by D, F, Cl, Br, I, CN or $NO_2$, an aromatic or heteroaromatic ring system which has 5 to 60 aromatic ring atoms and may be substituted in each case by one or more $R^6$ radicals, an aryloxy or heteroaryloxy group which has 5 to 60 aromatic ring atoms and may be substituted by one or more $R^6$ radicals, or a combination of these systems; where it is optionally possible for two or more adjacent R substituents to form a monocyclic or polycyclic, aliphatic, aromatic or heteroaromatic ring system which may be substituted by one or more $R^6$ radicals;

$R^6$ is the same or different at each instance and is selected from the group consisting of H, D, F, Cl, Br, I, CN, $NO_2$, $N(Ar^5)_2$, $N(R^7)_2$, $C(=O)Ar^5$, C(=O)IC, $P(=O)(Ar^5)_2$, a straight-chain alkyl, alkoxy or thioalkyl group having 1 to 40 carbon atoms or a branched or cyclic alkyl, alkoxy or thioalkyl group having 3 to 40 carbon atoms or an alkenyl or alkynyl group having 2 to 40 carbon atoms, each of which may be substituted by one or more $R^7$ radicals, where one or more nonadjacent $CH_2$ groups may be replaced by $R^7C=CR^7$, $C\equiv C$, $Si(R^7)_2$, $Ge(R^7)_2$, $Sn(R^7)_2$, $C=O$, $C=S$, $C=Se$, $C=NR^7$, $P(=O)(R^7)$, SO, $SO_2$, $NR^7$, O, S or $CONR^7$ and where one or more hydrogen atoms may be replaced by D, F, Cl, Br, I, CN or $NO_2$, an aromatic or heteroaromatic ring system which has 5 to 60 aromatic ring atoms and may be substituted in each case by one or more $R^7$ radicals, an aryloxy or heteroaryloxy group which has 5 to 60 aromatic ring atoms and may be substituted by one or more $R^7$ radicals, or a combination of these systems; where it is optionally possible for two or more adjacent $R^6$ substituents to form a monocyclic or polycyclic, aliphatic, aromatic or heteroaromatic ring system which may be substituted by one or more $R^7$ radicals:

$Ar^5$ is the same or different at each instance and is an aromatic or heteroaromatic ring system which has 5 to 30 aromatic ring atoms and may be substituted by one or more nonaromatic $R^7$ radicals; at the same time, two $Ar^5$ radicals bonded to the same nitrogen atom or phosphorus atom may also be bridged to one another by a single bond or a bridge selected from N(R), $C(R^7)_2$ and O;

$R^7$ is selected from the group consisting of H, D, F, CN, an aliphatic hydrocarbyl radical having 1 to 20 carbon atoms, an aromatic or heteroaromatic ring system having 5 to 30 aromatic ring atoms in which one or more hydrogen atoms may be replaced by D, F, Cl, Br, I or CN, where two or more adjacent $R^7$ substituents together may form a mono- or polycyclic, aliphatic, aromatic or heteroaromatic ring system.

2. The composition according to claim 1, wherein the bipolar host is selected from the group of the triazines, pyrimidines, pyrazines, pyridines, pyrazoles, pyridazines, quinolines, isoquinolines, quinoxalines, quinazolines, thiazoles, benzothiazoles, oxazoles, oxadiazoles, benzoxazoles, imidazoles, benzimidazoles, carbazoles, indenocarbazoles, indolocarbazoles, phosphine oxides, phenyl sulfonyl s, ketones, lactams, phenanthrolines and triarylamines.

3. The composition according to claim 1, wherein the bipolar host is a compound of the general formula (1)

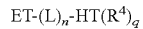   Formula (1)

where the symbols and indices used are as follows:

ET is an organic electron-transporting group (ET) from the group of the electron-deficient heteroaromatic groups, where the ET group may be substituted by one or more independent $R^1$ radicals;

HT is an organic hole-transporting group (HT) from the group of the electron-rich heteroaromatic groups, where the HT group may be substituted by one or more independent $R^{1'}$ radicals;

L is C(=O), $S(=O)_2$, $P(=O)(R^{1''})$ or an aromatic or heteroaromatic ring system which has 5 to 30 aromatic ring atoms and may be substituted by one or more independent $R^{1''}$ radicals;

n is 0, 1, 2, 3 or 4;

q is an integer from 1 to 5;

$R^1$, $R^{1'}$, $R^{1''}$ is the same or different at each instance and is H, D, F, Cl, Br, I, $N(R^2)_2$, CN, $NO_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy or thioalkoxy group having 1 to 40 carbon atoms or a straight-chain alkenyl or alkynyl group having 2 to 40 carbon atoms or a branched or cyclic alkyl, alkenyl, alkynyl, alkoxy, alkylalkoxy or thioalkoxy group having 3 to 40 carbon atoms, each of which may be substituted by one or more $R^2$ radicals, where one or more nonadjacent $CH_2$ groups may be replaced by $R^2C=CR^2$, $C\equiv C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where one or more hydrogen atoms may be replaced by D, F, Cl, Br, I, CN or $NO_2$, or an aromatic or heteroaromatic ring system which has 5 to 60 aromatic ring atoms and may be substituted in each case by one or more $R^2$ radicals, or an aryloxy, arylalkoxy or heteroaryloxy group which has 5 to 60 aromatic ring atoms and may be substituted by one or more $R^2$ radicals, or a diarylamino group, diheteroarylamino group or arylheteroarylamino group which has 10 to 40 aromatic ring atoms and may be substituted by one or more $R^2$ radicals, or a combination of two or more of these groups; at the same time, two or more adjacent $R^1$, $R^{1'}$ or $R^{1'''}$ radicals together may form a mono- or polycyclic, aliphatic or aromatic ring system;

$R^2$ is the same or different at each instance and is H, D, F, Cl, Br, I, $N(R^3)_2$, CN, $NO_2$, $Si(R^3)_3$, $B(OR^3)_2$, $C(=O)R^3$, $P(=O)(R^3)_2$, $S(=O)R^3$, $S(=O)_2R^3$, $OSO_2R^3$, a straight-chain alkyl, alkoxy or thioalkoxy group having 1 to 40 carbon atoms or a straight-chain alkenyl or alkynyl group having 2 to 40 carbon atoms or a branched or cyclic alkyl, alkenyl, alkynyl, alkoxy, alkylalkoxy or thioalkoxy group having 3 to 40 carbon atoms, each of which may be substituted by one or more $R^3$ radicals, where one or more nonadjacent $CH_2$ groups may be replaced by $R^3C=CR^3$, $C\equiv C$, $Si(R^3)_2$, $Ge(R^3)_2$, $Sn(R^3)_2$, $C=O$, $C=S$, $C=Se$, $C=NR^3$, $P(=O)(R^3)$, SO, $SO_2$, $NR^3$, O, S or $CONR^3$ and where one or more hydrogen atoms may be replaced by D, F, Cl, Br, I, CN or $NO_2$, or an aromatic or heteroaromatic ring system which has 5 to 60 aromatic ring atoms and may be substituted in each case by one or more $R^3$ radicals, or an aryloxy, arylalkoxy or heteroaryloxy group which has 5 to 60 aromatic ring atoms and may be substituted by one or more R³ radicals, or a diarylamino group, diheteroarylamino group or arylheteroarylamino group which has 10 to 40 aromatic ring atoms and may be substituted by one or more R³ radicals, or a combination of two or more of these groups; at the same time, two or more adjacent R² radicals together may form a mono- or polycyclic, aliphatic or aromatic ring system;

R³ is the same or different at each instance and is H, D, F or an aliphatic, aromatic and/or heteroaromatic hydrocarbyl radical having 1 to 20 carbon atoms, in which one or more hydrogen atoms may also be replaced by F; at the same time, two or more R³ substituents together may also form a mono- or polycyclic aliphatic or aromatic ring system;

R⁴ is the same or different at each instance and is N(R²)₂, Si(R²)₃, B(OR²)₂, C(=O)R², P(=O)(R²)₂, S(=O)R², S(=O)₂R², OSO₂R², a straight-chain alkyl, alkoxy or thioalkoxy group having 1 to 40 carbon atoms or a straight-chain alkenyl or alkynyl group having 2 to 40 carbon atoms or a branched or cyclic alkyl, alkenyl, alkynyl, alkoxy, alkylalkoxy or thioalkoxy group having 3 to 40 carbon atoms, each of which may be substituted by one or more R² radicals, where one or more nonadjacent CH₂ groups may be replaced by R²C=CR², C≡C, Si(R²)₂, Ge(R²)₂, Sn(R²)₂, C=O, C=S, C=Se, C=NR², P(=O)(R²), SO, SO₂, NR², O, S or CONR² and where one or more hydrogen atoms may be replaced by D, F, Cl, Br, I, CN or NO₂, or an aromatic or heteroaromatic ring system which has 5 to 60 aromatic ring atoms and may be substituted in each case by one or more R² radicals, or an aryloxy, arylalkoxy or heteroaryloxy group which has 5 to 60 aromatic ring atoms and may be substituted by one or more R² radicals, or a diarylamino group, diheteroarylamino group or arylheteroarylamino group which has 10 to 40 aromatic ring atoms and may be substituted by one or more R² radicals, or a combination of two or more of these groups; at the same time, two or more adjacent R⁴ radicals together may form a mono- or polycyclic, aliphatic or aromatic ring system.

4. The composition according to claim 3, wherein
ET is selected from the group of the triazines, pyrimidines, pyrazines, pyrazoles, pyridines, pyridazines, quinolines, isoquinolines, quinoxalines, quinazolines, thiazoles, benzothiazoles, oxazoles, oxadiazoles, benzoxazoles, imidazoles and benzimidazoles, where the ET group may be substituted by one or more independent R¹ radicals;

HT is selected from the group of the carbazoles, indenocarbazoles, indolocarbazoles, phenanthrolines and triarylamines, where the HT group may be substituted by one or more independent R¹' radicals;

n is 1;
q is 1;

R¹, R¹', R¹''' is the same or different at each instance and is H, D, F, Cl, Br, I, N(R²)₂, CN, NO₂, Si(R²)₃, B(OR²)₂, C(=O)R², P(=O)(R²)₂, S(=O)R², S(=O) R², OSO₂R² a straight-chain alkyl, alkoxy or thioalkoxy group having 1 to 40 carbon atoms or a straight-chain alkenyl or alkynyl group having 2 to 40 carbon atoms or a branched or cyclic alkyl, alkenyl, alkynyl, alkoxy, alkylalkoxy or thioalkoxy group having 3 to 40 carbon atoms, each of which may be substituted by one or more R² radicals, where one or more nonadjacent CH₂ groups may be replaced by R²C=CR², C≡C, Si(R²)₂, Ge(R²)₂, Sn(R²)₂, C=O, C=S, C=Se, C=NR², P(=O)(R²), SO, SO₂, NR², O, S or CONR² and where one or more hydrogen atoms may be replaced by D, F, Cl, Br, I, CN or NO₂, or an aromatic or heteroaromatic ring system which has 5 to 60 aromatic ring atoms and may be substituted in each case by one or more R² radicals, or an aryloxy, arylalkoxy or heteroaryloxy group which has 5 to 60 aromatic ring atoms and may be substituted by one or more R² radicals, or a diarylamino group, diheteroarylamino group or arylheteroarylamino group which has 10 to 40 aromatic ring atoms and may be substituted by one or more R² radicals, or a combination of two or more of these groups; at the same time, two or more adjacent R¹, R¹' or R¹''' radicals together do not form a mono- or polycyclic, aliphatic or aromatic ring system.

5. The composition according to claim 3, wherein the ET group is selected from the following groups:

Formula (ET-1)

Formula (ET-2)

Formula (ET-3)

Formula (ET-4)

Formula (ET-5)

Formula (ET-6)

Formula (ET-7)

Formula (ET-8)

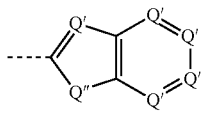
Formula (ET-9)

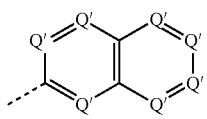
Formula (ET-10)

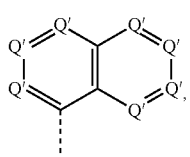
Formula (ET-11)

where the dotted bond marks the position of attachment to the bridging (L)$_n$ group or the HT group (when n=0), R$^1$ is as defined in claim 3 and Q' is the same or different at each instance and is CR$^1$ or N, and Q" is NR$^1$, O or S;

and where at least one Q' and N and/or at least one Q" is NR$^1$.

6. The composition according to claim 3, wherein the HT group has a structure of the formula (HT-1)

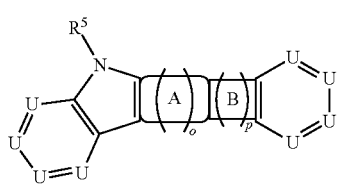
Formula (HT-1)

where:

A, B are the same or different and are an aromatic or heteroaromatic ring which has 5 or 6 ring atoms and may be substituted by one or more R$^5$ radicals;

o, p are the same or different and are 0 or 1;

U is the same or different at each instance and is CR$^5$, N or O, where not more than two U per cycle, which are not adjacent to one another, are N or O, and where U is carbon if a bridging (L)$_n$ group or an ET group (when n=0) is attached to this position;

R$^5$ is the same or different at each instance and is R$^{1'}$ or R$^4$, with the proviso that there are 1 to 5 R$^5$ radicals corresponding to R$^4$ in the structure of the formula (HT-1), where R$^{1'}$ and R$^4$ have the definitions given in claim 3.

7. The composition according to claim 3, wherein the HT group is selected from the following groups:

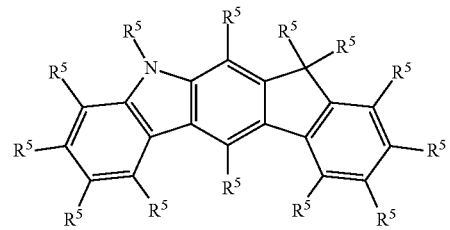
Formula (HT-2)

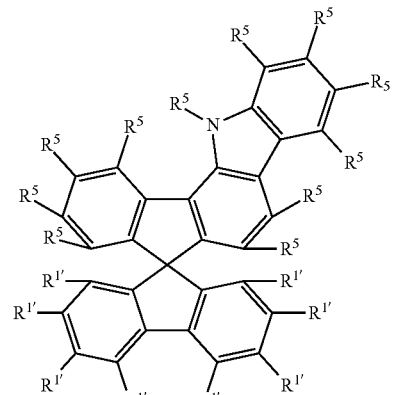
Formula (HT-3)

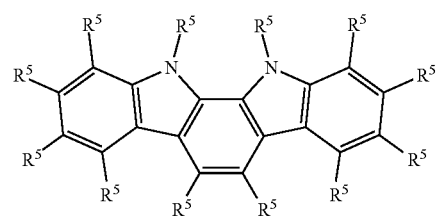
Formula (HT-4)

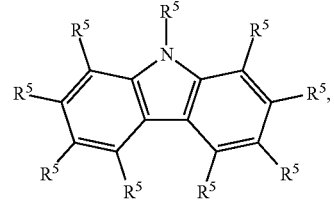
Formula (HT-5)

where R$^5$ is the same or different at each instance and is either Rh or R$^4$, with the proviso that the (HT-2), (HT-3), (HT-4) and (HT-5) groups each have, rather than one of the R$^5$ radicals, a bond to the bridging (L)$_n$ group or the ET group (when n=0), and that, in each of the (HT-2), (HT-3), (HT-4) and (HT-5) groups, there are 1 to 5 R$^5$ radicals corresponding to R$^4$, and where R$^{1'}$ and R$^4$ have the definitions given in claim 3.

8. The composition according to claim 1, wherein the bipolar host contains at least one of the (ET-12) to (ET-16) and (ET-20) groups

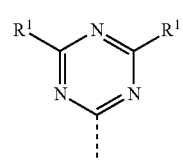
Formula (ET-12)

-continued

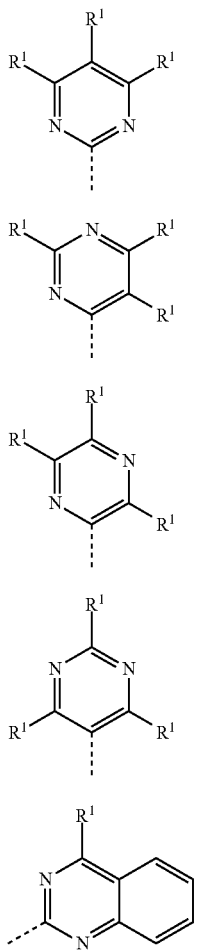

Formula (ET-13)

Formula (ET-14)

Formula (ET-15)

Formula (ET-16)

Formula (ET-20)

bonded via a bridging (L)n group or directly to an HT group (when n=0) selected from the structures of the formulae (HT-6), (HT-7), (HT-8) and (HT-9)

Formula (HT-6)

Formula (HT-7)

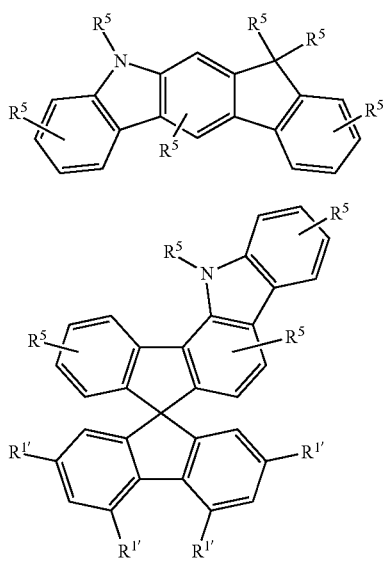

-continued

Formula (HT-8)

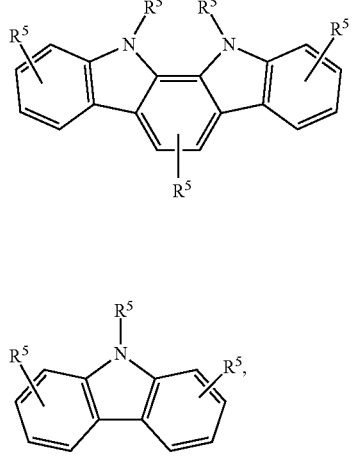

Formula (HT-9)

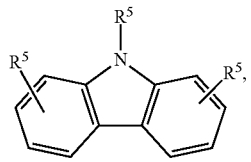

where L, n, $R^1$ and $R^5$ have the definitions given above and the dotted bond marks the position of attachment to $(L)_n$ or the HT group (when n=0).

9. The composition according to claim 1, wherein the bipolar host is selected from the compounds of the formulae (1a-1) to (1a-6) and (1b-1) to (1b-6)

Formula (1a-1)

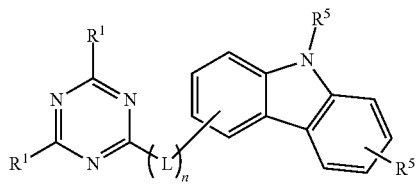

Formula (1a-2)

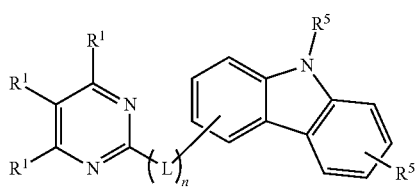

Formula (1a-3)

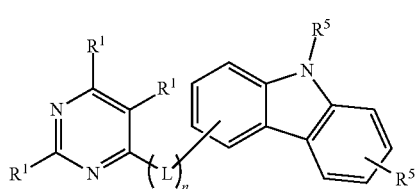

Formula (1a-4)

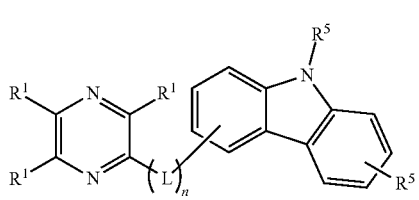

Formula (1a-5)
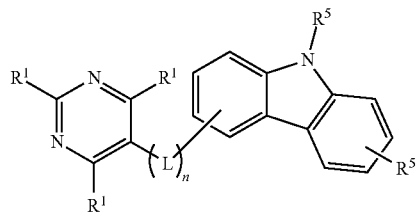
Formula (1a-6)
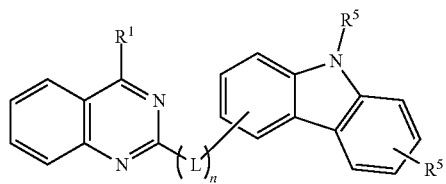
Formula (1b-1)
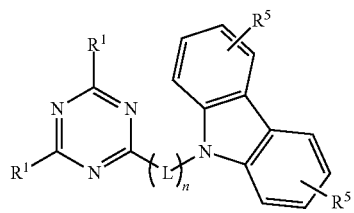
Formula (1b-2)
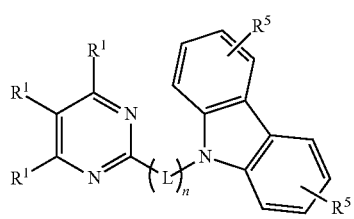
Formula (1b-3)
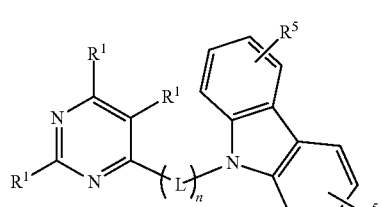
Formula (1b-4)
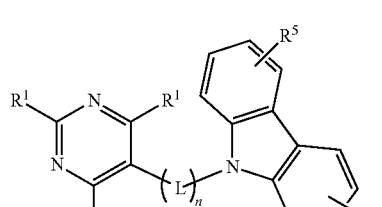
Formula (1b-5)
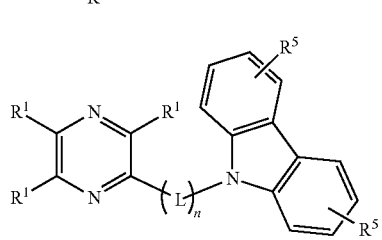
Formula (1b-6)
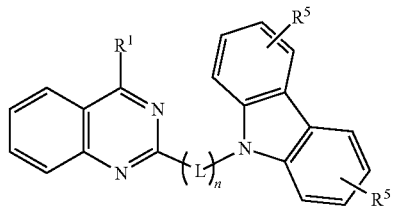
where L, n, $R^1$, and $R^5$ have the definitions given above.
10. The composition according to claim 3, wherein the bipolar host is selected from the compounds of the formulae (1a-7) to (1a-12) and formulae (1b-7) to (1b-12)
Formula (1a-7)
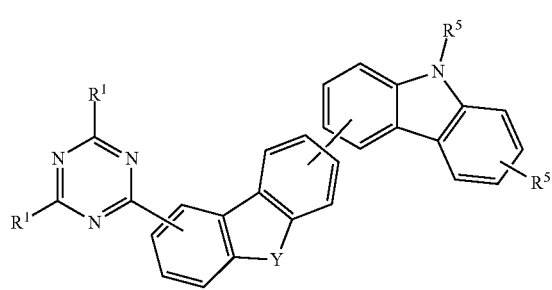
Formula (1a-8)
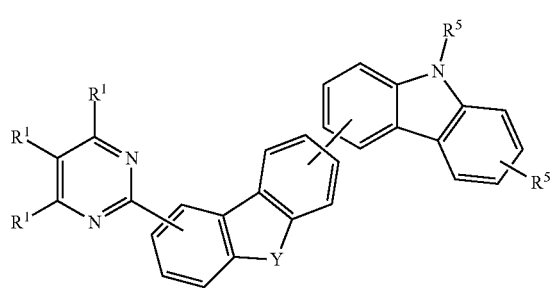
Formula (1a-9)
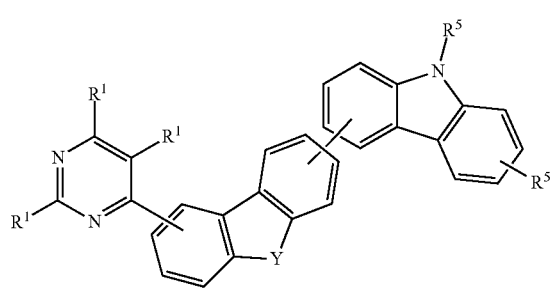
Formula (1a-10)
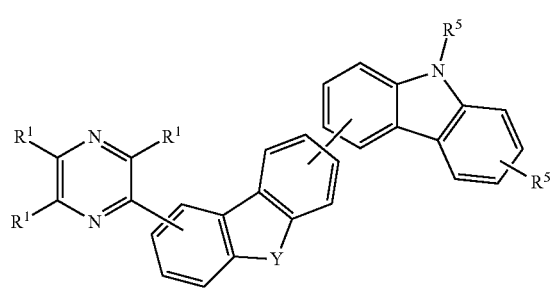

Formula (1a-11)
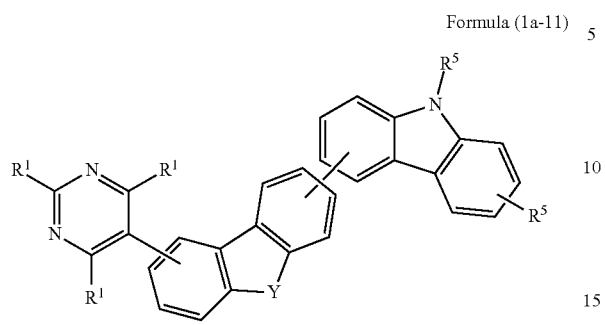

Formula (1a-12)
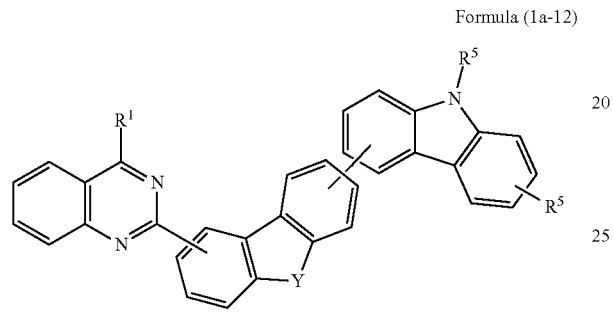

Formula (1b-7)
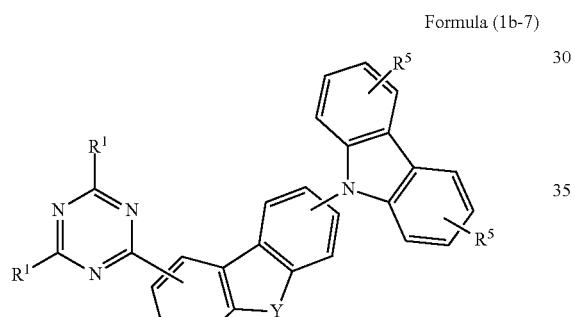

Formula (1b-8)
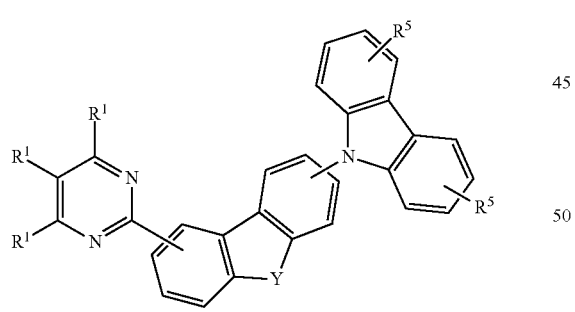

Formula (1b-9)
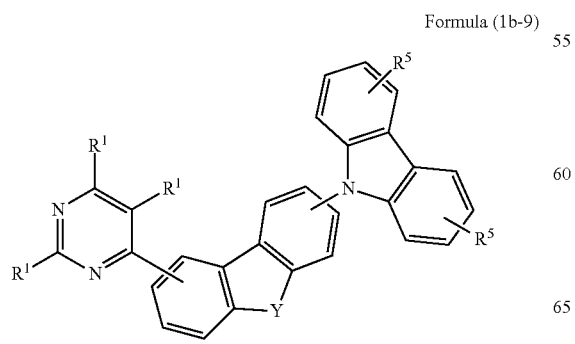

Formula (1b-10)
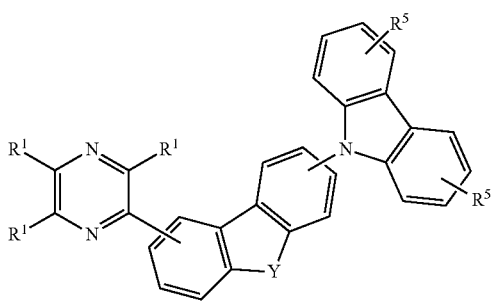

Formula (1b-11)
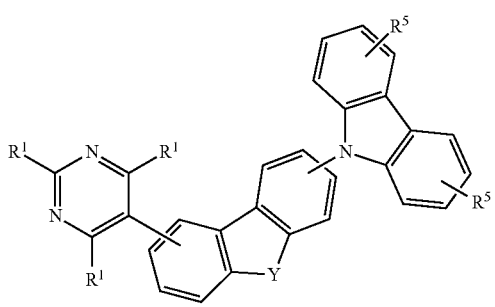

Formula (1b-12)
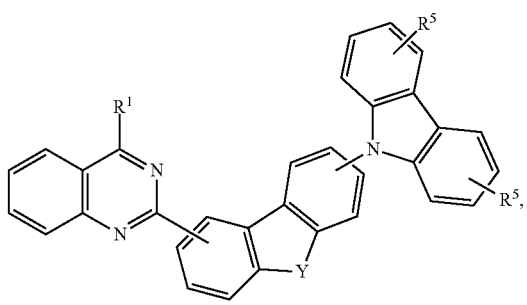

where

Y is O or S, and $R^1$ and $R^5$ have the definitions given above, and where, in the formulae (1a-7) to (1a-12) and (1b-7) to (1b-12), exactly one of the $R^5$ radicals in each case corresponds to an $R^4$ radical.

11. A composition comprising a bipolar host and an electron-transporting host and wherein the bipolar host is selected from:

the compounds of the formulae (1a-13) to (1a-18) having the general formula

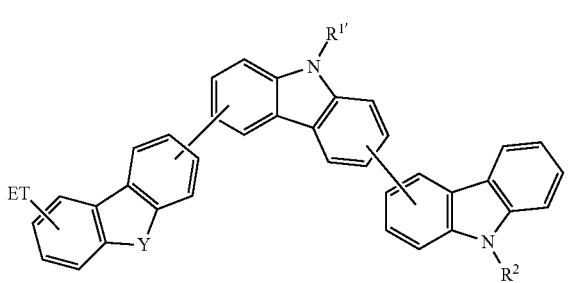

where:

| ET group | Bipolar host |
|---|---|
| (ET-12) | Formula (1a-13) |
| (ET-13) | Formula (1a-14) |
| (ET-14) | Formula (1a-15) |
| (ET-15) | Formula (1a-16) |
| (ET-16) | Formula (1a-17) |
| (ET-20) | Formula (1a-18); | the compounds of the formulae (1a-19) to (1a-24) having the general formula where:

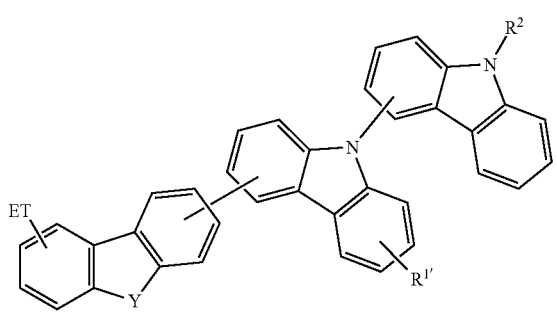

| ET group | Bipolar host |
|---|---|
| (ET-12) | Formula (1a-19) |
| (ET-13) | Formula (1a-20) |
| (ET-14) | Formula (1a-21) |
| (ET-15) | Formula (1a-22) |
| (ET-16) | Formula (1a-23) |
| (ET-20) | Formula (1a-24); | the compounds of the formulae (1b-13) to (1b-18) having the general formula

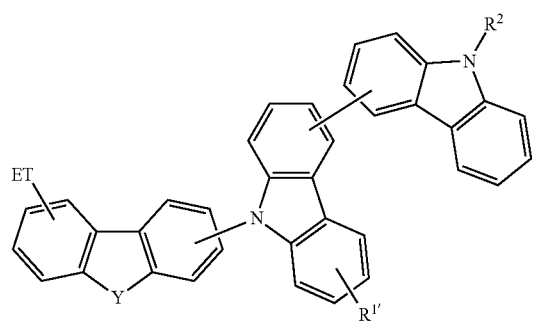

where:

| ET group | Bipolar host |
|---|---|
| (ET-12) | Formula (1b-13) |
| (ET-13) | Formula (1b-14) |
| (ET-14) | Formula (1b-15) |
| (ET-15) | Formula (1b-16) |
| (ET-16) | Formula (1b-17) |
| (ET-20) | Formula (1b-18); | and
the compounds of the formulae (1b-19) to (1b-24) having the general formula

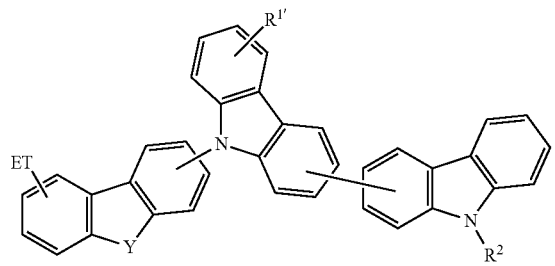

where:

| ET group | Bipolar host |
|---|---|
| (ET-12) | Formula (1b-19) |
| (ET-13) | Formula (1b-20) |
| (ET-14) | Formula (1b-21) |
| (ET-15) | Formula (1b-22) |
| (ET-16) | Formula (1b-23) |
| (ET-20) | Formula (1b-24); | where Y, Rh and $R^2$ have the definitions given above

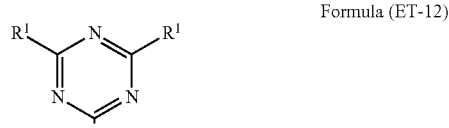

Formula (ET-12)

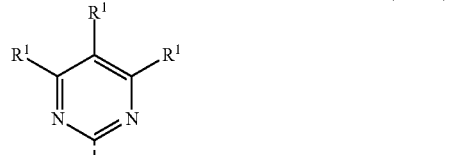

Formula (ET-13)

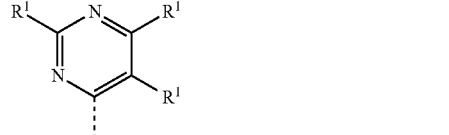

Formula (ET-14)

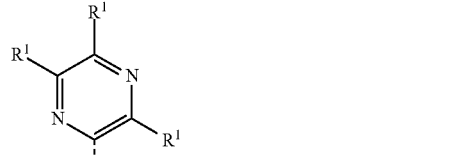

Formula (ET-15)

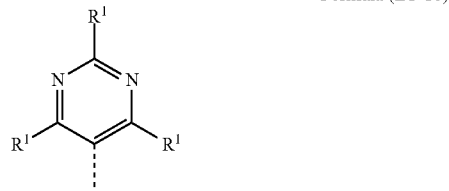

Formula (ET-16)

-continued

Formula (ET-20)

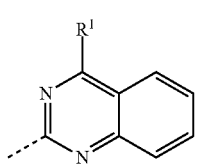

bonded via a bridging $(L)_n$ group or directly to an HT group (when n=0) selected from the structures of the formulae (HT-6), (HT-7), (HT-8) and (HT-9)

Formula (HT-6)

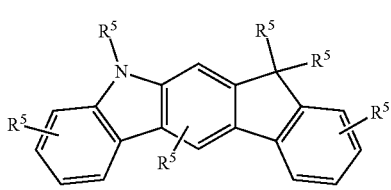

Formula (HT-7)

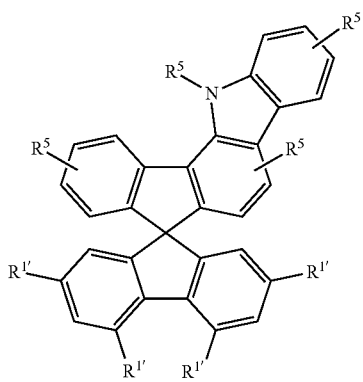

Formula (HT-8)

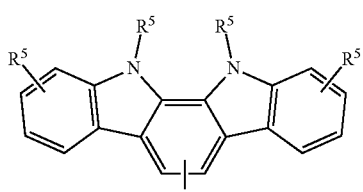

Formula (HT-9)

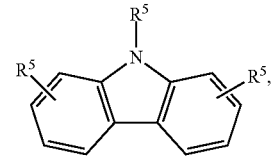

where L, n, le and $R^5$ have the definitions given above and the dotted bond marks the position of attachment to $(L)_n$ or the HT group (when n=0), $R^1$, $R^{1\prime}$ is the same or different at each instance and is H, D, F, Cl, Br, I, $N(R^2)_2$, CN, $NO_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy or thioalkoxy group having 1 to 40 carbon atoms or a straight-chain alkenyl or alkynyl group having 2 to 40 carbon atoms or a branched or cyclic alkyl, alkenyl, alkynyl, alkoxy, alkylalkoxy or thioalkoxy group having 3 to 40 carbon atoms, each of which may be substituted by one or more $R^2$ radicals, where one or more nonadjacent $CH_2$ groups may be replaced by $R^2C=CR^2$, C≡C, $Si(R^2)_2$, $Ge(R^2)_2$, $Sn(R^2)_2$, C=O, C=S, C=Se, $C=NR^2$, $P(=O)(R^2)$, SO, $SO_2$, $NR^2$, O, S or $CONR^2$ and where one or more hydrogen atoms may be replaced by D, F, Cl, Br, I, CN or $NO_2$, or an aromatic or heteroaromatic ring system which has 5 to 60 aromatic ring atoms and may be substituted in each case by one or more $R^2$ radicals, or an aryloxy, arylalkoxy or heteroaryloxy group which has 5 to 60 aromatic ring atoms and may be substituted by one or more $R^2$ radicals, or a diarylamino group, diheteroarylamino group or arylheteroarylamino group which has 10 to 40 aromatic ring atoms and may be substituted by one or more $R^2$ radicals, or a combination of two or more of these groups; at the same time, two or more adjacent $R^1$, $R^{1\prime}$ or $R^{1\prime\prime}$ radicals together may form a mono- or polycyclic, aliphatic or aromatic ring system;

$R^2$ is the same or different at each instance and is H, D, F, Cl, Br, I, $N(R^3)_2$, CN, $NO_2$, $Si(R^3)_3$, $B(OR^3)_2$, $C(=O)R^3$, $P(=O)(R^3)_2$, $S(=O)R^3$, $S(=O)_2R^3$, $OSO_2R^3$, a straight-chain alkyl, alkoxy or thioalkoxy group having 1 to 40 carbon atoms or a straight-chain alkenyl or alkynyl group having 2 to 40 carbon atoms or a branched or cyclic alkyl, alkenyl, alkynyl, alkoxy, alkylalkoxy or thioalkoxy group having 3 to 40 carbon atoms, each of which may be substituted by one or more $R^3$ radicals, where one or more nonadjacent $CH_2$ groups may be replaced by $R^3C=CR^3$, C≡C, $Si(R^3)_2$, $Ge(R^3)_2$, $Sn(R^3)_2$, C=O, C=S, C=Se, $C=NR^3$, $P(=O)(R^3)$, SO, $SO_2$, $NR^3$, O, S or $CONR^3$ and where one or more hydrogen atoms may be replaced by D, F, Cl, Br, I, CN or $NO_2$, or an aromatic or heteroaromatic ring system which has 5 to 60 aromatic ring atoms and may be substituted in each case by one or more $R^3$ radicals, or an aryloxy, arylalkoxy or heteroaryloxy group which has 5 to 60 aromatic ring atoms and may be substituted by one or more $R^3$ radicals, or a diarylamino group, diheteroarylamino group or arylheteroarylamino group which has 10 to 40 aromatic ring atoms and may be substituted by one or more $R^3$ radicals, or a combination of two or more of these groups; at the same time, two or more adjacent $R^2$ radicals together may form a mono- or polycyclic, aliphatic or aromatic ring system, $R^3$ is the same or different at each instance and is H, D, F or an aliphatic, aromatic and/or heteroaromatic hydrocarbyl radical having 1 to 20 carbon atoms, in which one or more hydrogen atoms may also be replaced by F; at the same time, two or more $R^3$ substituents together may also form a mono- or polycyclic aliphatic or aromatic ring system, $R^4$ is the same or different at each instance and is $N(R^2)_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy or thioalkoxy group having 1 to 40 carbon atoms or a straight-chain alkenyl or alkynyl group having 2 to 40 carbon atoms or a branched or cyclic alkyl, alkenyl, alkynyl, alkoxy, alkylalkoxy or thioalkoxy group having 3 to 40 carbon atoms, each of which may be substituted by one or more $R^2$ radicals, where one or more nonadjacent $CH_2$ groups may be replaced $R^2C=CR^2$, C≡C, $Si(R^2)_2$, $Ge(R^2)_2$, $Sn(R^2)_2$, C=O, C=S, C=Se, $C=NR^2$, $P(=O)(R^2)$, SO, $SO_2$, $NR^2$, O, S or $CONR^2$ and where one or more hydrogen atoms may be replaced by D, F, Cl, Br, I, CN or $NO_2$, or an aromatic or heteroaromatic ring system which has 5 to 60 aromatic ring atoms and may be substituted in each case by one or more R² radicals, or an aryloxy, arylalkoxy or heteroaryloxy group which has 5 to 60 aromatic ring atoms and may be substituted by one or more R² radicals, or a diarylamino group, diheteroarylamino group or arylheteroarylamino group which has 10 to 40 aromatic ring atoms and may be substituted by one or more R² radicals, or a combination of two or more of these groups; at the same time, two or more adjacent R⁴ radicals together may form a mono- or polycyclic, aliphatic or aromatic ring system and R⁵ is the same or different at each instance and is either R¹" or R⁴.

12. A composition comprising a bipolar host and an electron-transporting host and wherein the bipolar host is selected from the compounds of the formulae (1a-37), (1a-38), (1b-37) and (1b-38)

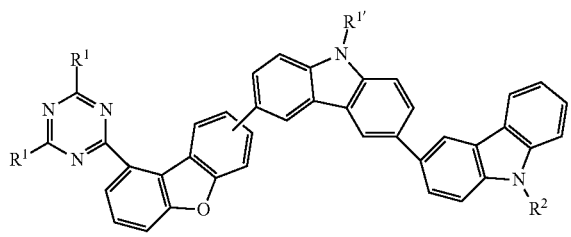

Formula (1a-37)

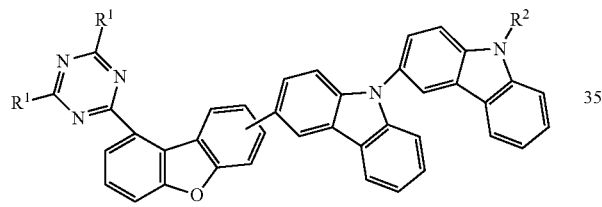

Formula (1a-38)

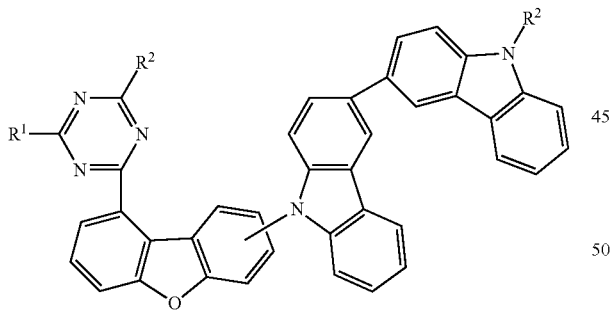

Formula (1b-37)

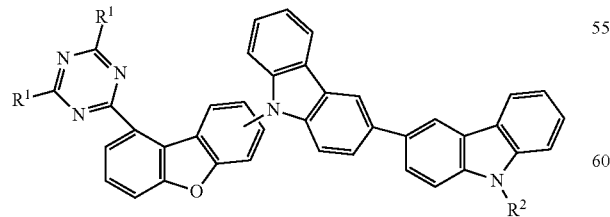

Formula (1b-38)

where

R¹, R¹" is the same or different at each instance and is H, D, F, Cl, Br, I, N(R²)₂, CN, NO₂, Si(R²)₃, B(OR²)₂, C(=O)R², P(=O)(R²)₂, S(=O)R², S(=O)₂R², OSO₂R², a straight-chain alkyl, alkoxy or thioalkoxy group having 1 to 40 carbon atoms or a straight-chain alkenyl or alkynyl group having 2 to 40 carbon atoms or a branched or cyclic alkyl, alkenyl, alkynyl, alkoxy, alkylalkoxy or thioalkoxy group having 3 to 40 carbon atoms, each of which may be substituted by one or more R² radicals, where one or more nonadjacent CH₂ groups may be replaced by R²C=CR², C≡C, Si(R²)₂, Ge(R²)₂, Sn(R²)₂, C=O, C=S, C=Se, C=NR², P(=O)(R²), SO, SO₂, NR², O, S or CONR² and where one or more hydrogen atoms may be replaced by D, F, Cl, Br, I, CN or NO₂, or an aromatic or heteroaromatic ring system which has 5 to 60 aromatic ring atoms and may be substituted in each case by one or more R² radicals, or an aryloxy, arylalkoxy or heteroaryloxy group which has 5 to 60 aromatic ring atoms and may be substituted by one or more R² radicals, or a diarylamino group, diheteroarylamino group or arylheteroarylamino group which has 10 to 40 aromatic ring atoms and may be substituted by one or more R² radicals, or a combination of two or more of these groups; at the same time, two or more adjacent R¹, R¹" or R¹"' radicals together may form a mono- or polycyclic, aliphatic or aromatic ring system;

R² is the same or different at each instance and is H, D, F, Cl, Br, I, N(R³)₂, CN, NO₂, Si(R³)₃, B(OR³)₂, C(=O)R³, P(=O)(R³)₂, S(=O)R³, S(=O)₂R³, OSO₂R³, a straight-chain alkyl, alkoxy or thioalkoxy group having 1 to 40 carbon atoms or a straight-chain alkenyl or alkynyl group having 2 to 40 carbon atoms or a branched or cyclic alkyl, alkenyl, alkynyl, alkoxy, alkylalkoxy or thioalkoxy group having 3 to 40 carbon atoms, each of which may be substituted by one or more R³ radicals, where one or more nonadjacent CH₂ groups may be replaced by R³C=CR³, C≡C, Si(R³)₂, Ge(R³)₂, Sn(R³)₂, C=O, C=S, C=Se, C=NR³, P(=O)(R³), SO, SO₂, NR³, O, S or CONR³ and where one or more hydrogen atoms may be replaced by D, F, Cl, Br, I, CN or NO₂, or an aromatic or heteroaromatic ring system which has 5 to 60 aromatic ring atoms and may be substituted in each case by one or more R³ radicals, or an aryloxy, arylalkoxy or heteroaryloxy group which has 5 to 60 aromatic ring atoms and may be substituted by one or more R³ radicals, or a diarylamino group, diheteroarylamino group or arylheteroarylamino group which has 10 to 40 aromatic ring atoms and may be substituted by one or more R³ radicals, or a combination of two or more of these groups; at the same time, two or more adjacent R² radicals together may form a mono- or polycyclic, aliphatic or aromatic ring system;

R³ is the same or different at each instance and is H, D, F or an aliphatic, aromatic and/or heteroaromatic hydrocarbyl radical having 1 to 20 carbon atoms, in which one or more hydrogen atoms may also be replaced by F; at the same time, two or more R³ substituents together may also form a mono- or polycyclic aliphatic or aromatic ring system.

13. The composition according to claim 11, wherein the electron-transporting host is a compound of the general formula (2) or (2a)

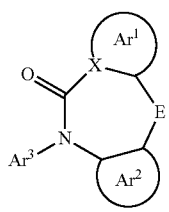

Formula (2)

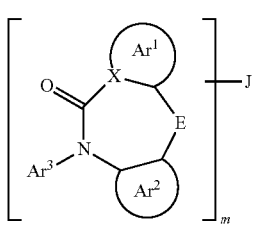

Formula (2a)

where the symbols and indices used are as follows:

E is a single bond or NAr$^4$;

X is C when Ar$^1$ is a 6-membered aryl or 6-membered heteroaryl group, or is C or N when Ar$^1$ is a 5-membered heteroaryl group;

Ar$^1$ together with the X group and the carbon atom shown explicitly is an aromatic or heteroaromatic ring system which has 5 to 30 aromatic ring atoms and may be substituted by one or more R radicals;

Ar$^2$ together with the carbon atoms shown explicitly is an aromatic or heteroaromatic ring system which has 5 to 30 aromatic ring atoms and may be substituted by one or more R radicals; at the same time, Ar$^2$ may also be joined to Ar$^3$ by a single bond;

Ar$^3$ is selected from the group consisting of H, D, F, Cl, Br, I, CN, NO$_2$, N(Ar$^5$)$_2$, N(R$^6$)$_2$, C(=O)Ar$^5$, C(=O) R$^6$, P(=O)(Ar$^5$)$_2$, a straight-chain alkyl, alkoxy or thioalkyl group having 1 to 40 carbon atoms or a branched or cyclic alkyl, alkoxy or thioalkyl group having 3 to 40 carbon atoms or an alkenyl or alkynyl group having 2 to 40 carbon atoms, each of which may be substituted by one or more R$^6$ radicals, where one or more nonadjacent CH$_2$ groups may be replaced by R$^6$C=CR$^6$, C≡C, Si(R$^6$)$_2$, Ge(R$^6$)$_2$, Sn(R$^6$)$_2$, C=O, C=S, C=Se, C=NR$^6$, P(=O)(R$^6$), SO, SO$_2$, NR$^6$, O, S or CONR$^6$ and where one or more hydrogen atoms may be replaced by D, F, Cl, Br, I, CN or NO$_2$, an aromatic or heteroaromatic ring system which has 5 to 30 aromatic ring atoms and may be substituted in each case by one or more R$^6$ radicals, an aryloxy or heteroaryloxy group which has 5 to 30 aromatic ring atoms and may be substituted by one or more R$^6$ radicals, or a combination of these systems; at the same time, Ar$^3$ may also be joined to Ar$^2$ by a single bond;

Ar$^4$ is an aromatic or heteroaromatic ring system which has 5 to 30 aromatic ring atoms and may be substituted by one or more R radicals; at the same time, Ar$^4$ may also be joined to Ar$^2$ or A' by a single bond;

m is 1, 3 or 4;

J when m=2 is a single bond or a bivalent group, or when m=3 is a trivalent group, or when m=4 is a tetravalent group, each of which is bonded at any desired position to Ar$^1$, Ar$^2$, Ar$^3$ or Ar$^4$;

R is the same or different at each instance and is selected from the group consisting of H, D, F, Cl, Br, I, CN, NO$_2$, N(Ar$^5$)$_2$, N(R$^6$)$_2$, C(=O)Ar$^5$, C(=O)R$^6$, P(=O) (Ar$^5$)$_2$, a straight-chain alkyl, alkoxy or thioalkyl group having 1 to 40 carbon atoms or a branched or cyclic alkyl, alkoxy or thioalkyl group having 3 to 40 carbon atoms or an alkenyl or alkynyl group having 2 to 40 carbon atoms, each of which may be substituted by one or more R$^6$ radicals, where one or more nonadjacent CH$_2$ groups may be replaced by R$^6$C=CR$^6$, C≡C, Si(R$^6$)$_2$, Ge(R$^6$)$_2$, Sn(R$^6$)$_2$, C=O, C=S, C=Se, C=NR$^6$, P(=O)(R$^6$), SO, SO$_2$, NR$^6$, O, S or CONR$^6$ and where one or more hydrogen atoms may be replaced by D, F, Cl, Br, I, CN or NO$_2$, an aromatic or heteroaromatic ring system which has 5 to 60 aromatic ring atoms and may be substituted in each case by one or more R$^6$ radicals, an aryloxy or heteroaryloxy group which has 5 to 60 aromatic ring atoms and may be substituted by one or more R$^6$ radicals, or a combination of these systems; where it is optionally possible for two or more adjacent R substituents to form a monocyclic or polycyclic, aliphatic, aromatic or heteroaromatic ring system which may be substituted by one or more R$^6$ radicals;

R$^6$ is the same or different at each instance and is selected from the group consisting of H, D, F, Cl, Br, I, CN, NO$_2$, N(Ar$^5$)$_2$, N(R$^7$)$_2$, C(=O)Ar$^5$, C(=O)R$^7$, P(=O) (Ar$^5$)$_2$, a straight-chain alkyl, alkoxy or thioalkyl group having 1 to 40 carbon atoms or a branched or cyclic alkyl, alkoxy or thioalkyl group having 3 to 40 carbon atoms or an alkenyl or alkynyl group having 2 to 40 carbon atoms, each of which may be substituted by one or more R$^7$ radicals, where one or more nonadjacent CH$_2$ groups may be replaced by R$^7$C=CR$^7$, C≡C, Si(R$^7$)$_2$, Ge(R$^7$)$_2$, Sn(R$^7$)$_2$, C=O, C=S, C=Se, C=NR$^7$, P(=O)(R$^7$), SO, SO$_2$, NR$^7$, O, S or CONR$^7$ and where one or more hydrogen atoms may be replaced by D, F, Cl, Br, I, CN or NO$_2$, an aromatic or heteroaromatic ring system which has 5 to 60 aromatic ring atoms and may be substituted in each case by one or more R$^7$ radicals, an aryloxy or heteroaryloxy group which has 5 to 60 aromatic ring atoms and may be substituted by one or more R$^7$ radicals, or a combination of these systems; where it is optionally possible for two or more adjacent R$^6$ substituents to form a monocyclic or polycyclic, aliphatic, aromatic or heteroaromatic ring system which may be substituted by one or more R$^7$ radicals;

Ar$^5$ is the same or different at each instance and is an aromatic or heteroaromatic ring system which has 5 to 30 aromatic ring atoms and may be substituted by one or more nonaromatic R$^7$ radicals; at the same time, two Ar$^5$ radicals bonded to the same nitrogen atom or phosphorus atom may also be bridged to one another by a single bond or a bridge selected from N(R), C(R$^7$)$_2$ and O;

R$^7$ is selected from the group consisting of H, D, F, CN, an aliphatic hydrocarbyl radical having 1 to 20 carbon atoms, an aromatic or heteroaromatic ring system having 5 to 30 aromatic ring atoms in which one or more hydrogen atoms may be replaced by D, F, Cl, Br, I or CN, where two or more adjacent R$^7$ substituents together may forma mono- or polycyclic, aliphatic, aromatic or heteroaromatic ring system.

14. The composition according to claim 1 wherein in compounds of the formula (2) or (2a), the Ar$^1$ group is a group of the formula (3), (4), (5), (6) or (7)

Formula (3)

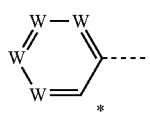

Formula (4)

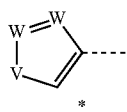

Formula (5)

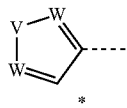

Formula (6)

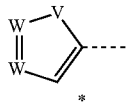

Formula (7)

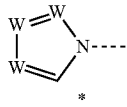

where the dotted bond indicates the linkage to the carbonyl group, * indicates the position of the linkage to E and in addition:

W is the same or different at each instance and is CR or N; or two adjacent W groups are a group of the following formula (8) or (9)

Formula (8)

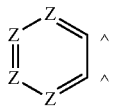

Formula (9)

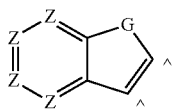

where G is $CR^2$, NR, O or S, Z is the same or different at each instance and is CR or N and
^ indicates the corresponding adjacent W groups in the formula (3) to (7);
V is NR, O or S;
and in that the $Ar^2$ group is a group of one of the formulae (10), (11) and (12)

Formula (10)

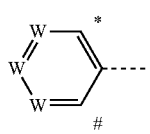

Formula (11)

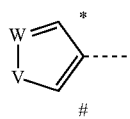

Formula (12)

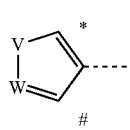

where the dotted bond indicates the linkage to N, # indicates the position of a possible linkage to $Ar^3$, * indicates the linkage to E, and W and V have the definitions given above;

and in that the $Ar^3$ group is a group of one of the formulae (13), (14), (15) and (16)

Formula (13)

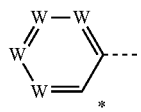

Formula (14)

Formula (15)

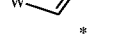

Formula (16)

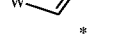

where the dotted bond indicates the linkage to N, * indicates a possible linkage to $Ar^2$, and W and V have the definitions given in claim 1.

15. The composition according to claim 1 wherein the compound of the formula (2) is selected from the compounds of the formulae (17) to (32)

Formula (17)

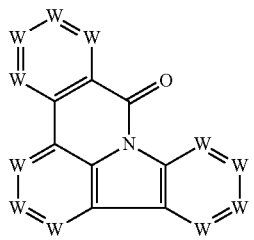

US 11,778,907 B2
203
-continued
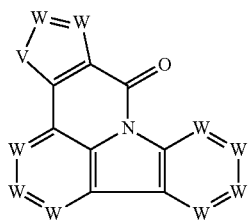
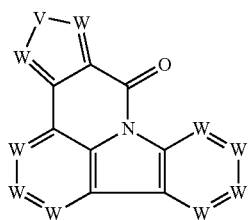
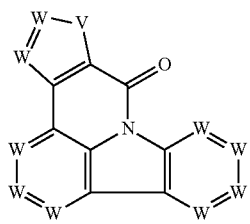
Formula (20)
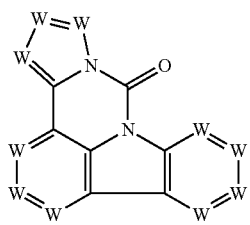
Formula (21)
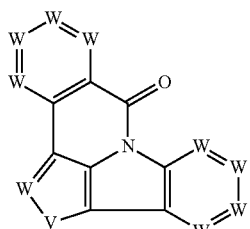
Formula (22)
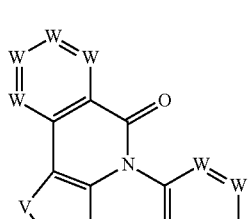
Formula (23)
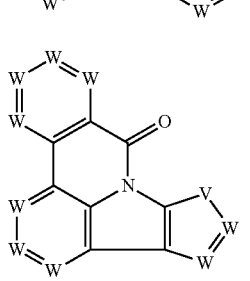
204
-continued
Formula (18)
Formula (18-1)
Formula (19)
Formula (24)
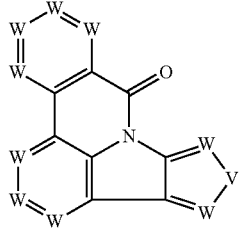
Formula (25)
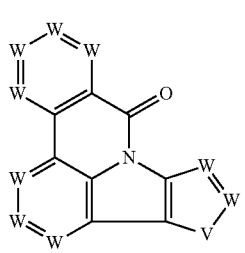
Formula (26)
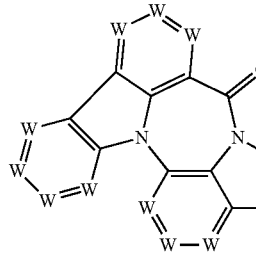
Formula (27)
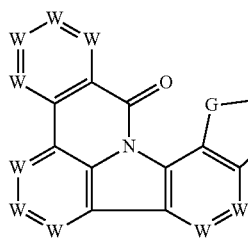
Formula (28)
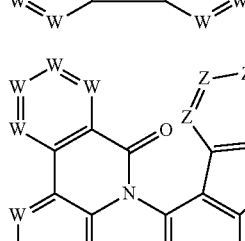
Formula (29)
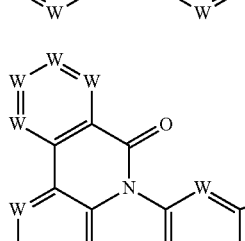

-continued
Formula (30)
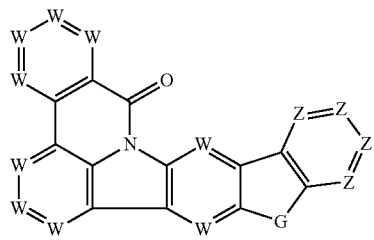
Formula (31)
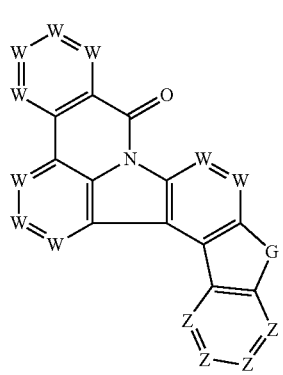
Formula (32)
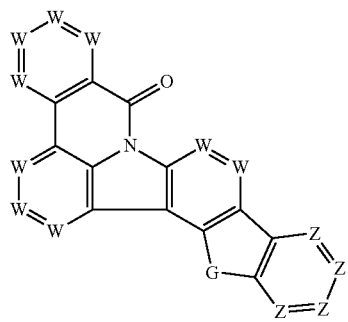
where the symbols used have the definitions given in claim 1.
16. The composition according to claim 1, wherein the compound of the formula (2) is selected from the compounds of the formulae (17a) to (32a)
Formula (17a)
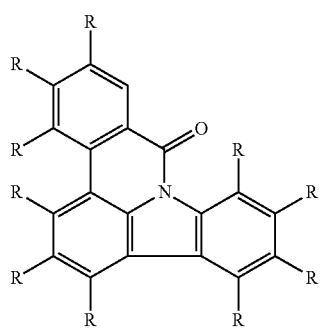
-continued
Formula (18a)
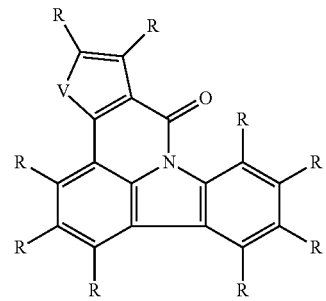
Formula (18-1a)
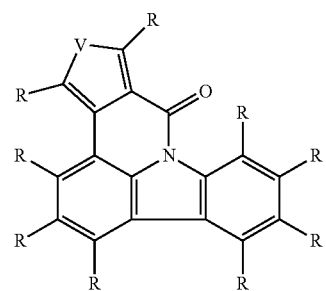
Formula (19a)
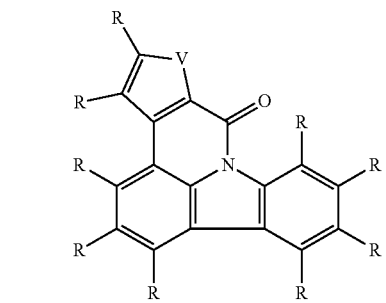
Formula (20a)
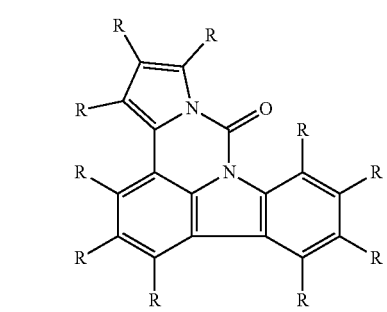
Formula (21a)
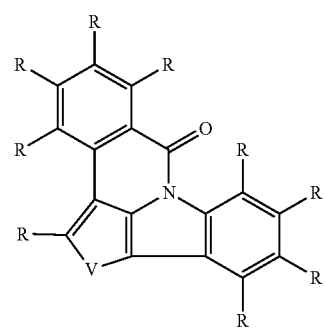

Formula (22a)
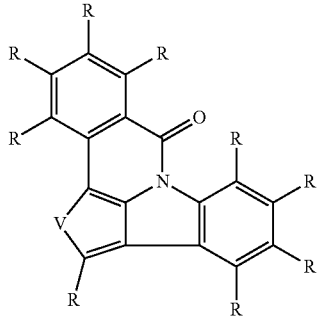
Formula (23a)
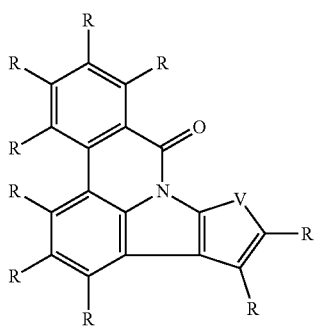
Formula (24a)
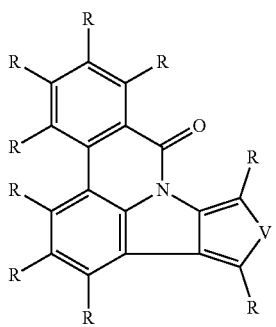
Formula (25a)
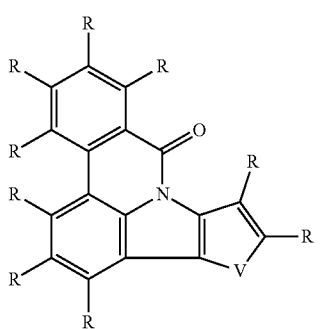
Formula (26a)
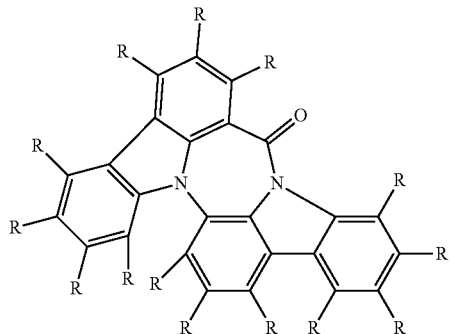
in claim 1.
17. The composition according to claim 1, wherein the compound of the formula (2) is selected from the compounds of the formulae (17b) to (32b)
Formula (17b)
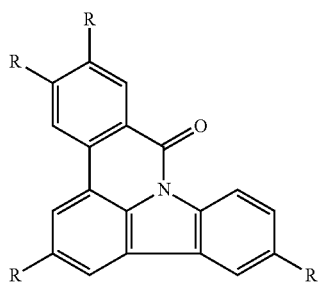
Formula (18b)
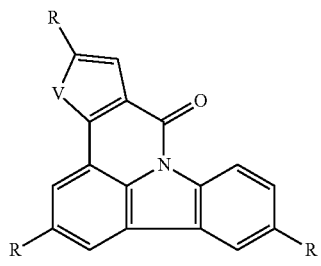
Formula (18-Ib)
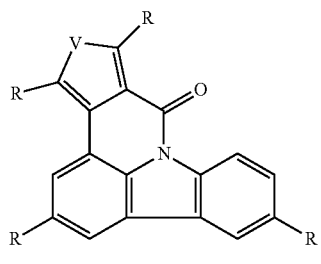
Formula (19b)
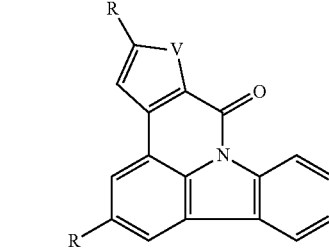

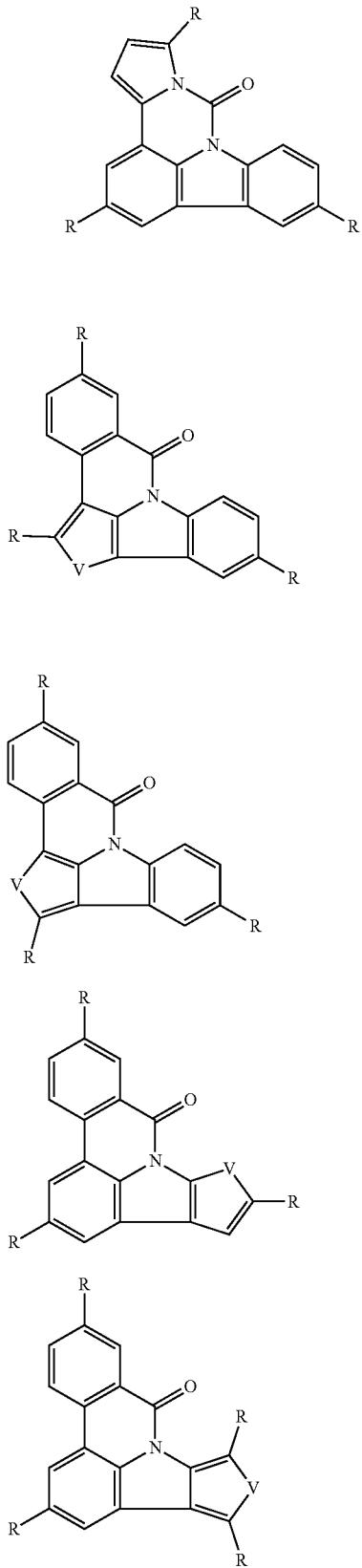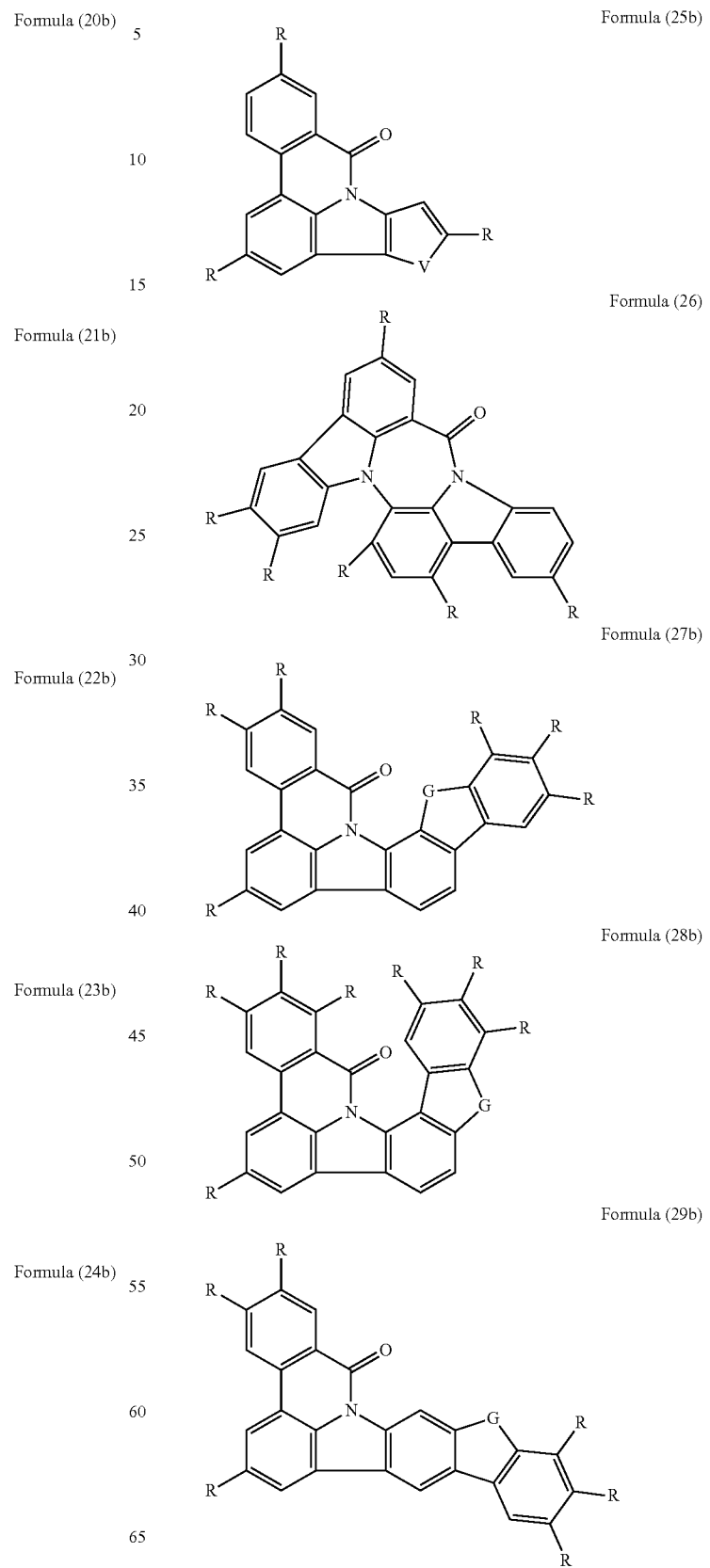

-continued

Formula (30b)

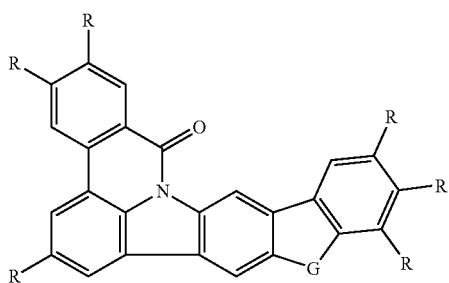

Formula (31b)

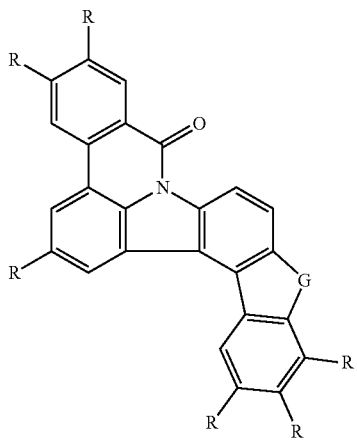

Formula (32b)

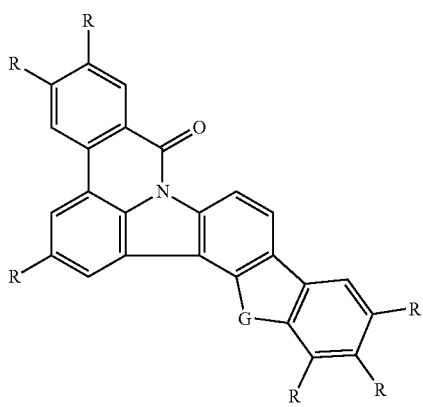

where the symbols used have the definitions given in claim 1.

18. The composition according to claim 1, wherein the composition further comprises at least one compound selected from the group consisting of hole injection materials, hole transport materials, hole blocker materials, wide band gap materials, fluorescent emitters, phosphorescent emitters, host materials, matrix materials, electron blocker materials, electron transport materials and electron injection materials, n-dopants and p-dopants.

19. A formulation comprising a composition according to claim 1 and at least one solvent.

20. An organic electronic device comprising at least one composition according to claim 1.

21. The organic electronic device according to claim 20, wherein the device is selected from organic integrated circuits (OICs), organic field-effect transistors (OFETs), organic thin-film transistors (OTFTs), organic electroluminescent devices, organic solar cells (OSCs), organic optical detectors and organic photoreceptors.

22. The organic electronic device according to claim 21, wherein the organic electroluminescent device selected from the group consisting of organic light-emitting transistors (OLETs), organic field quench devices (OFQDs), organic light-emitting electrochemical cells (OLECs, LECs, LEECs), organic laser diodes (O-lasers) and organic light-emitting diodes (OLEDs).

23. An organic electroluminescent device comprising the composition according to claim 1 in the emission layer together with a phosphorescent emitter.

24. The composition according to claim 11, wherein the composition further comprises at least one compound selected from the group consisting of hole injection materials, hole transport materials, hole blocker materials, wide band gap materials, fluorescent emitters, phosphorescent emitters, host materials, matrix materials, electron blocker materials, electron transport materials and electron injection materials, n-dopants and p-dopants.

25. A formulation comprising a composition according to claim 11 and at least one solvent.

26. An organic electronic device comprising at least one composition according to claim 11.

27. An organic electroluminescent device comprising the composition according to claim 11 in the emission layer together with a phosphorescent emitter.

28. The composition according to claim 12, wherein the electron-transporting host is a compound of the general formula (2) or (2a)

Formula (2)

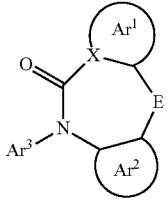

Formula (2a)

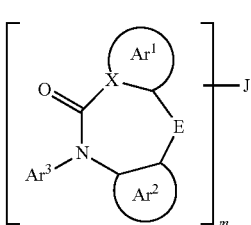

where the symbols and indices used are as follows:

E is a single bond or $NAr^4$;

X is C when $Ar^1$ is a 6-membered aryl or 6-membered heteroaryl group, or is C or N when $Ar^1$ is a 5-membered heteroaryl group;

$Ar^1$ together with the X group and the carbon atom shown explicitly is an aromatic or heteroaromatic ring system which has 5 to 30 aromatic ring atoms and may be substituted by one or more R radicals;

$Ar^2$ together with the carbon atoms shown explicitly is an aromatic or heteroaromatic ring system which has 5 to 30 aromatic ring atoms and may be substituted by one or more R radicals; at the same time, $Ar^2$ may also be joined to $Ar^3$ by a single bond;

Ara is selected from the group consisting of H, D, F, Cl, Br, I, CN, $NO_2$, $N(Ar^5)_2$, $N(R^6)_2$, $C(=O)Ar^5$, $C(=O)R^6$, $P(=O)(Ar^5)_2$, a straight-chain alkyl, alkoxy or thioalkyl group having 1 to 40 carbon atoms or a branched or cyclic alkyl, alkoxy or thioalkyl group having 3 to 40 carbon atoms or an alkenyl or alkynyl group having 2 to 40 carbon atoms, each of which may be substituted by one or more $R^6$ radicals, where one or more nonadjacent $CH_2$ groups may be replaced by $R^6C=CR^6$, $C\equiv C$, $Si(R^6)_2$, $Ge(R^6)_2$, $Sn(R^6)_2$, $C=O$, $C=S$, $C=Se$, $C=NR^6$, $P(=O)(R^6)$, SO, $SO_2$, $NR^6$, O, S or $CONR^6$ and where one or more hydrogen atoms may be replaced by D, F, Cl, Br, I, CN or $NO_2$, an aromatic or heteroaromatic ring system which has 5 to 30 aromatic ring atoms and may be substituted in each case by one or more $R^6$ radicals, an aryloxy or heteroaryloxy group which has 5 to 30 aromatic ring atoms and may be substituted by one or more $R^6$ radicals, or a combination of these systems; at the same time, $Ar^3$ may also be joined to $Ar^2$ by a single bond;

$Ar^4$ is an aromatic or heteroaromatic ring system which has 5 to 30 aromatic ring atoms and may be substituted by one or more R radicals; at the same time, $Ar^4$ may also be joined to $Ar^2$ or A' by a single bond;

m is 1, 3 or 4;

J when m=2 is a single bond or a bivalent group, or when m=3 is a trivalent group, or when m=4 is a tetravalent group, each of which is bonded at any desired position to $Ar^1$, $Ar^2$, $Ar^3$ or $Ar^4$;

R is the same or different at each instance and is selected from the group consisting of H, D, F, Cl, Br, I, CN, $NO_2$, $N(Ar)_2$, $N(R^6)_2$, $C(=O)Ar^5$, $C(=O)R^6$, $P(=O)(Ar^5)_2$, a straight-chain alkyl, alkoxy or thioalkyl group having 1 to 40 carbon atoms or a branched or cyclic alkyl, alkoxy or thioalkyl group having 3 to 40 carbon atoms or an alkenyl or alkynyl group having 2 to 40 carbon atoms, each of which may be substituted by one or more $R^6$ radicals, where one or more nonadjacent $CH_2$ groups may be replaced by $R^6C=CR^6$, $C\equiv C$, $Si(R^6)_2$, $Ge(R^6)_2$, $Sn(R^6)_2$, $C=O$, $C=S$, $C=Se$, $C=NR^6$, $P(=O)(R^6)$, SO, $SO_2$, $NR^6$, O, S or $CONR^6$ and where one or more hydrogen atoms may be replaced by D, F, Cl, Br, I, CN or $NO_2$, an aromatic or heteroaromatic ring system which has 5 to 60 aromatic ring atoms and may be substituted in each case by one or more $R^6$ radicals, an aryloxy or heteroaryloxy group which has 5 to 60 aromatic ring atoms and may be substituted by one or more $R^6$ radicals, or a combination of these systems; where it is optionally possible for two or more adjacent R substituents to form a monocyclic or polycyclic, aliphatic, aromatic or heteroaromatic ring system which may be substituted by one or more $R^6$ radicals;

$R^6$ is the same or different at each instance and is selected from the group consisting of H, D, F, Cl, Br, I, CN, $NO_2$, $N(Ar)_2$, $N(R^7)_2$, $C(=O)Ar^5$, $C(=O)R^7$, $P(=O)(Ar^5)_2$, a straight-chain alkyl, alkoxy or thioalkyl group having 1 to 40 carbon atoms or a branched or cyclic alkyl, alkoxy or thioalkyl group having 3 to 40 carbon atoms or an alkenyl or alkynyl group having 2 to 40 carbon atoms, each of which may be substituted by one or more $R^7$ radicals, where one or more nonadjacent $CH_2$ groups may be replaced by $R^7C=CR^7$, $C\equiv C$, $Si(R^7)_2$, $Ge(R^7)_2$, $Sn(R^7)_2$, $C=O$, $C=S$, $C=Se$, $C=NR^7$, $P(=O)(R^7)$, SO, $SO_2$, $NR^7$, O, S or $CONR^7$ and where one or more hydrogen atoms may be replaced by D, F, Cl, Br, I, CN or $NO_2$, an aromatic or heteroaromatic ring system which has 5 to 60 aromatic ring atoms and may be substituted in each case by one or more $R^7$ radicals, an aryloxy or heteroaryloxy group which has 5 to 60 aromatic ring atoms and may be substituted by one or more $R^7$ radicals, or a combination of these systems; where it is optionally possible for two or more adjacent $R^6$ substituents to form a monocyclic or polycyclic, aliphatic, aromatic or heteroaromatic ring system which may be substituted by one or more $R^7$ radicals;

$Ar^5$ is the same or different at each instance and is an aromatic or heteroaromatic ring system which has 5 to 30 aromatic ring atoms and may be substituted by one or more nonaromatic $R^7$ radicals; at the same time, two $Ar^5$ radicals bonded to the same nitrogen atom or phosphorus atom may also be bridged to one another by a single bond or a bridge selected from N(R), $C(R^7)_2$ and O;

$R^7$ is selected from the group consisting of H, D, F, CN, an aliphatic hydrocarbyl radical having 1 to 20 carbon atoms, an aromatic or heteroaromatic ring system having 5 to 30 aromatic ring atoms in which one or more hydrogen atoms may be replaced by D, F, Cl, Br, I or CN, where two or more adjacent $R^7$ substituents together may forma mono- or polycyclic, aliphatic, aromatic or heteroaromatic ring system.

29. The composition according to claim 12, wherein the composition further comprises at least one compound selected from the group consisting of hole injection materials, hole transport materials, hole blocker materials, wide band gap materials, fluorescent emitters, phosphorescent emitters, host materials, matrix materials, electron blocker materials, electron transport materials and electron injection materials, n-dopants and p-dopants.

30. A formulation comprising a composition according to claim 12 and at least one solvent.

31. An organic electronic device comprising at least one composition according to claim 12.

32. An organic electroluminescent device comprising the composition according to claim 12 in the emission layer together with a phosphorescent emitter.

* * * * *